US012703824B2

(12) United States Patent
Inoue et al.

(10) Patent No.: US 12,703,824 B2
(45) Date of Patent: Aug. 11, 2026

(54) ORGANIC ELECTROLUMINESCENT ELEMENT

(71) Applicant: NIPPON STEEL CHEMICAL & MATERIAL CO., LTD., Tokyo (JP)

(72) Inventors: Munetomo Inoue, Tokyo (JP); Masashi Tada, Tokyo (JP); Yuta Sagara, Tokyo (JP); Ayaka Terada, Tokyo (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 1023 days.

(21) Appl. No.: 17/801,914

(22) PCT Filed: Mar. 19, 2021

(86) PCT No.: PCT/JP2021/011286

§ 371 (c)(1),
(2) Date: Aug. 24, 2022

(87) PCT Pub. No.: WO2021/200250

PCT Pub. Date: Oct. 7, 2021

(65) Prior Publication Data

US 2023/0136708 A1 May 4, 2023

(30) Foreign Application Priority Data

Mar. 31, 2020 (JP) ................................ 2020-063326

(51) Int. Cl.
*H01L 51/50* (2006.01)
*C09K 11/06* (2006.01)
(Continued)

(52) U.S. Cl.
CPC ............ *C09K 11/06* (2013.01); *H10K 85/621* (2023.02); *H10K 85/622* (2023.02);
(Continued)

(58) Field of Classification Search
None
See application file for complete search history.

(56) References Cited

U.S. PATENT DOCUMENTS

2009/0236974 A1* 9/2009 Tamaru ............... C09K 11/025 313/504
2010/0295444 A1 11/2010 Kuma et al.
(Continued)

FOREIGN PATENT DOCUMENTS

CN 109411634 A 3/2019
CN 110492006 A 11/2019
(Continued)

*Primary Examiner* — Gregory D Clark
(74) *Attorney, Agent, or Firm* — Birch, Stewart, Kolasch & Birch, LLP

(57) ABSTRACT

Provided is a blue light emitting organic EL device having high emission efficiency and a long lifetime. This organic electroluminescent device includes one or more light emitting layers between an anode and a cathode opposite to each other, wherein at least one of the light emitting layers comprises one or more hosts selected from the indolocarbazole compounds represented by the following general formula (1) and, as a light emitting dopant, a polycyclic aromatic compound represented by the following general formula (2) or a polycyclic aromatic compound having the structure represented by the general formula (2) as a substructure, and wherein in the formulae Z is an indolocarbazole ring-containing group, $X^1$ is O, N—$Ar^3$, S, or Se, and $Y^1$ is B, P, P═O, P═S, Al, Ga, As, Si—$R^2$ or Ge—$R^3$.

$$(Z)_a - L^1 - (Ar^1)_b \quad (1)$$

(Continued)

-continued

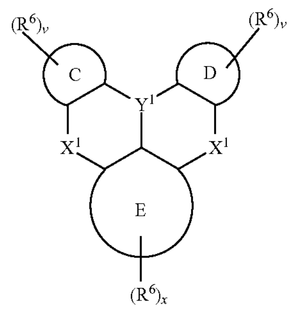

(2)

13 Claims, 1 Drawing Sheet

(51) Int. Cl.
*H10K 85/60* (2023.01)
*H10K 101/00* (2023.01)

(52) U.S. Cl.
CPC ......... *H10K 85/636* (2023.02); *H10K 85/654* (2023.02); *H10K 85/657* (2023.02); *H10K 85/6572* (2023.02); *H10K 85/6574* (2023.02); *H10K 85/6576* (2023.02); *H10K 85/658* (2023.02); *H10K 2101/27* (2023.02); *H10K 2101/90* (2023.02)

(56) References Cited

U.S. PATENT DOCUMENTS

2012/0241732 A1 9/2012 Endo et al.
2016/0093813 A1 3/2016 Stoessel et al.
2017/0263869 A1 9/2017 Tada et al.
2020/0190115 A1 6/2020 Hatakeyama et al.
2020/0203652 A1* 6/2020 Duan .................. H10K 85/631
2021/0050546 A1 2/2021 Li et al.

FOREIGN PATENT DOCUMENTS

WO WO 2010/134350 A1 11/2010
WO WO 2011/070963 A1 6/2011
WO WO 2014/166585 A1 10/2014
WO WO 2015/102118 A1 7/2015
WO WO 2016042997 A1 * 3/2016
WO WO 2018/212169 A1 11/2018

* cited by examiner

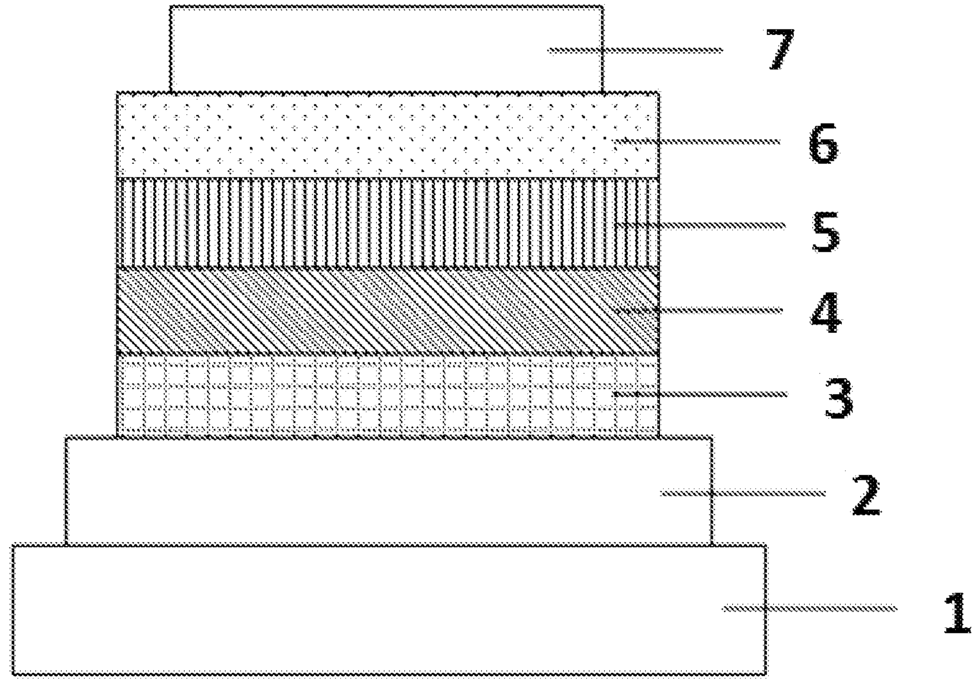
7
6
5
4
3
2
1

ORGANIC ELECTROLUMINESCENT ELEMENT

TECHNICAL FIELD

The present invention relates to an organic electroluminescent device or element (hereinafter, also referred to as an organic EL device or element).

BACKGROUND ART

When a voltage is applied to an organic EL device, holes and electrons are injected from the anode and the cathode, respectively, into the light emitting layer. Then, the injected holes and electrons are recombined in the light emitting layer to thereby generate excitons. At this time, according to the electron spin statistics theory, singlet excitons and triplet excitons are generated at a ratio of 1:3. In the fluorescent organic EL device that uses emission caused by singlet excitons, the limit of the internal quantum efficiency is said to be 25%. On the other hand, it has been known that, in the phosphorescent organic EL device that uses emission caused by triplet excitons, the internal quantum efficiency can be enhanced up to 100% when intersystem crossing efficiently occurs from singlet excitons.

However, the blue phosphorescent organic EL device has a technical problem of extending the lifetime.

Further, a highly efficient organic EL device utilizing delayed fluorescence has been developed, in recent years. For example, Patent Literature 1 discloses an organic EL device utilizing the Triplet-Triplet Fusion (TTF) mechanism, which is one of the mechanisms of delayed fluorescence. The TTF mechanism utilizes a phenomenon in which a singlet exciton is generated by the collision of two triplet excitons, and it is believed that the internal quantum efficiency can be enhanced up to 40%, in theory. However, its efficiency is low as compared with the efficiency of the phosphorescent organic EL device, and thus further improvement in efficiency is desired.

On the other hand, Patent Literature 2 discloses an organic EL device utilizing the Thermally Activated Delayed Fluorescence (TADF) mechanism. The TADF mechanism utilizes a phenomenon in which reverse intersystem crossing occurs from the triplet exciton to the singlet exciton in a material having a small energy difference between the singlet level and the triplet level, and it is believed that the internal quantum efficiency can be enhanced up to 100%, in theory. However, further improvement in lifetime characteristics is desired as in the phosphorescent device.

CITATION LIST

Patent Literature

Patent Literature 1: International Publication No. WO2010/134350

Patent Literature 2: International Publication No. WO2011/070963

Patent Literature 3: International Publication No. WO2015/102118

Patent Literature 4: International Publication No. WO2018/212169

Patent Literature 5: International Publication No. WO2014/166585

Patent Literature 6: International Publication No. WO2016/042997

Patent Literatures 3 and 4 discloses a highly efficient organic EL device in which a TADF material including a polycyclic aromatic compound exemplified by the following compound is used as a light emitting dopant and a material including a carbazole ring-containing compound is used as a host; however, they do not specifically disclose lifetime characteristics.

[C 1]

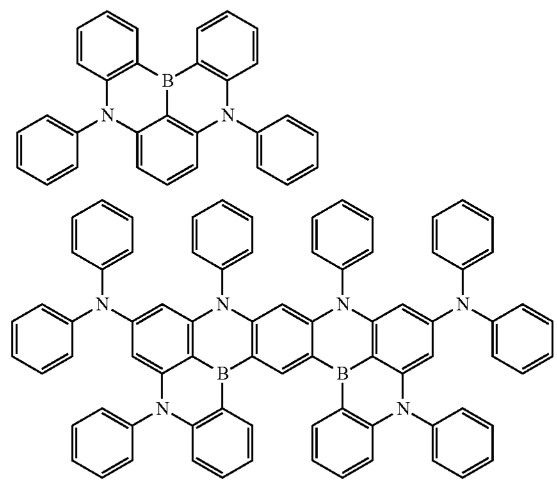

Patent Literature 5 discloses an organic EL device in which a TADF material is used as a light emitting dopant and a material including an indolocarbazole ring-containing compound is used as a host; however, it does not render the present invention useful.

Patent Literature 6 discloses an organic EL device in which a material having preliminarily mixed two or more indolocarbazole ring-containing compounds is used as a host; however, it does not disclose a device using a TADF material including the aforementioned polyaromatic compound as a light emitting dopant.

SUMMARY OF INVENTION

In order to apply an organic EL device to a display device such as a flat panel display and a light source, it is necessary to improve the emission efficiency of the device and ensure a device lifetime sufficient to withstand practical use. An object of the present invention is to provide a practically useful organic EL device having high efficiency and a long lifetime while having a low driving voltage.

The present invention is an organic electroluminescent device comprising one or more light emitting layers between an anode and a cathode opposite to each other, wherein at least one of the light emitting layers comprises one or more hosts selected from the compounds represented by the following general formula (1) and, as a light emitting dopant, a polycyclic aromatic compound represented by the following general formula (2) or a polycyclic aromatic compound having a structure represented by the general formula (2) as a substructure,

[C 2]

(1)

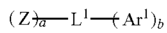

(1a)

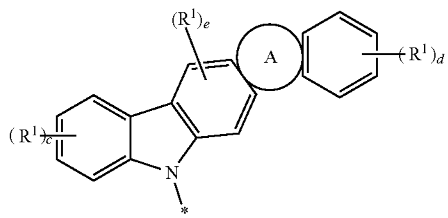

(1b)

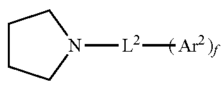

wherein Z is an indolocarbazole ring-containing group represented by the general formula (1a),

* is a bonding site to $L^1$, and the ring A is a heterocyclic ring represented by formula (1b), and the ring A is condensed with an adjacent ring at an arbitrary position.

$L^1$ and $L^2$ are each independently a substituted or unsubstituted aromatic hydrocarbon group having 6 to 30 carbon atoms, or a substituted or unsubstituted aromatic heterocyclic group having 3 to 17 carbon atoms, and $Ar^1$ and $Ar^2$ are each independently a substituted or unsubstituted aromatic hydrocarbon group having 6 to 30 carbon atoms, a substituted or unsubstituted aromatic heterocyclic group having 3 to 17 carbon atoms, or a linked aromatic group formed by linking 2 to 8 groups thereof.

$R^1$ is each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms.

a represents an integer of 1 to 3, b represents an integer of 0 to 3, and c and d each independently represent an integer of 0 to 4, e represents an integer of 0 to 2, and f represents an integer of 0 to 3.

[C 3]

(2)

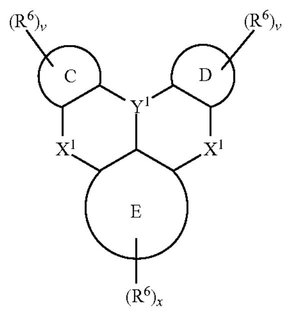

wherein the C ring, the D ring, and the E ring are each independently an aromatic hydrocarbon ring having 6 to 24 carbon atoms or an aromatic heterocyclic ring having 3 to 17 carbon atoms, and $Y^1$ is B, P, P═O, P═S, Al, Ga, As, Si—$R^2$ or Ge—$R^3$, $R^2$ and $R^3$ are each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, $X^1$ is each independently O, N—$Ar^3$, S or Se, and $Ar^3$ is each independently a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 8 groups thereof, N—$Ar^3$ is optionally bonded to any of the C ring, the D ring, or the E ring to form a heterocyclic ring containing N, and at least one hydrogen in the C ring, the D ring, the E ring, $R^2$, $R^3$, $R^6$ and $Ar^3$ is optionally replaced with a halogen or deuterium.

$R^6$ each independently represents a cyano group, deuterium, a diarylamino group having 12 to 44 carbon atoms, an arylheteroarylamino group having 12 to 44 carbon atoms, a diheteroarylamino group having 12 to 44 carbon atoms, an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, and v each independently represents an integer of 0 to 4, and x represents an integer of 0 to 3.

The polycyclic aromatic compound having the structure represented by the general formula (2) as a substructure is a polycyclic aromatic compound represented by formula (3) below or a born-containing polycyclic aromatic compound represented by formula (4) below,

[C 4]

(3)

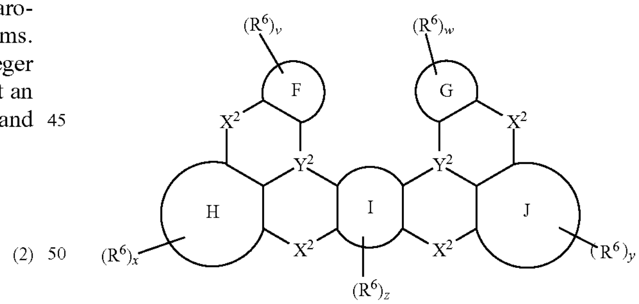

wherein the F ring, the G ring, the H ring, the I ring, and the J ring are each independently a substituted or unsubstituted aromatic hydrocarbon ring having 6 to 24 carbon atoms or a substituted or unsubstituted aromatic heterocyclic ring having 3 to 17 carbon atoms, $Y^2$ has the same meaning as $Y^1$ in the general formula (2) above, $X^2$ has the same meaning as $X^1$ in the general formula (2) above, and at least one hydrogen in the F ring, the G ring, the H ring, the I ring, and the J ring is optionally replaced with a halogen or deuterium.

$R^6$, x, and v are as defined in the general formula (2) above, w represents an integer of 0 to 4, y represents an integer of 0 to 3, and z represents an integer of 0 to 2.

[C 5]

(4)

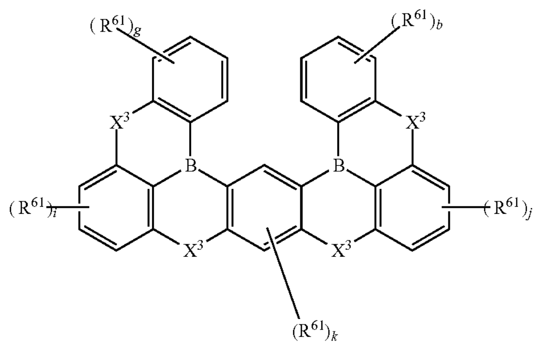

wherein $X^3$ each independently represents N—$Ar^5$, O, or S, however at least one $X^3$ represents N—$Ar^5$.

$Ar^5$ is each independently a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 8 aromatic rings thereof.

N—$Ar^5$ is optionally bonded with any of the aromatic ring bonded with $X^3$ to form a heterocyclic ring containing N. $R^{61}$ is each independently a cyano group, deuterium, a diarylamino group having 12 to 44 carbon atoms, an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms.

g and h each independently represent an integer of 0 to 4, i and j each independently represent an integer of 0 to 3, and k represents an integer of 0 to 2.

The light emitting layer can include two or more hosts selected from the compounds represented by the general formula (1).

At least one host selected from the compounds represented by the general formula (1) has $L^1$ and $L^2$, either of which alone is a substituted or unsubstituted nitrogen-containing aromatic heterocyclic ring group having 3 to 17 carbon atoms.

In the light emitting layer, as hosts selected from the compound represented by the general formula (1), a first host represented by the following formula (5a) or (5b) and a second host represented by the following formula (6),

[C 6]

(5a)

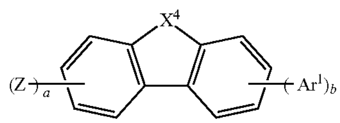

-continued (5b)

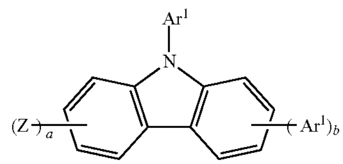

(6)

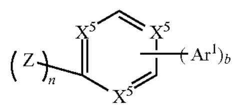

wherein Z, $Ar^1$, a and b are as defined in the general formula (1).

$X^4$ represents O or S.

b1 represents an integer of 0 to 2.

$X^5$ each independently represents N, C—H, C—, or C—$R^7$, and at least one $X^5$ represents N.

$R^7$ independently represents a cyano group, an aliphatic hydrocarbon group having 1 to 10 carbon atoms, or a diarylamino group having 12 to 44 carbon atoms, may be included.

At least one host selected from the compounds represented by the general formula (1) can be a compound represented by the following formula (7) or formula (8), and is preferably a compound represented by formula (7),

[C 7]

(7)

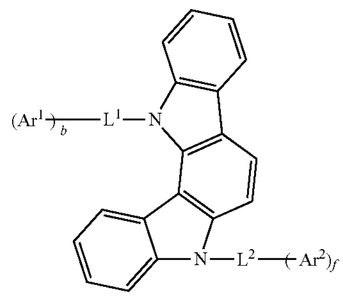

(8)

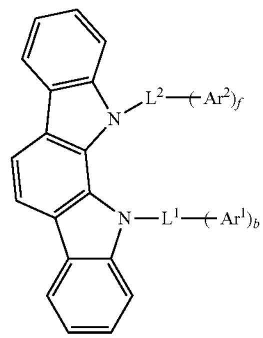

wherein $L^1$, $L^2$, $Ar^1$, $Ar^2$, b and f are as defined in the general formula (1) above.

The difference between excited singlet energy (S1) and excited triplet energy (T1) (ΔEST) of the light emitting dopant is preferably 0.20 eV or less and more preferably 0.10 eV or less.

In the light emitting layer, preferably 99.9 to 90% by mass of the hosts and 0.10 to 10% by mass of the light emitting dopant are contained, and more preferably the first host is contained in an amount of 10 to 90% by mass and the second host is contained in an amount of 90 to 10% by mass, based on the hosts.

The organic EL device of the present invention includes the specific light emitting dopant and the specific host material in the light emitting layer, therefore can be an organic EL device with a low driving voltage, high emission efficiency as well as a long lifetime. The reason for the low driving voltage of the organic EL device is conjectured because the indolocarbazole compound that is the host material has characteristics facilitating holes to be injected. Moreover, it is conjectured that by using two or more host materials composed of the indolocarbazole compounds with different electron and hole injection transportability in the light emitting layer, the balance between holes and electrons can be maintained more precisely, thereby enabling an organic EL device with higher emission efficiency to be achieved.

BRIEF DESCRIPTION OF DRAWING

FIG. 1 shows a cross-sectional view of one example of the organic EL device.

DESCRIPTION OF EMBODIMENTS

The organic EL device of the present invention includes one or more light emitting layers between an anode and a cathode opposite to each other, wherein at least one of the emitting layers contains a host and a light emitting dopant.

As the host, one or more hosts selected from the compounds represented by the general formula (1) are contained. As the light emitting dopant, a polycyclic aromatic compound represented by the general formula (2) or a polycyclic aromatic compound having the structure represented by the general formula (2) as a substructure is contained.

The compound represented by the general formula (1) used as the host will be described.

In the general formula (1), Z is the indolocarbazole ring-containing compound represented by the general formula (1a), the ring A is a heterocyclic ring represented by formula (1b), and the heterocyclic ring of the ring A is condensed with an adjacent ring at an arbitrary position.

$L^1$, and $L^2$ each independently represent a substituted or unsubstituted aromatic hydrocarbon group having 6 to 30 carbon atoms or a substituted or unsubstituted aromatic heterocyclic group having 3 to 17 carbon atoms, preferably an aromatic hydrocarbon group having 6 to 20 carbon atoms or an aromatic heterocyclic group having 3 to 15 carbon atoms.

Either of $L^1$ and $L^2$ is preferably a nitrogen-containing aromatic heterocyclic ring group having 3 to 17 carbon atoms.

When using two or more compounds represented by the general formula (1) are used, either of $L^1$ and $L^2$ of at least one compound is preferably a substituted or unsubstituted nitrogen-containing aromatic heterocyclic ring group having 3 to 17 carbon atoms.

Examples of $L^1$ and $L^2$ that are unsubstituted aromatic hydrocarbon groups or aromatic heterocyclic groups include groups produced from benzene, naphthalene, acenaphthene, acenaphthylene, azulene, anthracene, chrysene, pyrene, phenanthrene, triphenylene, fluorene, benzo[a]anthracene, tetracene, pentacene, hexacene, coronene, heptacene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, or carbazole. Here, the group produced refers to a group produced by removing a specific number of hydrogen atoms from these groups. $L^1$ and $L^2$ are, an a+b valent group, a c+d valent group, respectively.

More preferably, $L^1$ and $L^2$ are each a group produced from benzene, naphthalene, pyridine, triazine, dibenzofuran, or carbazole.

$Ar^1$ and $Ar^2$ are each independently a substituted or unsubstituted aromatic hydrocarbon group having 6 to 30 carbon atoms, a substituted or unsubstituted aromatic heterocyclic group having 3 to 17 carbon atoms, or a linked aromatic group formed by linking 2 to 8 groups thereof; preferably a substituted or unsubstituted aromatic hydrocarbon group having 6 to 20 carbon atoms, a substituted or unsubstituted aromatic heterocyclic group having 3 to 15 carbon atoms, or a linked aromatic group formed by linking 2 to 4 groups thereof; more preferably a substituted or unsubstituted aromatic hydrocarbon group having 6 to 18 carbon atoms, a substituted or unsubstituted aromatic heterocyclic group having 3 to 12 carbon atoms, or a linked aromatic group formed by linking 2 to 3 groups thereof.

Examples of $Ar^1$ and $Ar^2$ that are unsubstituted aromatic hydrocarbon groups, aromatic heterocyclic groups, or linked aromatic groups include groups produced by removing one hydrogen from benzene, naphthalene, acenaphthene, acenaphthylene, azulene, anthracene, chrysene, pyrene, phenanthrene, triphenylene, fluorene, benzo[a]anthracene, tetracene, pentacene, hexacene, coronene, heptacene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, carbazole, or a compound formed by linking two to eight of these compounds. Preferably, they include groups produced by removing one hydrogen from benzene, naphthalene, acenaphthene, acenaphthylene, azulene, pyridine, pyrimidine, triazine, dibenzofuran, dibenzothiophene, dibenzoselenophene, carbazole, or a compound formed by linking 2 to 4 of these compounds. More preferably, they include groups produced by removing one hydrogen from benzene, pyridine, pyrimidine, triazine, dibenzofuran, dibenzothiophene, carbazole, or a compound formed by linking 2 to 3 of these compounds.

$Ar^1$ and $Ar^2$ are preferably a phenyl group, a biphenyl group, or a terphenyl group. The terphenyl group may be linked in a linear or branched manner.

$R^1$ is each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms. Preferably, $R^1$ is an aliphatic hydrocarbon group having 1 to 8 carbon atoms, a substituted or unsubstituted aromatic hydrocarbon group having 6 to 12 carbon atoms, or a substituted or unsubstituted aromatic heterocyclic group having 3 to 15 carbon atoms. More preferably, $R^1$ is a substituted or unsubstituted aromatic hydrocarbon group having 6 to 10 carbon atoms, or a substituted or unsubstituted aromatic heterocyclic group having 3 to 12 carbon atoms.

When $R^1$ is an aliphatic hydrocarbon group having 1 to 10 carbon atoms, specific examples of $R^1$ include methyl, ethyl, propyl, butyl, pentyl, hexyl, heptyl, octyl, and nonyl. Preferred examples thereof include methyl, ethyl, propyl, butyl, pentyl, hexyl, heptyl, or octyl.

When $R^1$ is an unsubstituted aromatic hydrocarbon group having 6 to 18 carbon atoms or an unsubstituted aromatic heterocyclic group having 3 to 17 carbon atoms, specific examples of $R^1$ include a group produced by removing one hydrogen atom from benzene, naphthalene, acenaphthene, acenaphthylene, azulene, anthracene, chrysene, pyrene, phenanthrene, triphenylene, fluorene, benzo[a]anthracene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, and carbazole. Preferred examples thereof include a group produced by removing one hydrogen atom from benzene, naphthalene, acenaphthene, acenaphthylene, azulene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, and carbazole.

Preferred examples thereof include a group produced from benzene, naphthalene, azulene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, and carbazole.

The aforementioned unsubstituted aromatic hydrocarbon group or aromatic heterocyclic group as used herein may each have a substituent. The substituent in the case of having the substituent, is preferably deuterium, a cyano group, a triarylsilyl group, an aliphatic hydrocarbon group having 1 to 10 carbon atoms, and a diarylamino group having 12 to 44 carbon atoms. Here, when the substituent is the aliphatic hydrocarbon group having 1 to 10 carbon atoms, it may be linear, branched, or cyclic.

The number of substituents is 0 to 5, and preferably 0 to 2. When each of the aromatic hydrocarbon groups and aromatic heterocyclic groups has a substituent, the number of carbon atoms of the substituent is not included in the calculation of the number of carbon atoms. However, the total number of carbon atoms including the number of carbon atoms of the substituents preferably satisfies the above range.

Specific examples of the above substituent include cyano, methyl, ethyl, propyl, butyl, pentyl, hexyl, heptyl, octyl, nonyl, decyl, diphenylamino, naphthylphenylamino, dinaphthylamino, dianthranylamino, diphenanthrenylamino, dipyrenylamino groups, and the like. Preferred examples thereof include cyano, methyl, ethyl, propyl, butyl, pentyl, hexyl, heptyl, octyl, diphenylamino, naphthylphenylamino, and dinaphthylamino groups.

The linked aromatic group as used herein refers to a group in which each carbon atom of aromatic rings of aromatic groups are linked together by a single bond. It is an aromatic group by linking two or more aromatic groups, which may be linear or branched. The aromatic group may be an aromatic hydrocarbon group or an aromatic heterocyclic group, and the plurality of aromatic groups may be identical or different. The aromatic group corresponding to the linked aromatic group is different from the substituted aromatic group.

In the present description, it is understood that the hydrogen may be deuterium. Namely, in the general formulae (1) to (4), etc., some H atoms or all H atoms of a skeleton such as carbazole and substituents such as $R^1$ and $Ar^1$ may be deuterium.

a represents an integer of 1 to 3, b represents an integer of 0 to 3, and f represents an integer of 0 to 3 in the general formula (1). a preferably represents an integer of 1 to 2, b represents an integer of 0 to 2, and f represents an integer of 0 to 2.

c and d each independently represent an integer of 0 to 4, and e represents an integer of 0 to 2. Preferably c and d each independently represent an integer of 0 to 1.

One or more compounds represented by the general formula (1) are used in the light emitting layer; however, two or more thereof are preferably used.

More preferably the first host is the compound represented by formula (5a) or formula (5b) and the second host is the compound represented by formula (6).

In the general formula (1) or formula (5a) or formula (5b) or formula (6), the common symbols have the same meaning.

In formula (5a), $X^4$ independently represents O or S. In formula (5b), b1 is an integer of 0 to 2, which represents the number less than b by one.

In formula (6), $X^5$ independently represents N, C—H, C—, or C—$R^7$, and at least one $X^5$ represents N. When $X^5$ is C—, it is bonded to $Ar^1$. $R^7$ independently represents a cyano group, an aliphatic hydrocarbon group having 1 to 10 carbon atoms, or a diarylamino group having 12 to 44 carbon atoms. Specific examples of $R^7$ are understood from the description of the substituents above.

The preferred aspect of the general formula (1) is preferably formula (7) or formula (8) above, and formula (7) is more preferred.

In the general formula (1), formula (7) and formula (8), the common symbols have the same meaning.

Specific examples of the compounds represented by the general formula (1) are shown below, but the compounds are not limited to these exemplified compounds.

[C 8]
1-1
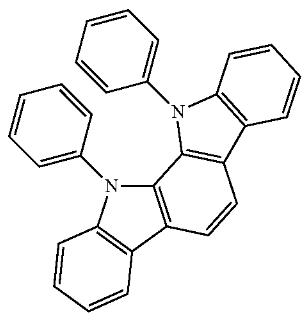
1-2
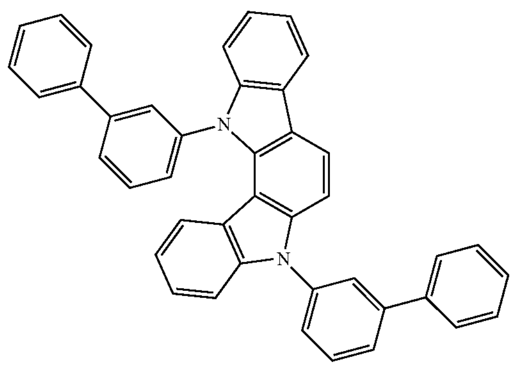
1-3
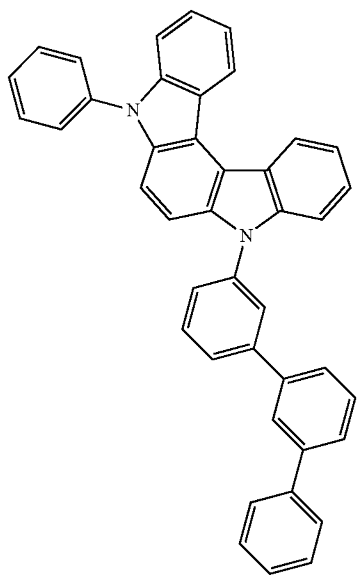
-continued
1-4
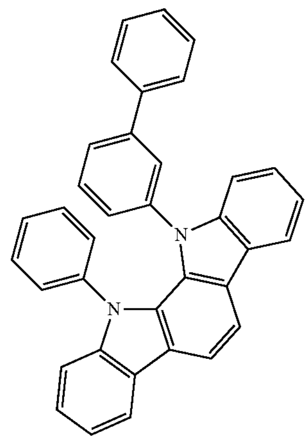
1-5
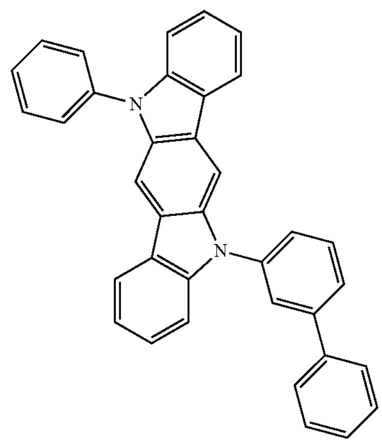
1-6
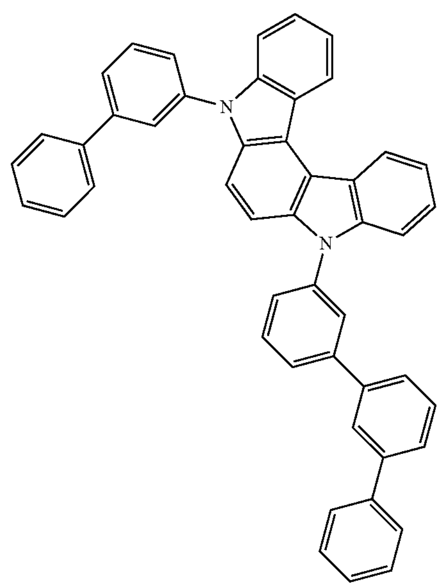

-continued
1-7
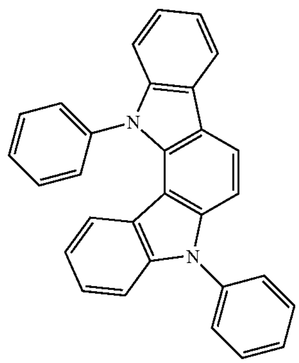
1-8
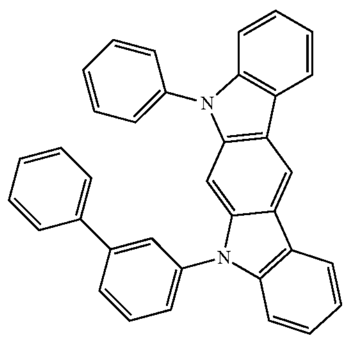
1-9
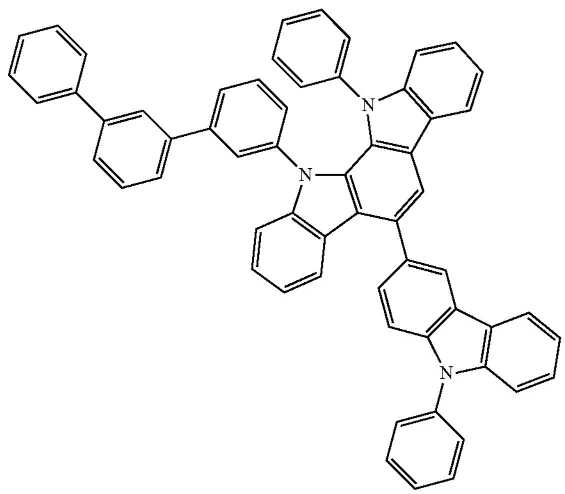
-continued
1-10
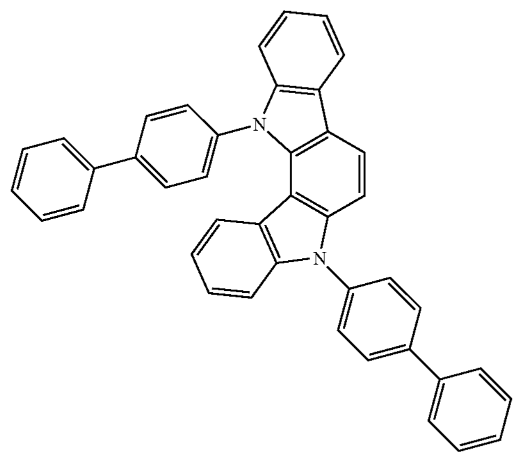
1-11
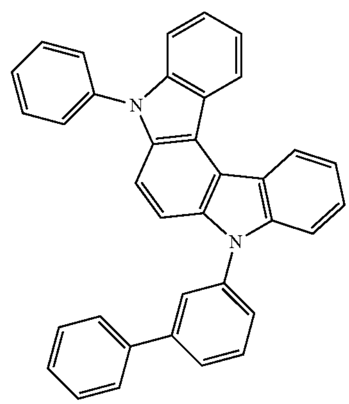
1-12
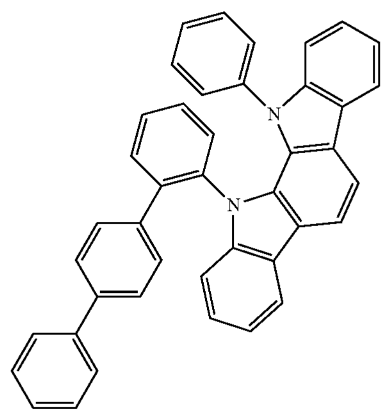
1-13
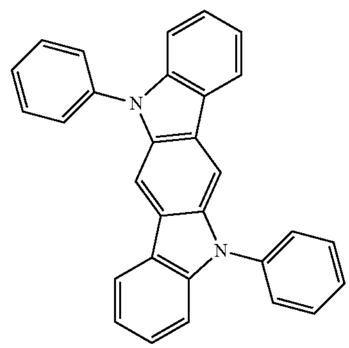

-continued
1-14
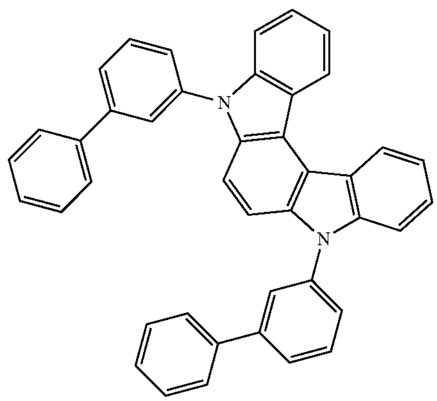
1-15
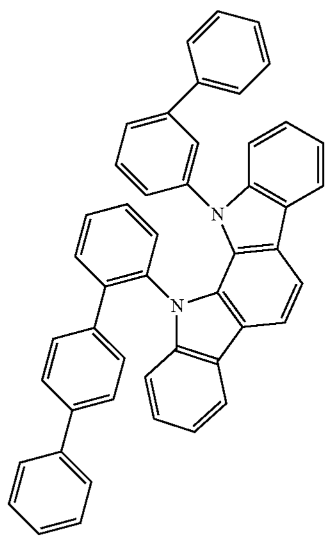
[C 9]
1-16
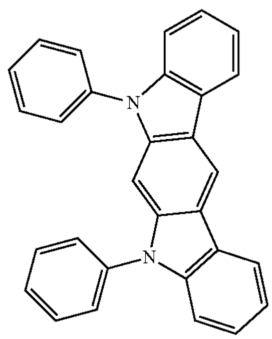
-continued
1-17
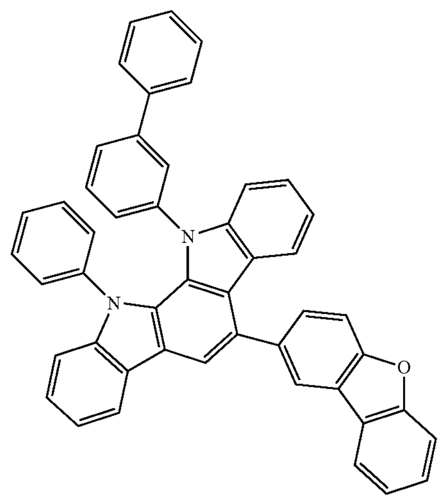
1-18
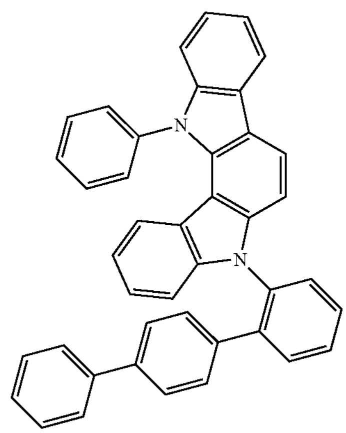
1-19
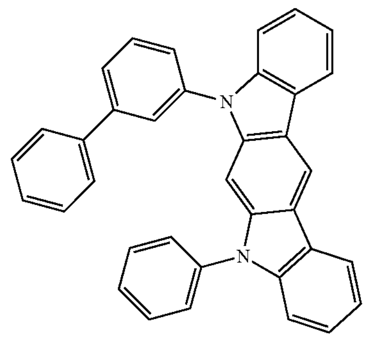

-continued
1-20
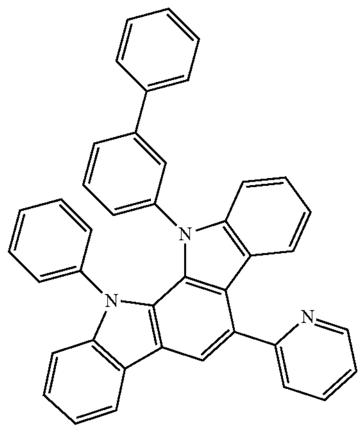
1-21
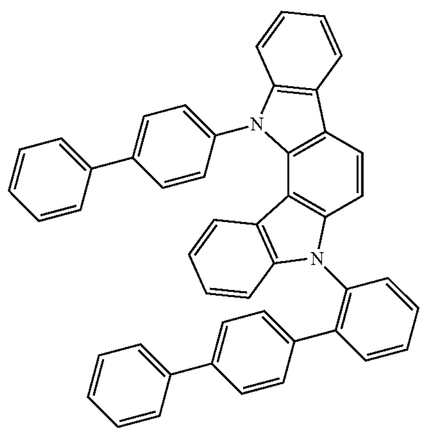
1-22
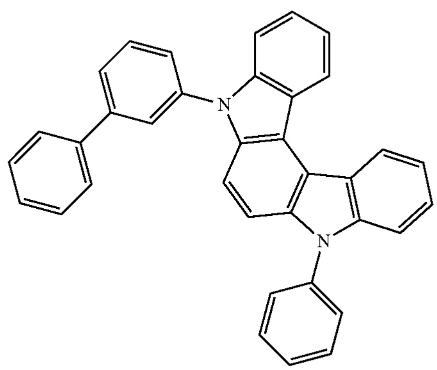
-continued
1-23
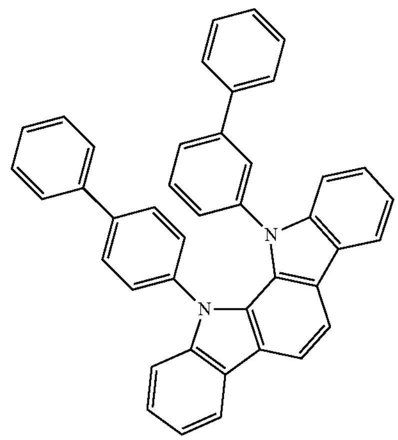
1-24
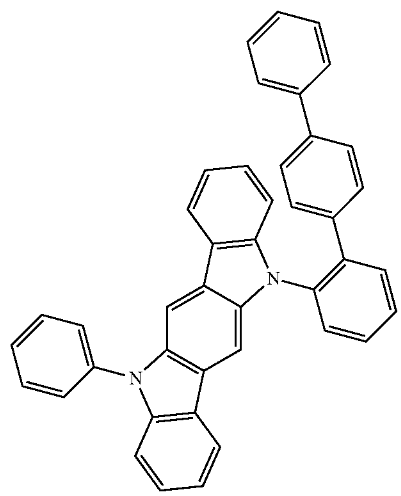
1-25
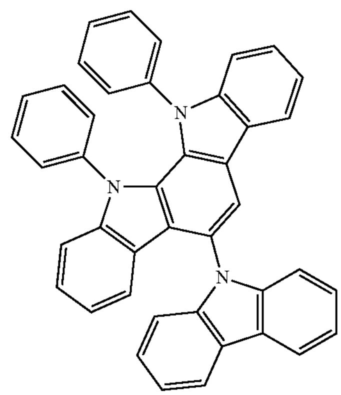

-continued
1-26
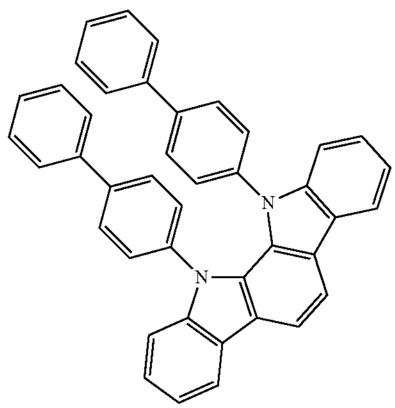
1-27
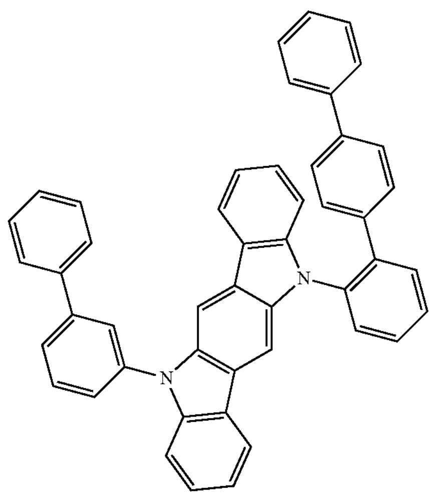
1-28
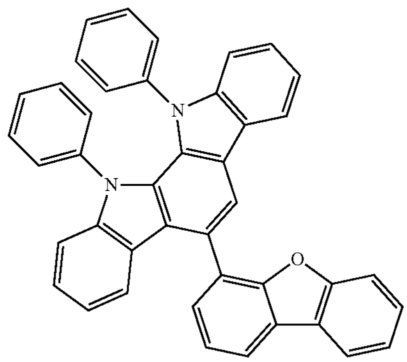
-continued
1-29
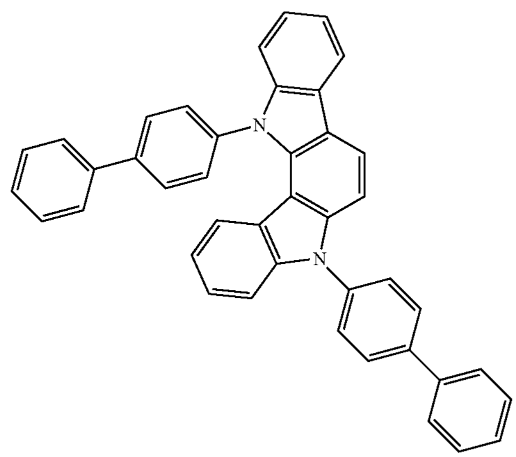
1-30
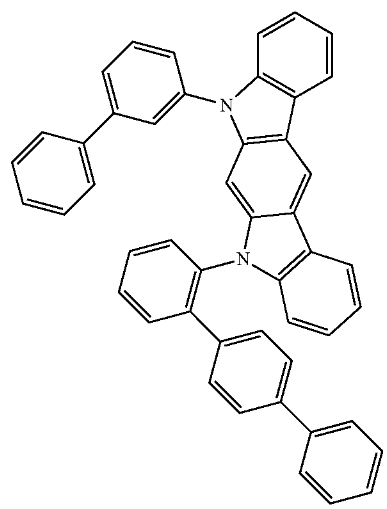
[C 10]
1-31
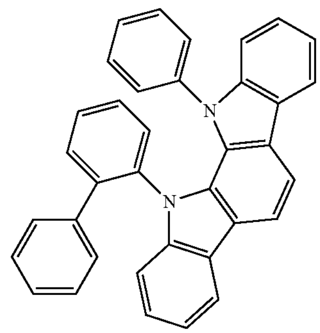

-continued
1-32
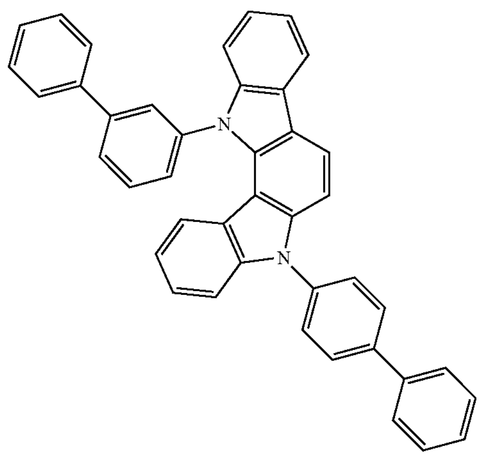
1-33
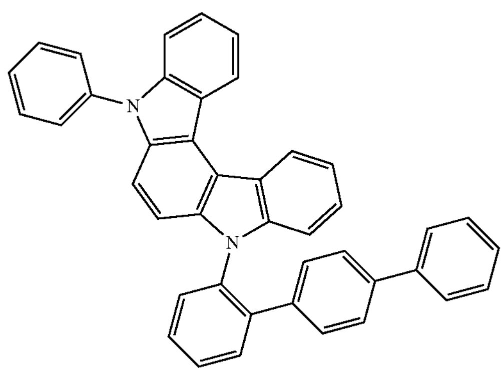
1-34
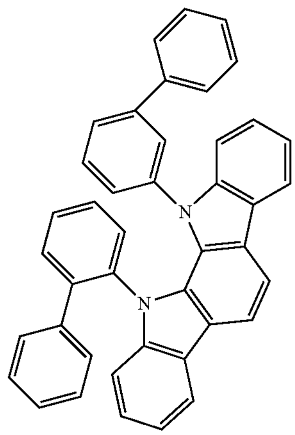
1-35
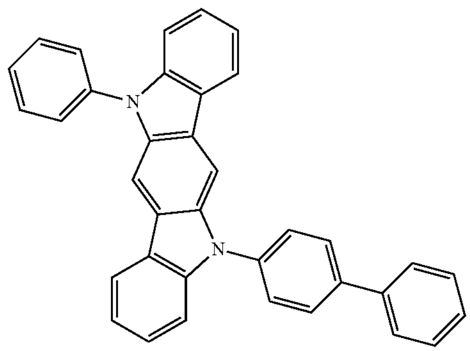
-continued
1-36
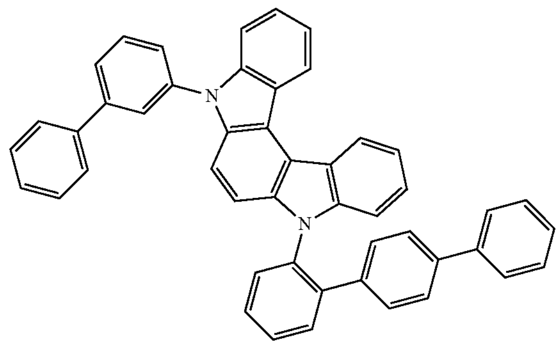
1-37
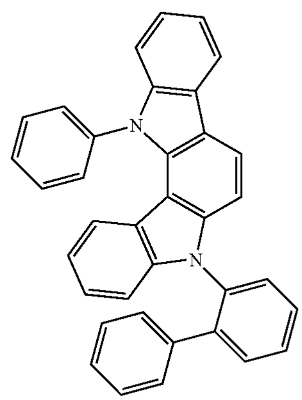
1-38
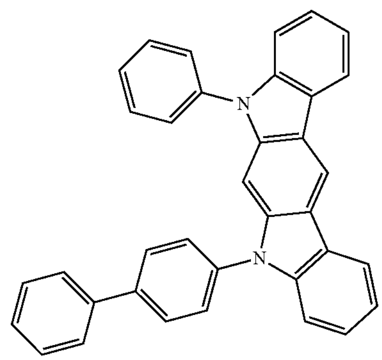
1-39
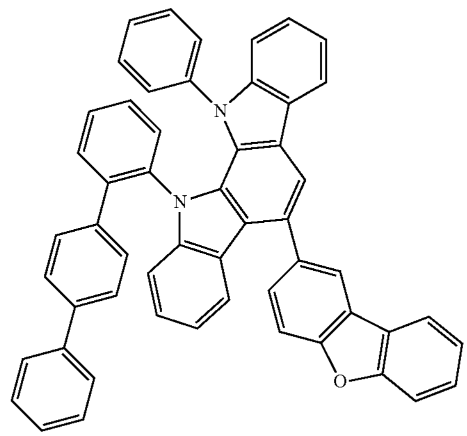

-continued
1-40
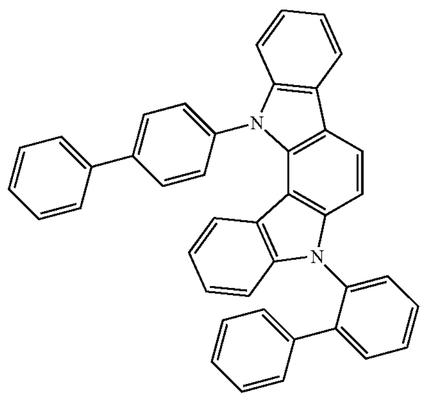
1-41
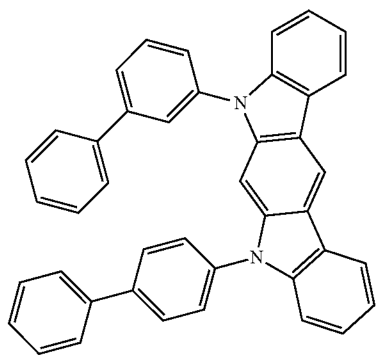
1-42
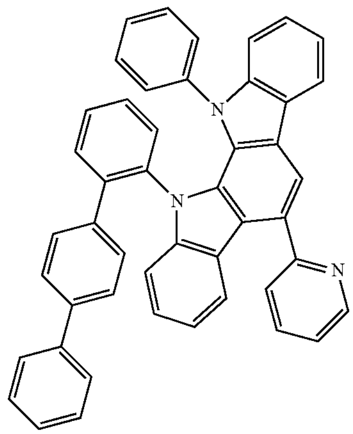
1-43
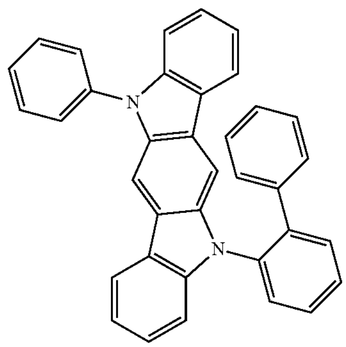
-continued
1-44
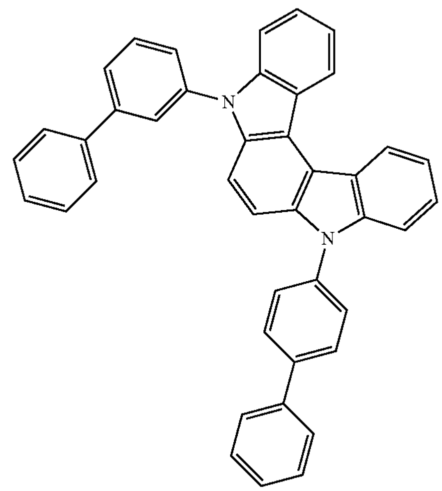
1-45
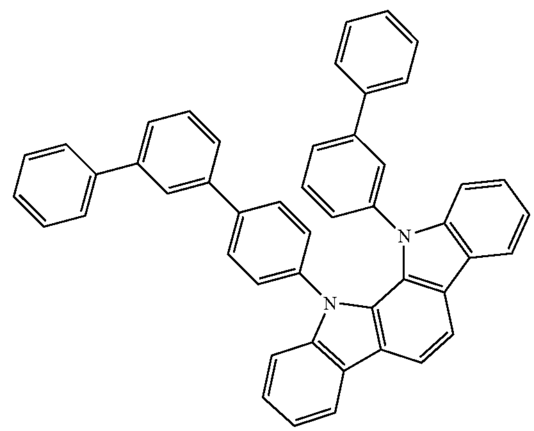
[C 11]
1-46
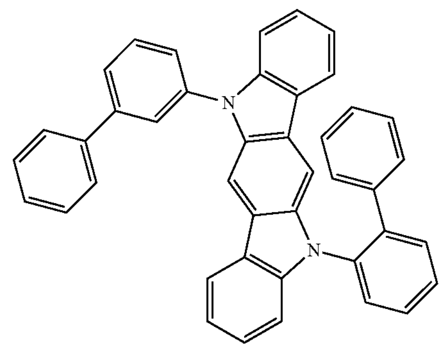

1-47
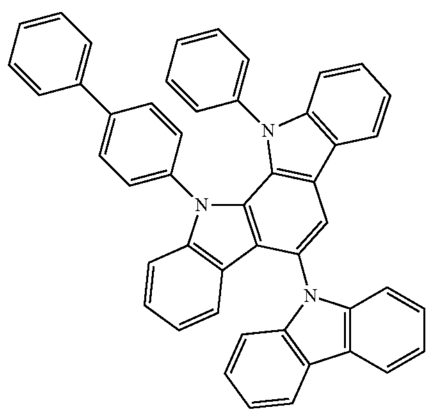
1-48
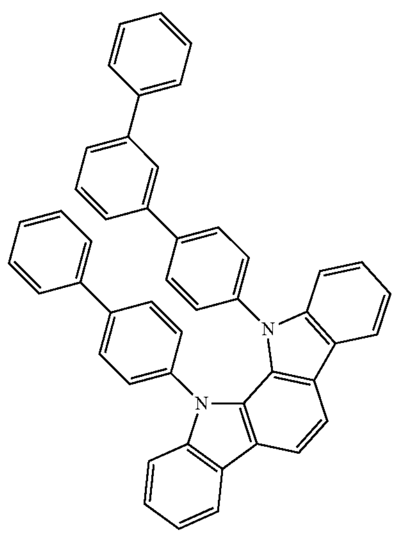
1-49
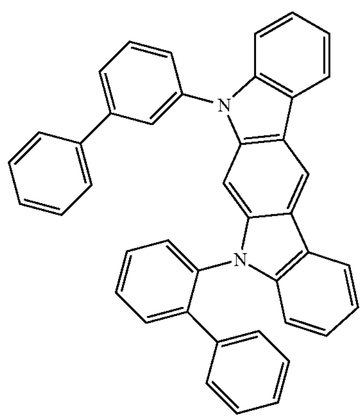
1-50
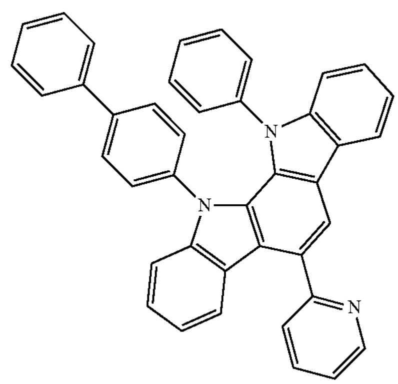
1-51
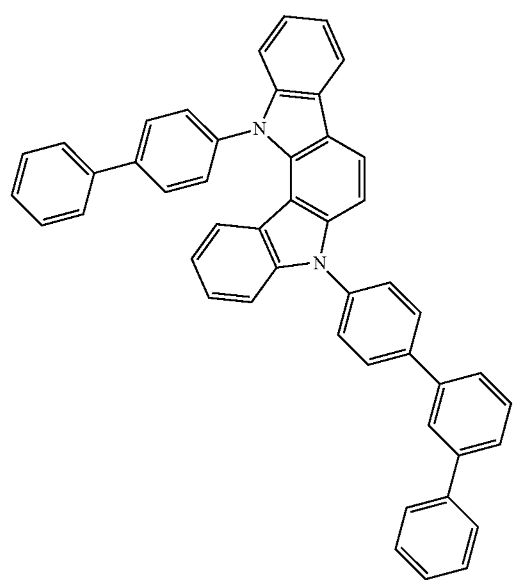
1-52
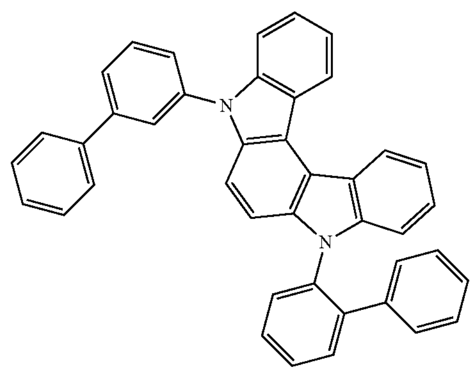

1-53
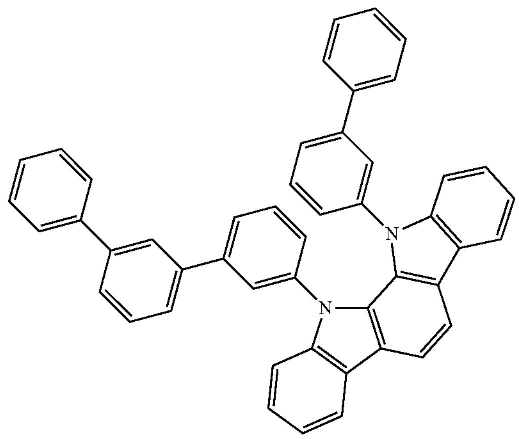
1-54
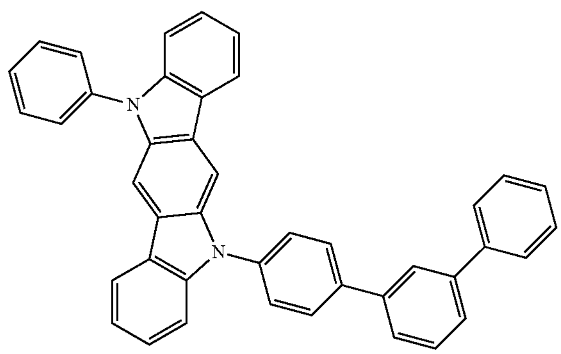
1-55
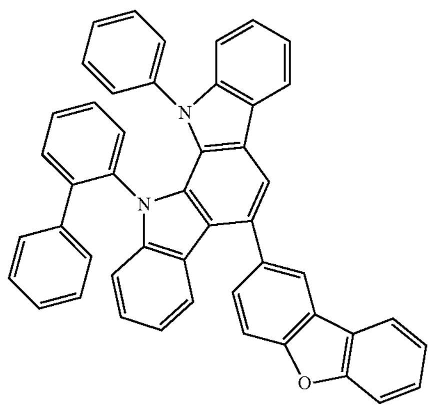
1-56
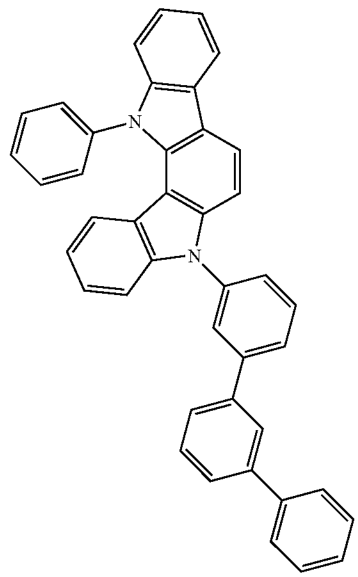
1-57
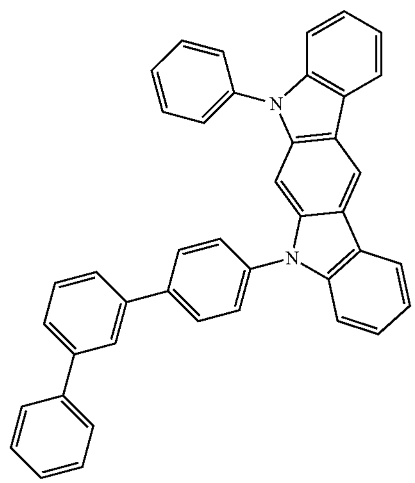
1-58
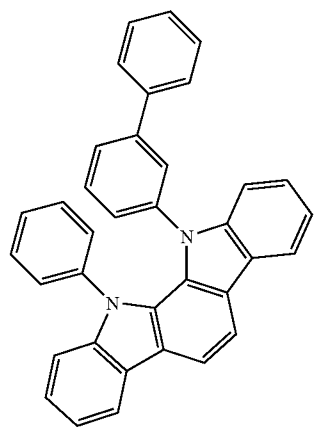

-continued
1-59
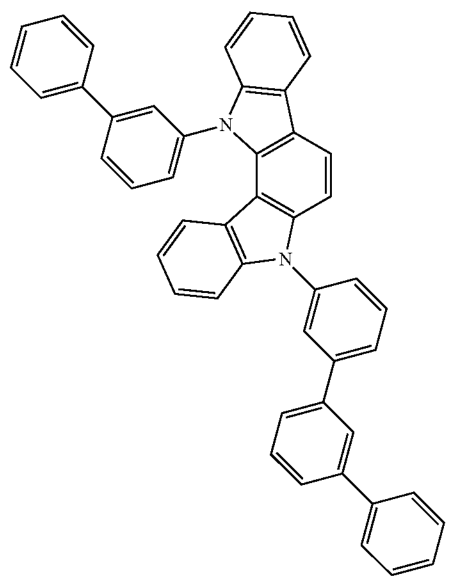
1-60
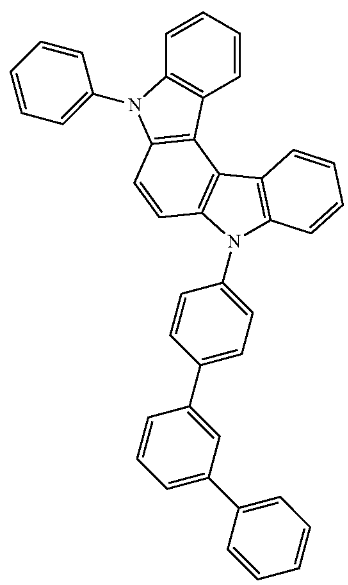
[C 12]
1-61
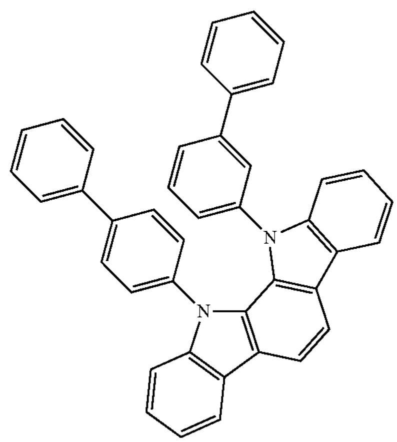
-continued
1-62
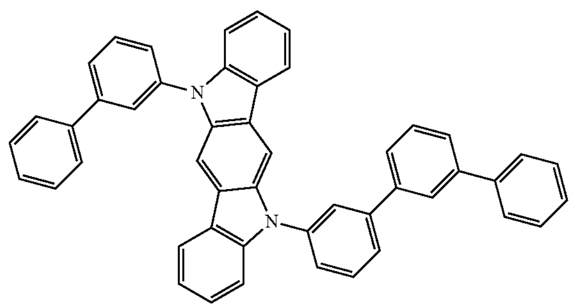
1-63
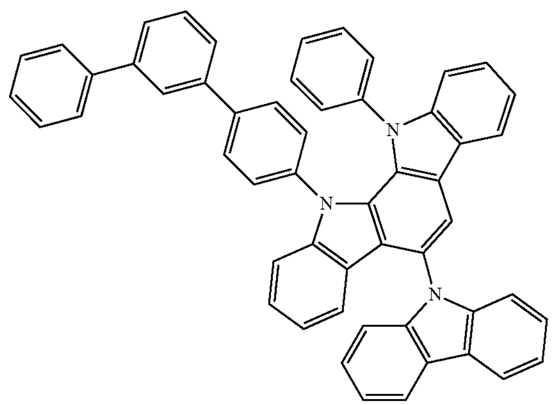
1-64
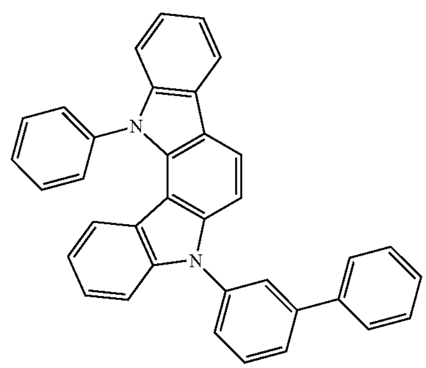
1-65
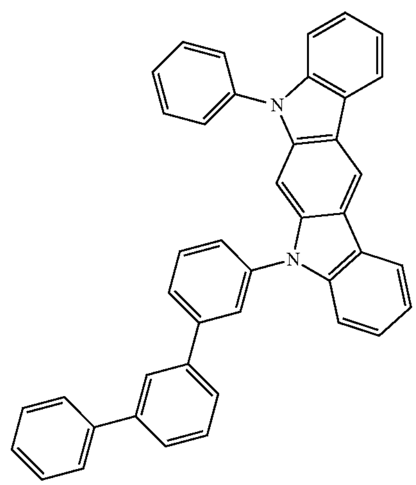

-continued
1-66
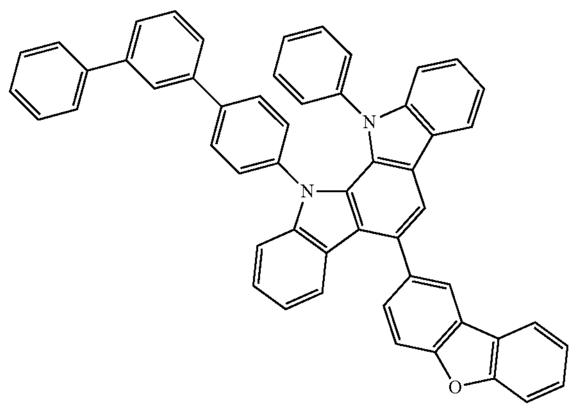
1-67
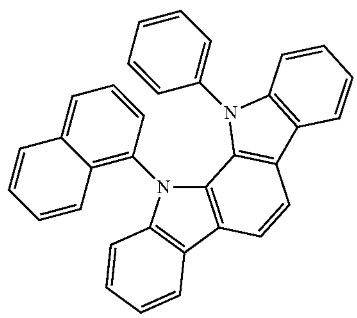
1-68
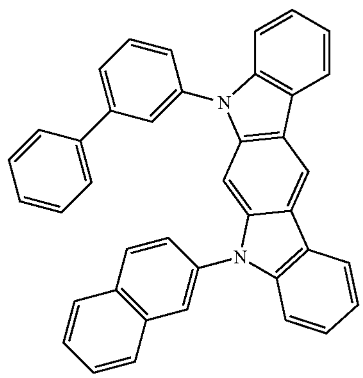
1-69
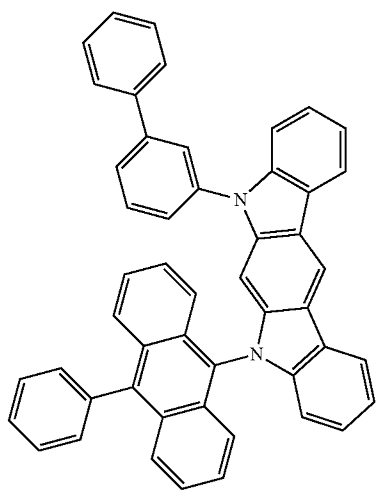
-continued
1-70
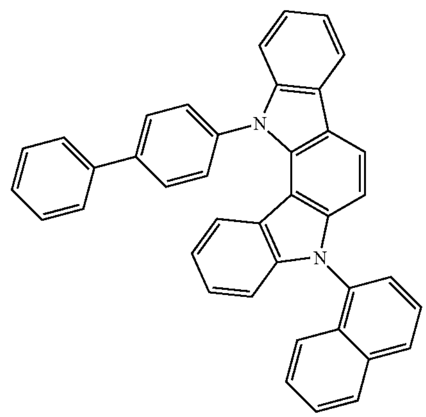
1-71
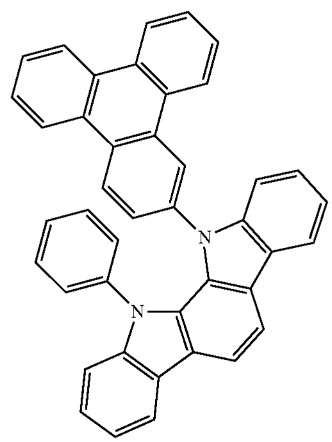
1-72
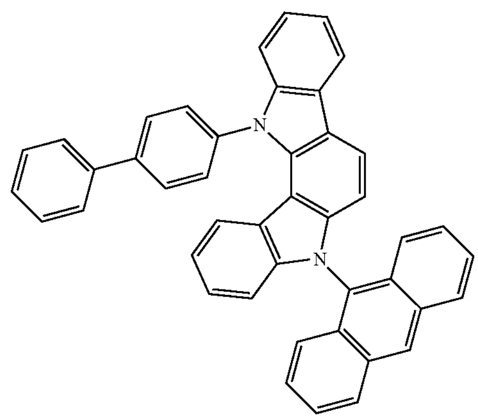
1-73
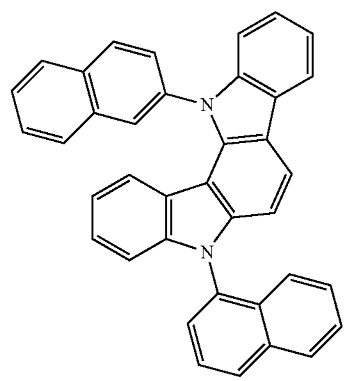

-continued
1-74
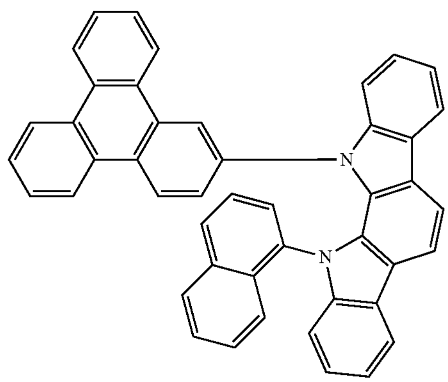
1-75
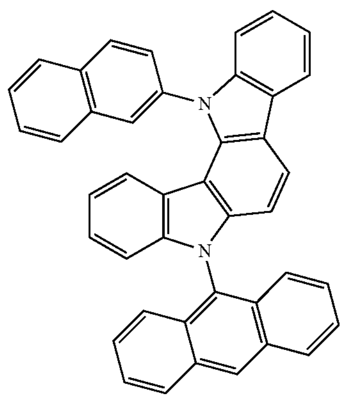
[C 13]
1-76
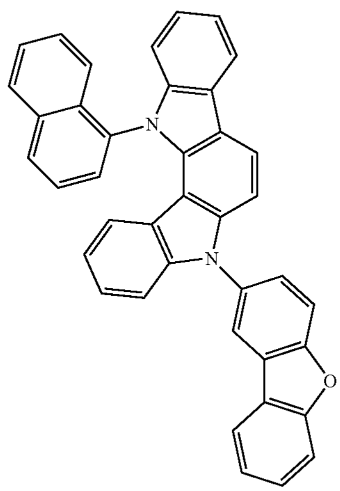
-continued
1-77
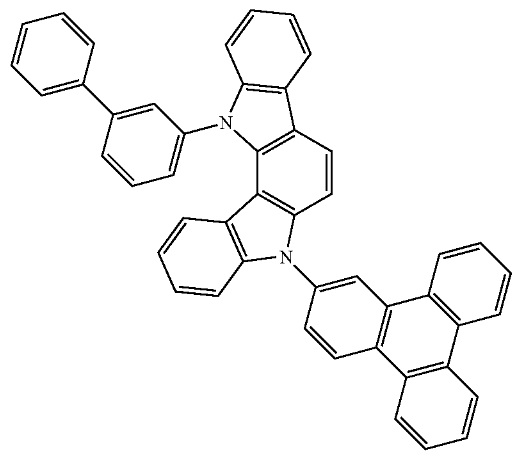
1-78
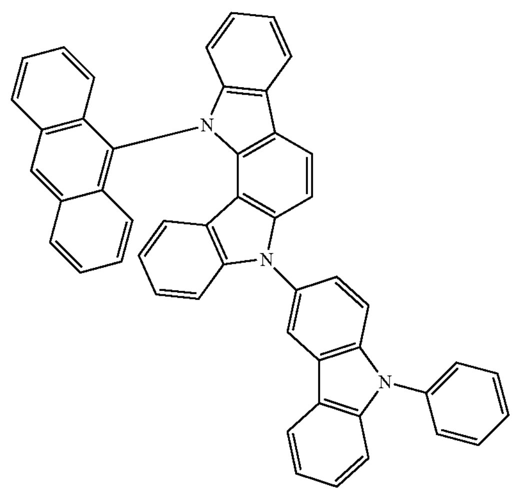
1-79
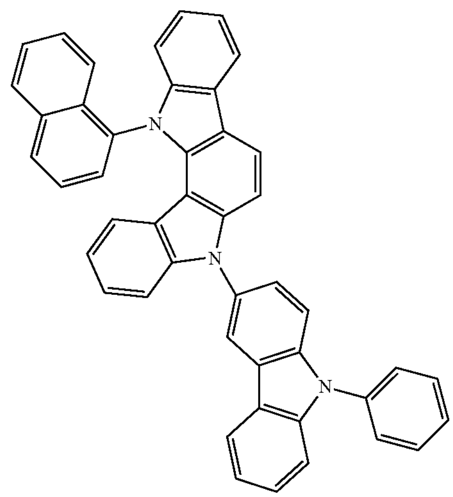

-continued
1-80
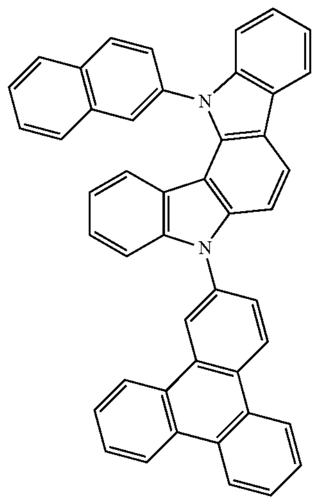
1-81
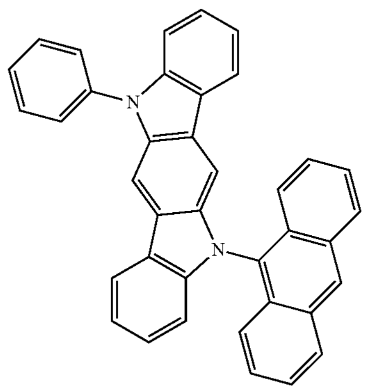
1-82
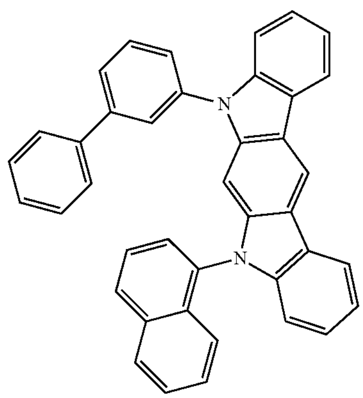
-continued
1-83
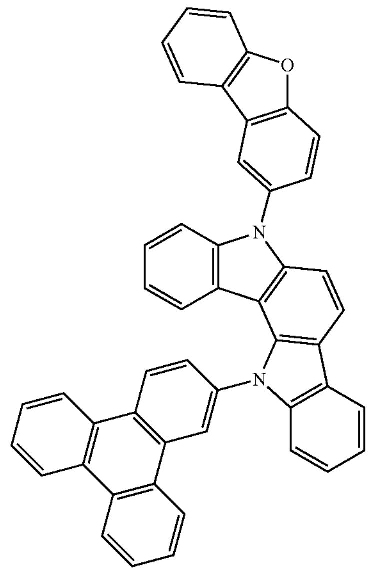
1-84
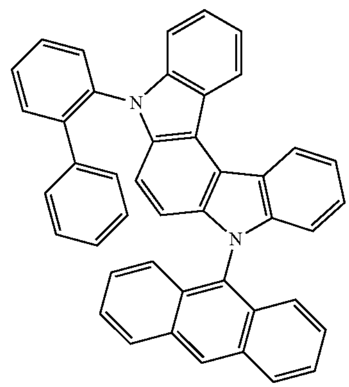
1-85
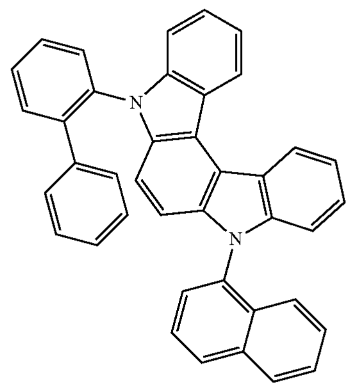

-continued
1-86
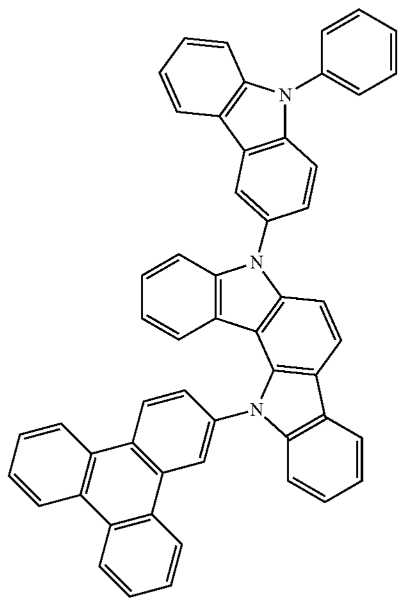
1-87
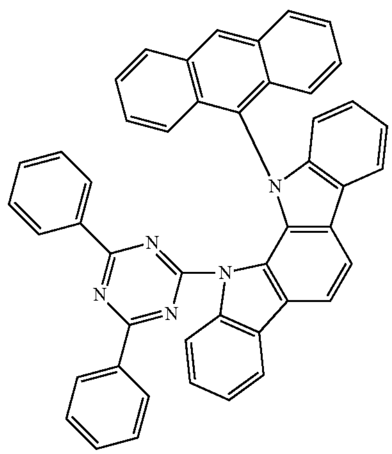
1-88
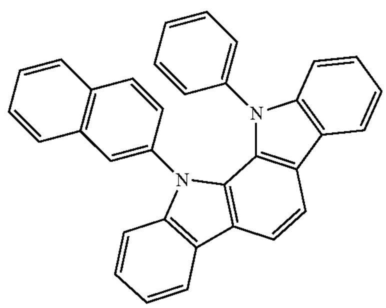
-continued
1-89
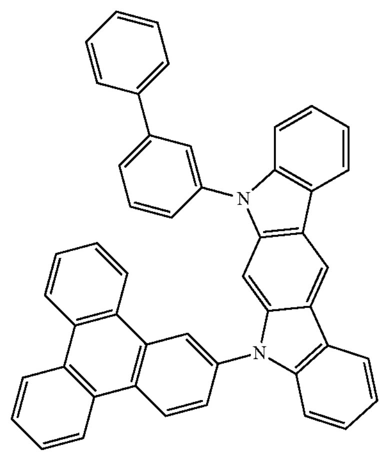
1-90
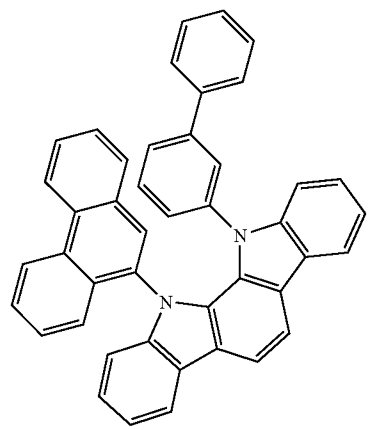
[C 14]
1-91
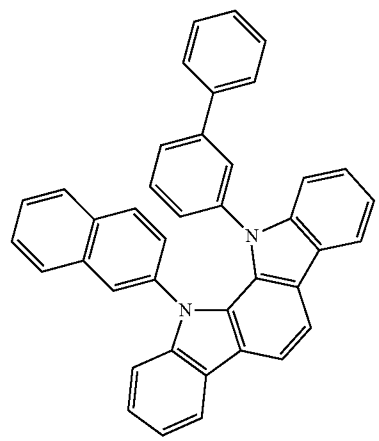

-continued
1-92
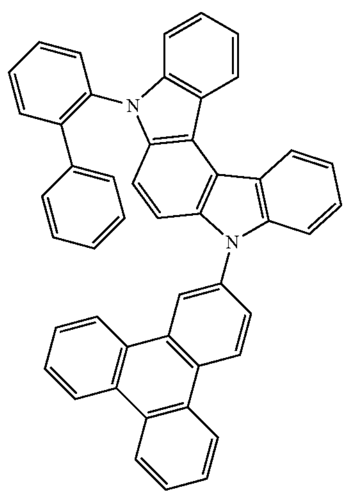
1-93
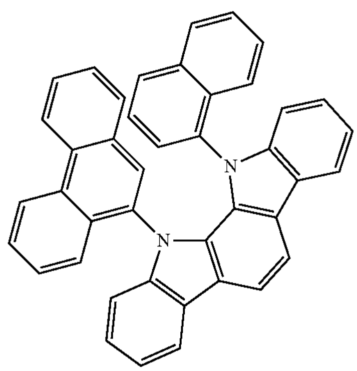
1-94
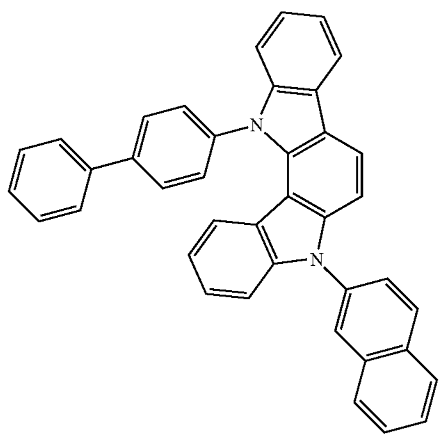
-continued
1-95
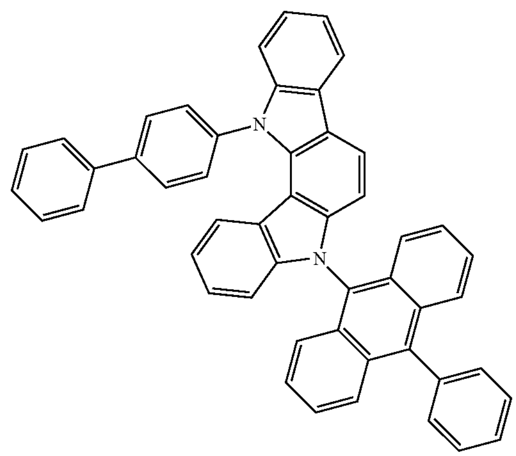
1-96
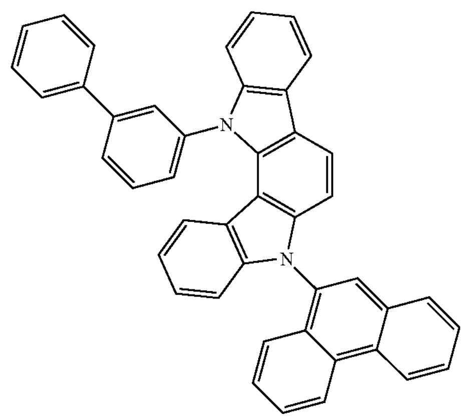
1-97
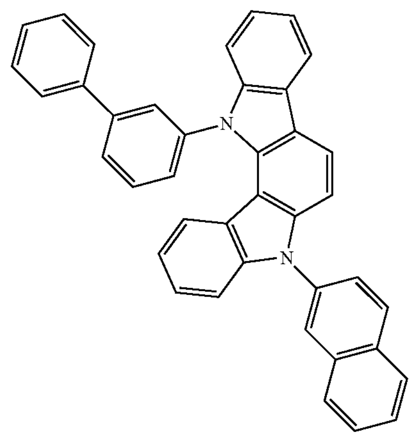

-continued
1-98
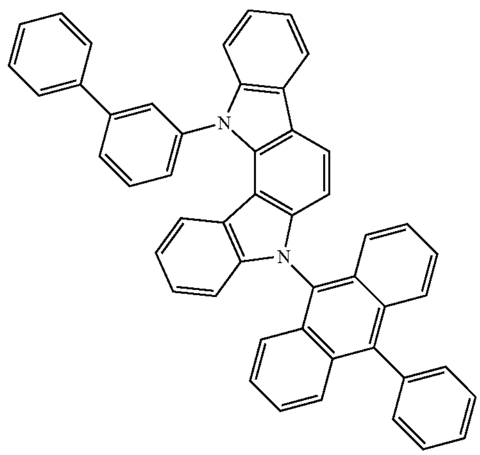
1-99
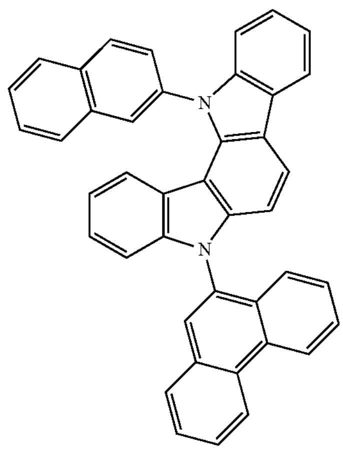
1-100
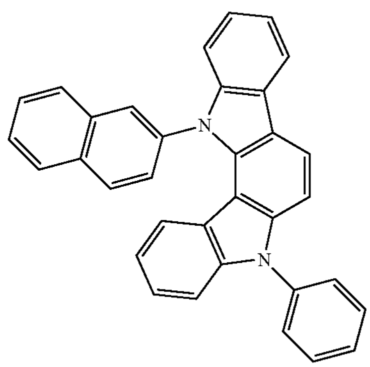
1-101
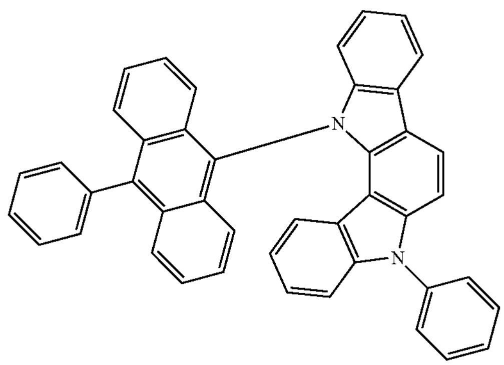
-continued
1-102
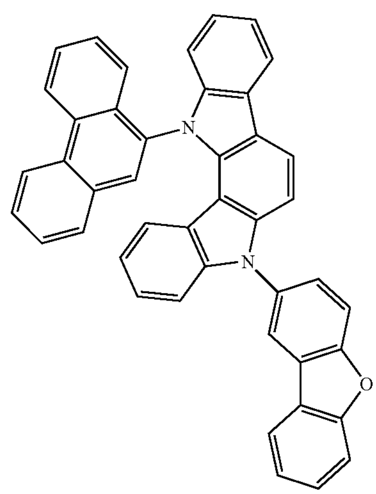
1-103
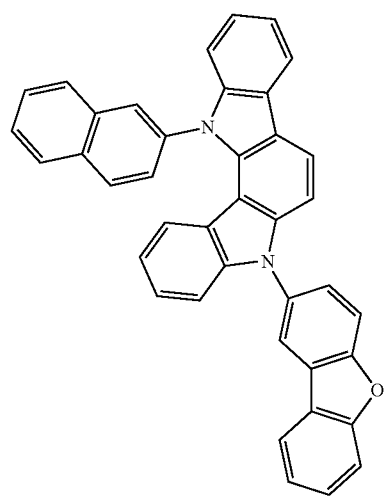
1-104
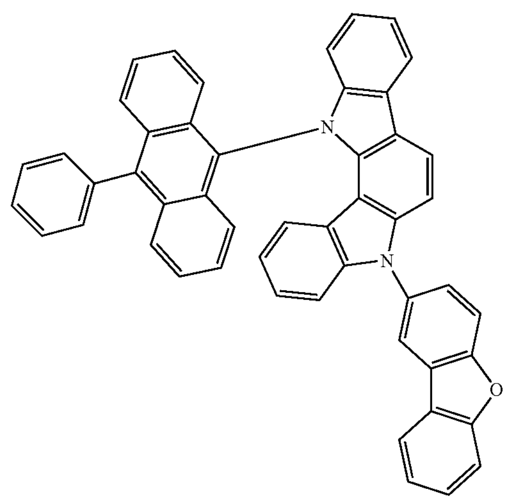

-continued
1-105
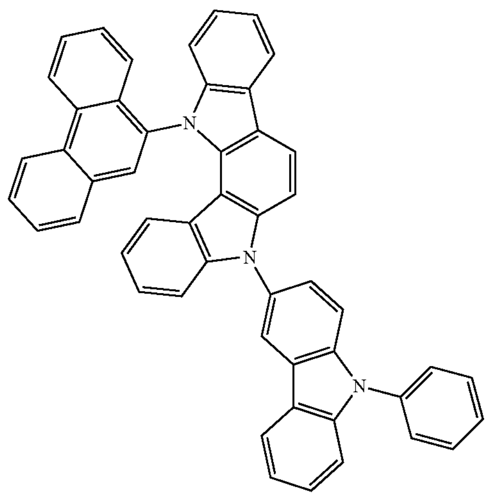
[C 15]
1-106
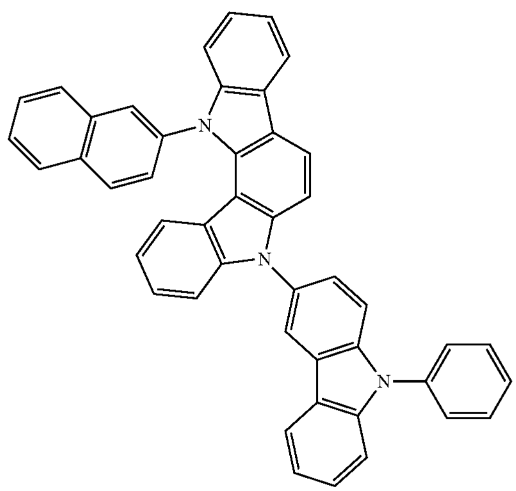
1-107
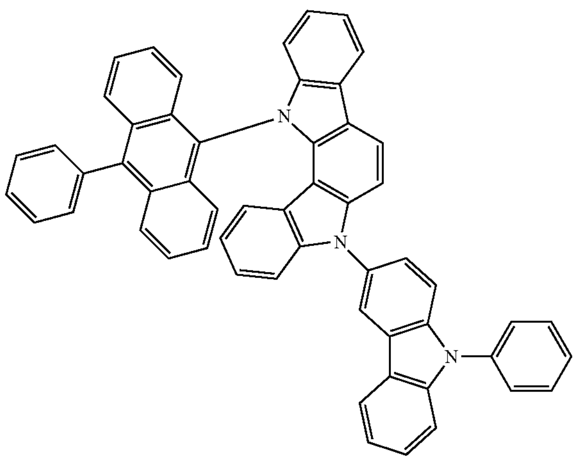
-continued
1-108
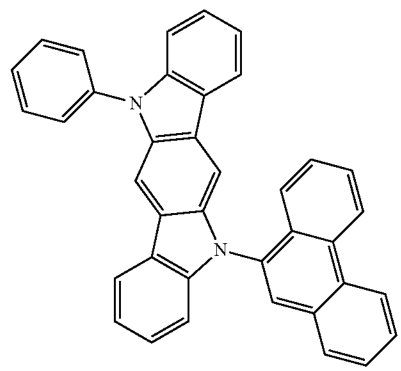
1-109
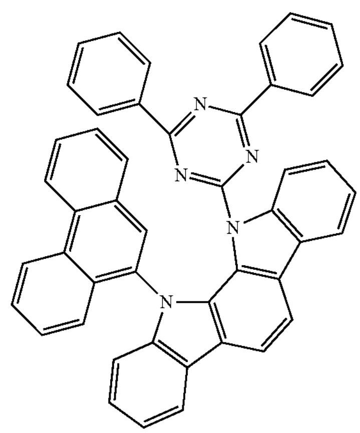
1-110
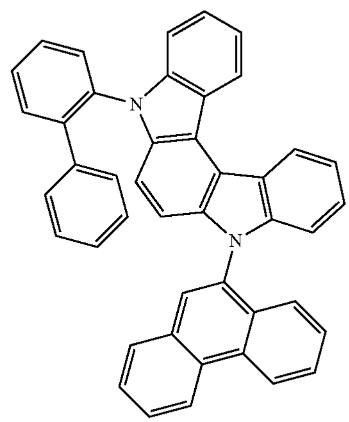
1-111
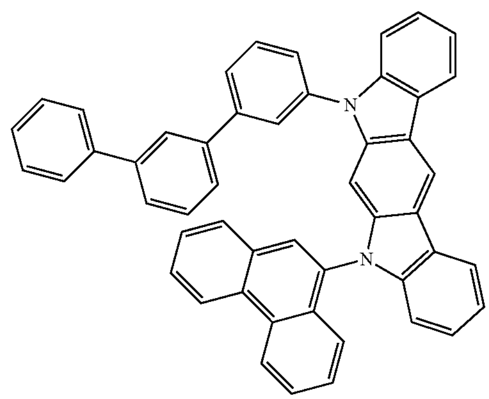

-continued
1-112
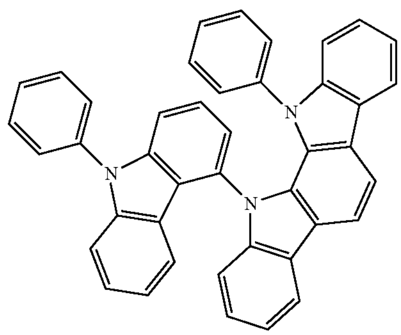
1-113
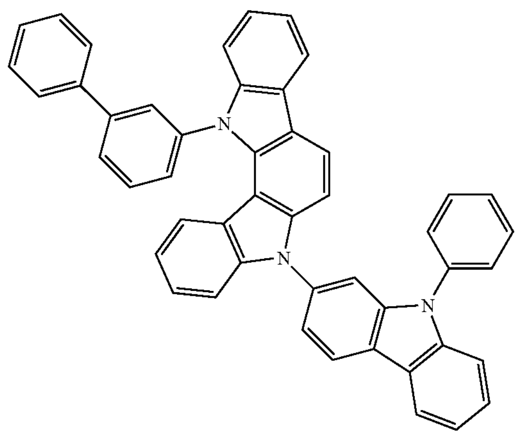
1-114
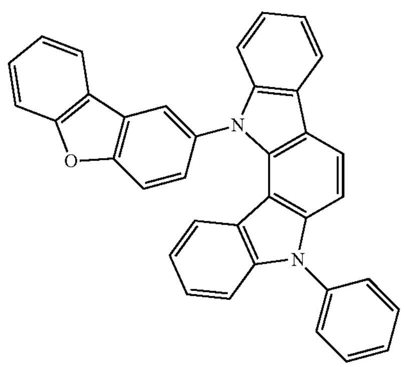
-continued
1-115
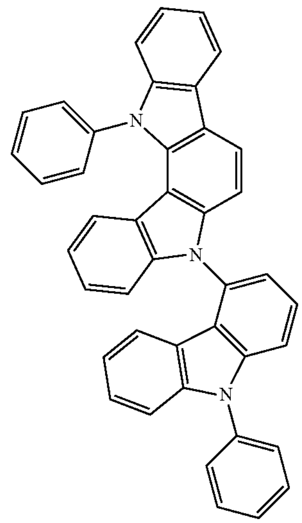
1-116
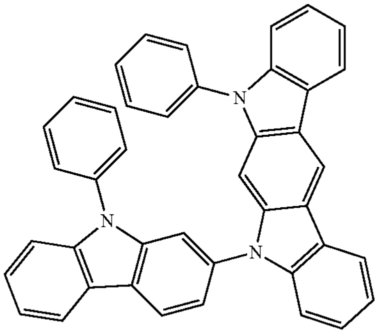
1-117
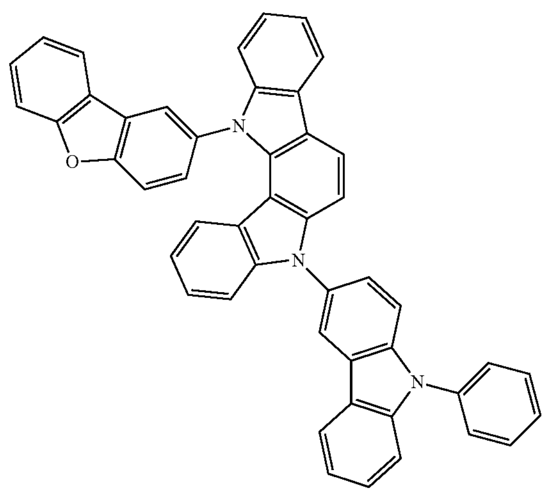

1-118
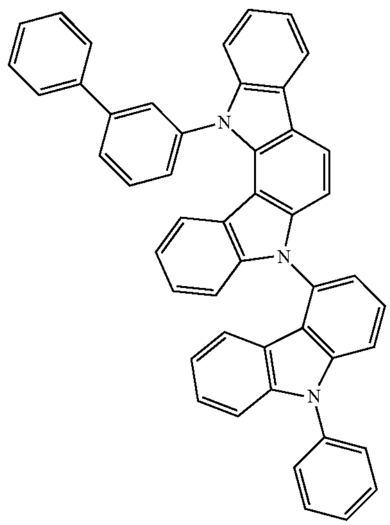
1-119
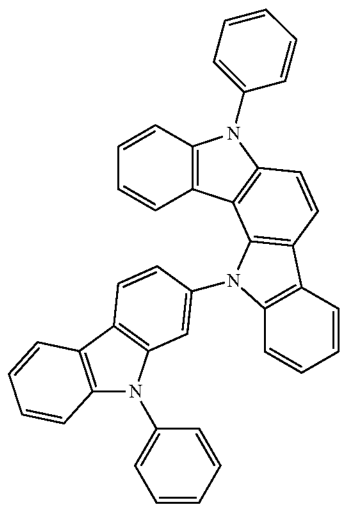
1-120
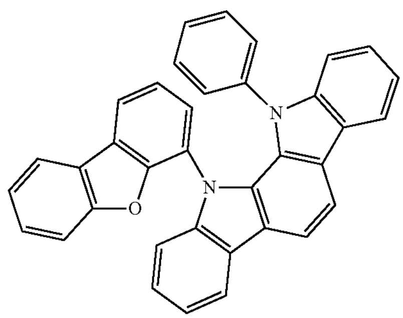
[C 16]
1-121
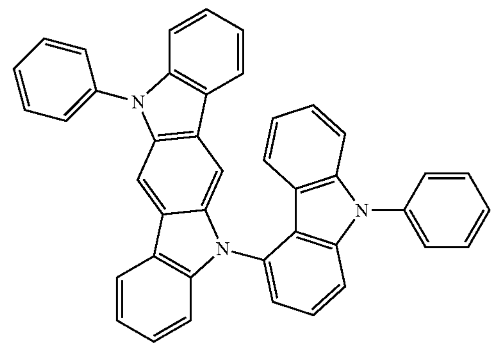
1-122
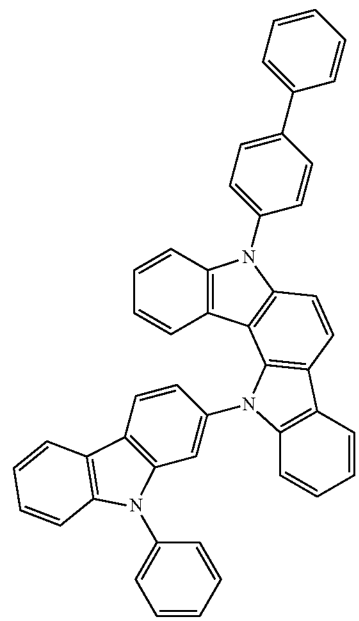
1-123
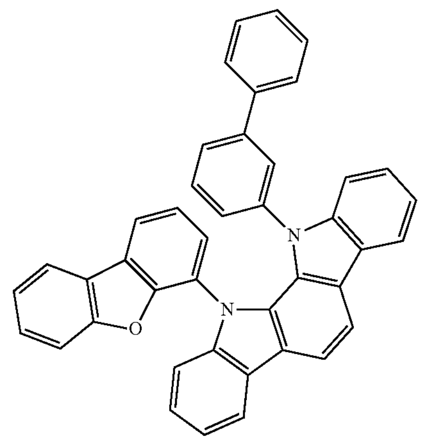

-continued
1-124
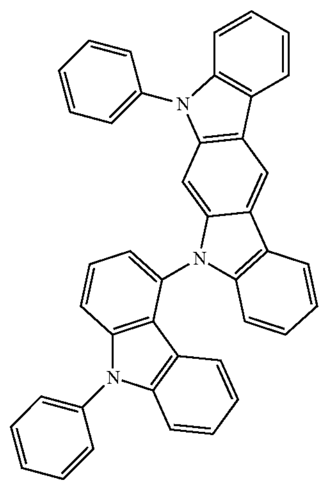
1-125
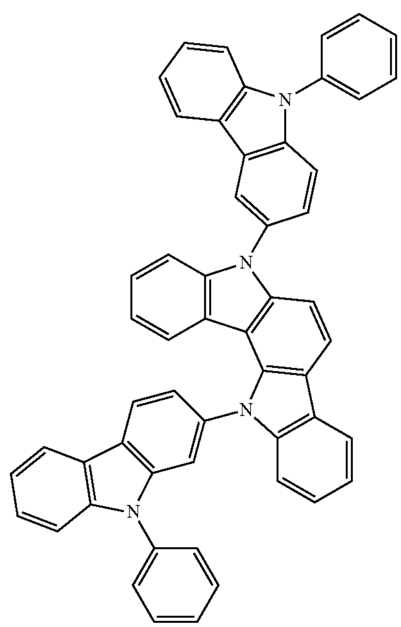
1-126
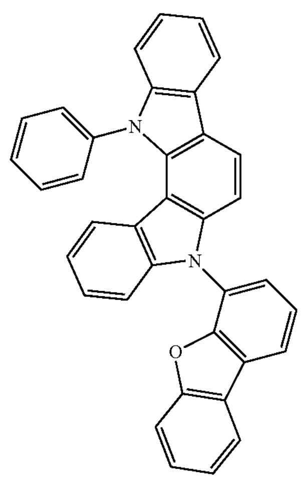
-continued
1-127
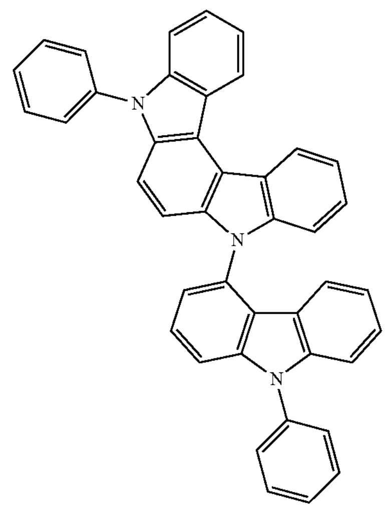
1-128
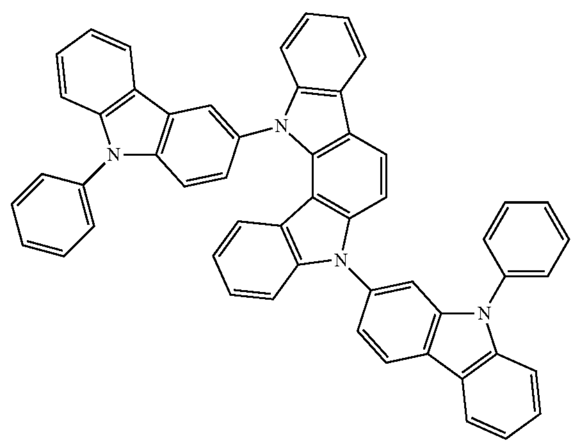
1-129
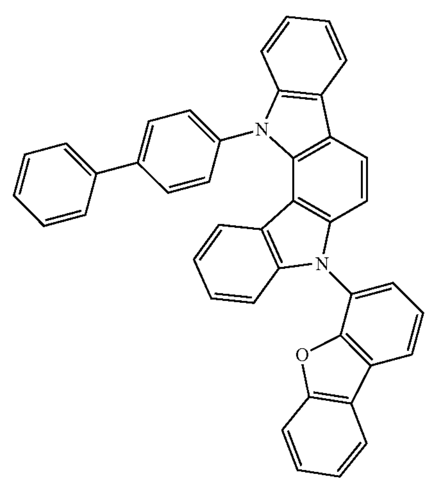

-continued
1-130
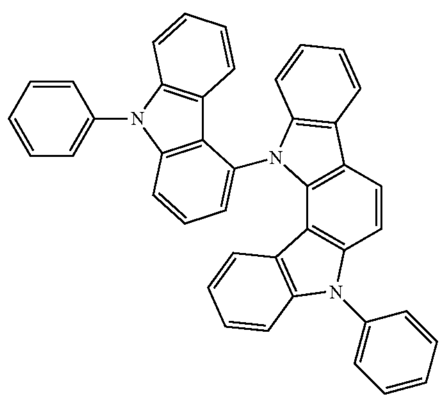
1-131
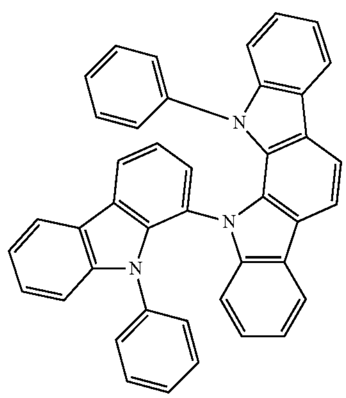
1-132
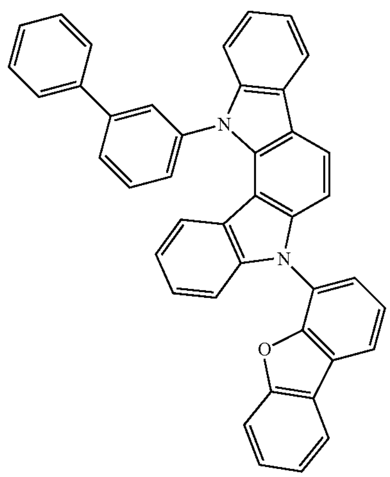
-continued
1-133
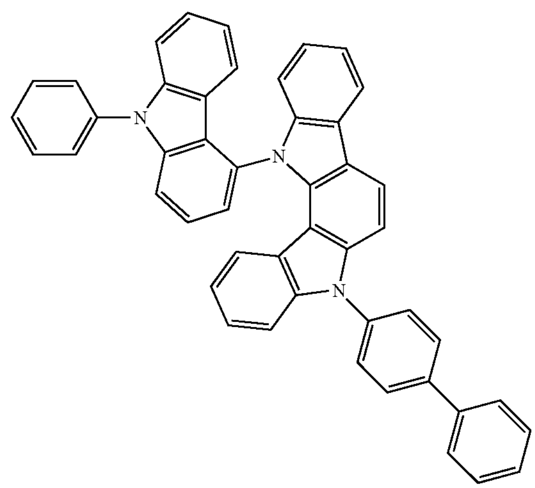
1-134
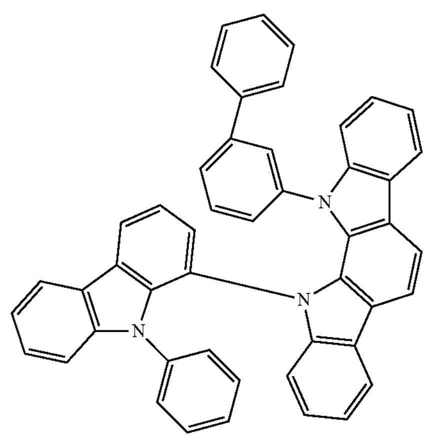
1-135
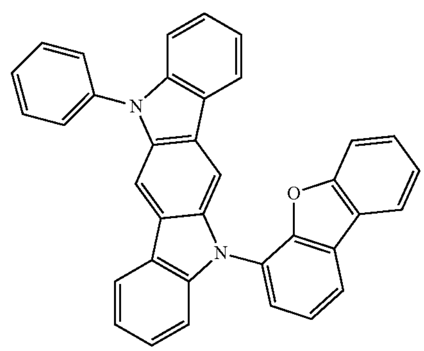

-continued
[C 17]
1-136
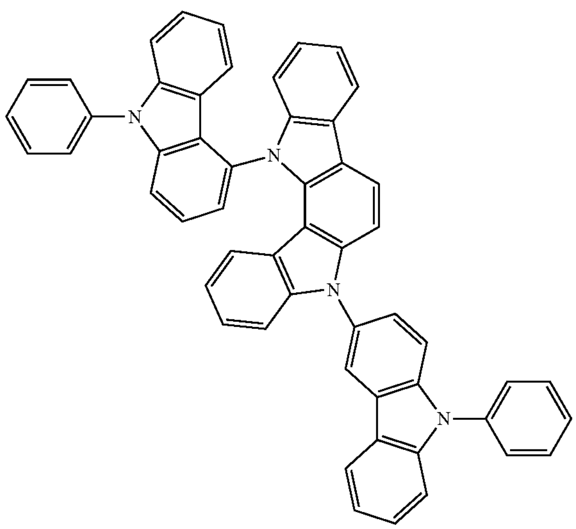
1-137
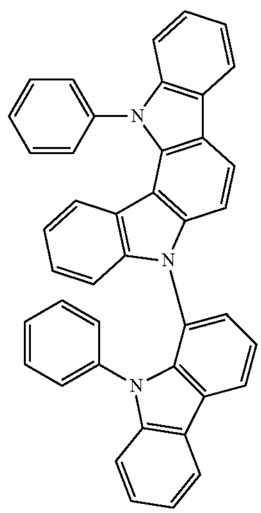
1-138
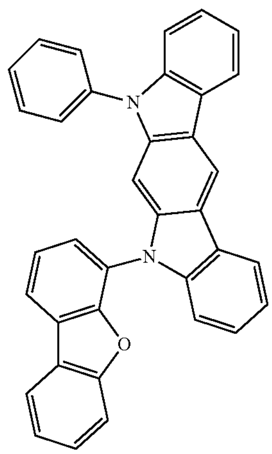
-continued
1-139
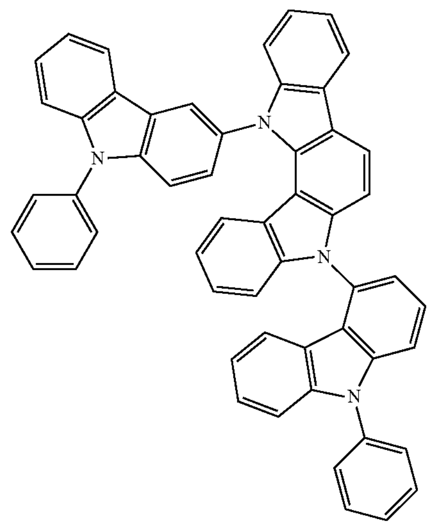
1-140
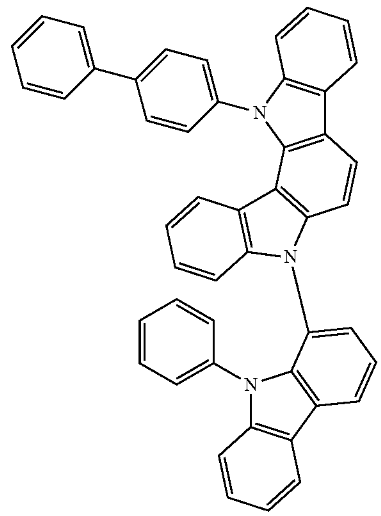
1-141
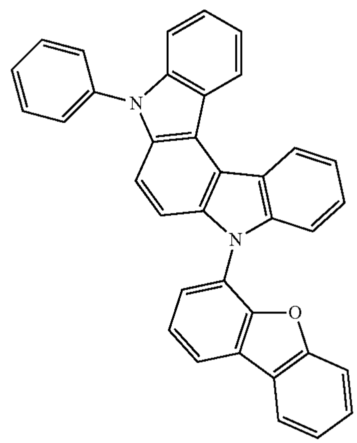

-continued
1-142
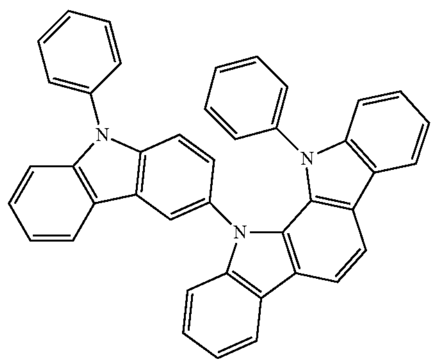
1-143
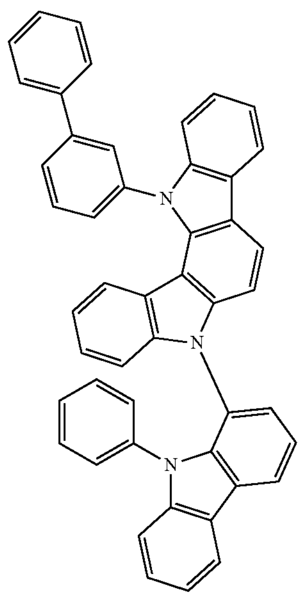
1-144
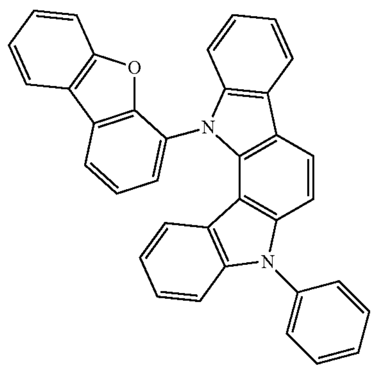
-continued
1-145
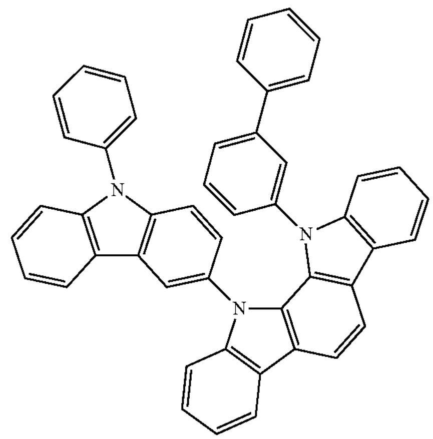
1-146
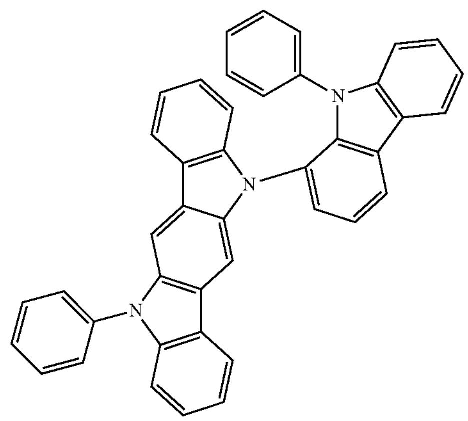
1-147
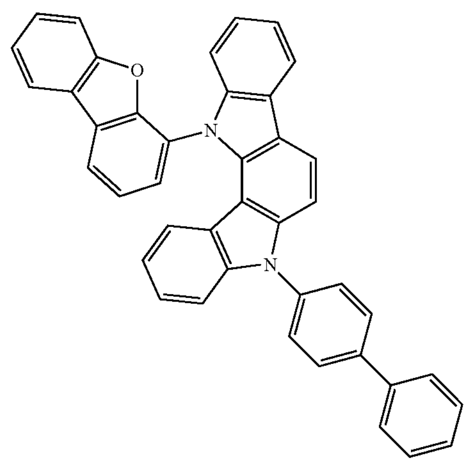

-continued
1-148
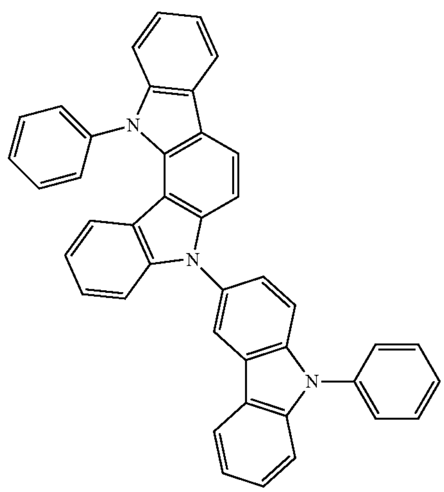
1-149
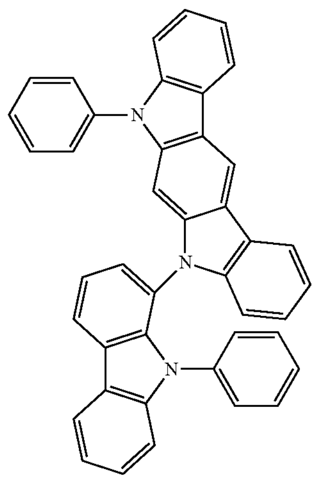
1-150
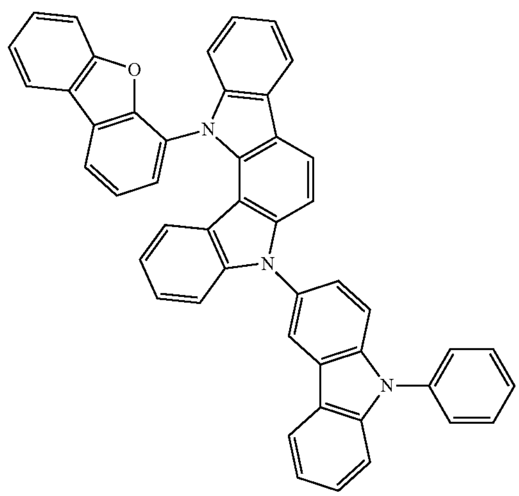
-continued
[C 18]
1-151
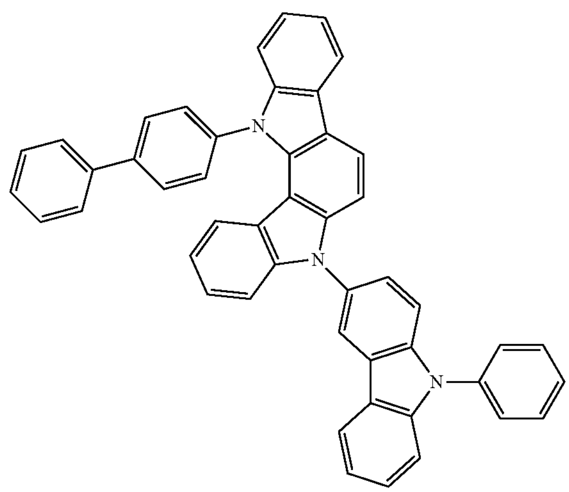
1-152
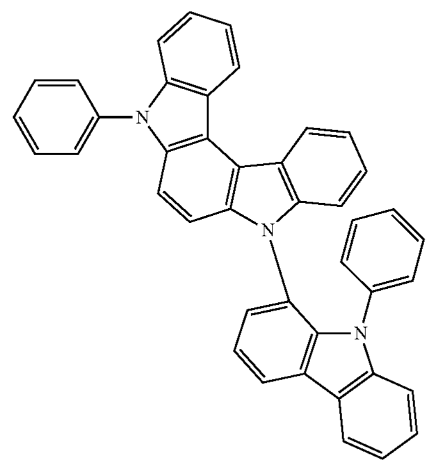
1-153
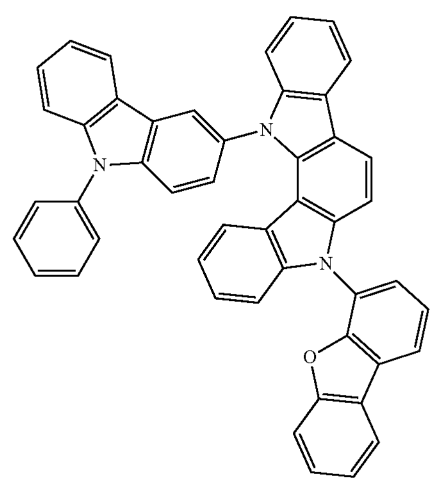

-continued
1-154
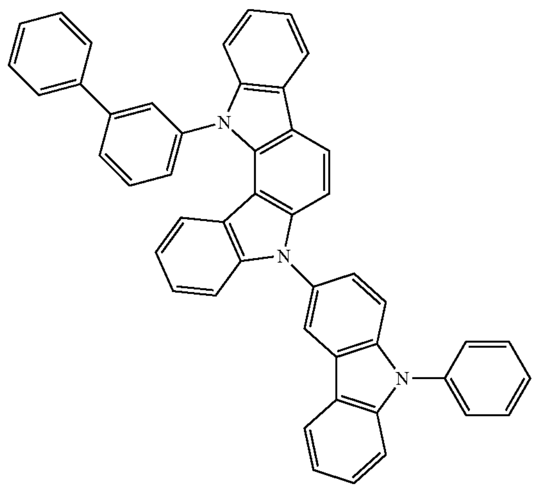
1-155
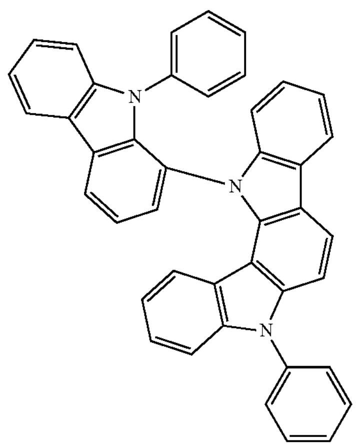
1-156
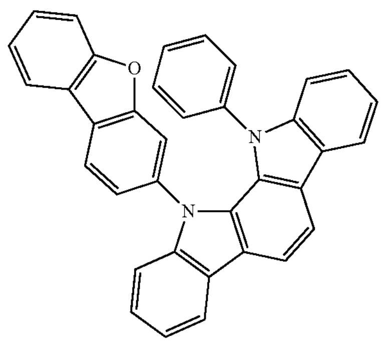
-continued
1-157
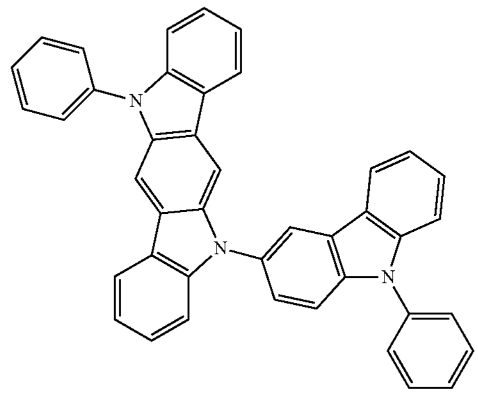
1-158
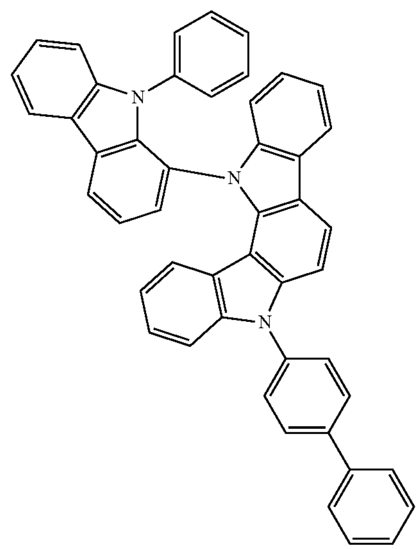
1-159
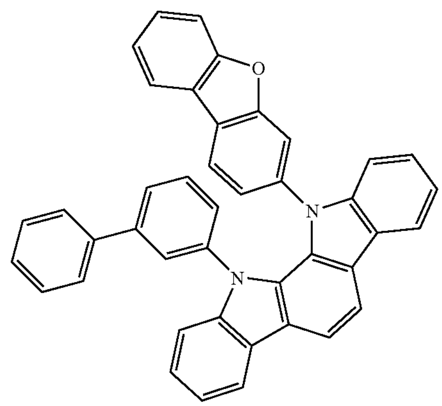

-continued
1-160
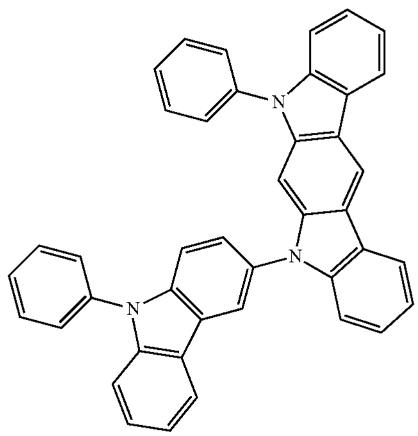
1-161
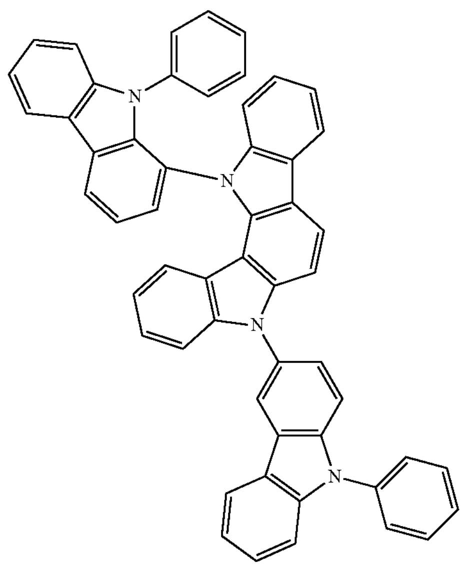
1-162
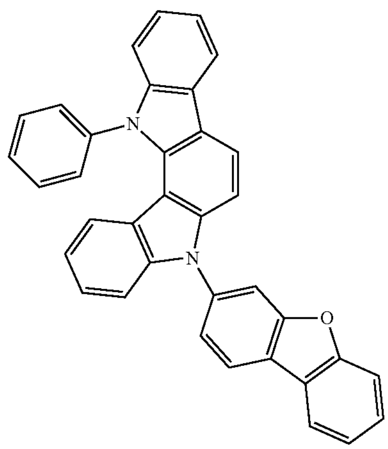
-continued
1-163
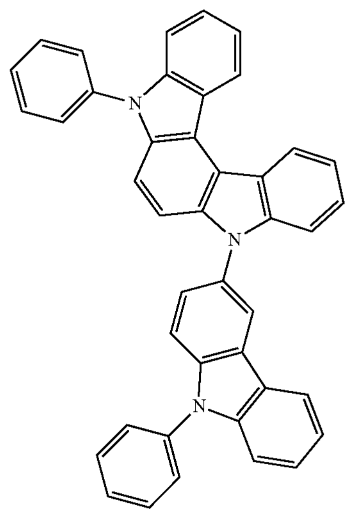
1-164
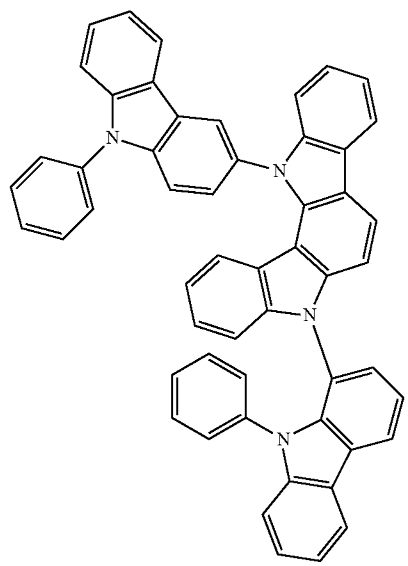
1-165
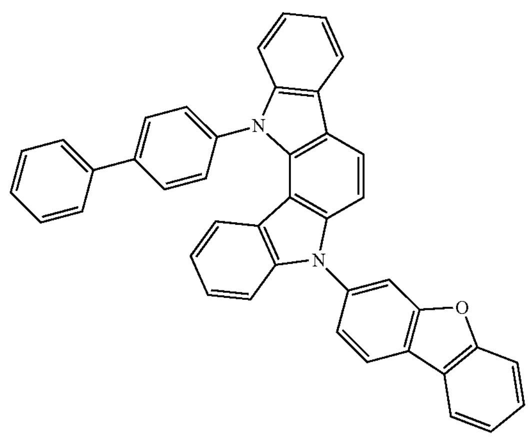

-continued
[C 19]
1-166
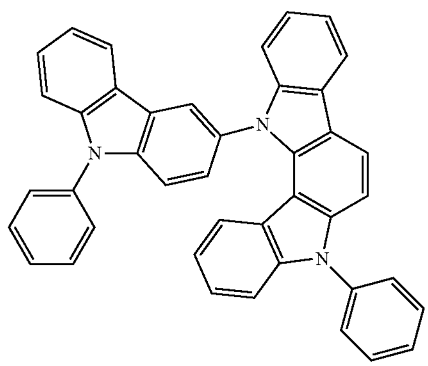
1-167
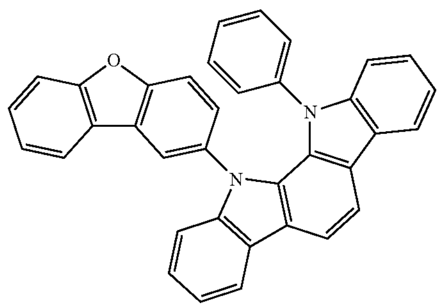
1-168
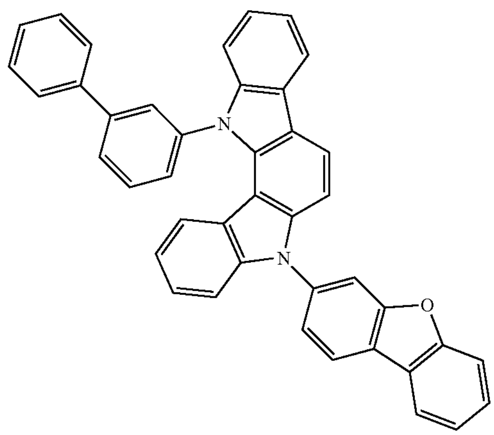
1-169
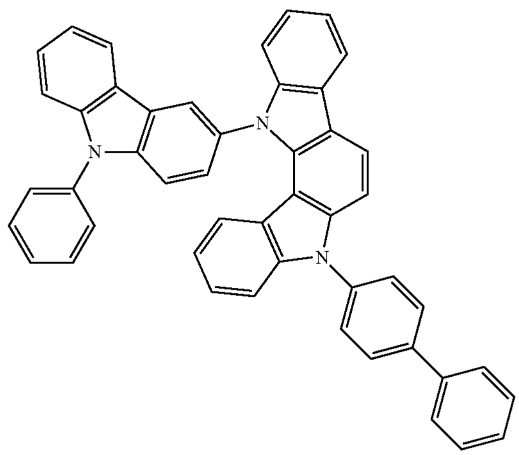
-continued
1-170
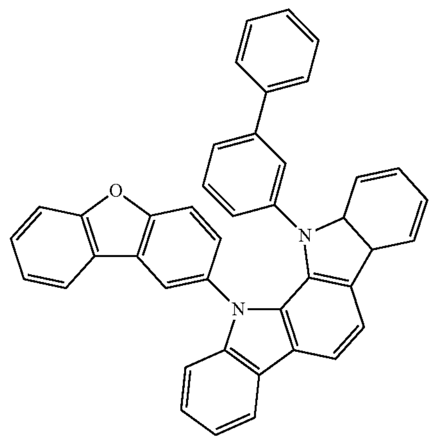
1-171
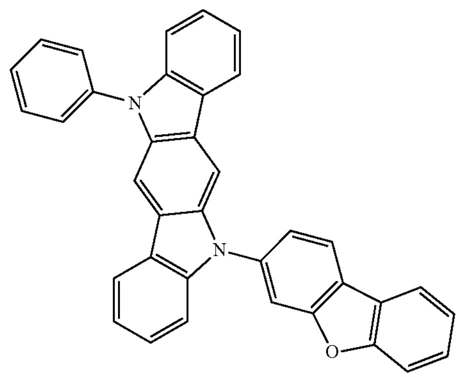
1-172
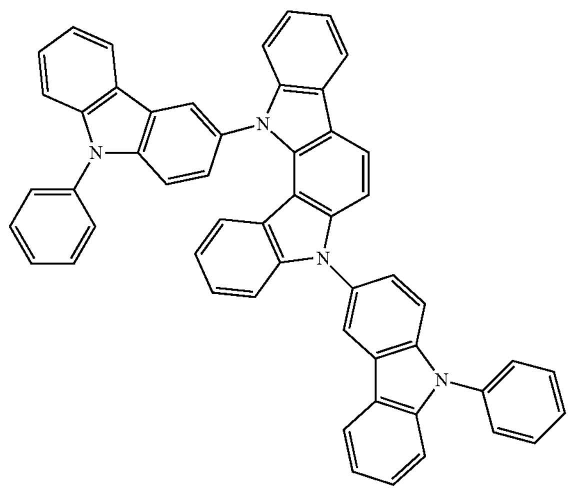

-continued
1-173
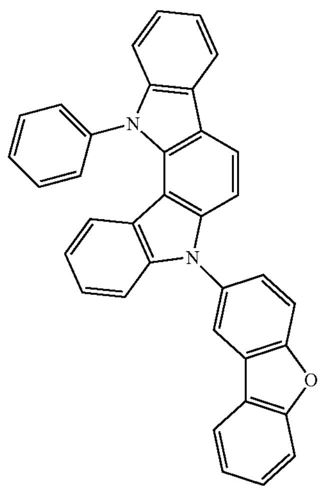
1-174
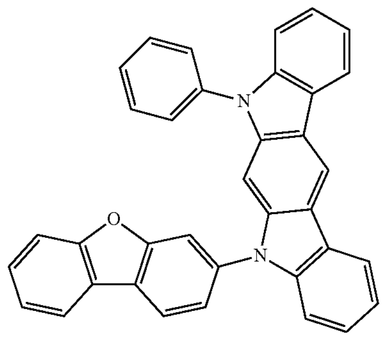
1-175
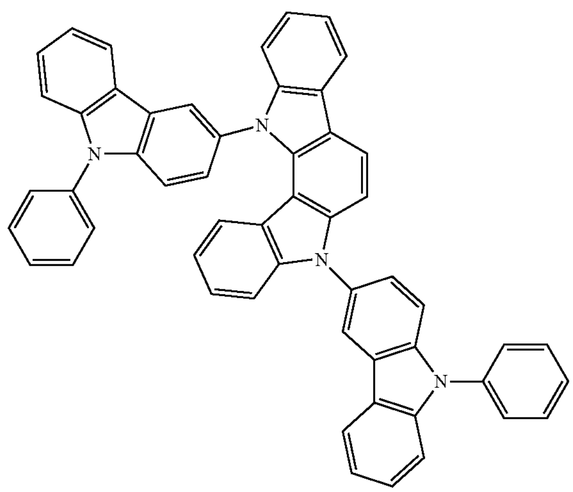
-continued
1-176
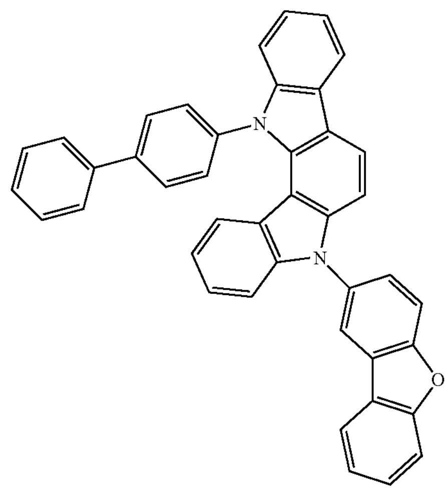
1-177
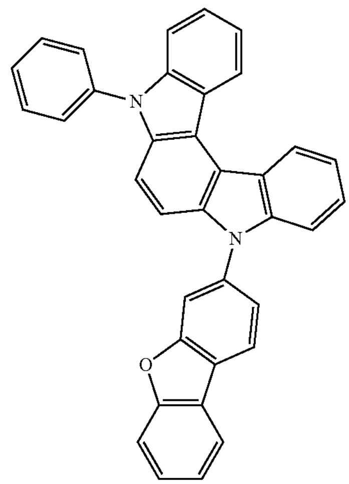
1-178
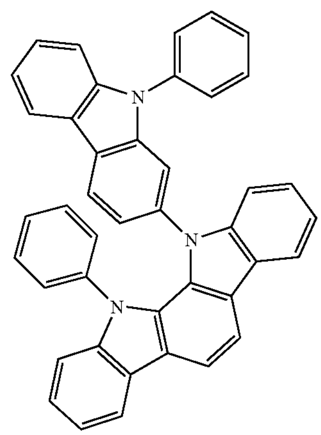

-continued
1-179
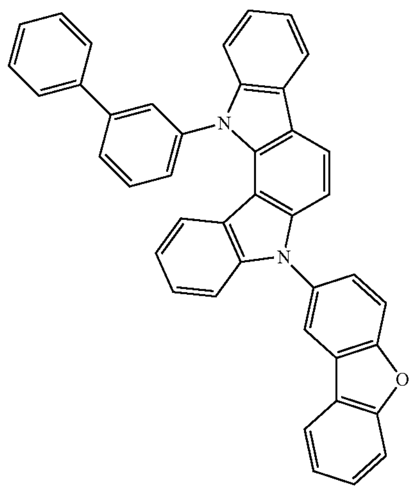
1-180
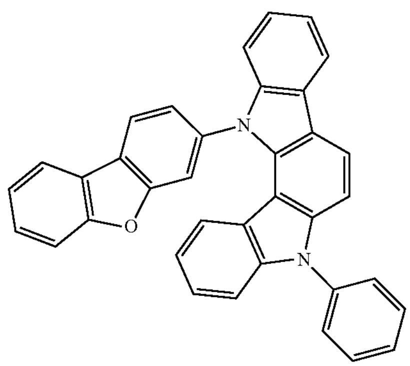
[C 20]
1-181
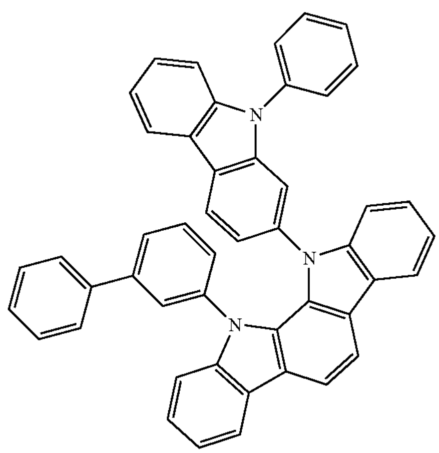
-continued
1-182
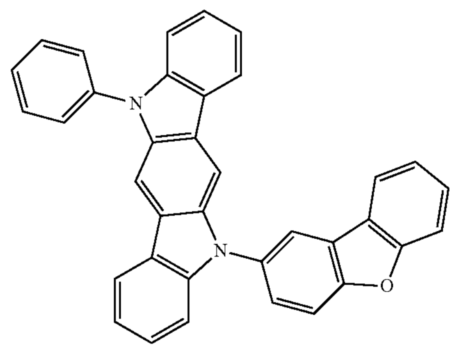
1-183
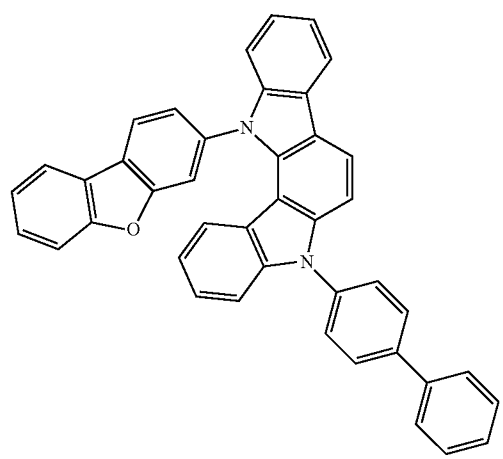
1-184
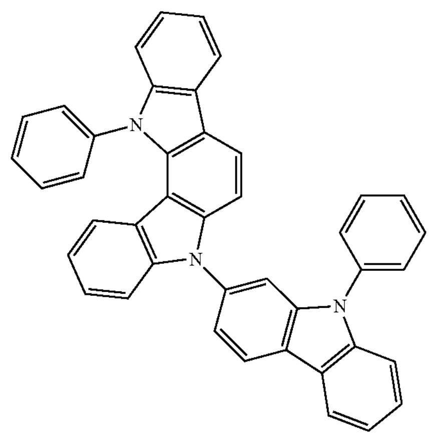

-continued
1-185
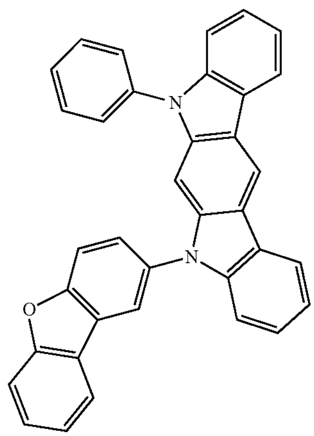
1-186
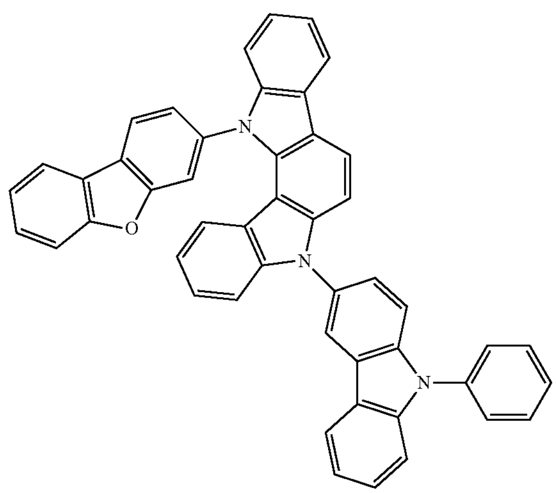
1-187
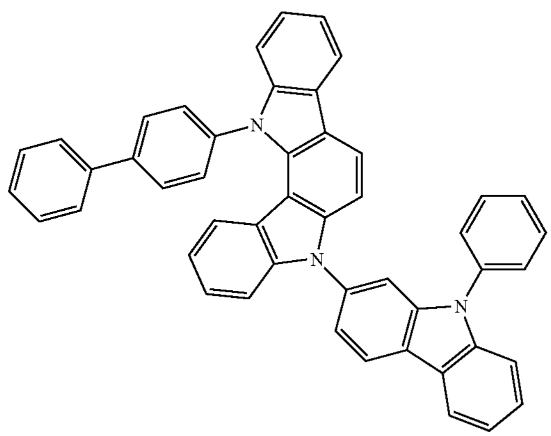
-continued
1-188
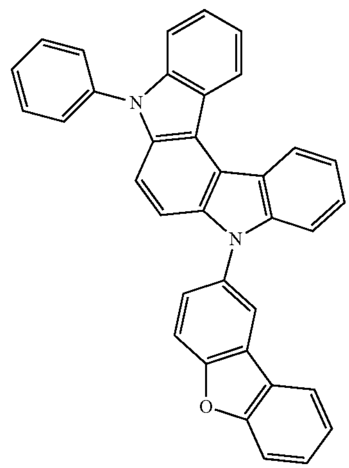
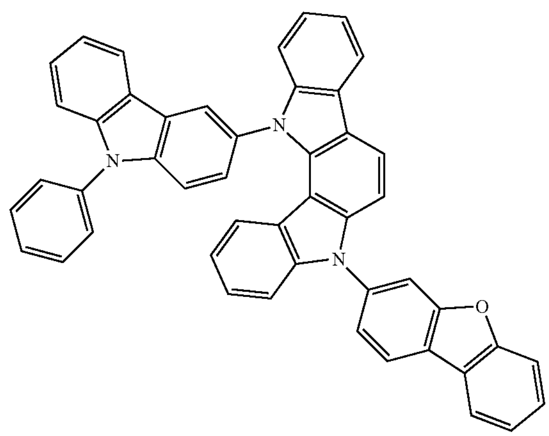
1-190
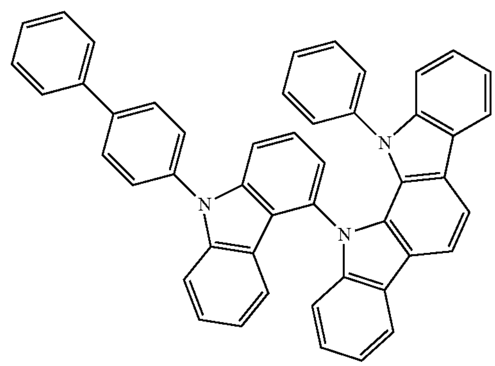

-continued
1-191
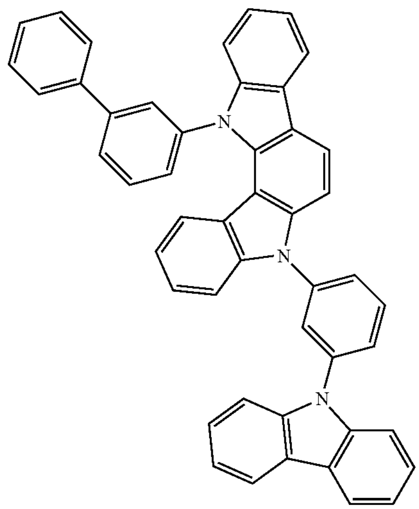
1-192
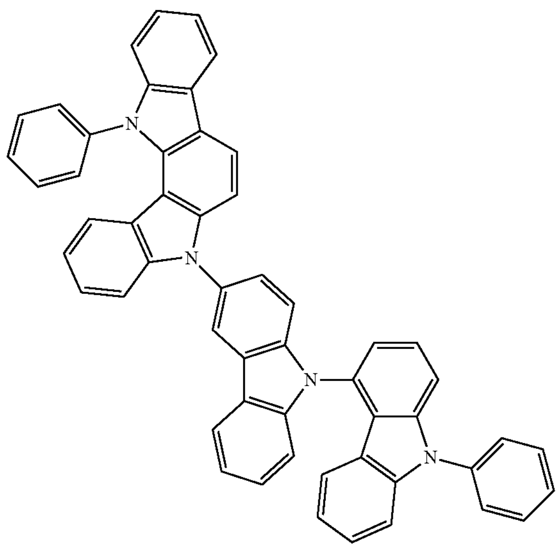
-continued
1-193
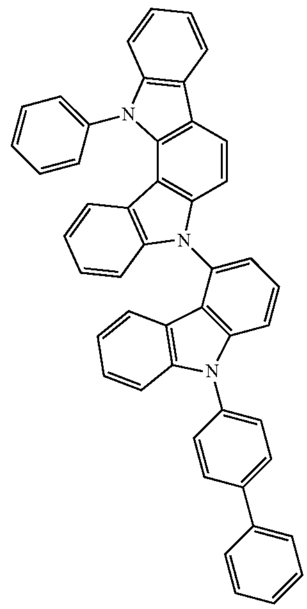
1-194
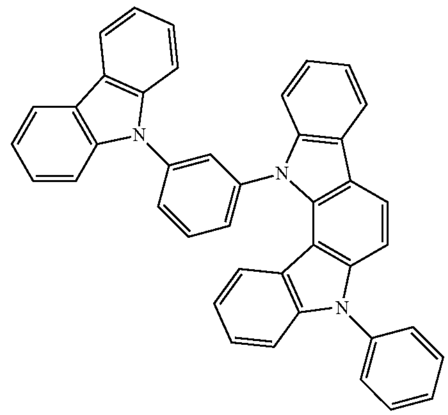
1-195
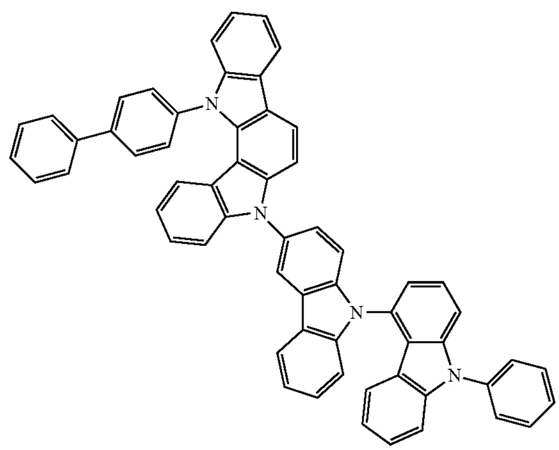

-continued
[C 21]
1-196
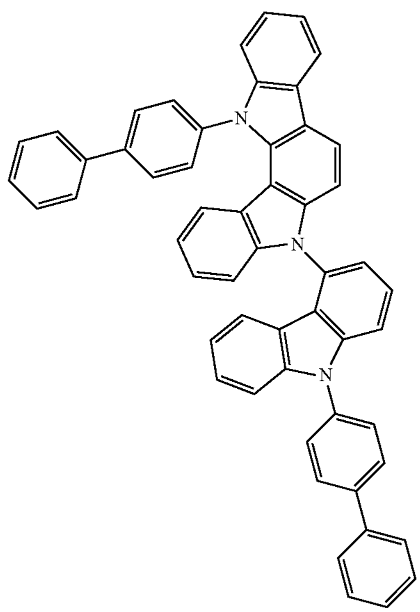
1-197
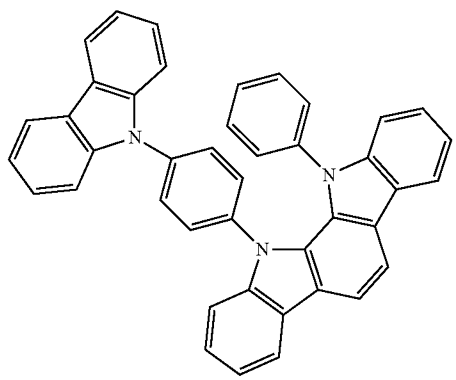
1-198
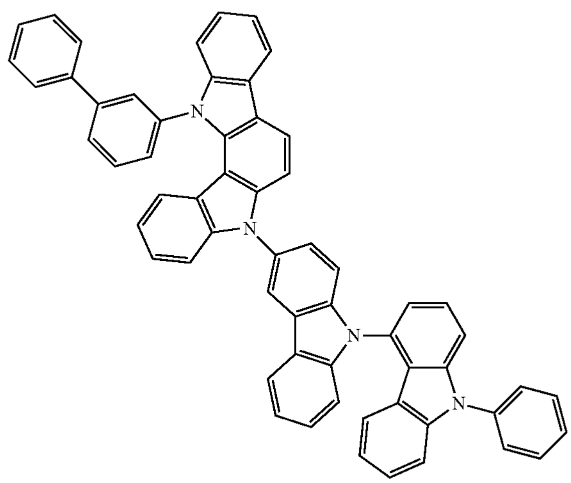
-continued
1-199
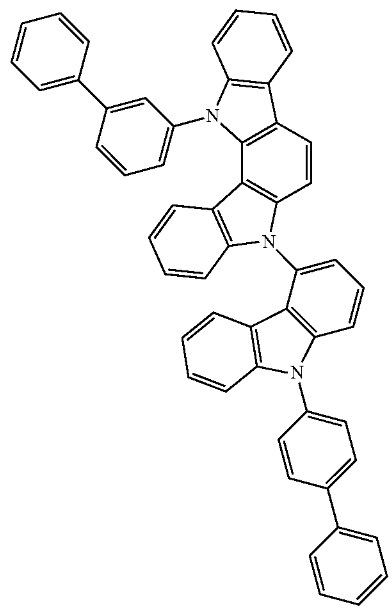
1-200
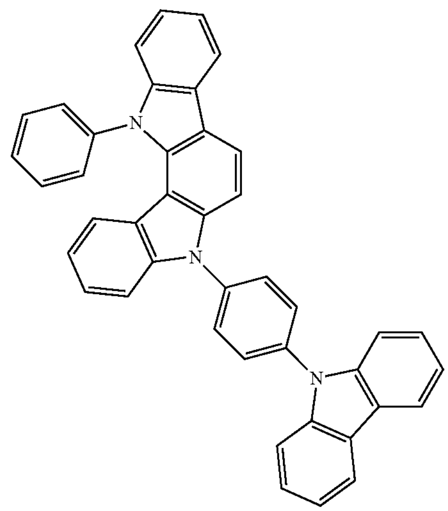
1-201
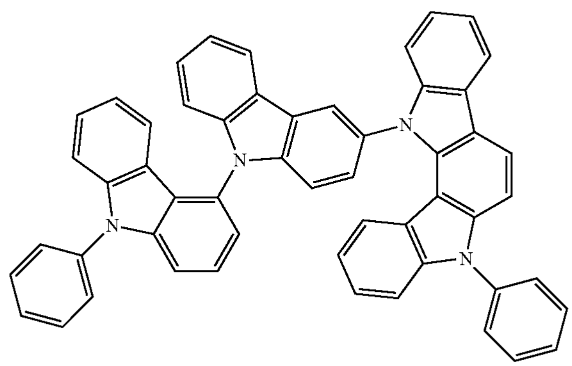

1-202
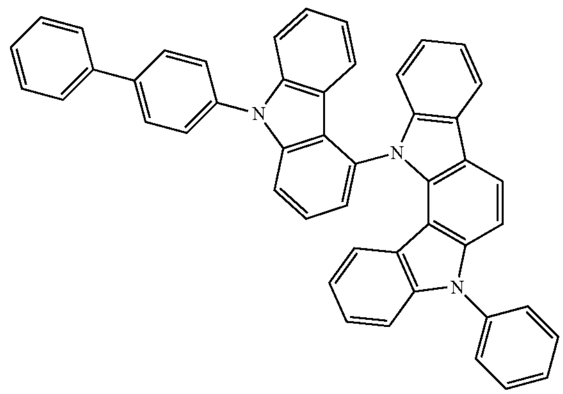
1-203
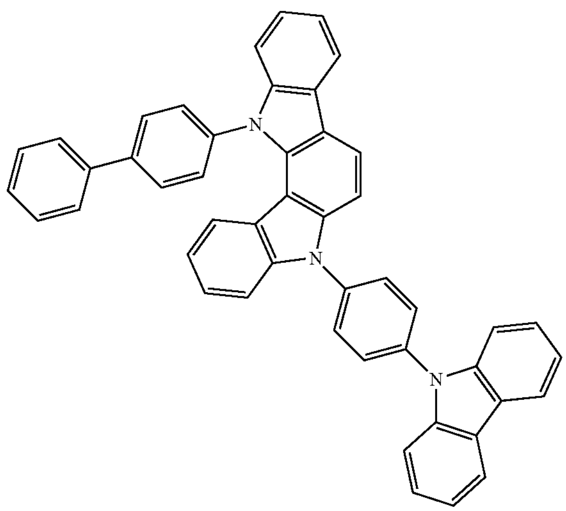
1-204
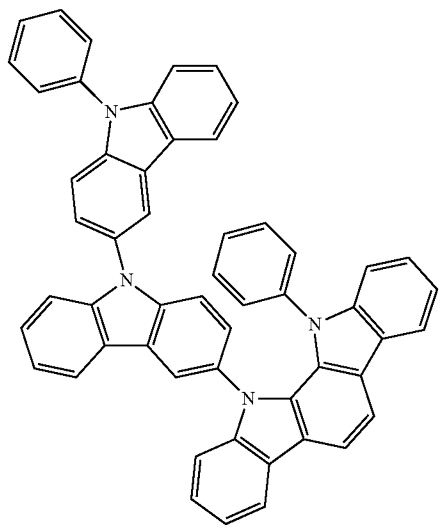
1-205
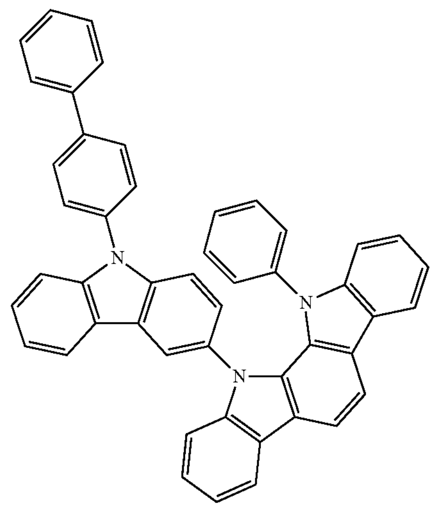
1-206
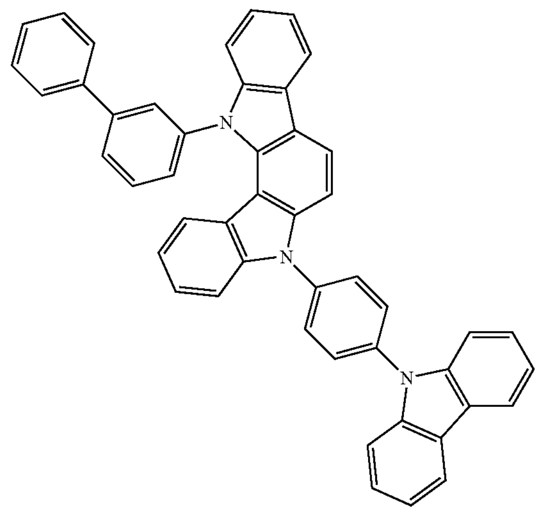
1-207
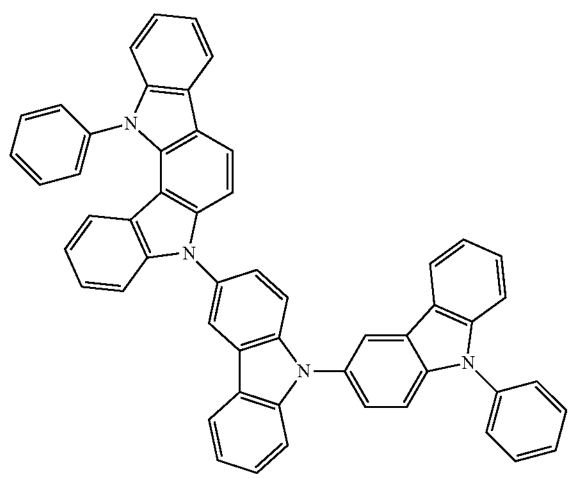

-continued
1-208
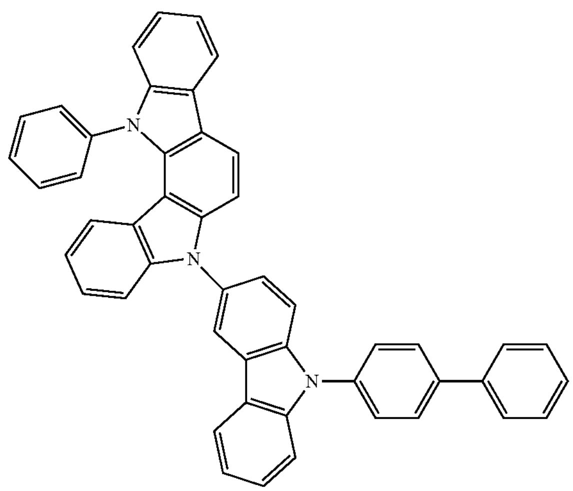
1-209
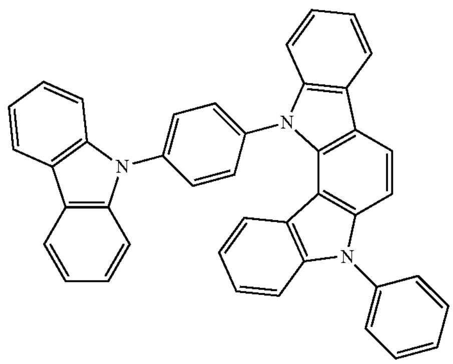
1-210
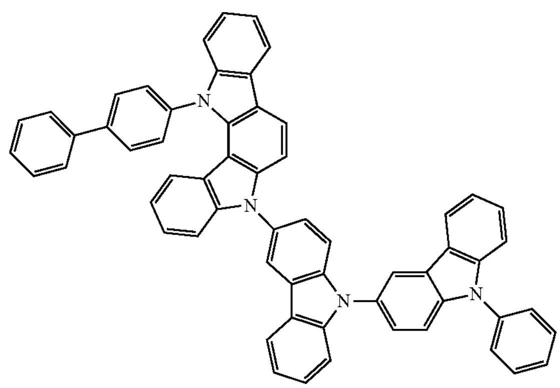
-continued
[C 22]
1-211
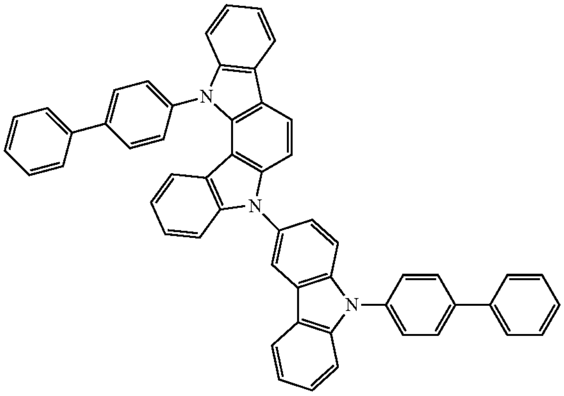
1-212
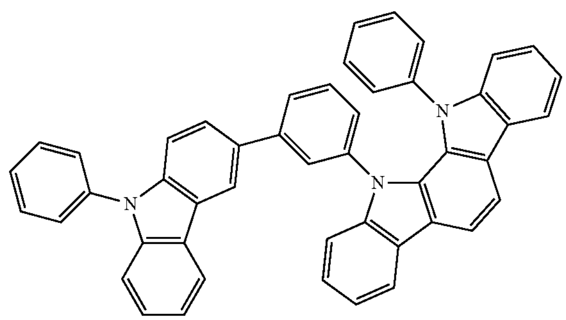
1-213
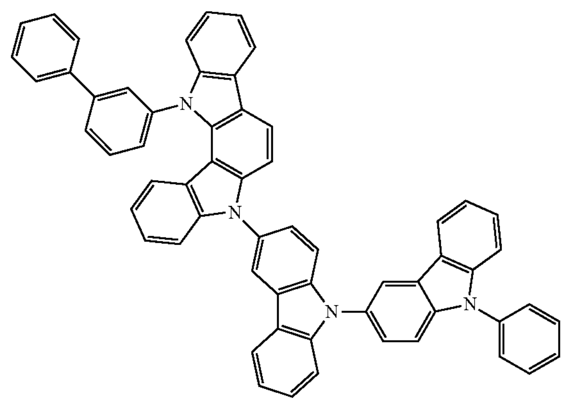
1-214
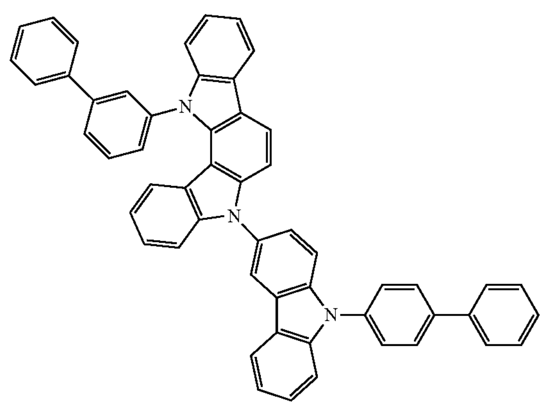

-continued
1-215
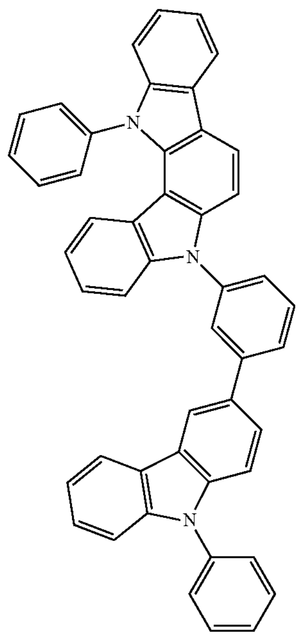
1-216
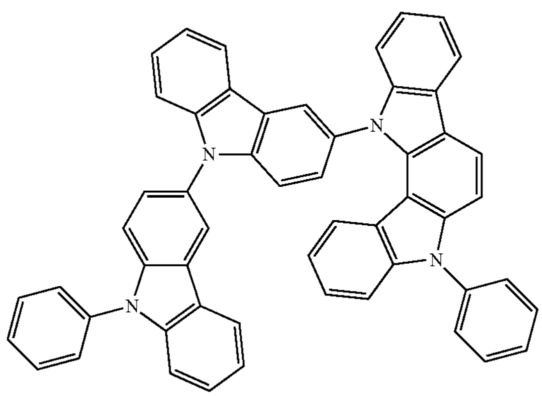
1-217
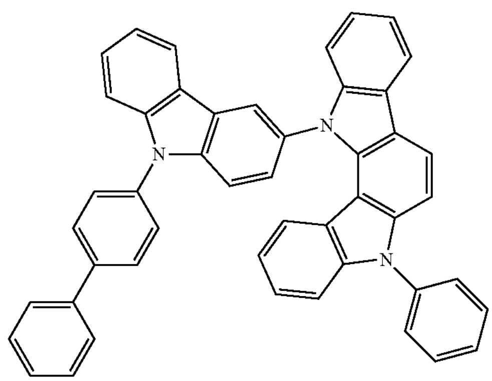
-continued
1-218
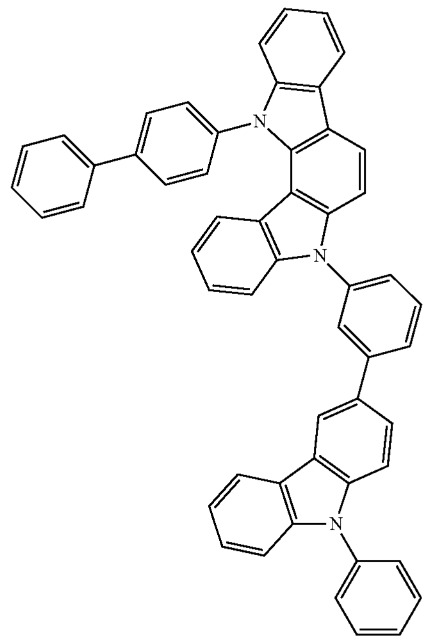
1-219
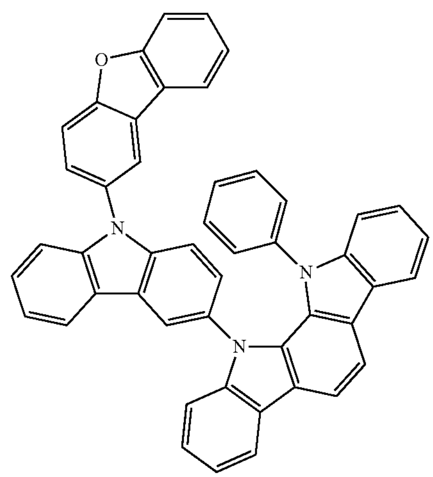
1-220
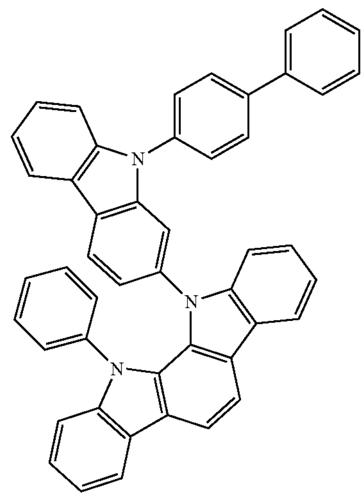

-continued
1-221
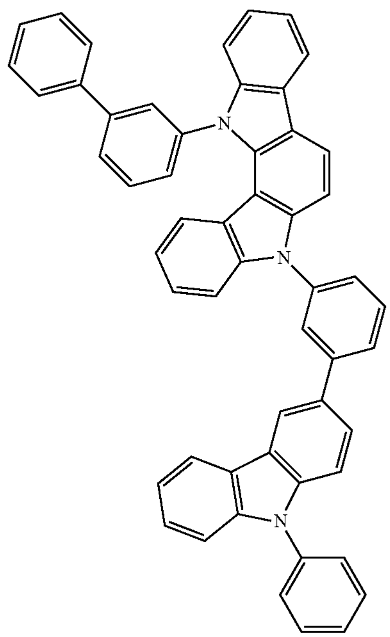
1-222
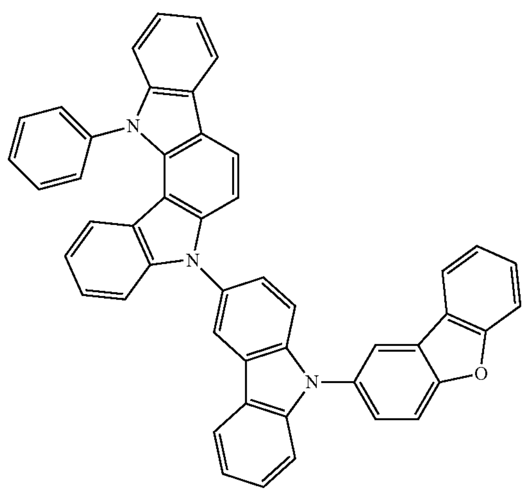
1-223
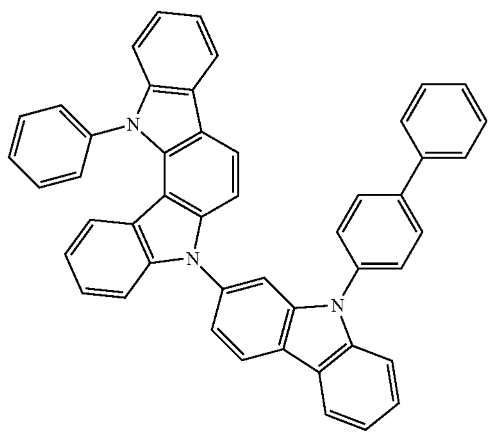
-continued
1-224
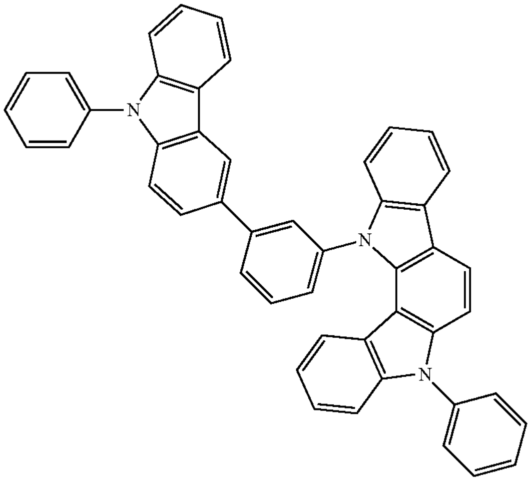
1-225
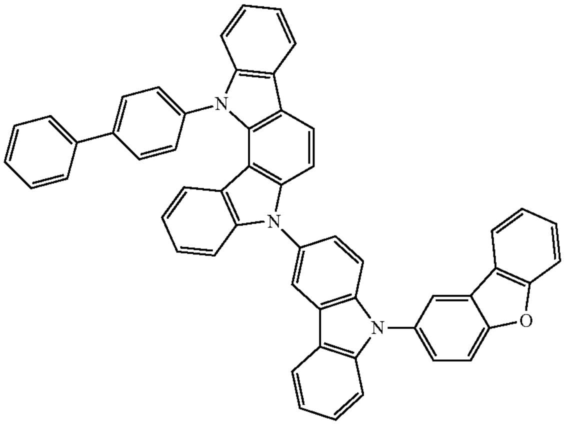
[C 23]
1-226
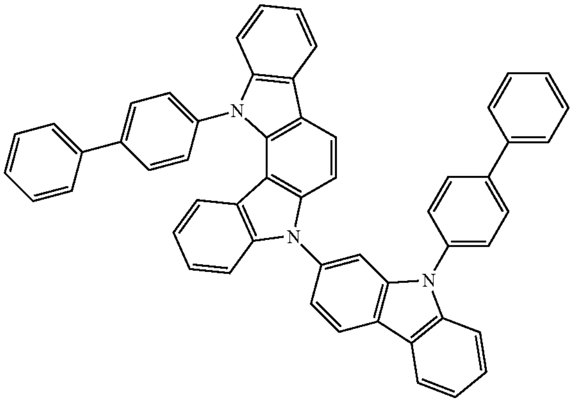

-continued
1-227
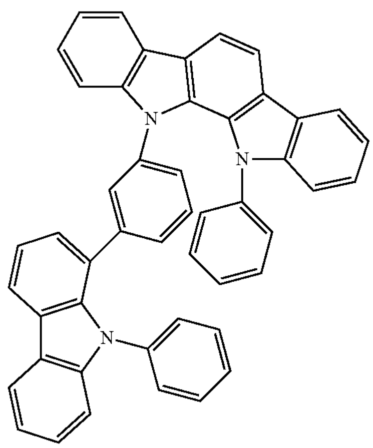
1-228
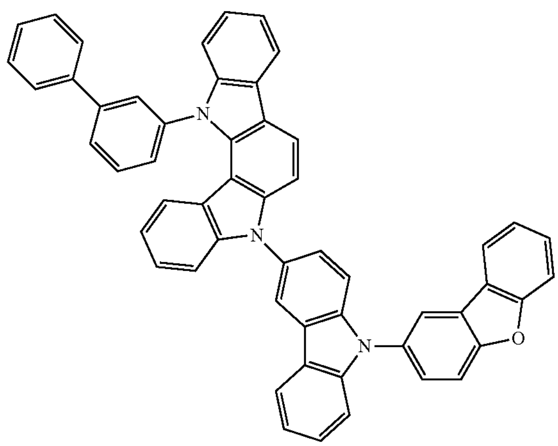
1-229
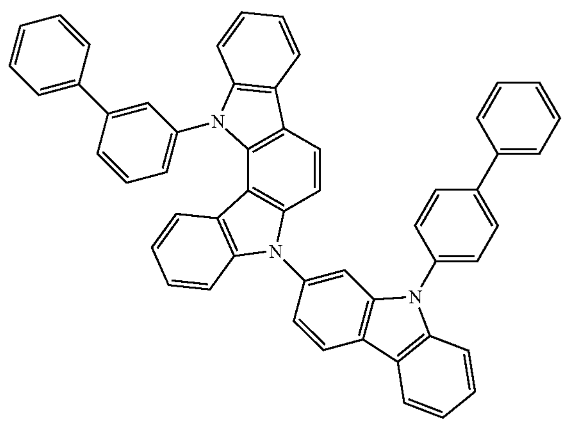
-continued
1-230
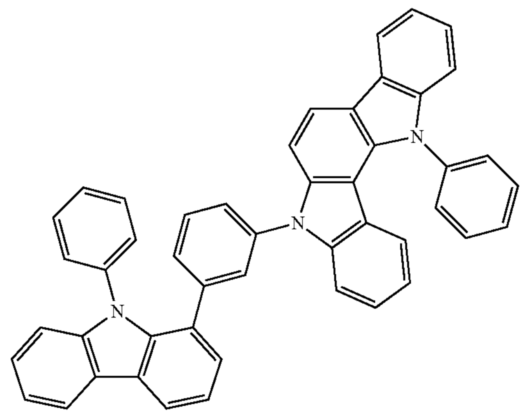
1-231
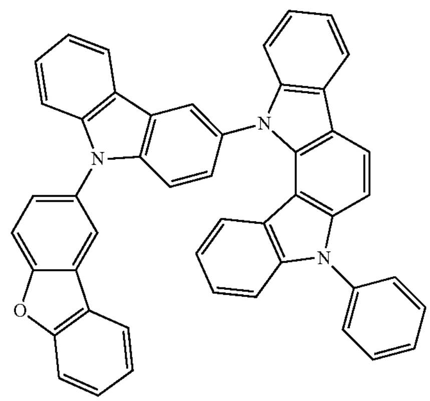
1-232
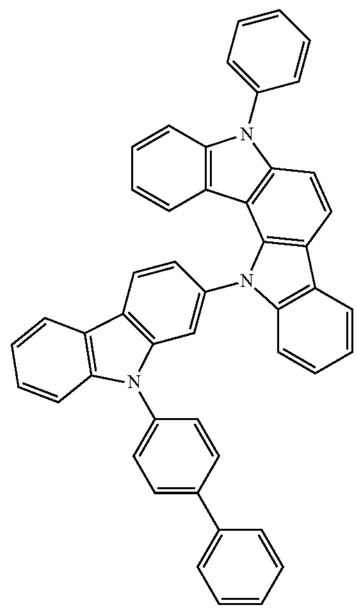

-continued
1-233
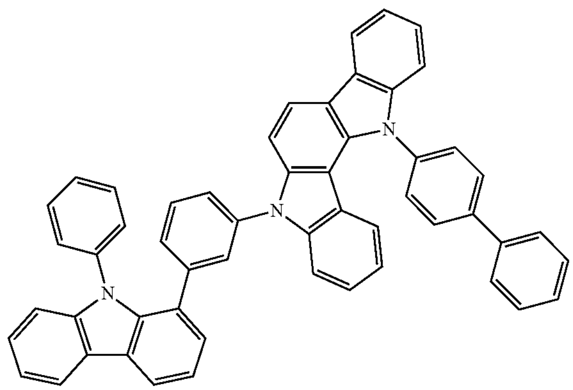
1-234
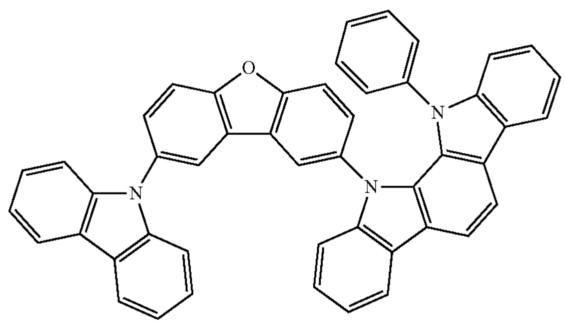
1-235
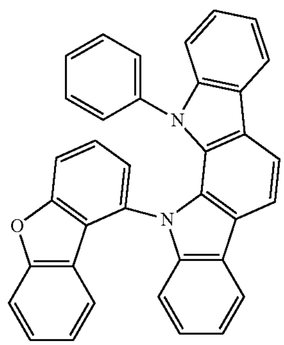
1-236
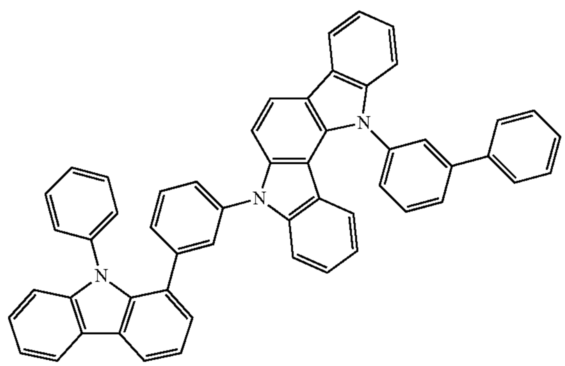
-continued
1-237
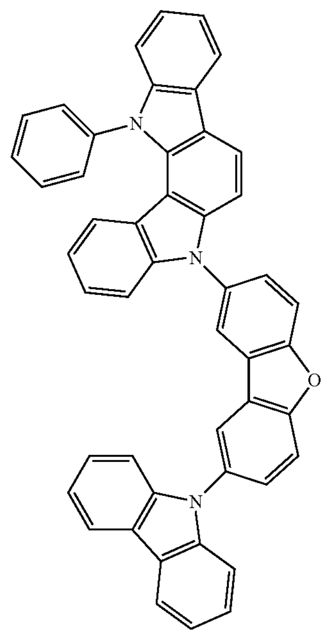
1-238
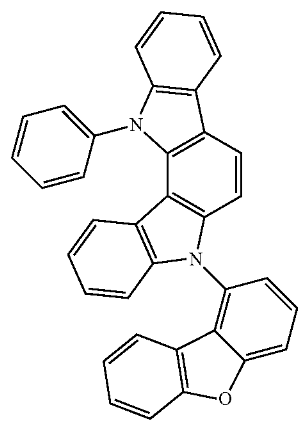
1-239
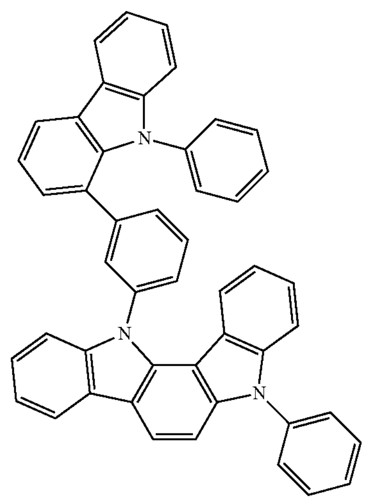

-continued
1-240
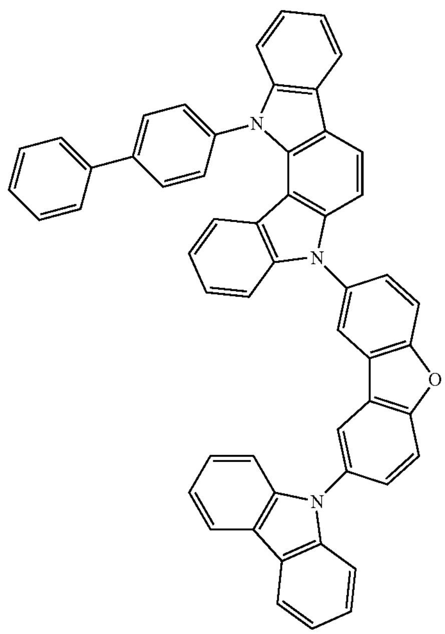
[C 24]
1-241
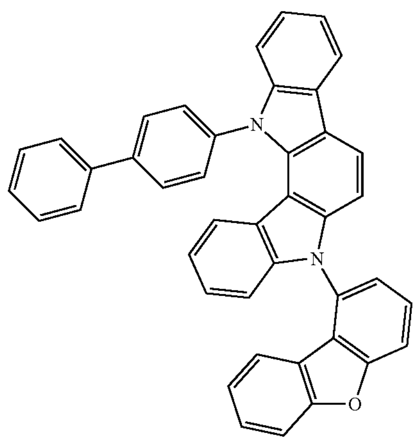
1-242
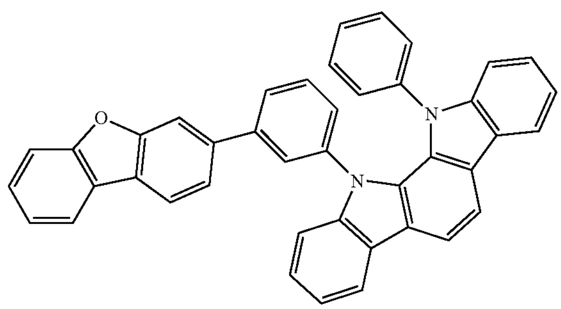
-continued
1-243
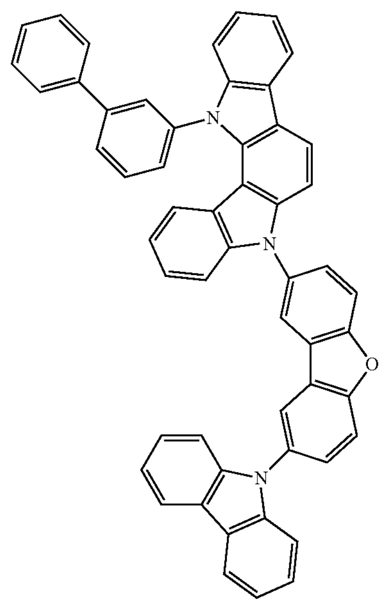
1-244
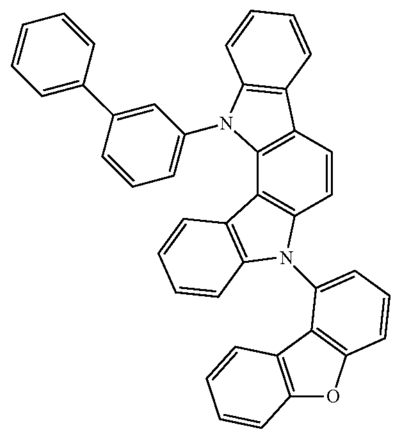
1-245
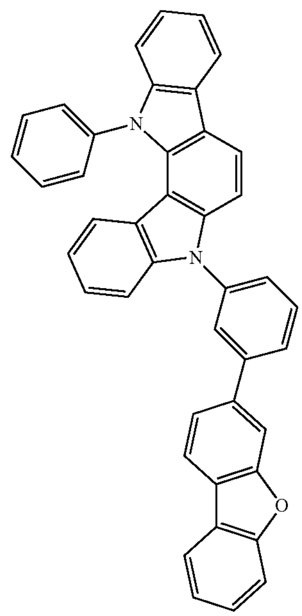

-continued
1-246
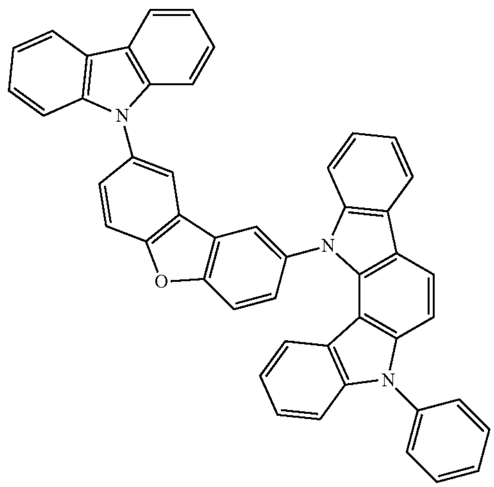
1-247
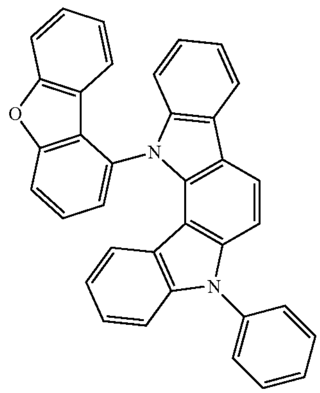
1-248
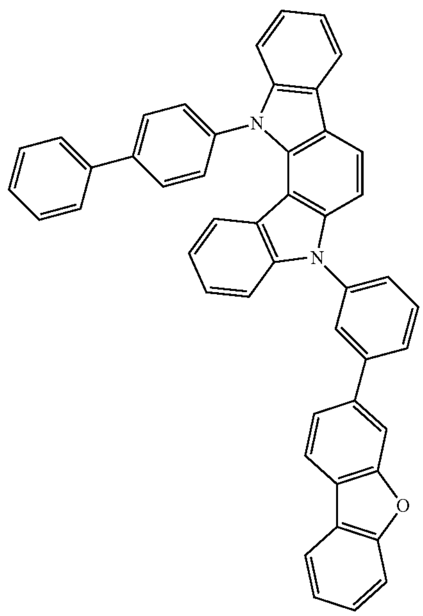
-continued
1-249
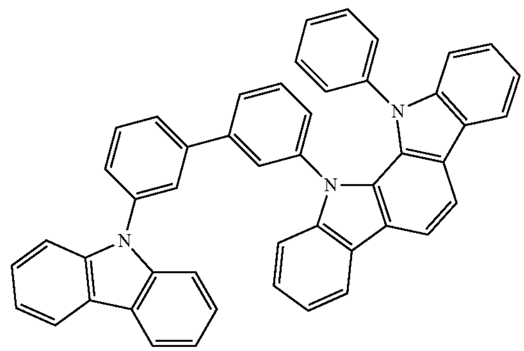
1-250
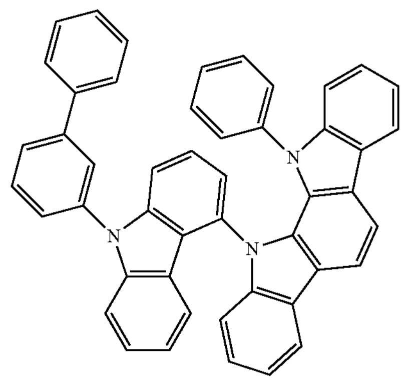
1-251
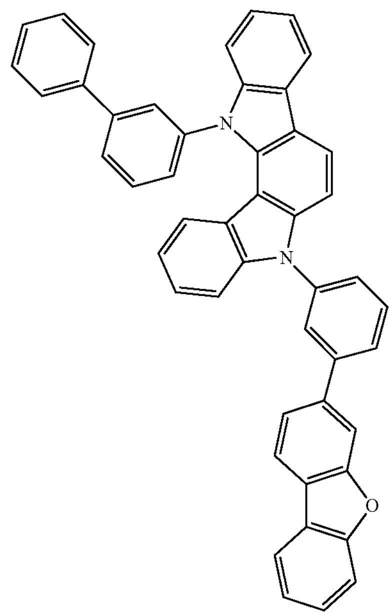

-continued
1-252
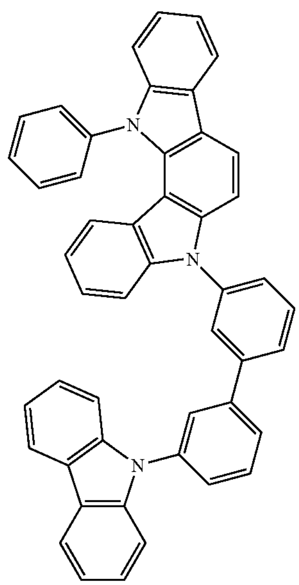
1-253
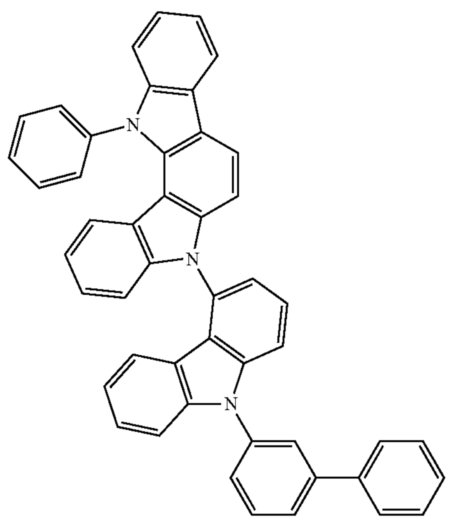
1-254
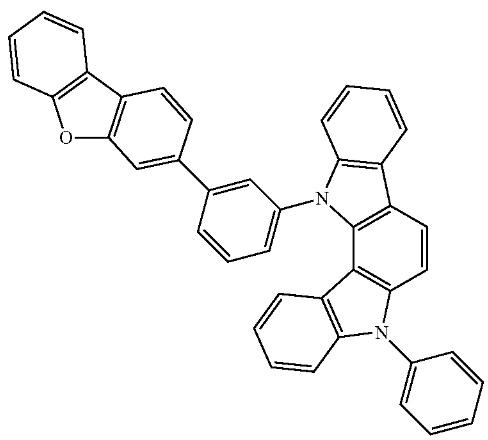
-continued
1-255
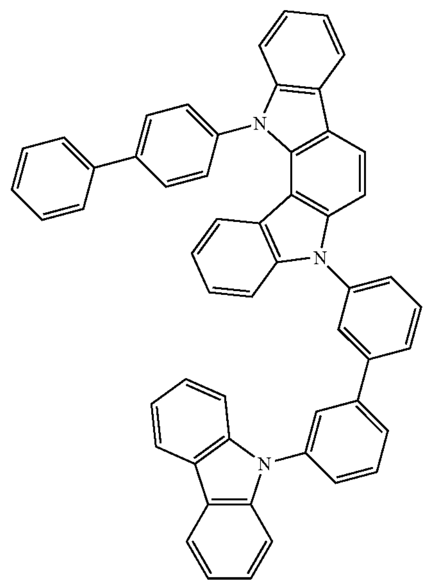
[C 25]
1-256
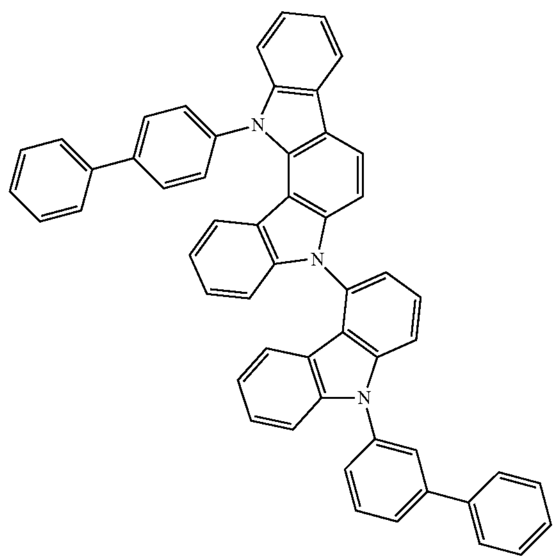
1-257
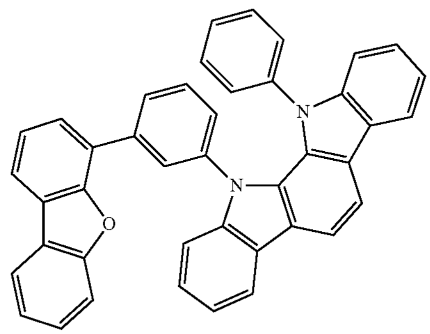

-continued
1-258
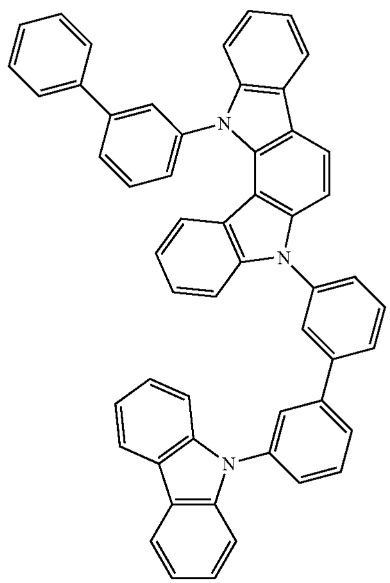
1-259
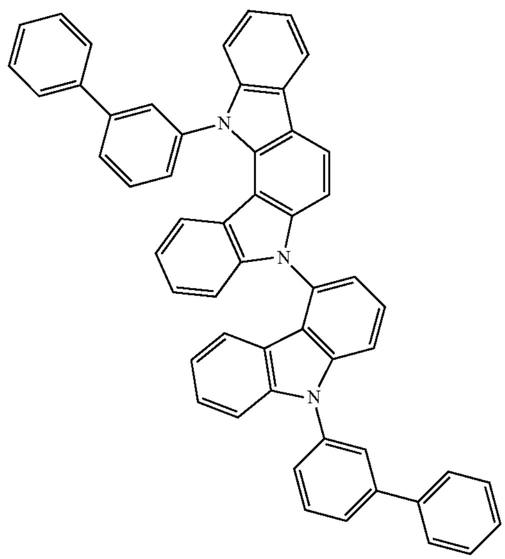
1-260
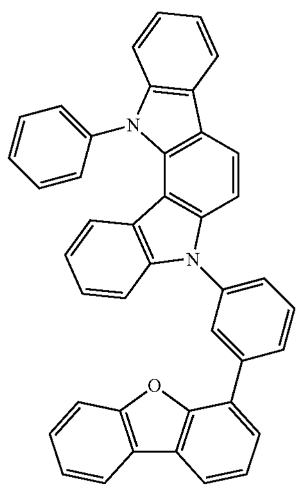
-continued
1-261
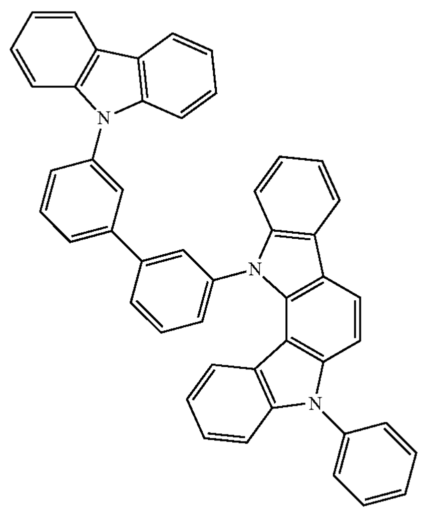
1-262
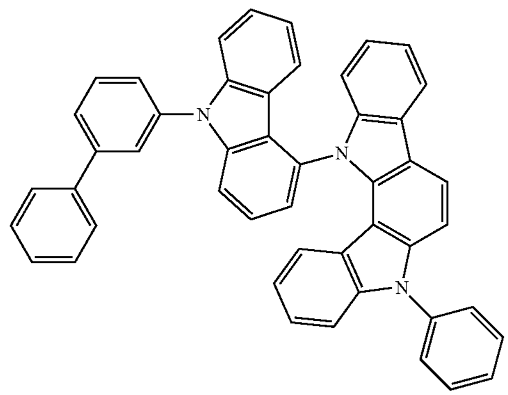
1-263
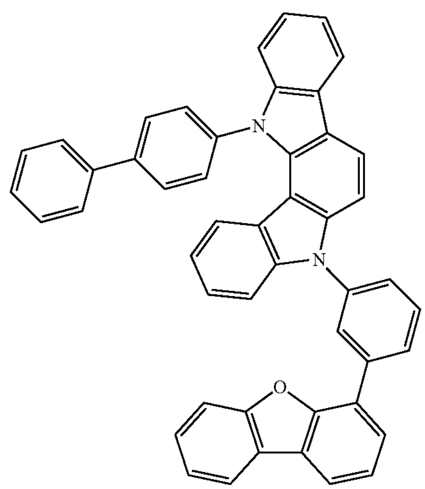

-continued
1-264
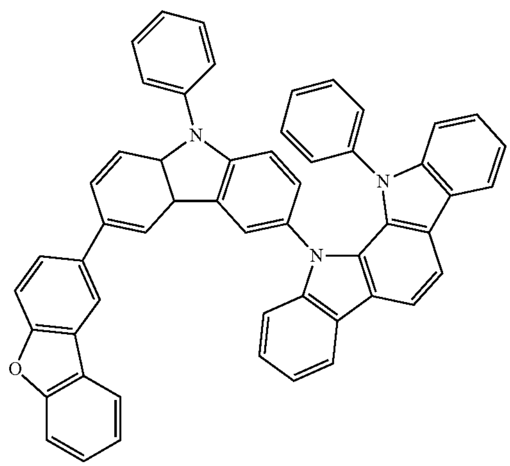
1-265
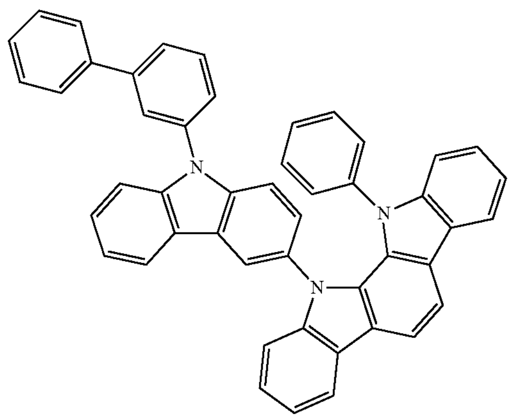
1-266
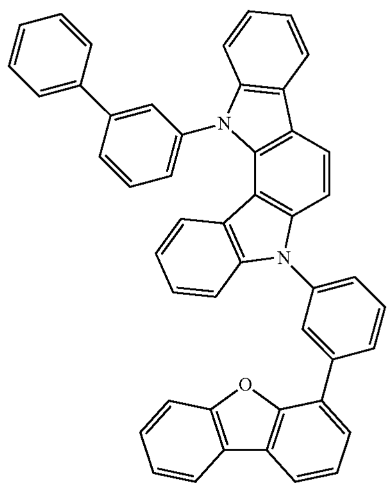
-continued
1-267
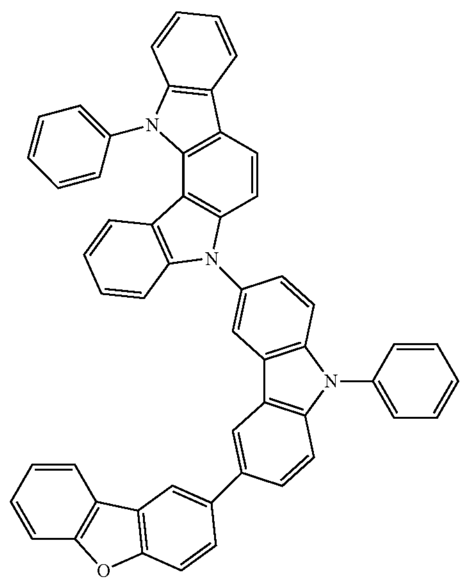
1-268
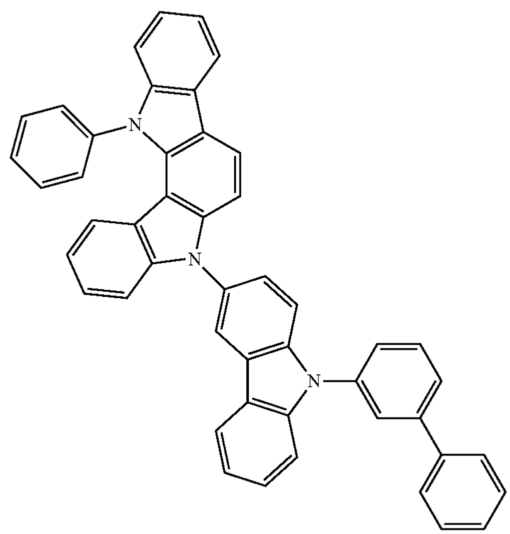
1-269
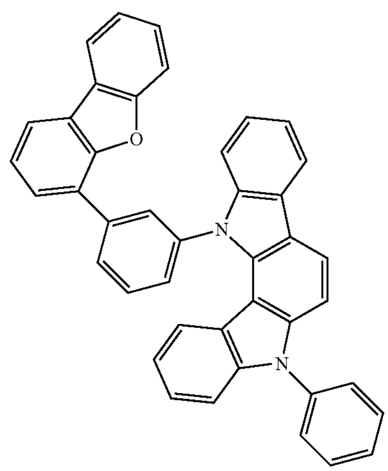

-continued
1-270
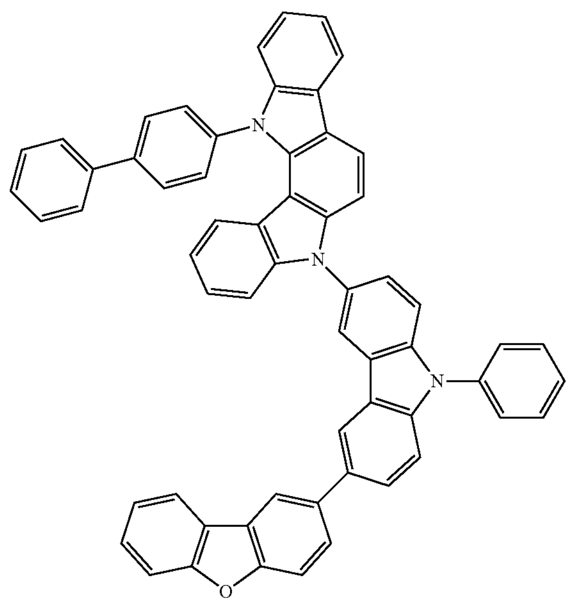
[C 26]
1-271
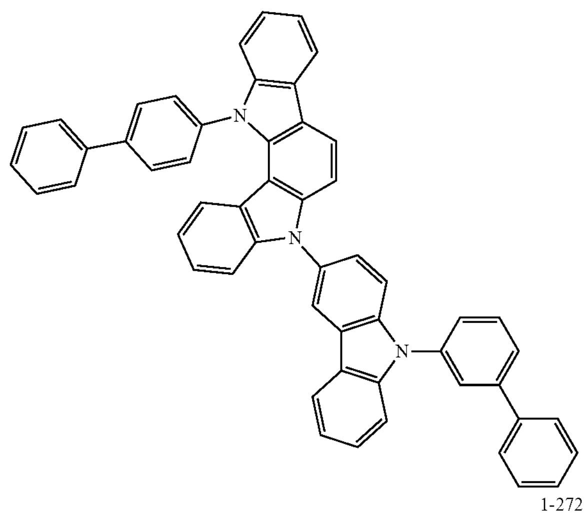
1-272
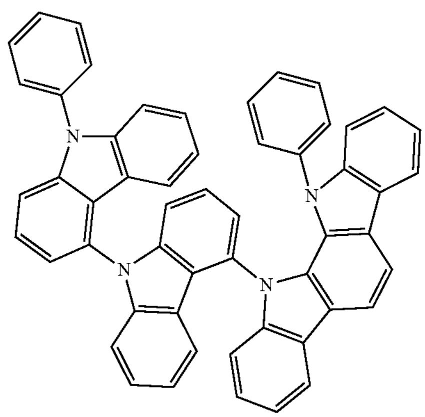
-continued
1-273
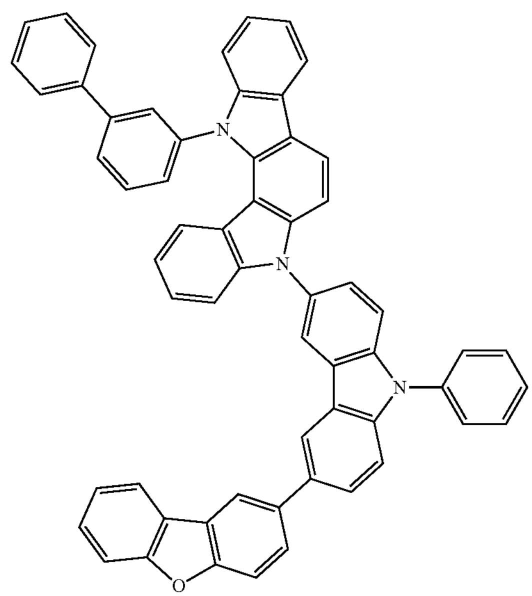
1-274
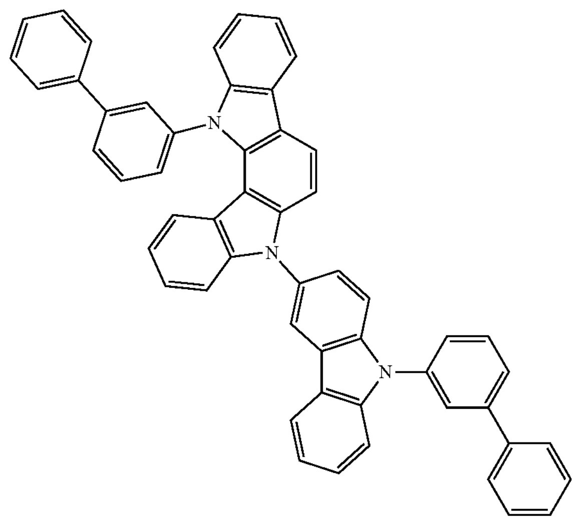

-continued
1-275
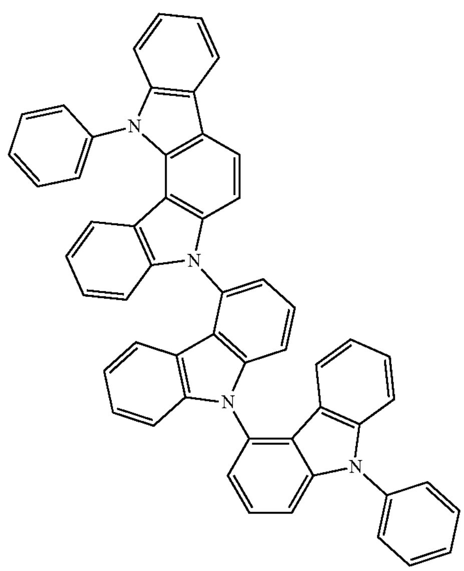
1-276
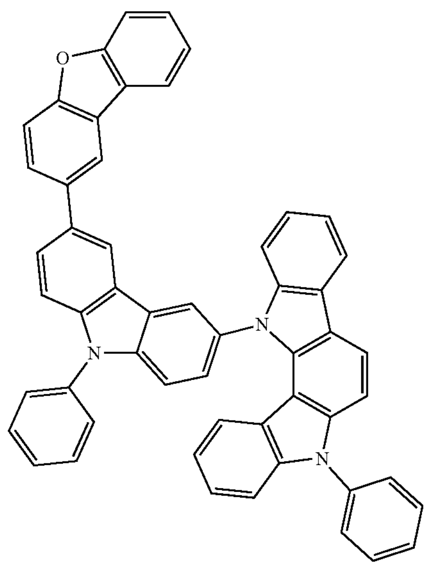
1-277
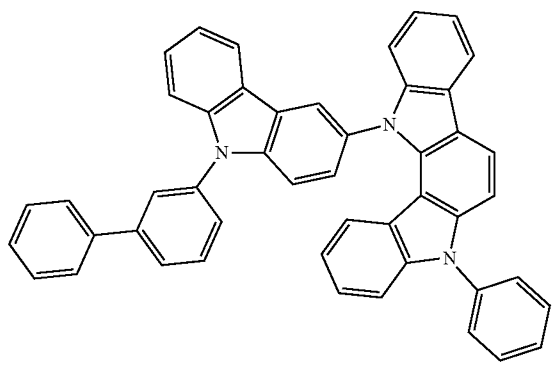
-continued
1-278
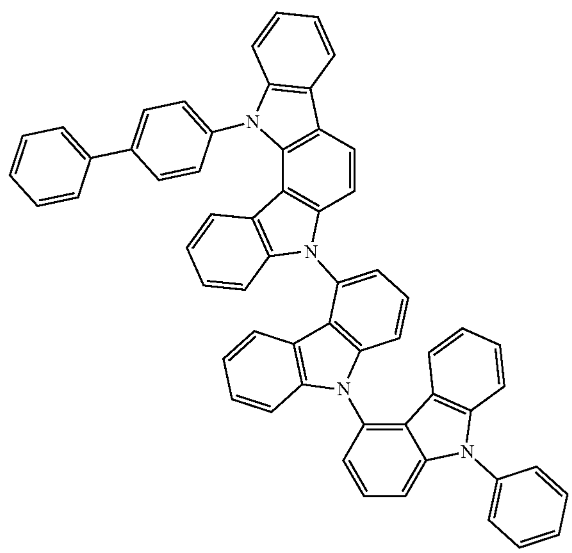
1-279
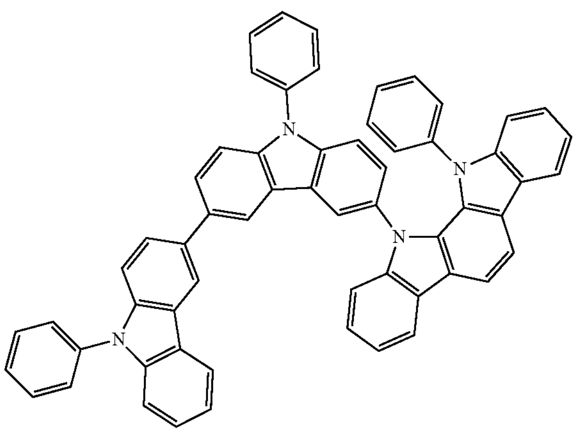
1-280
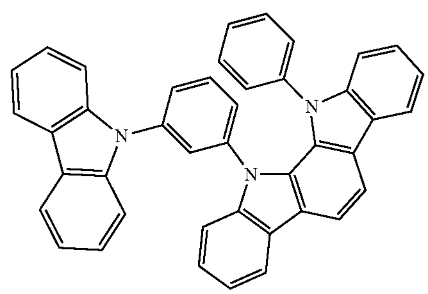

-continued
1-281
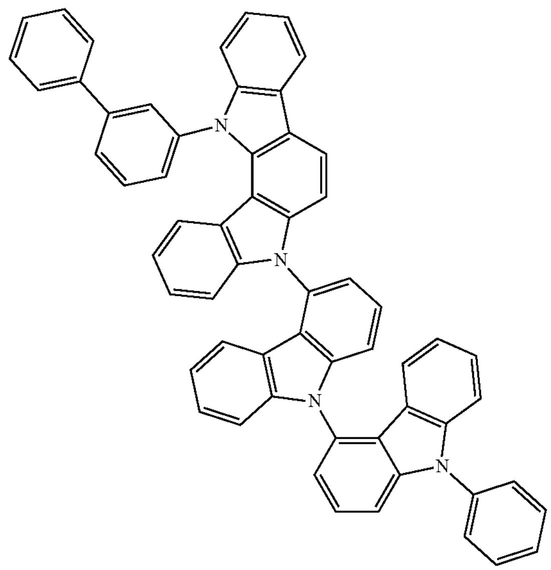
1-282
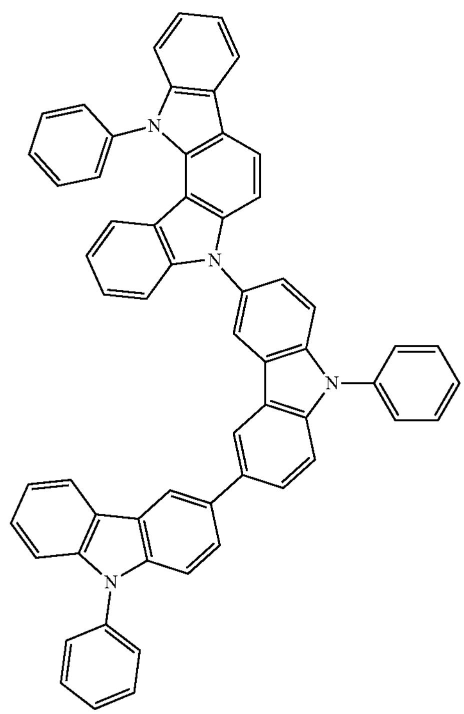
-continued
1-283
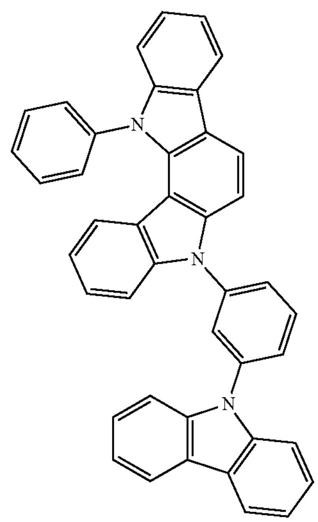
1-284
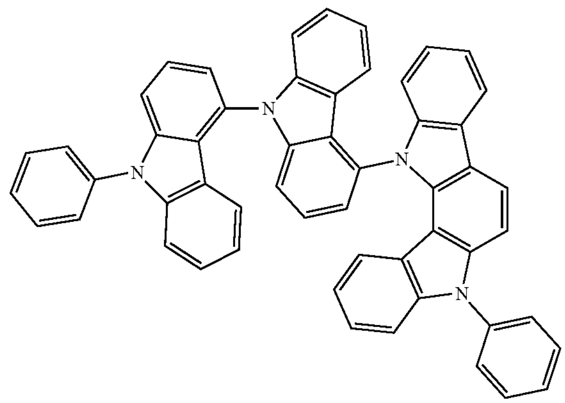
1-285
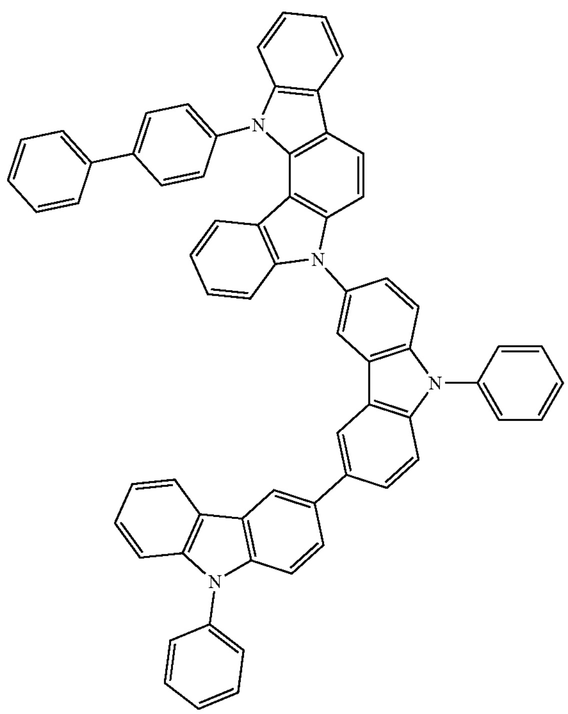

[C 27]
1-286
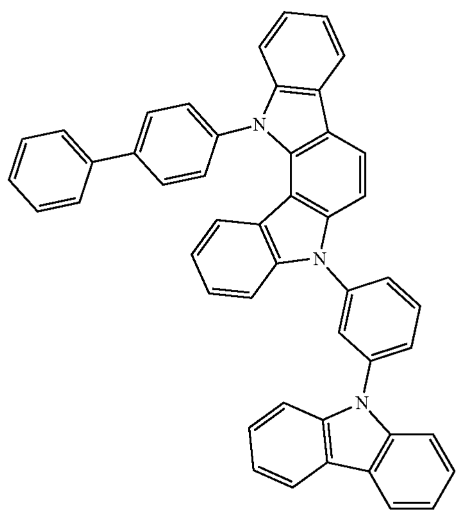
1-287
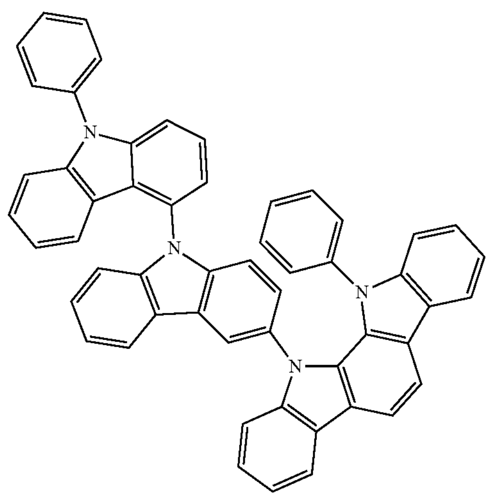
1-288
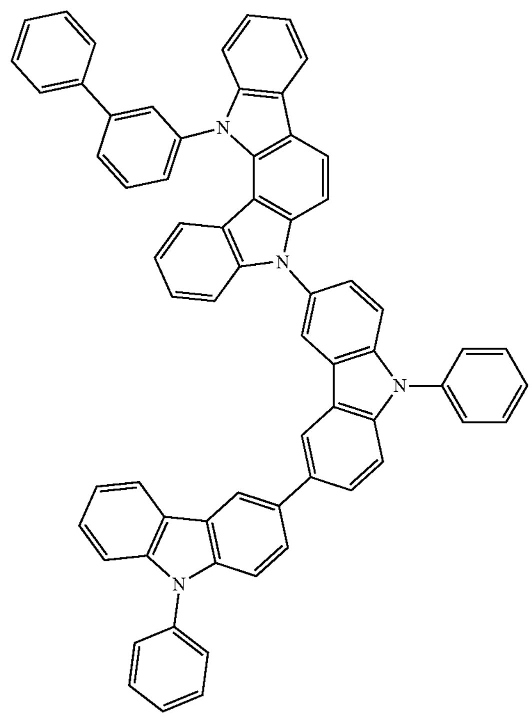
1-289
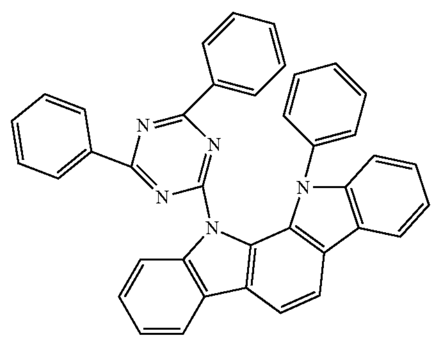
1-290
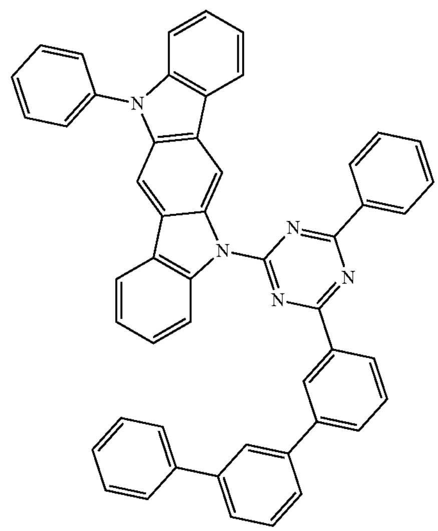

-continued
1-291
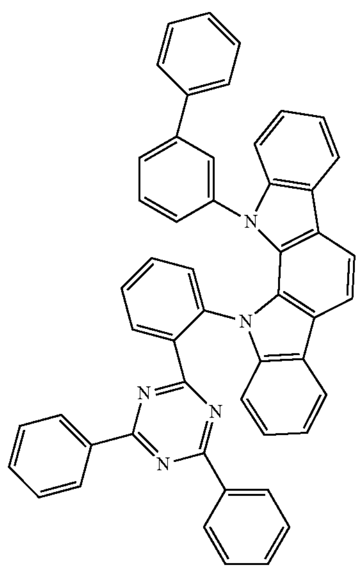
1-292
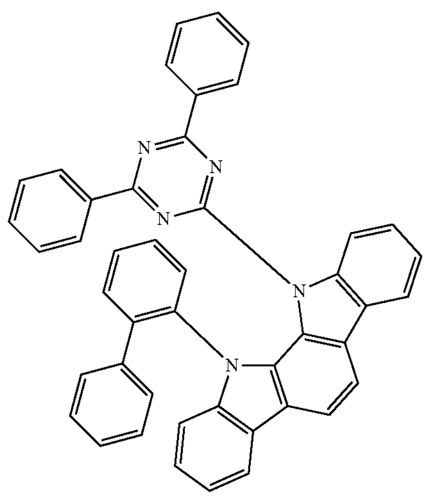
1-293
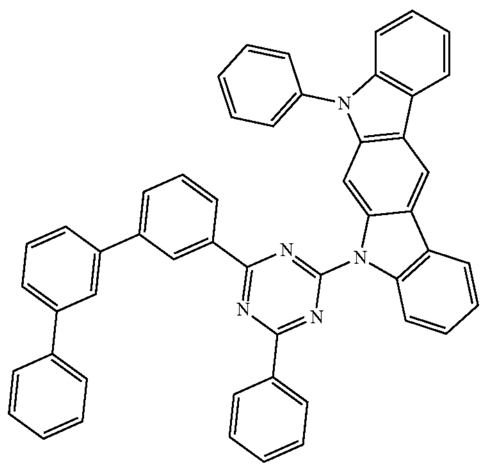
-continued
1-294
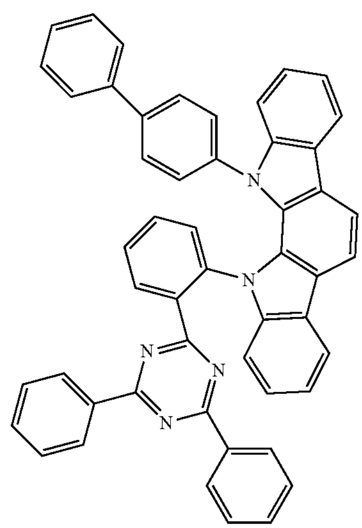
1-295
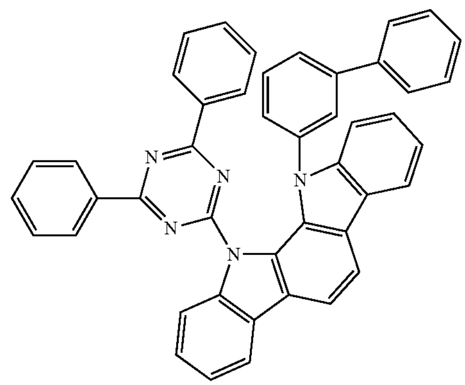
1-296
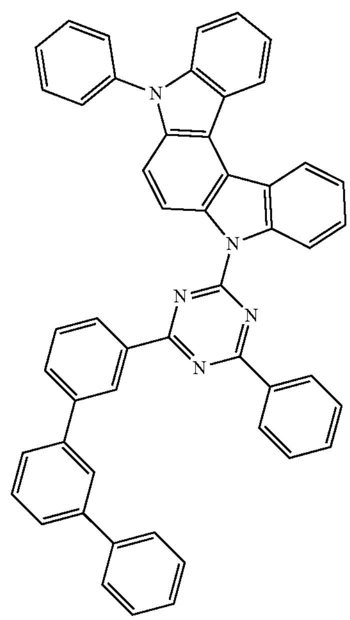

-continued
1-297
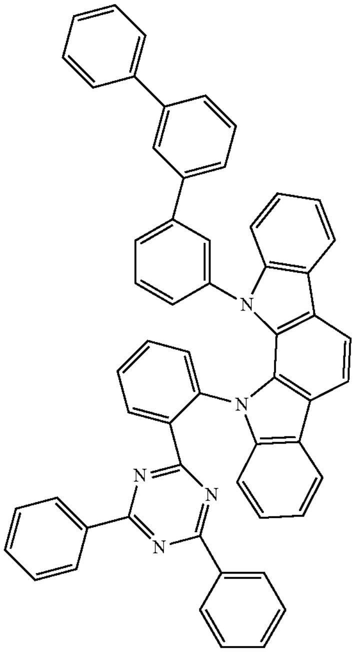
1-298
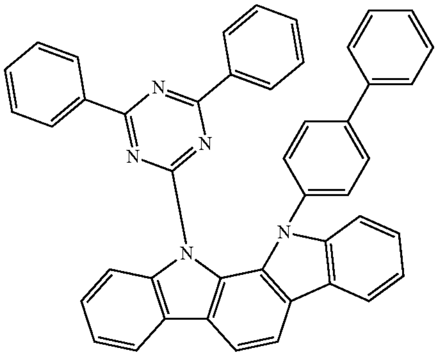
1-299
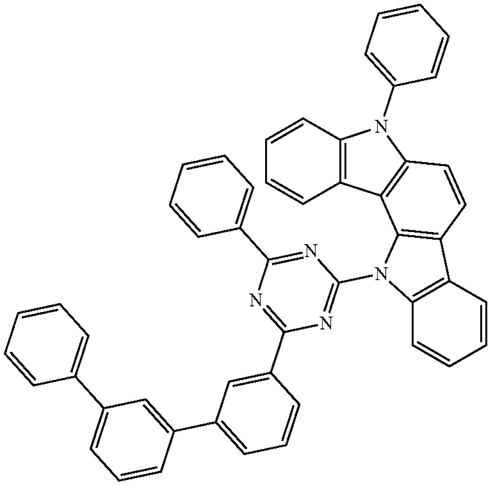
-continued
1-300
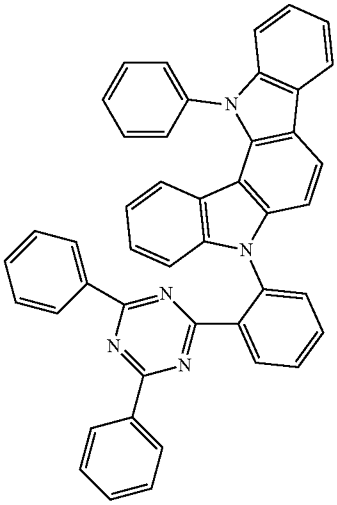
[C 28]
1-301
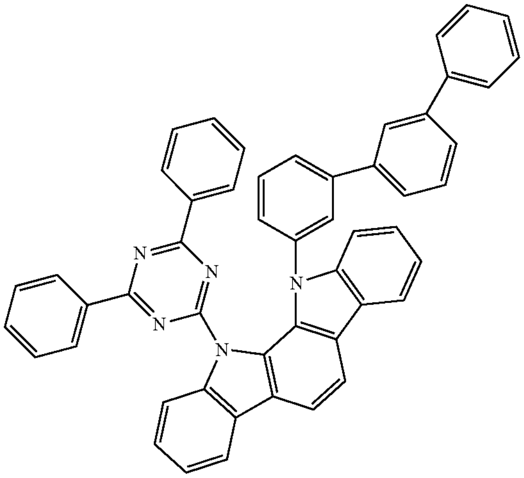
1-302
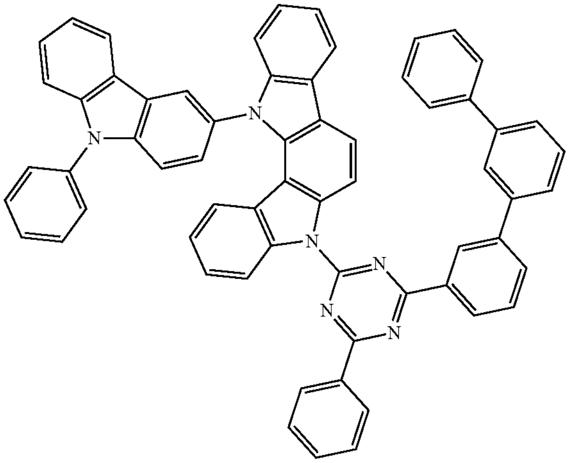

-continued
1-303
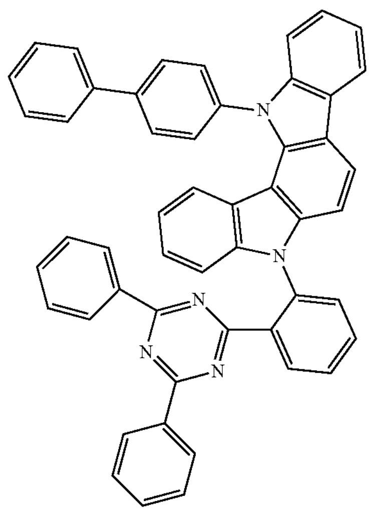
1-304
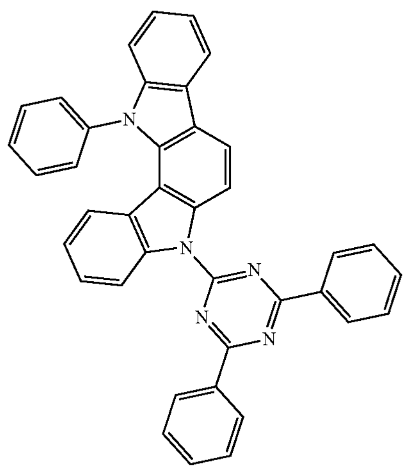
1-305
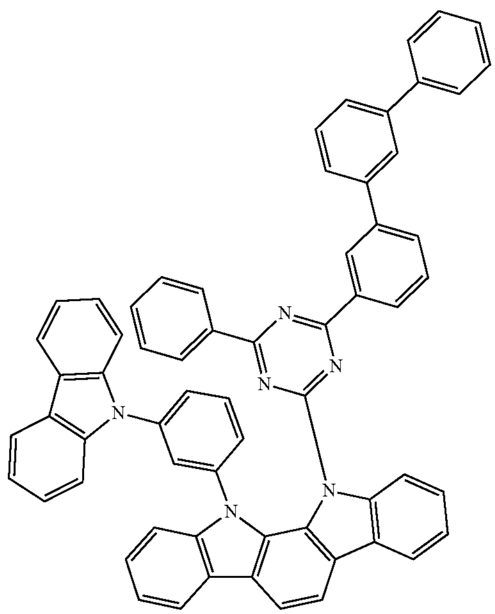
-continued
1-306
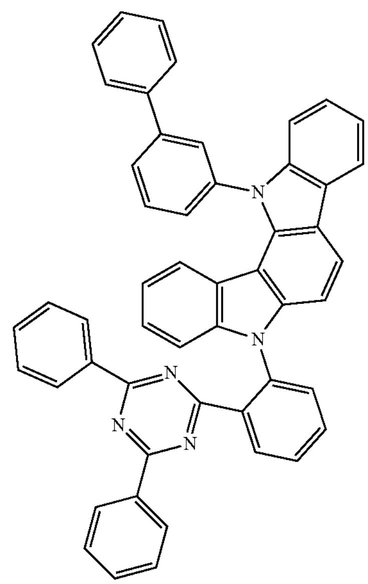
1-307
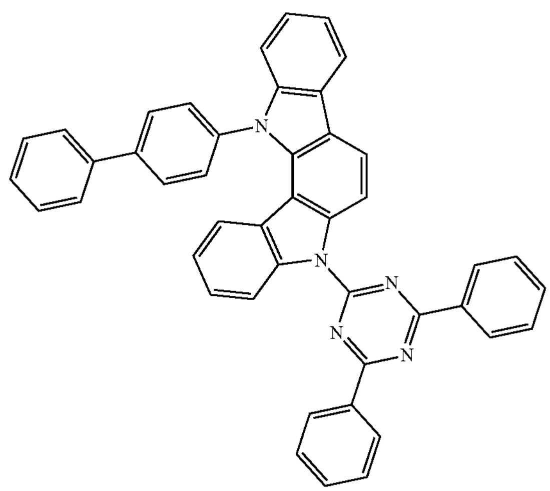
1-308
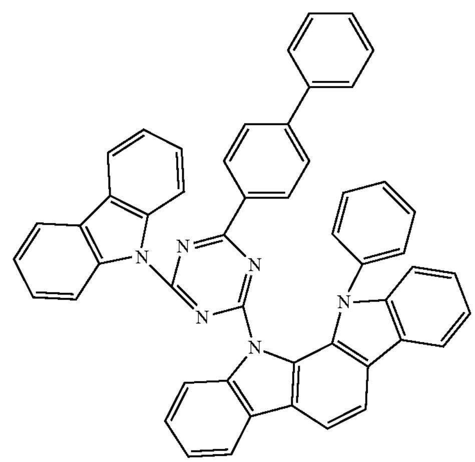

-continued
1-309
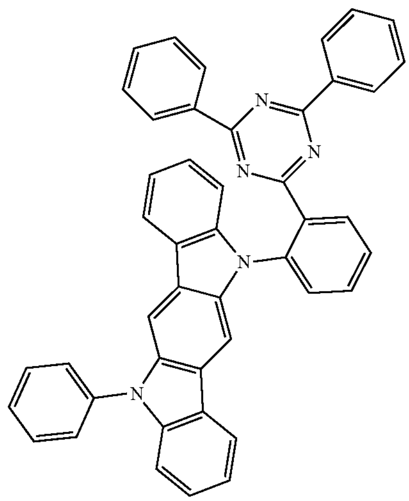
1-310
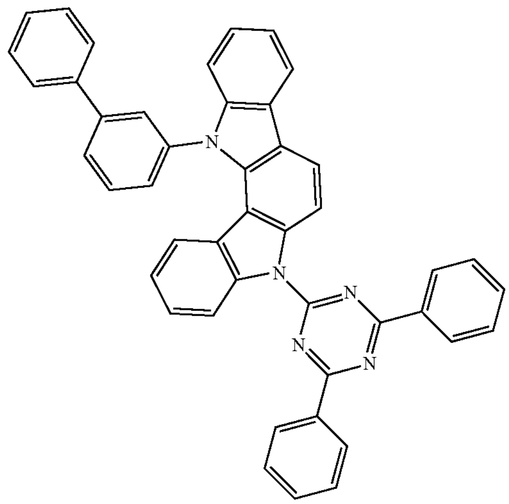
1-311
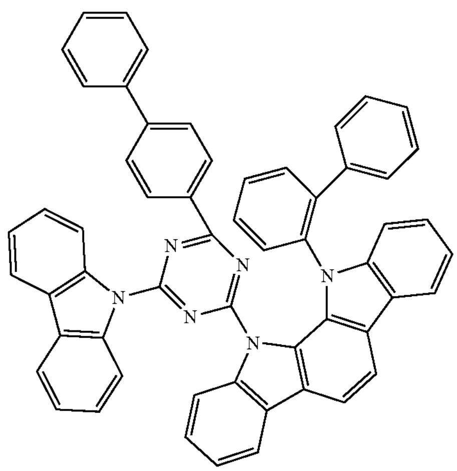
-continued
1-312
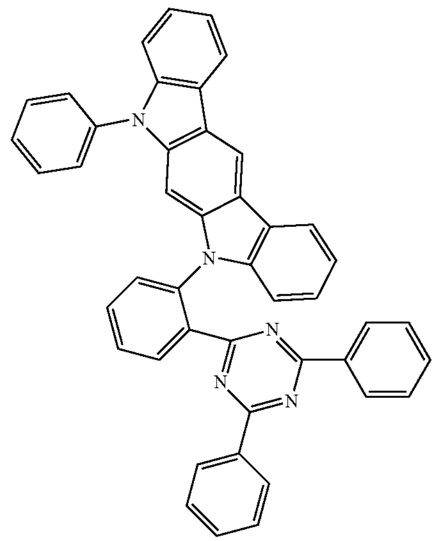
1-313
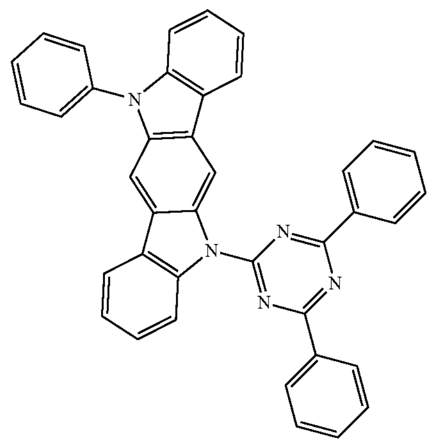
1-314
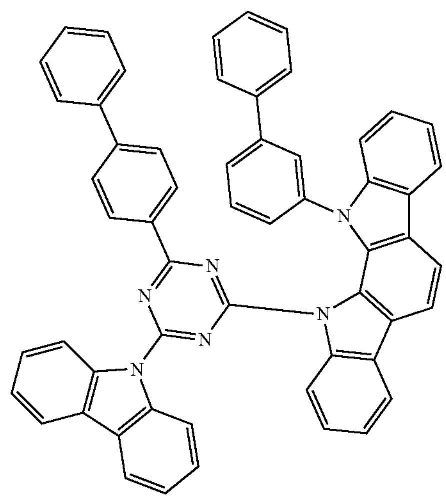

-continued
1-315
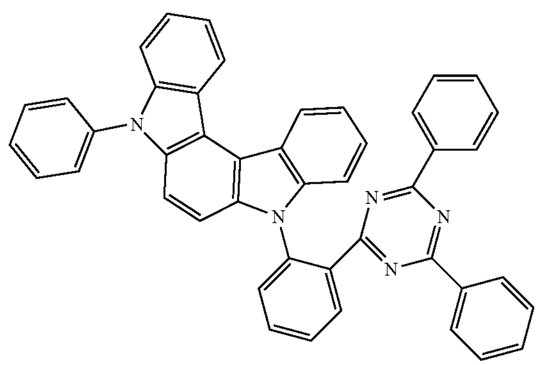
[C 29]
1-316
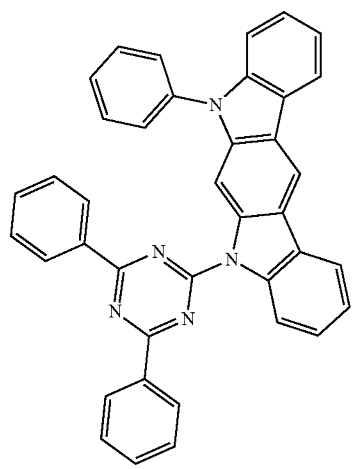
1-317
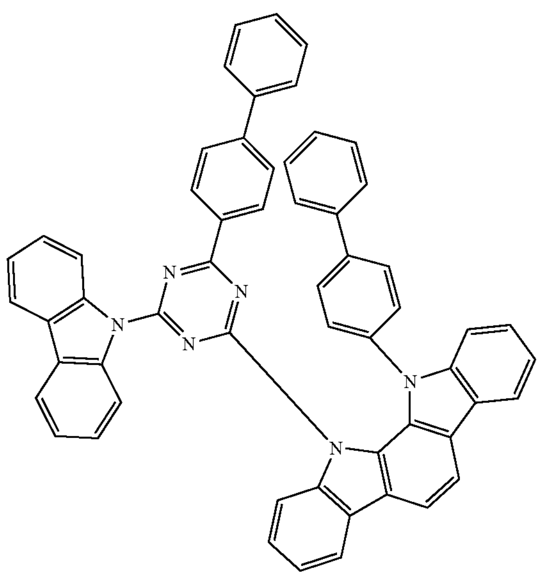
-continued
1-318
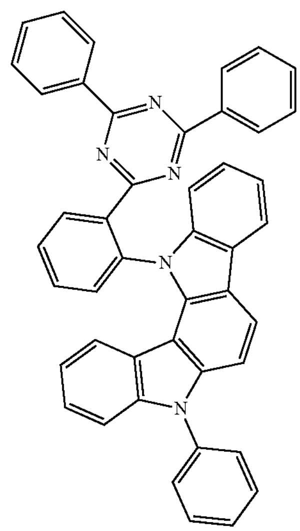
1-319
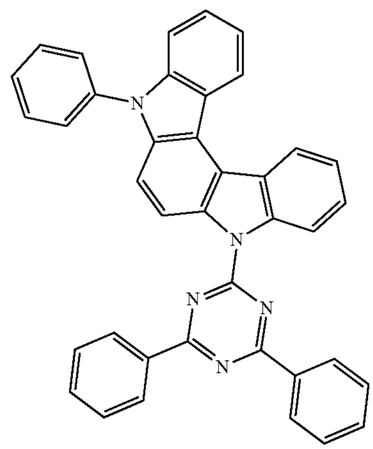
1-320
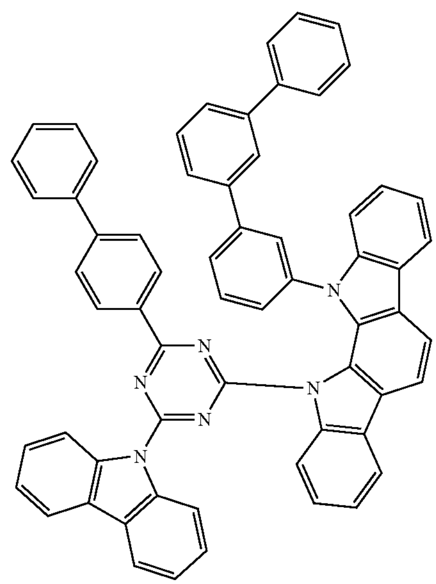

-continued
1-321
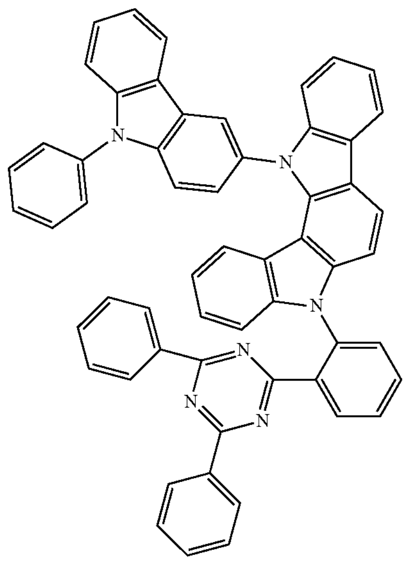
1-322
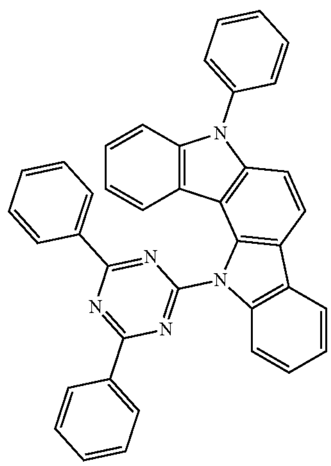
1-323
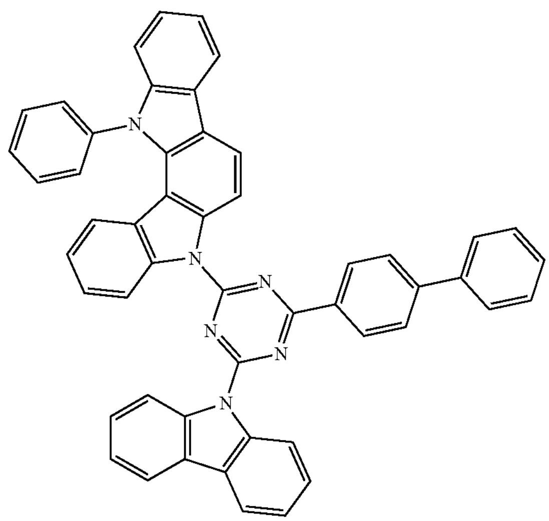
-continued
1-324
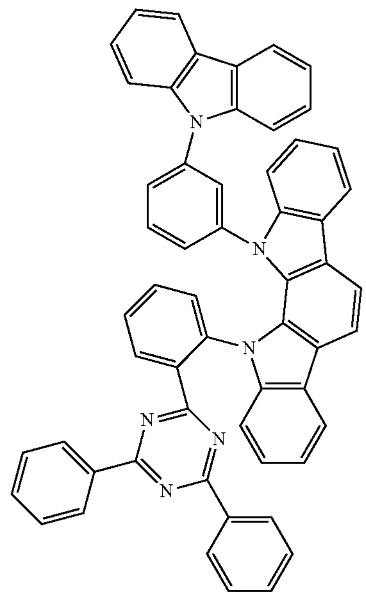
1-325
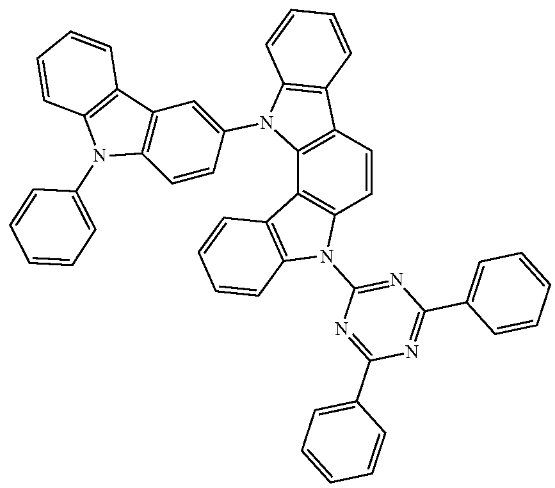
1-326
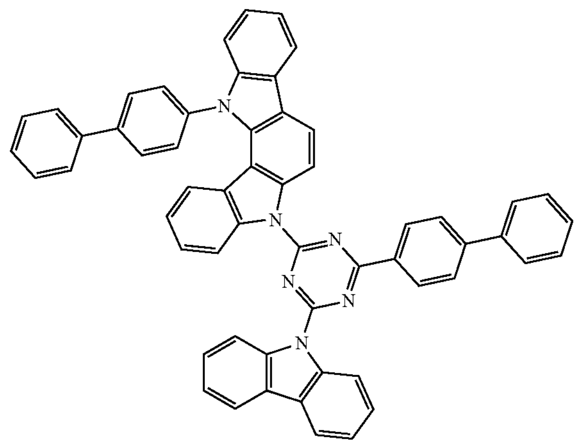

-continued
1-327
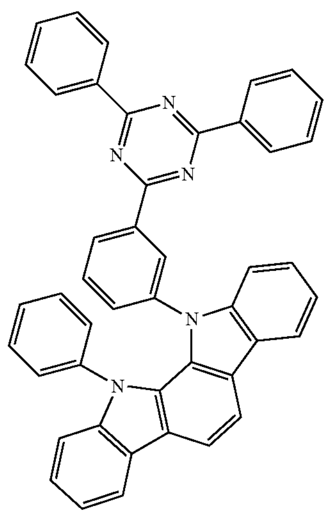
1-328
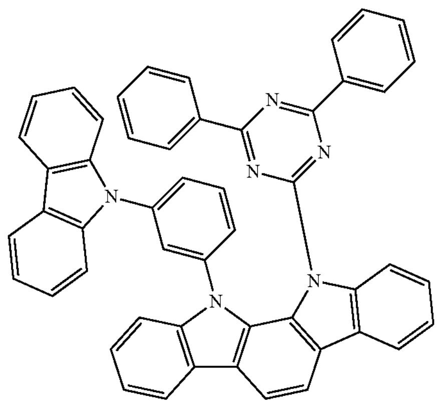
1-329
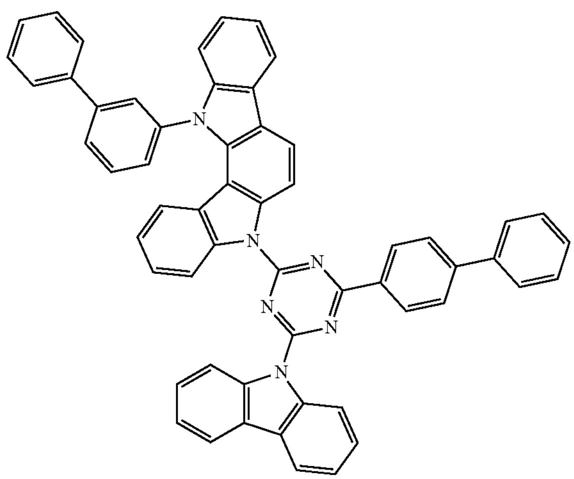
-continued
1-330
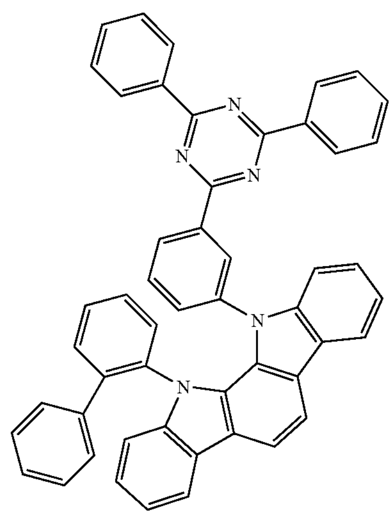
[C 30]
1-331
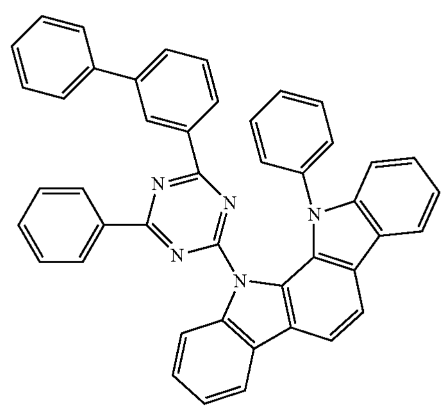
1-332
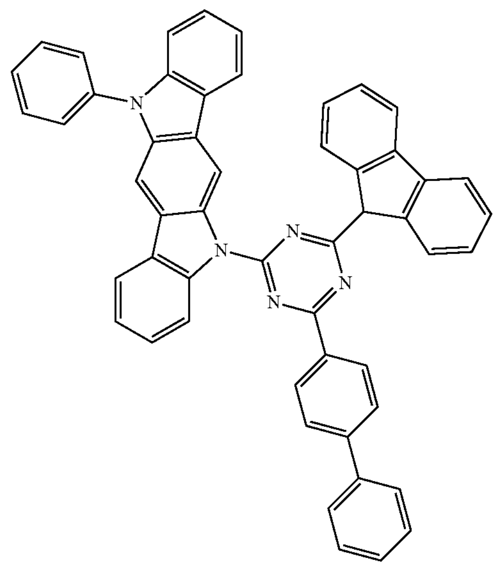

-continued
1-333
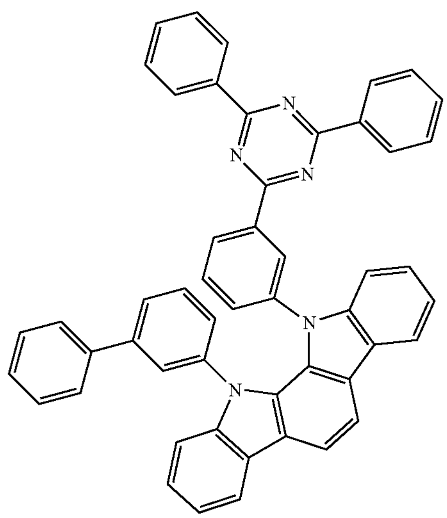
1-334
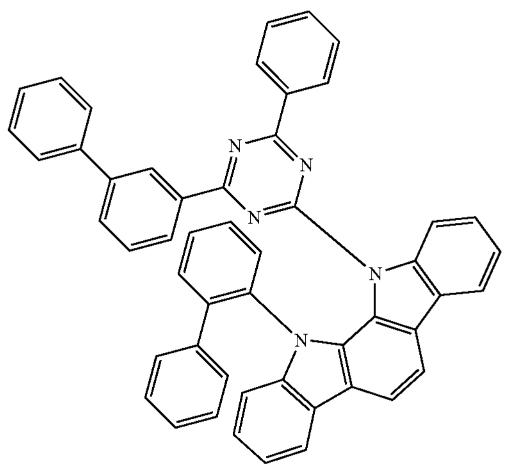
1-335
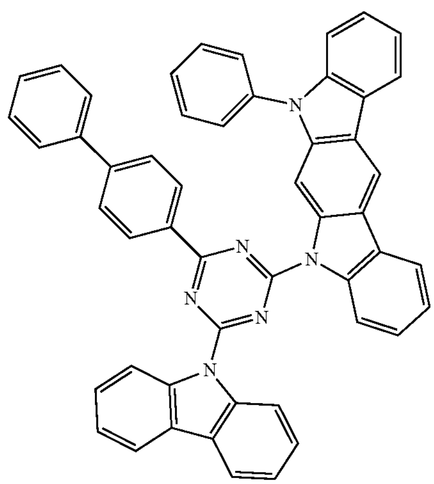
-continued
1-336
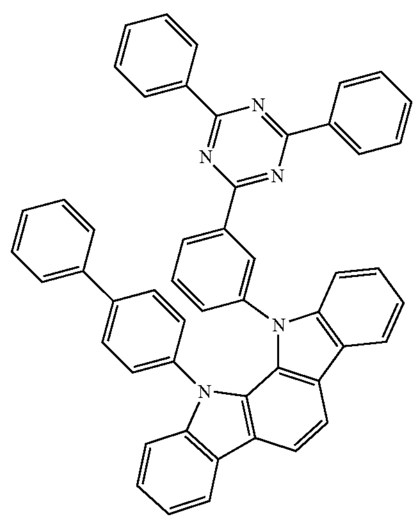
1-337
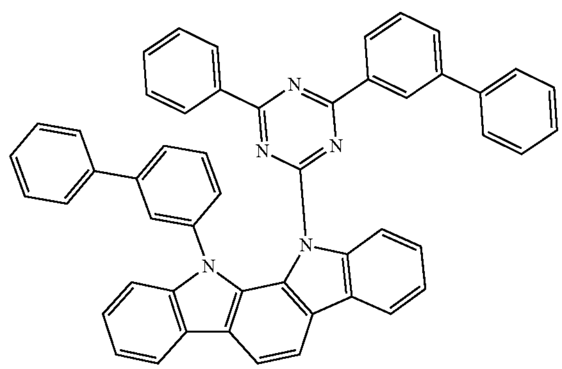
1-338
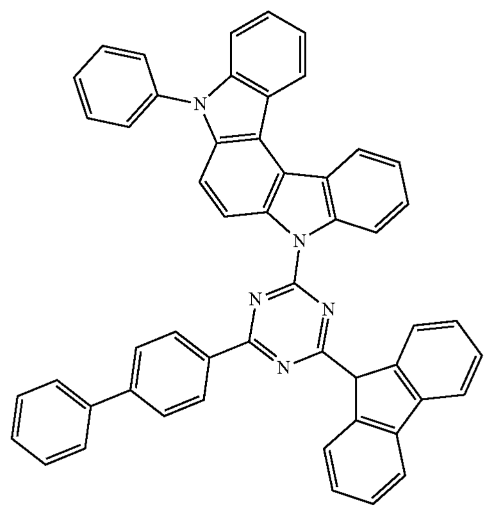

-continued
1-339
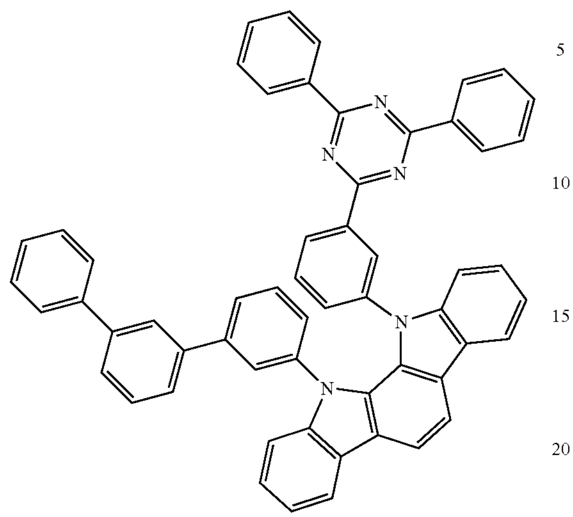
1-340
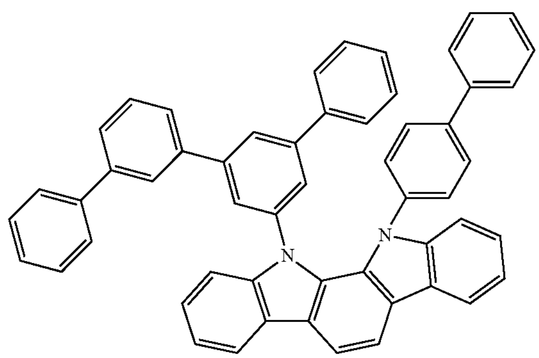
1-341
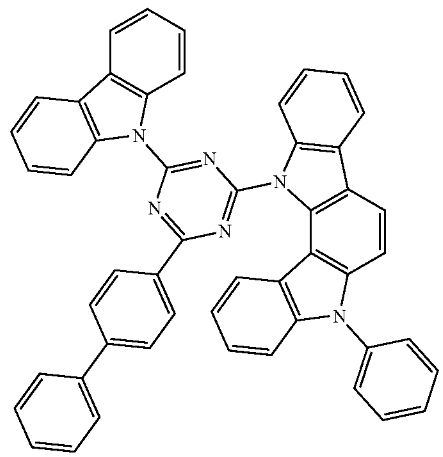
-continued
1-342
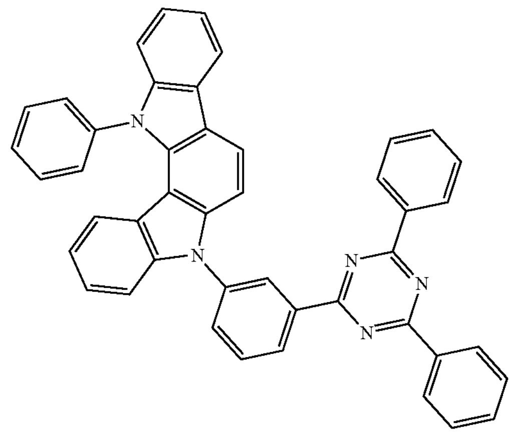
1-343
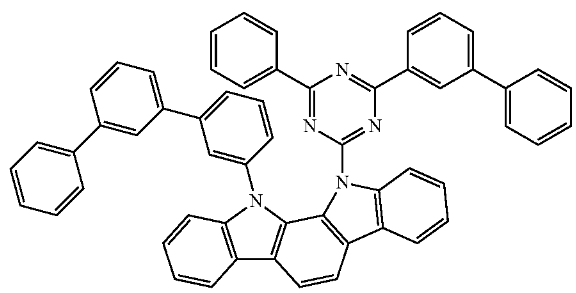
1-344
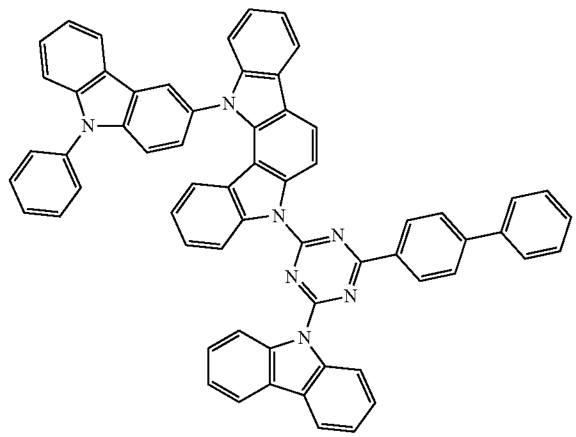
1-345
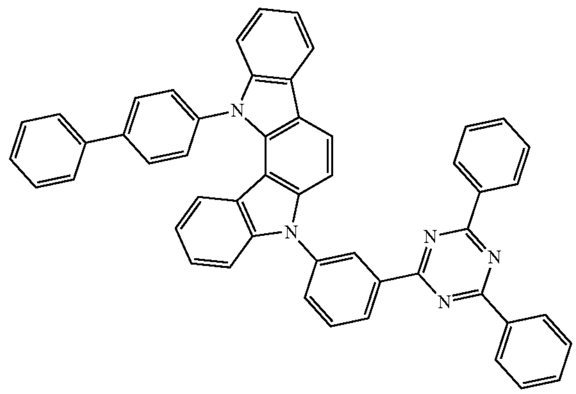

-continued
[C 31]
1-346
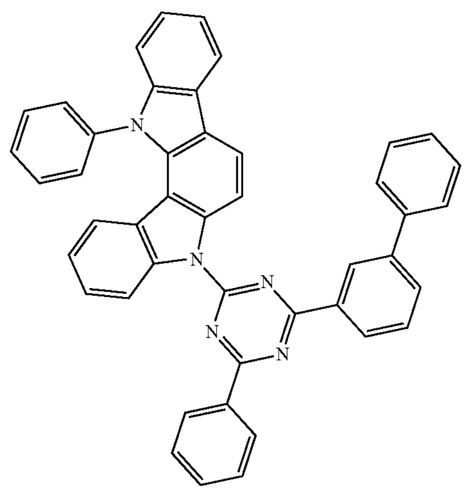
1-347
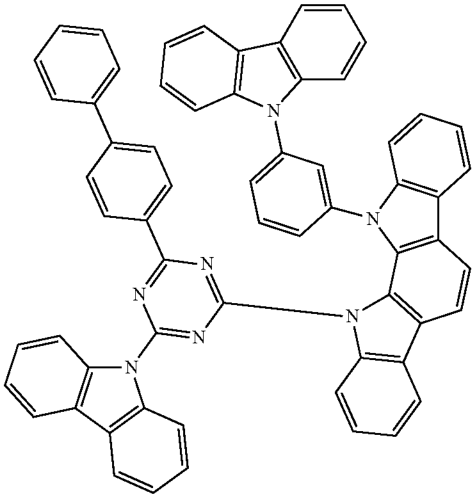
1-348
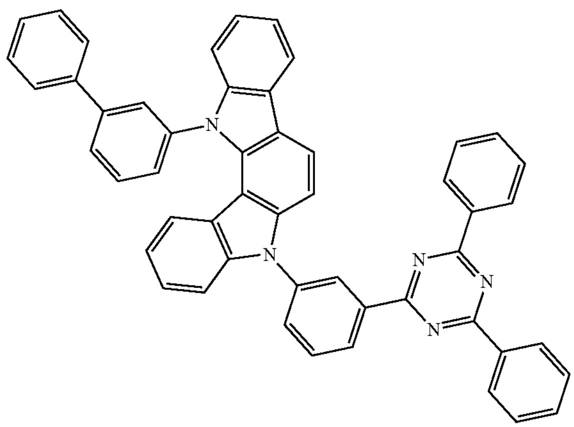
-continued
1-349
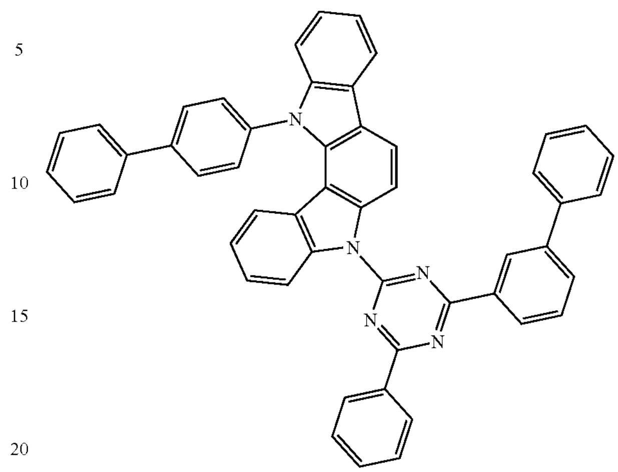
1-350
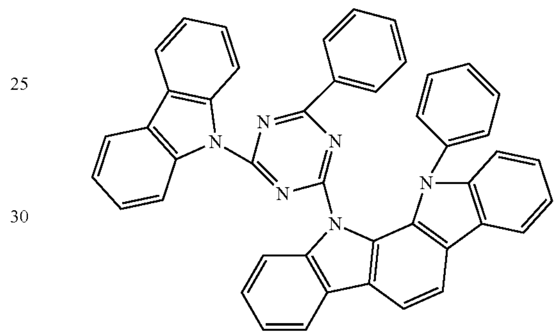
1-351
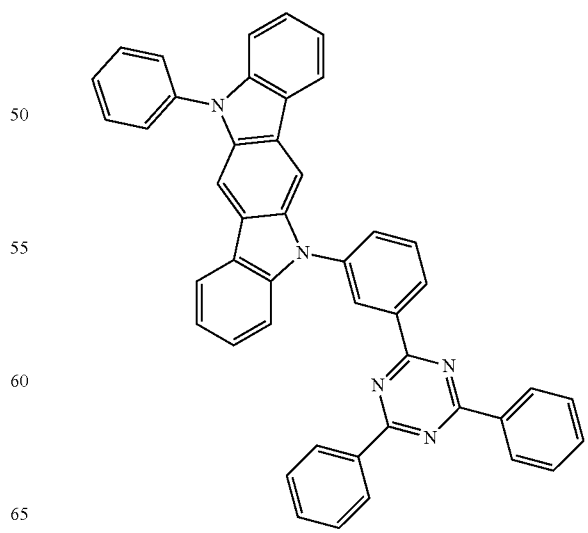

-continued
1-352
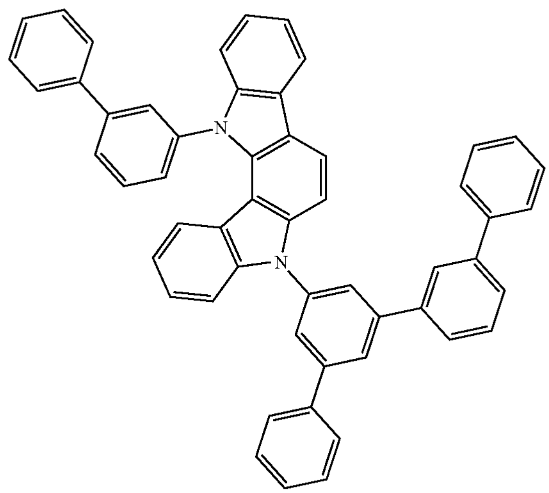
1-353
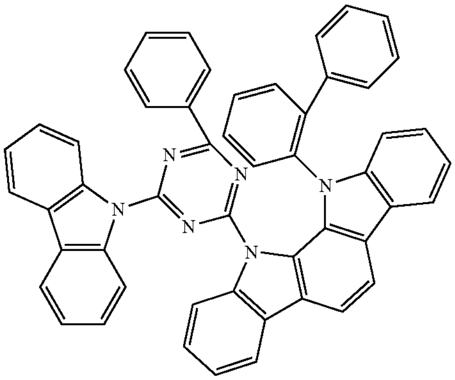
1-354
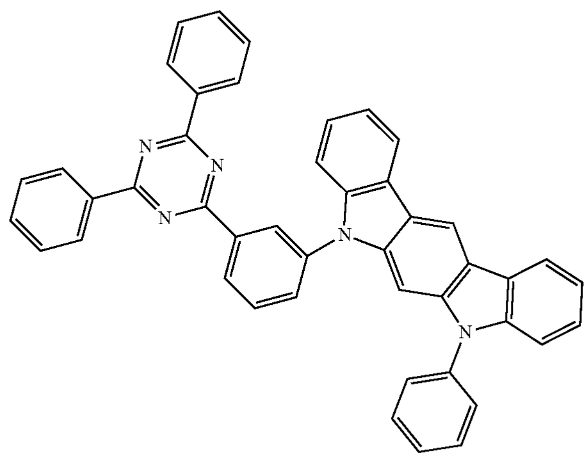
-continued
1-355
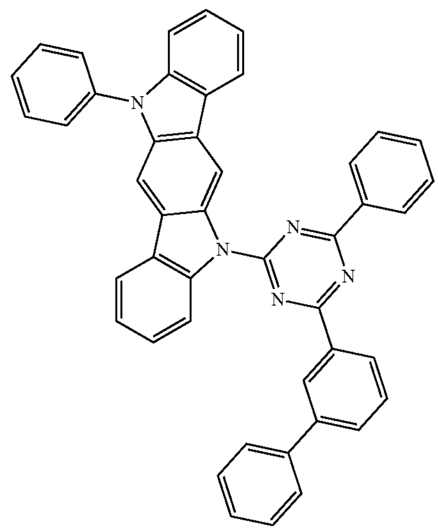
1-356
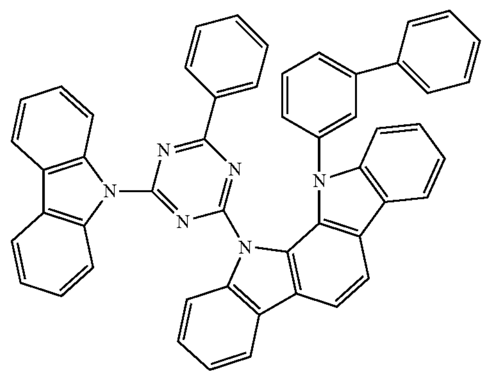
1-357
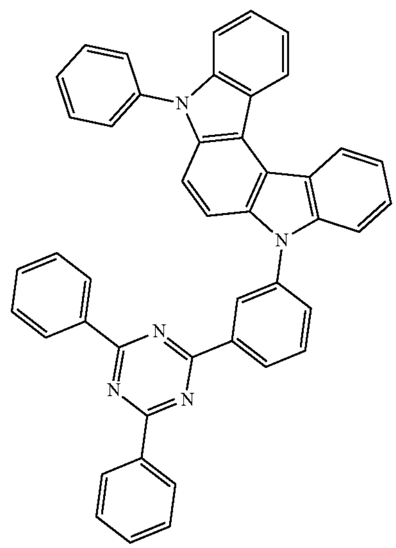

-continued
1-358
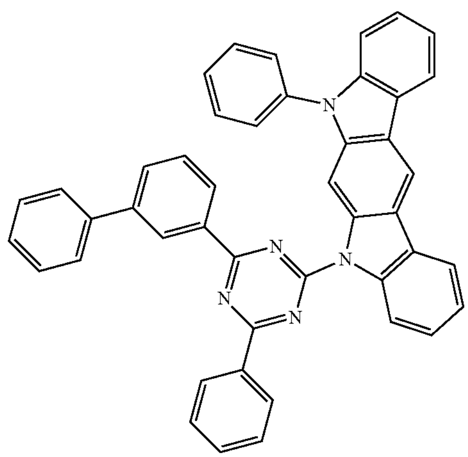
1-359
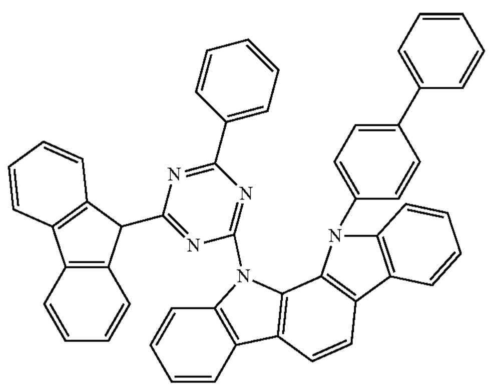
1-360
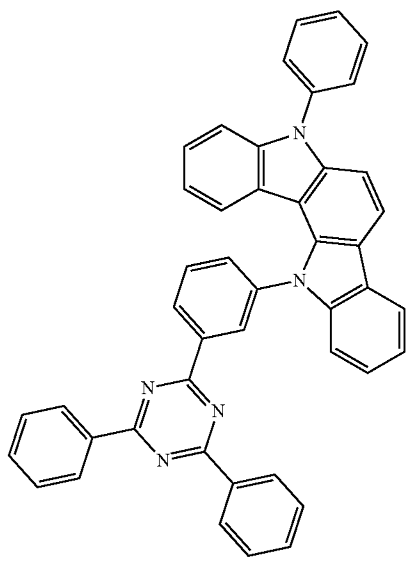
-continued
[C 32]
1-361
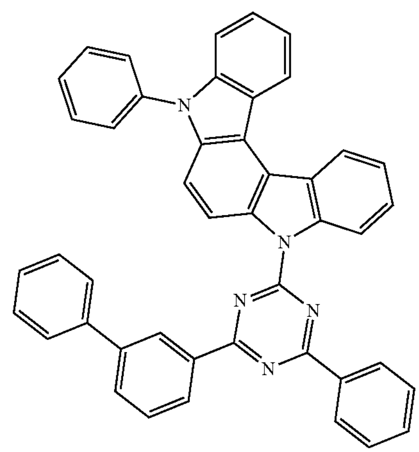
1-362
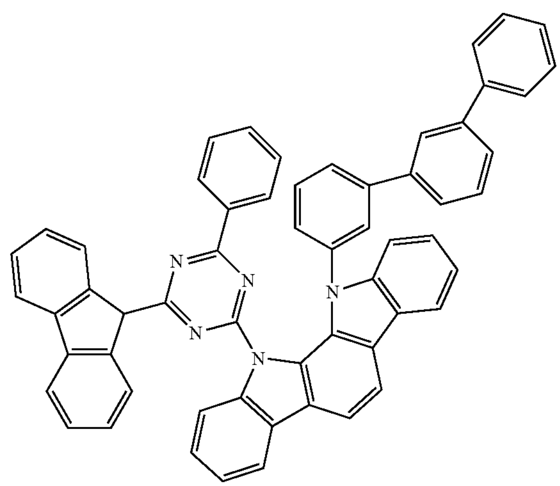
1-363
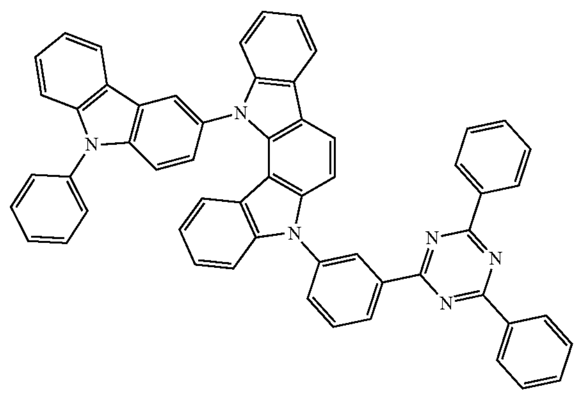

-continued
1-364
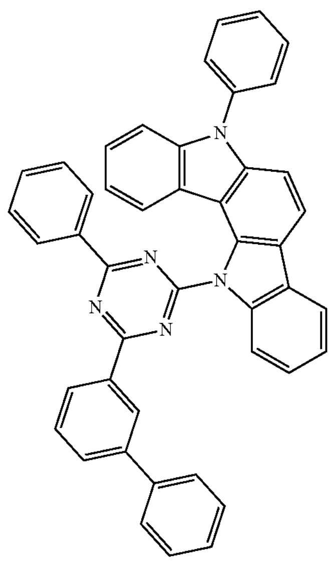
1-365
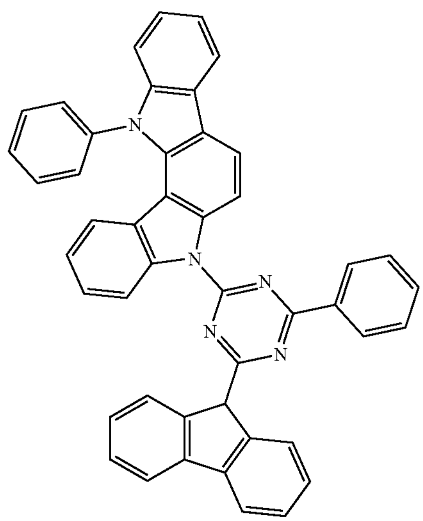
1-366
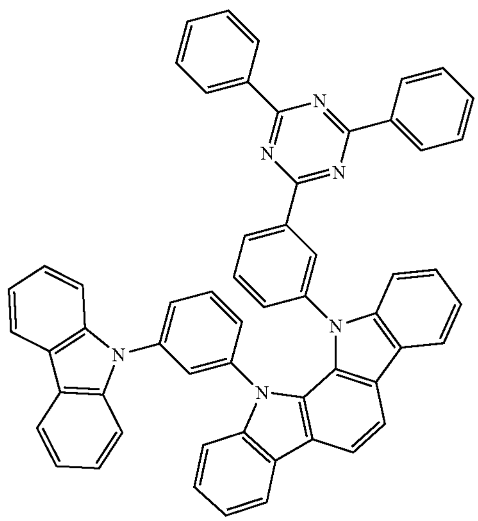
-continued
1-367
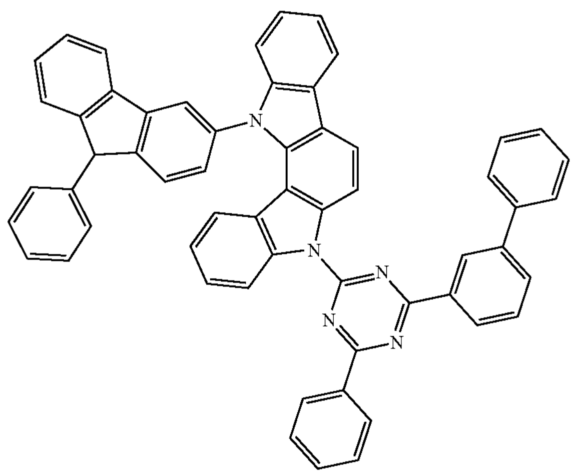
1-368
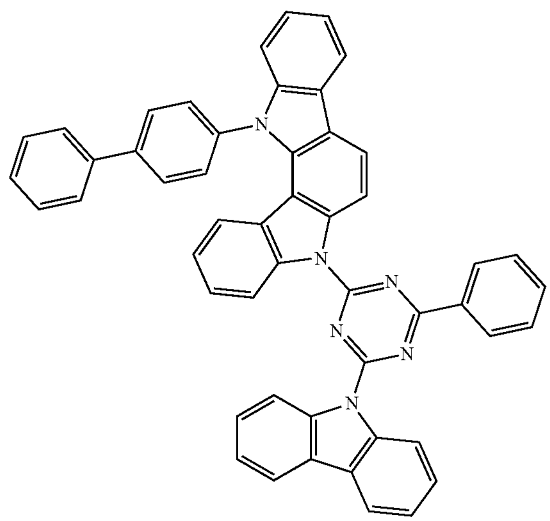
1-369
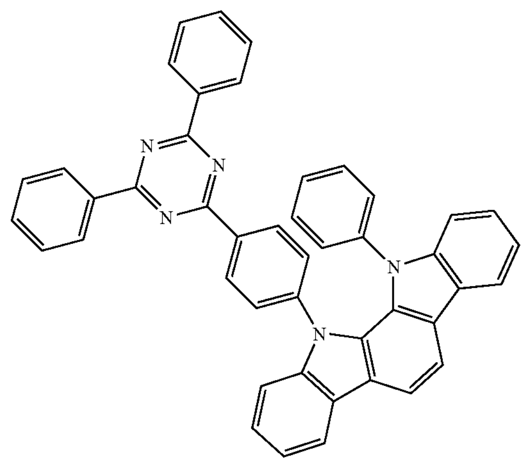

-continued
1-370
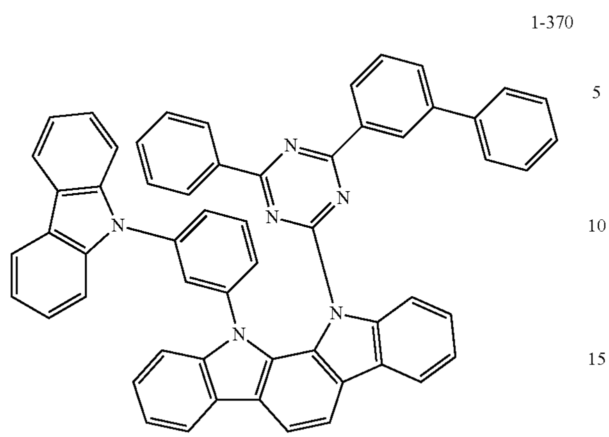
1-371
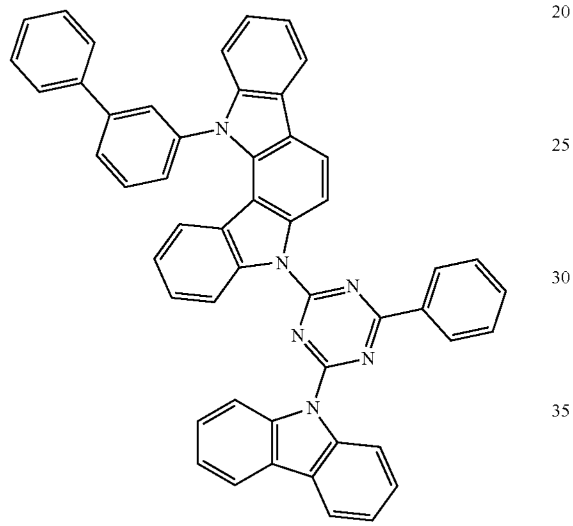
1-372
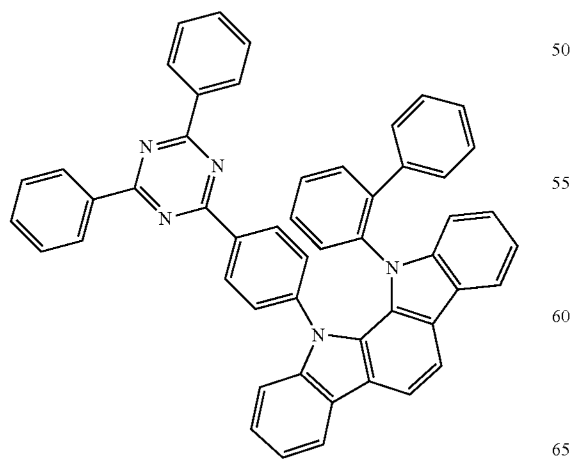
-continued
1-373
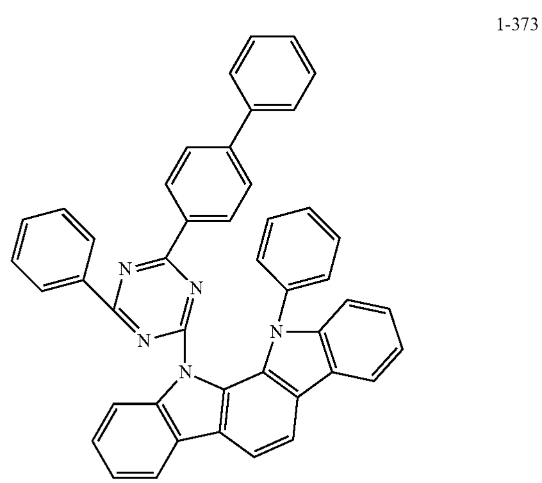
1-374
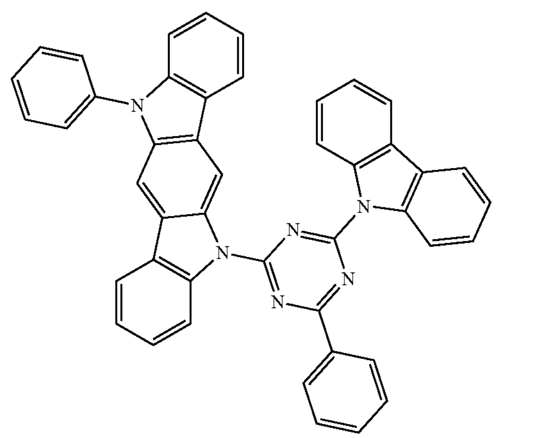
1-375
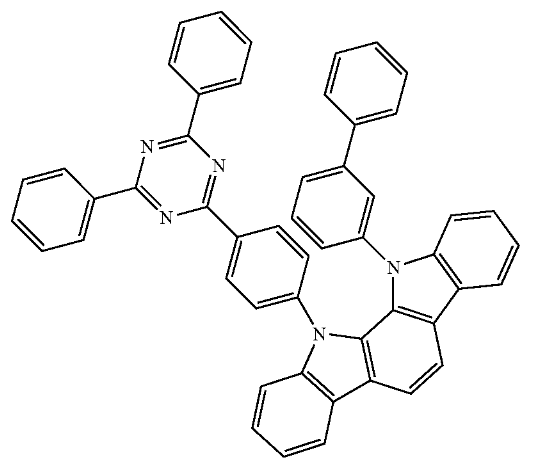

-continued
[C 33]
1-376
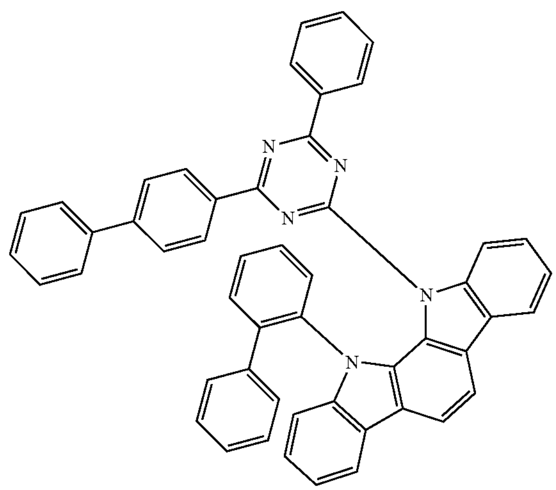
1-377
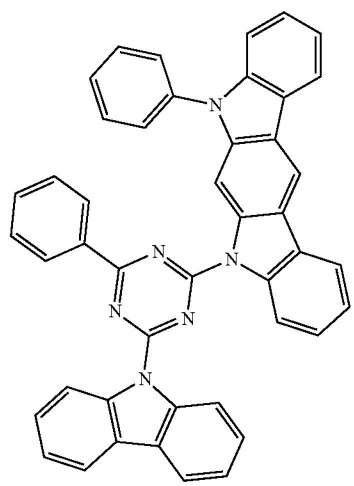
1-378
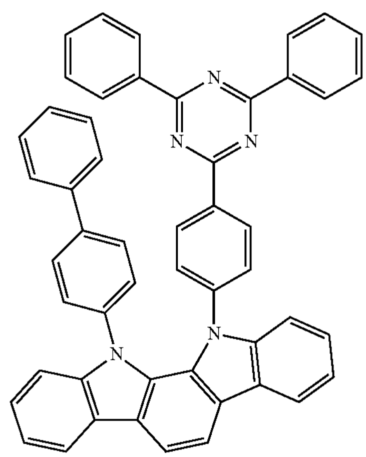
-continued
1-379
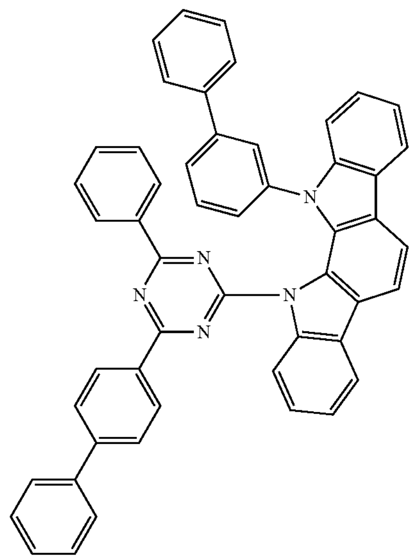
1-380
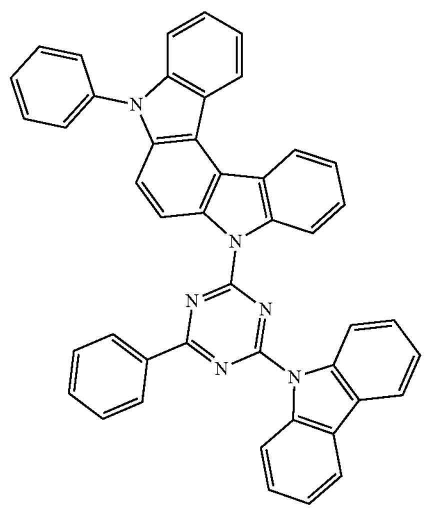
1-381
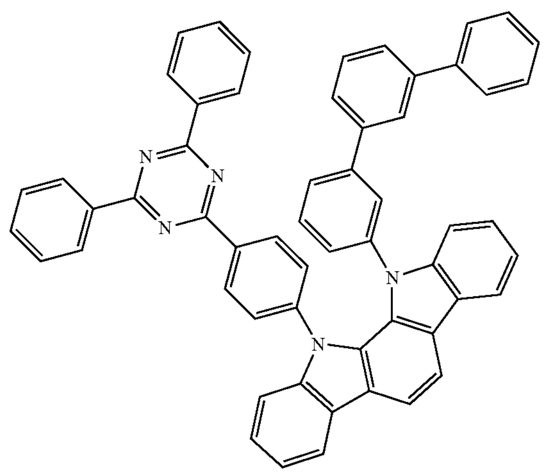

-continued
1-382
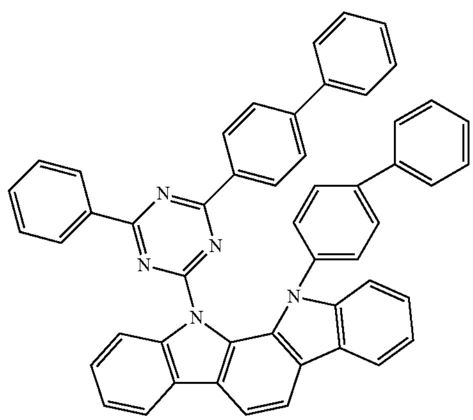
1-383
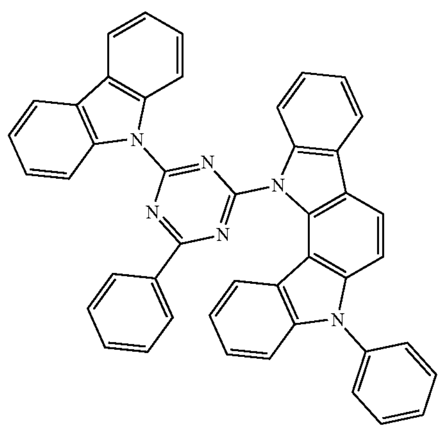
1-384
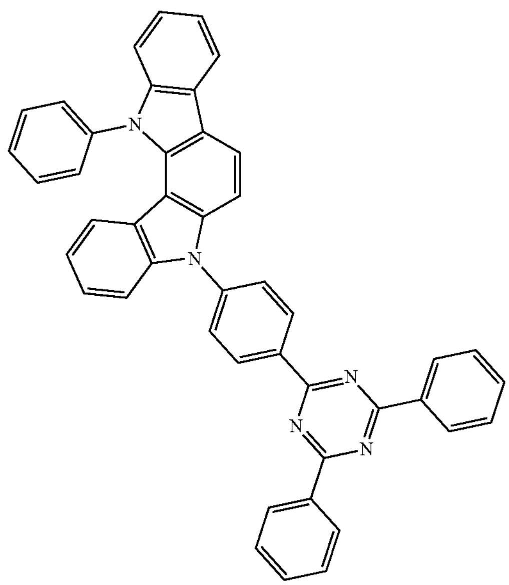
-continued
1-385
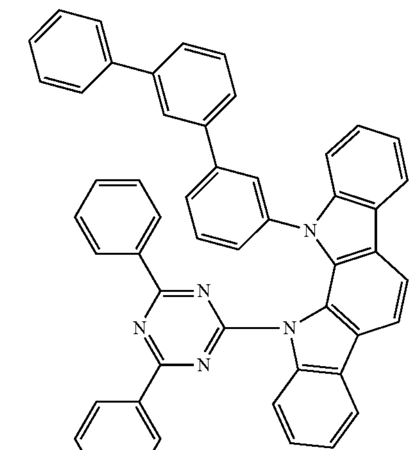
1-386
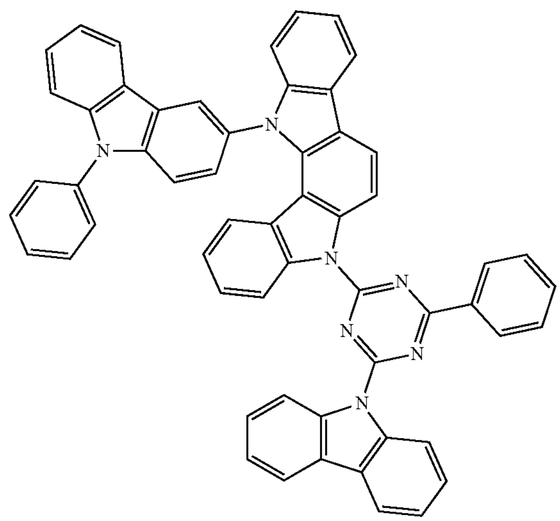
1-387
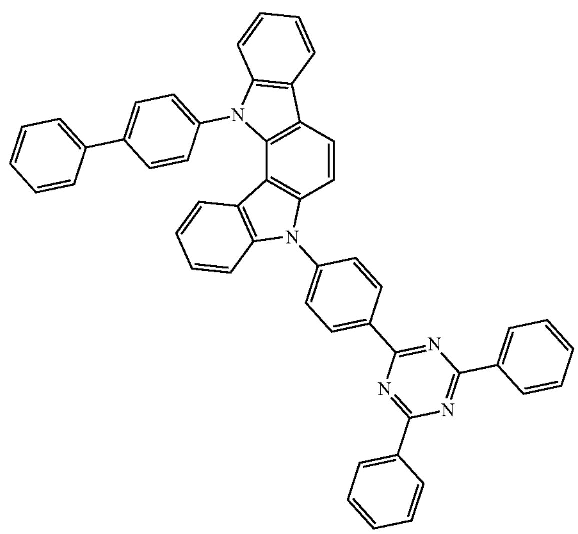

-continued
1-388
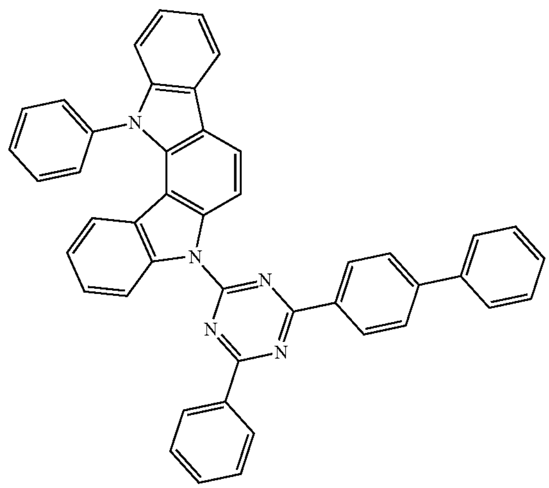
1-389
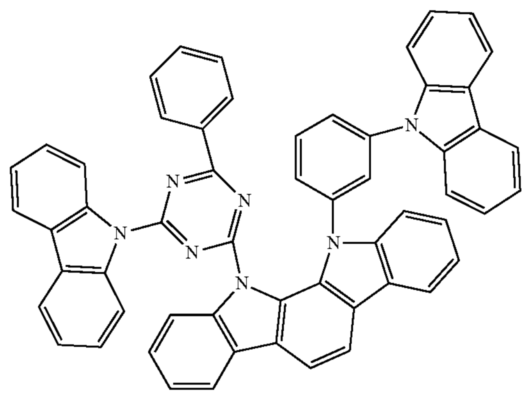
1-390
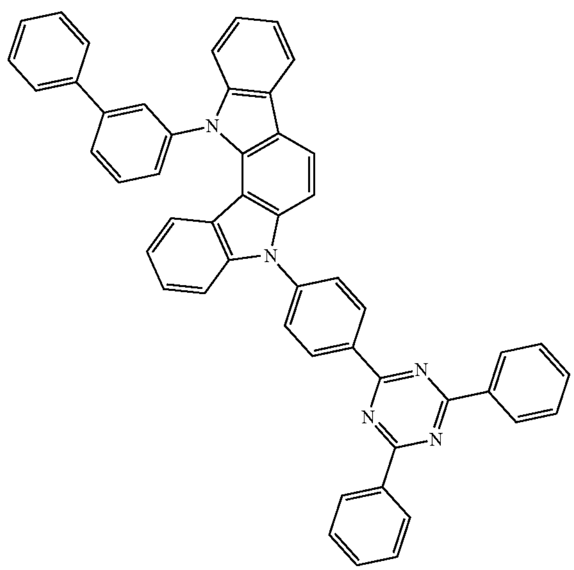
-continued
[C 34]
1-391
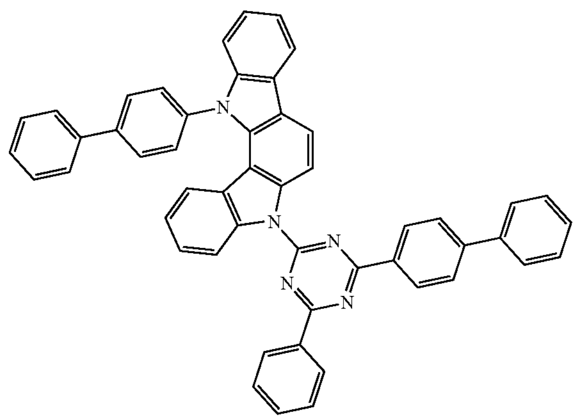
1-392
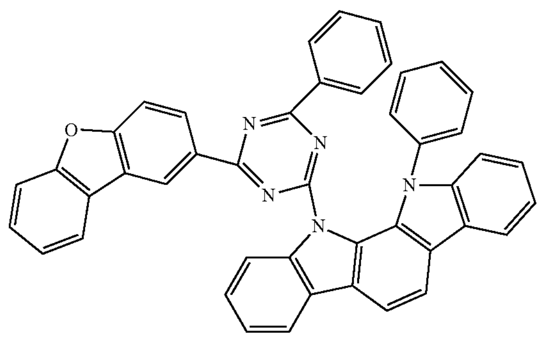
1-393
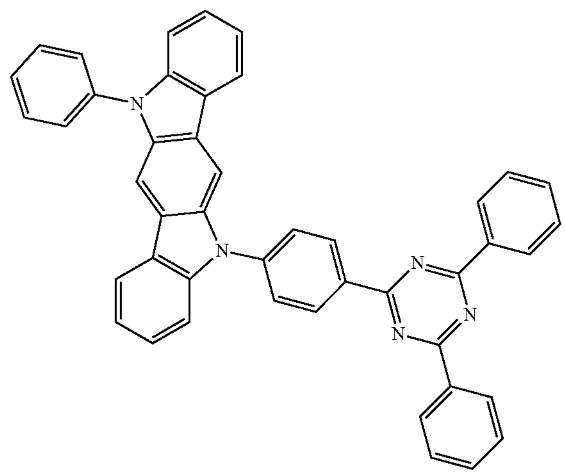

-continued
1-394
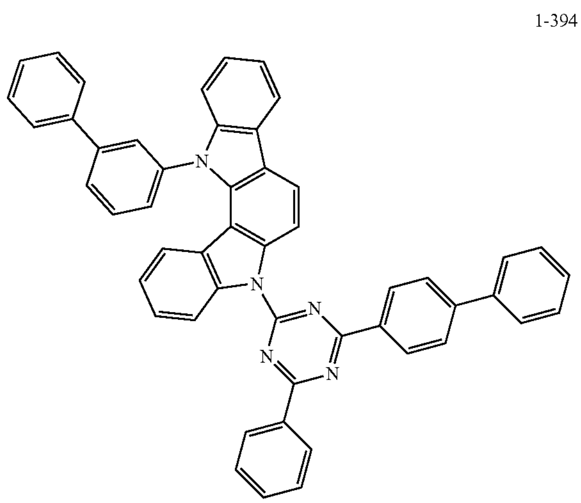
1-395
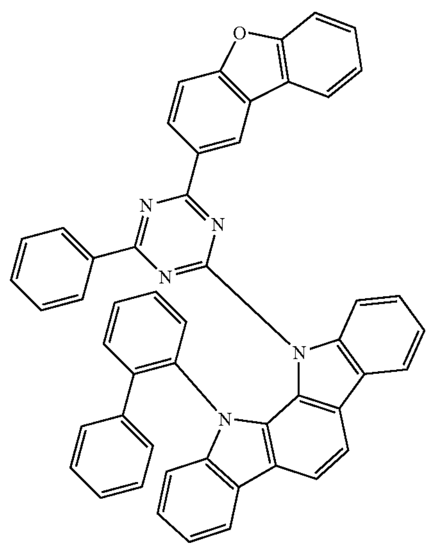
1-396
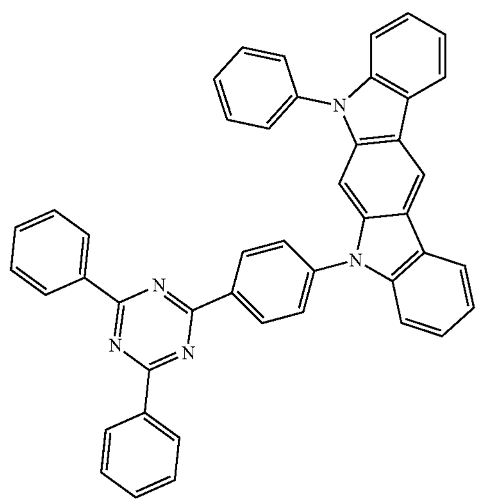
-continued
1-397
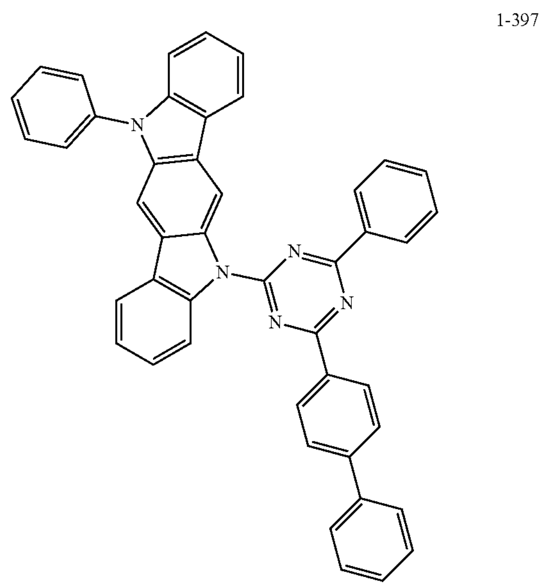
1-398
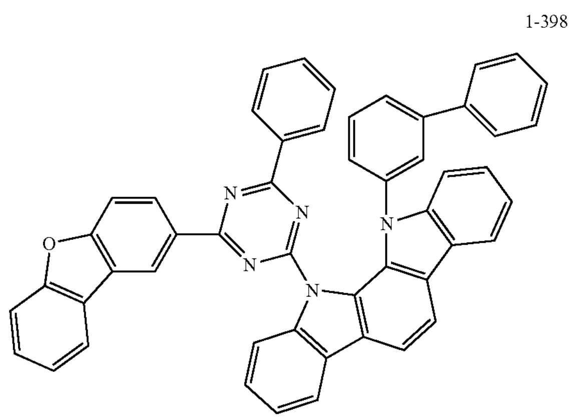
1-399
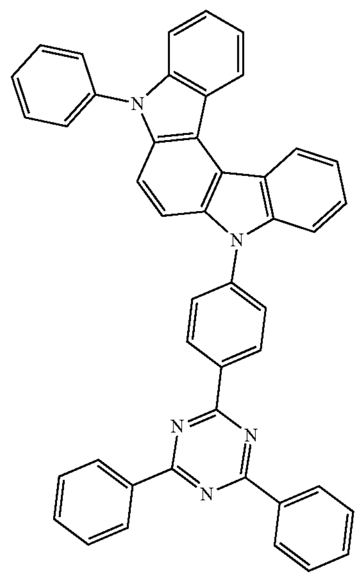

-continued
1-400
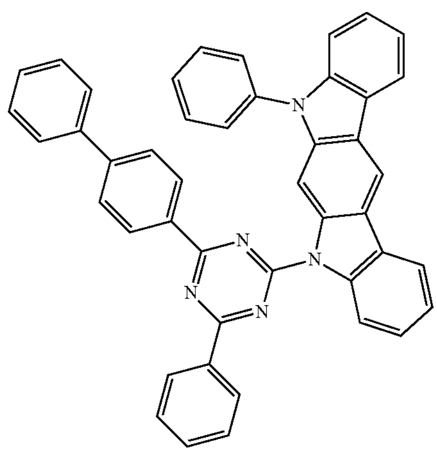
1-401
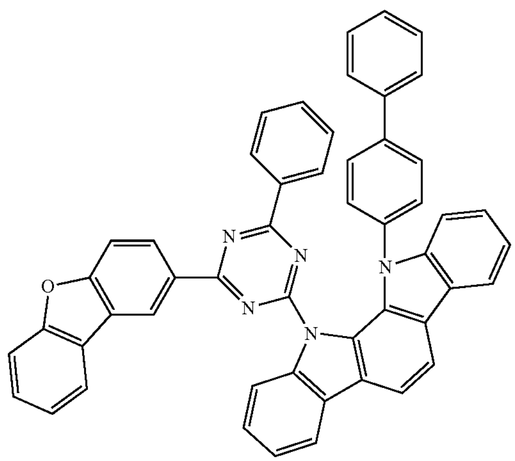
1-402
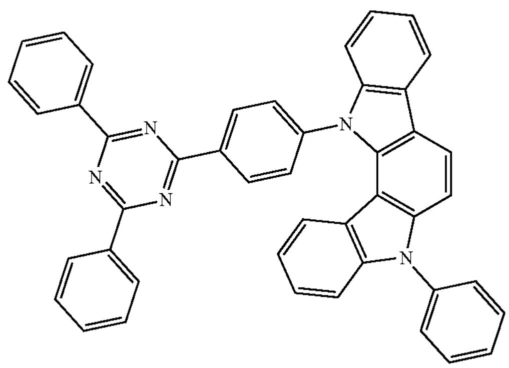
-continued
1-403
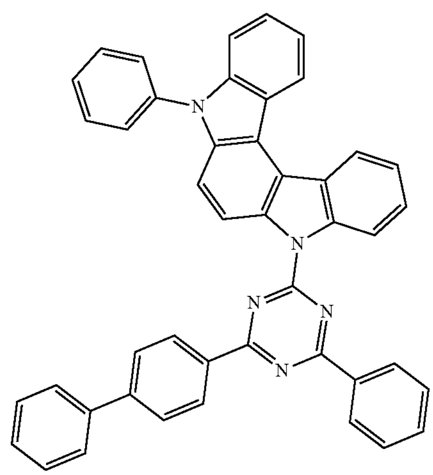
1-404
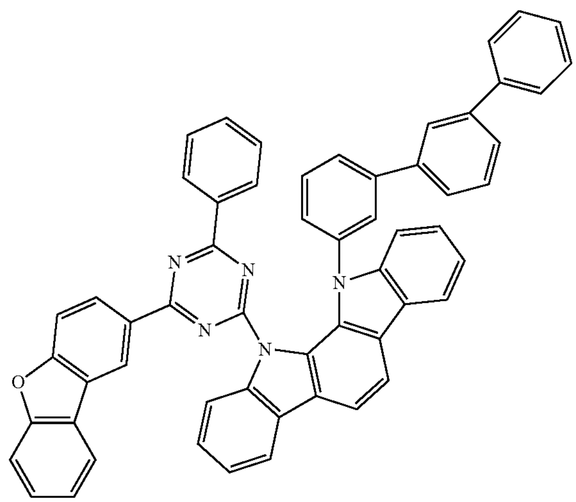
1-405
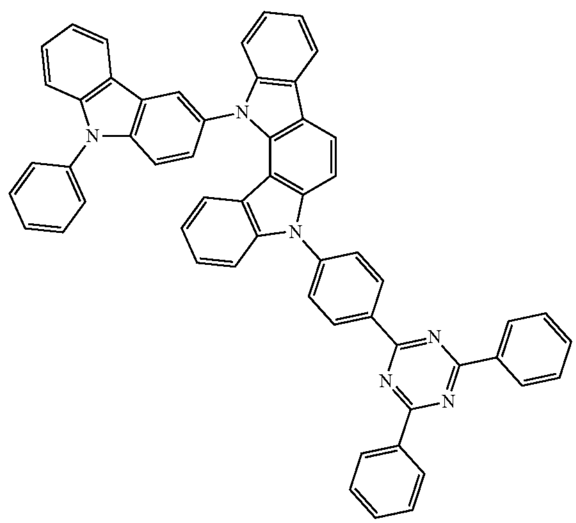

-continued
[C 35]
1-406
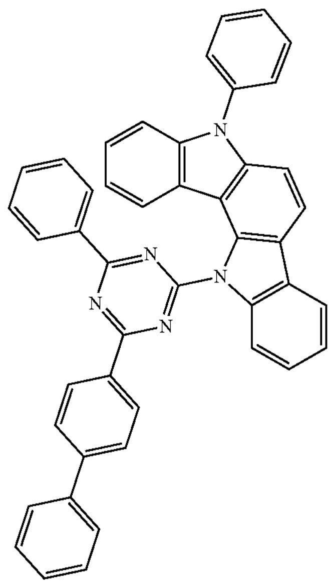
1-407
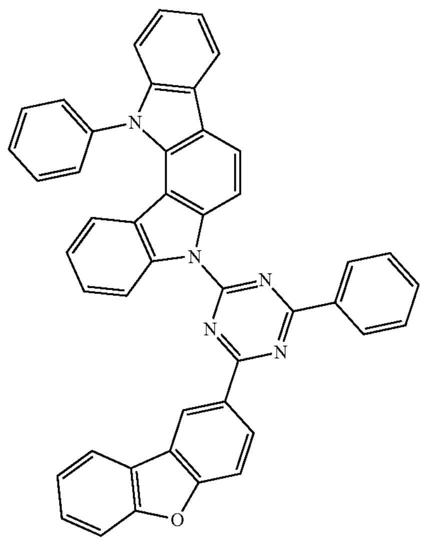
1-408
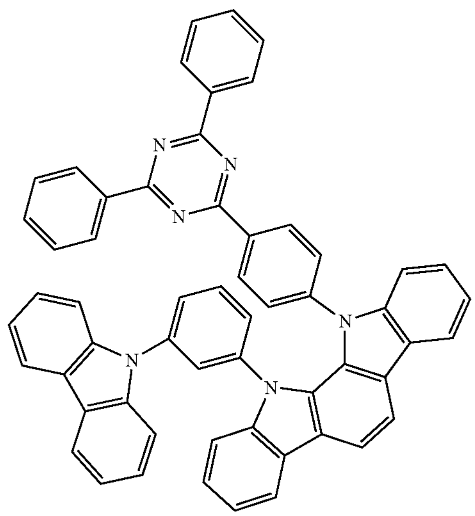
-continued
1-409
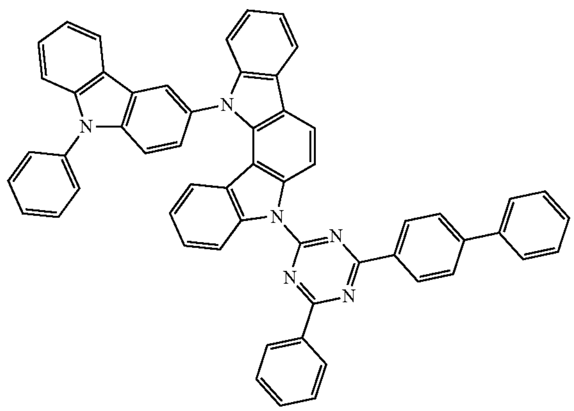
1-410
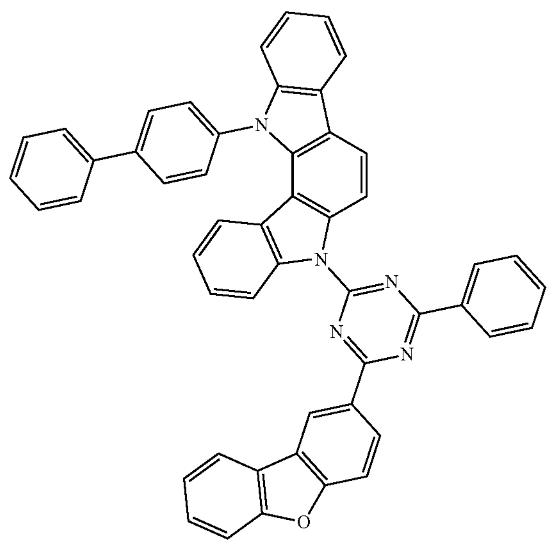
1-411
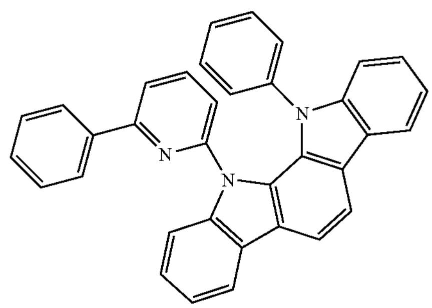

-continued
1-412
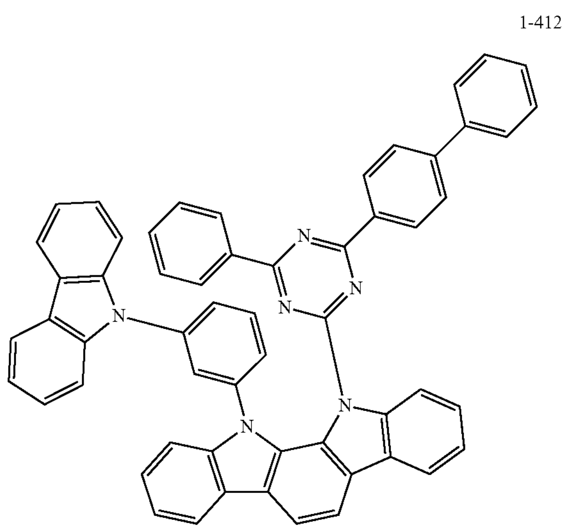
1-413
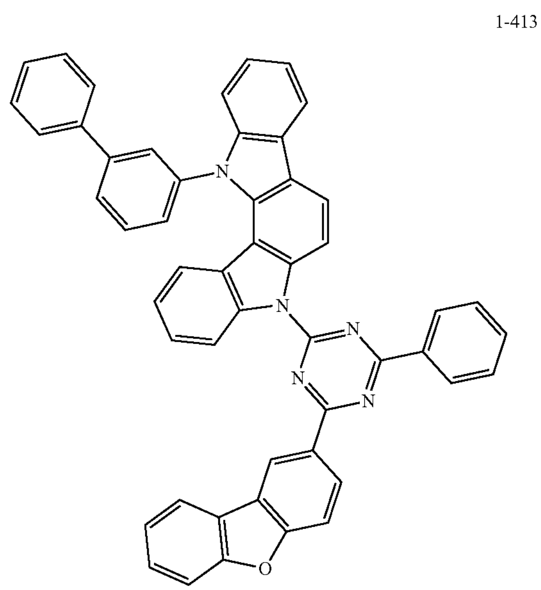
1-414
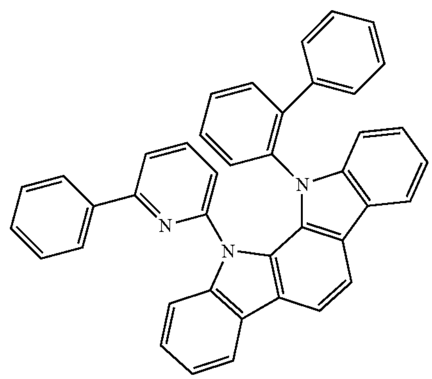
-continued
1-415
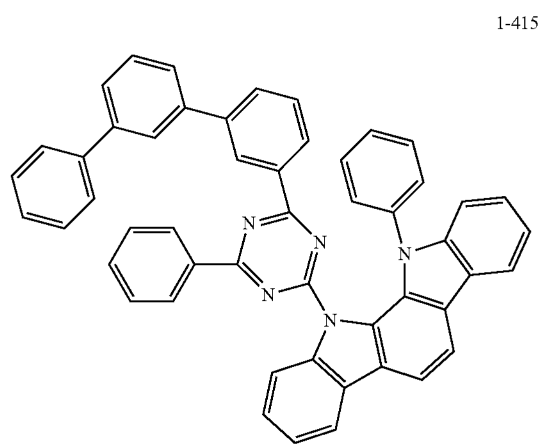
1-416
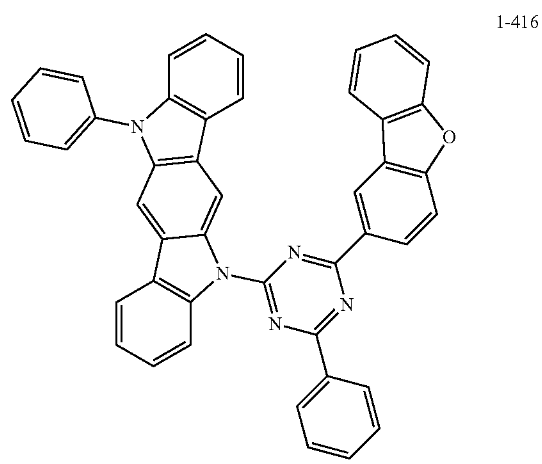
1-417
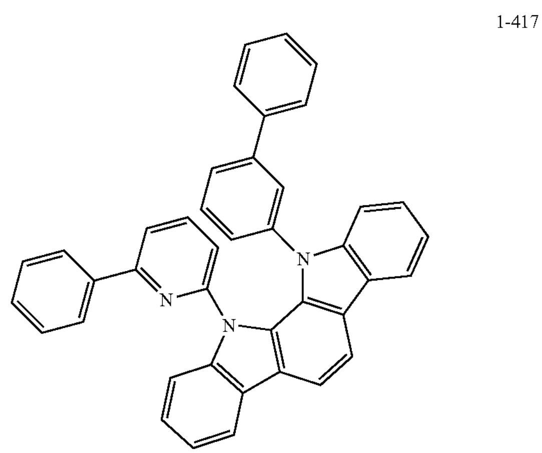

-continued
1-418
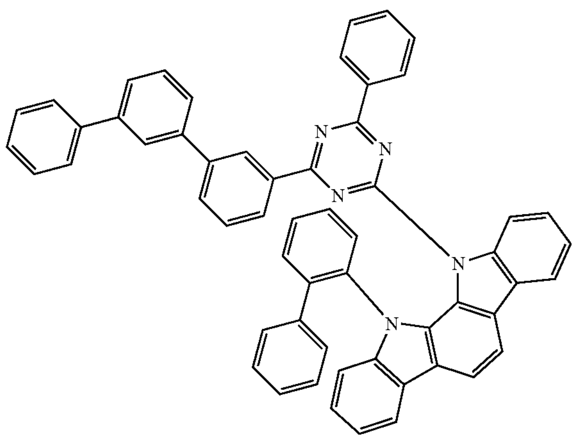
1-419
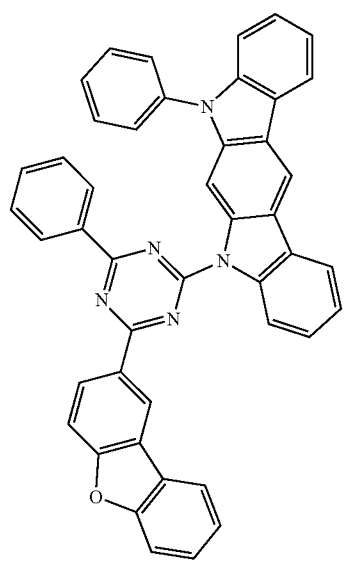
1-420
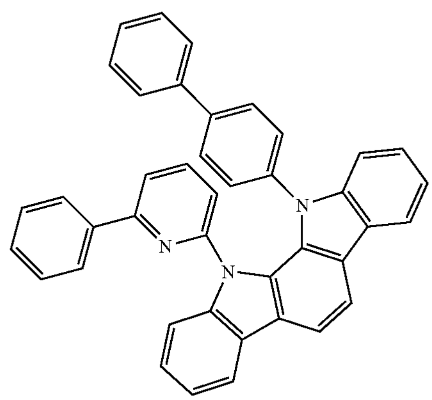
-continued
[C 36]
1-421
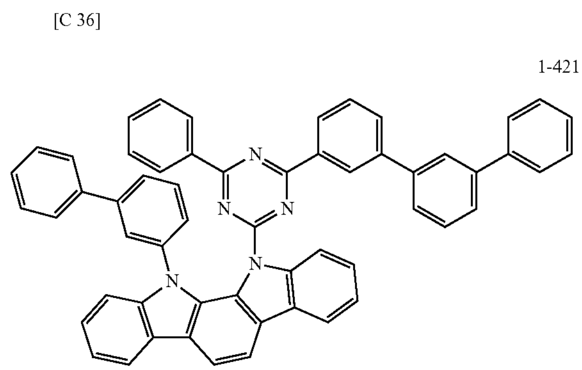
1-422
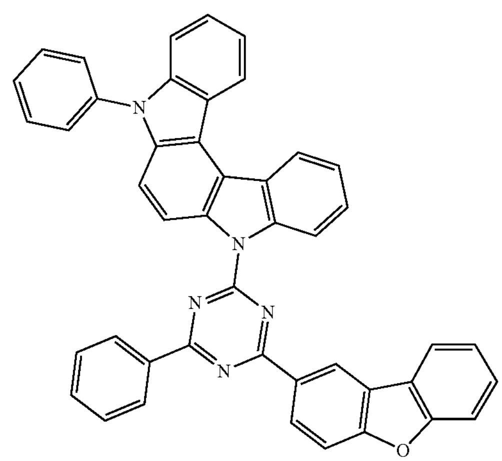
1-423
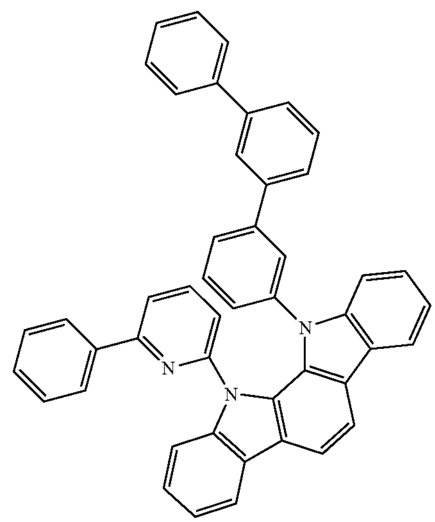

-continued
1-424
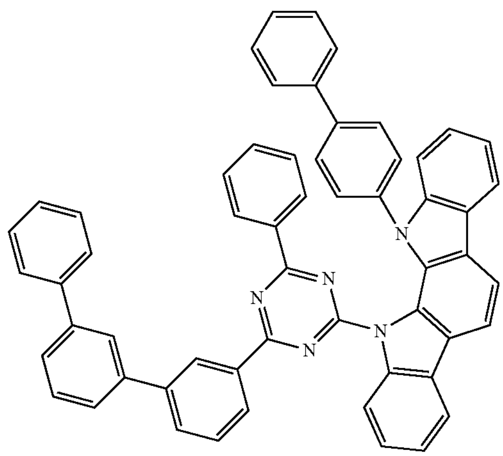
1-425
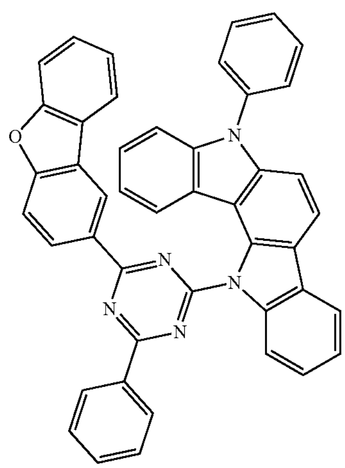
1-426
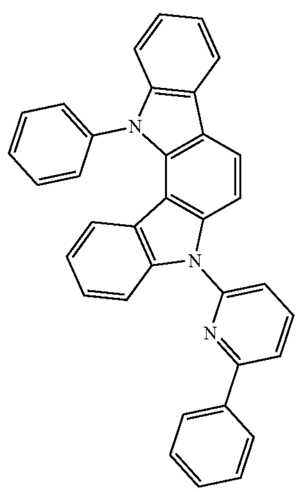
-continued
1-427
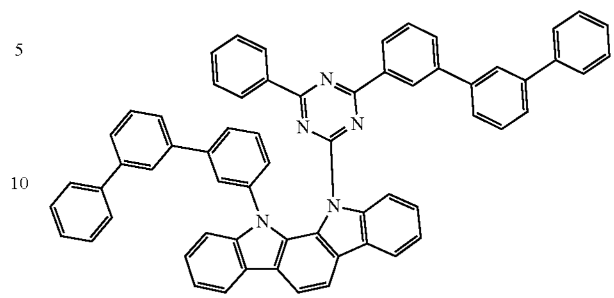
1-428
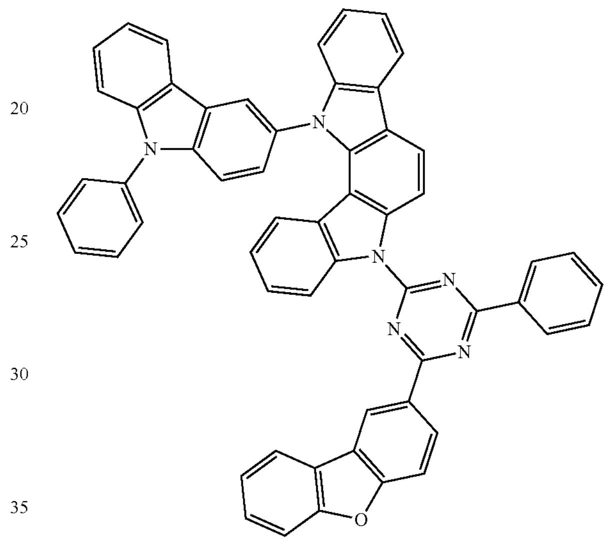
1-429
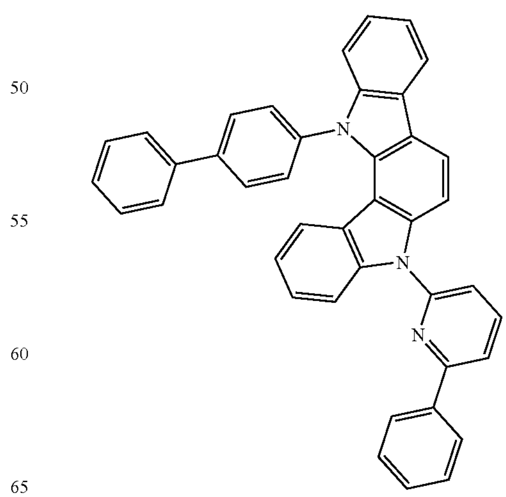

-continued
1-430
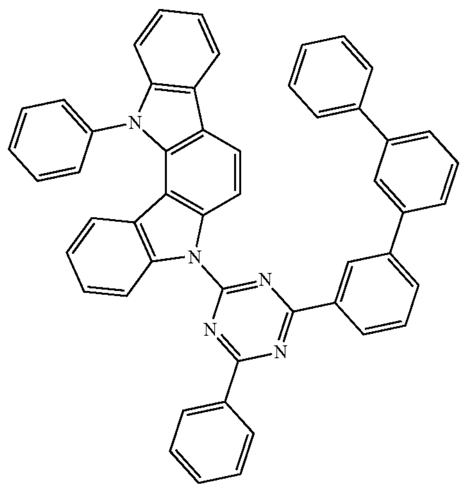
1-431
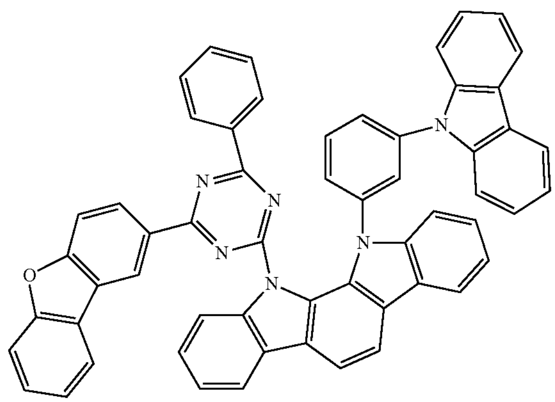
1-432
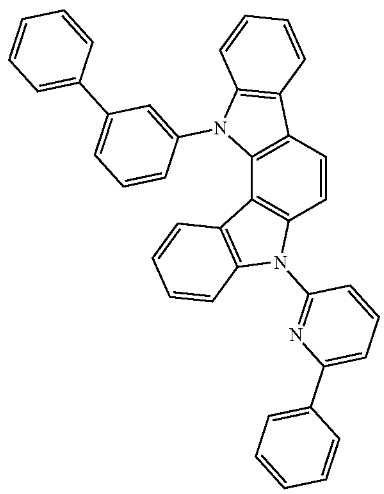
-continued
1-433
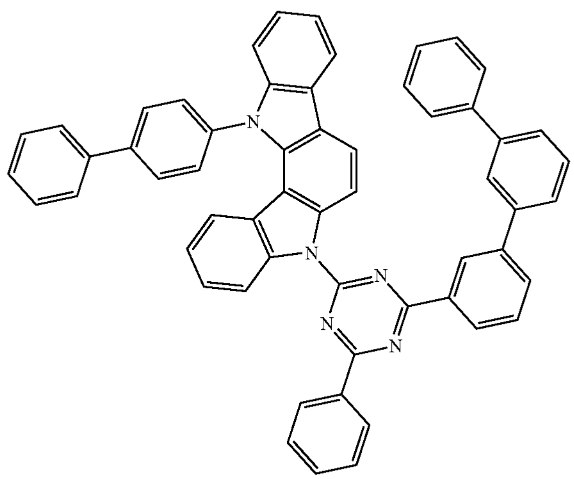
1-434
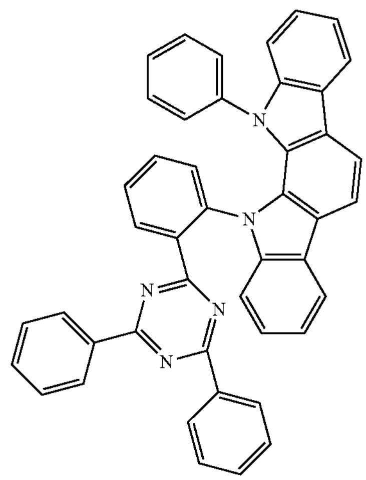
1-435
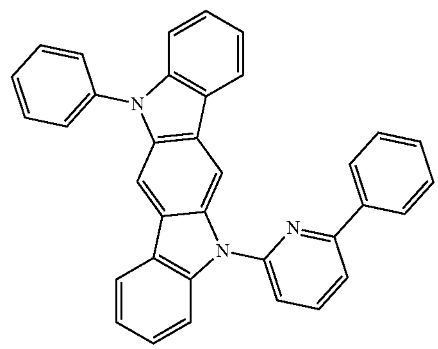

-continued
[C 37]
1-436
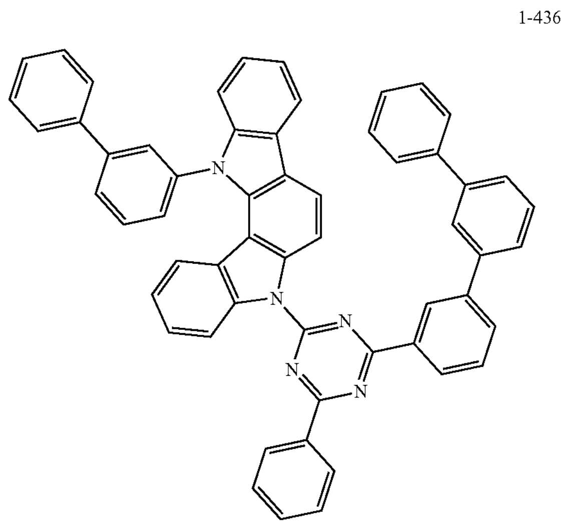
1-437
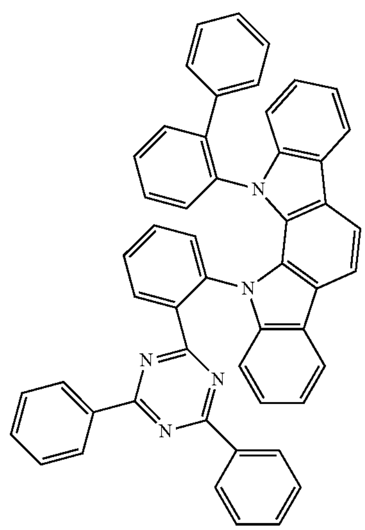
1-438
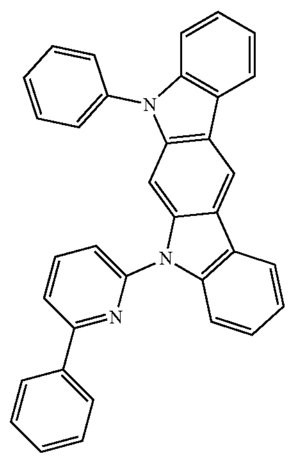
-continued
1-439
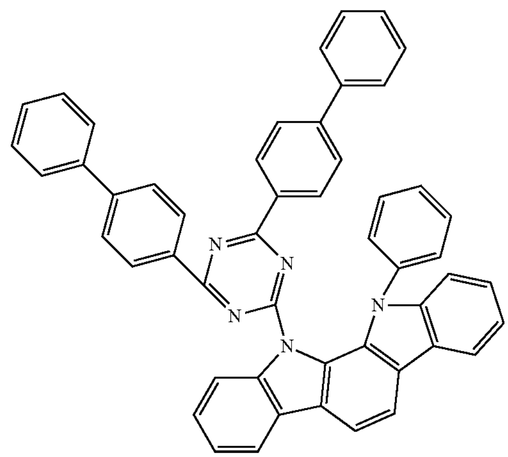
1-440
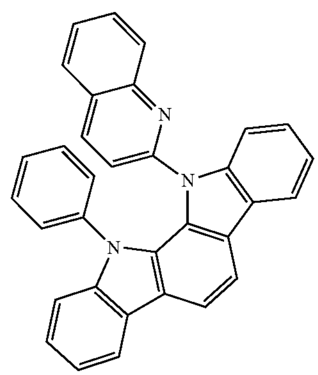
1-441
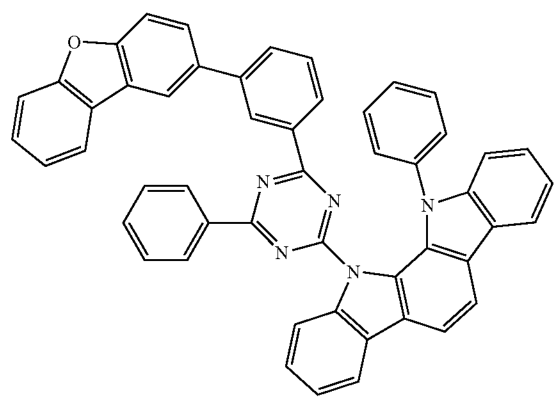

-continued
1-442
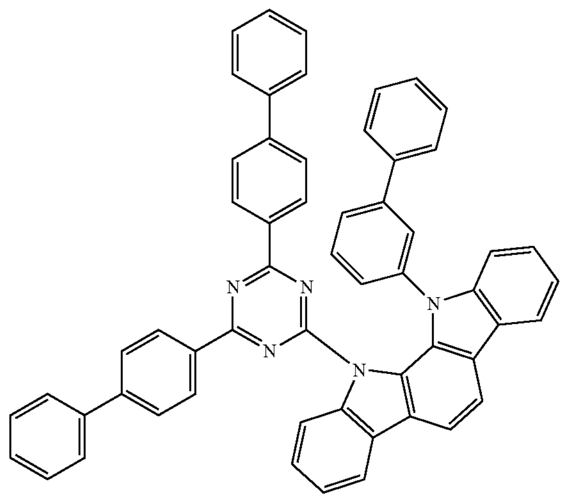
1-443
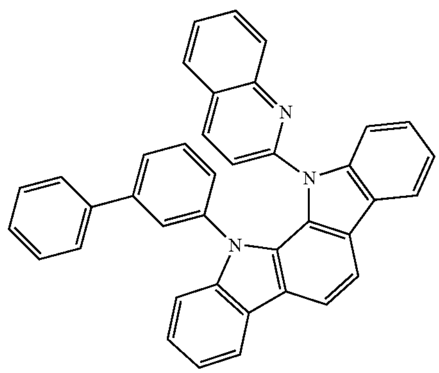
1-444
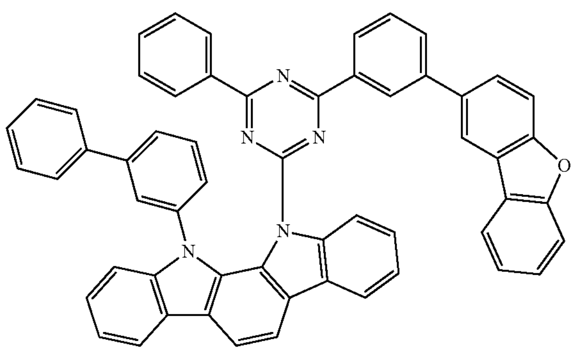
-continued
1-445
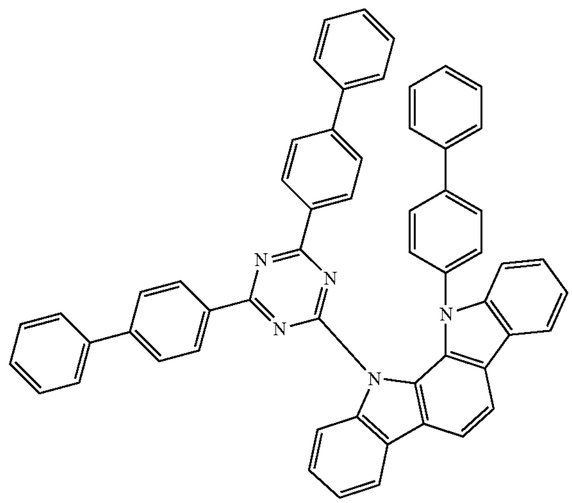
1-446
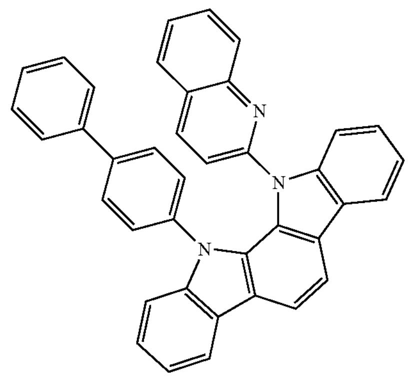
1-447
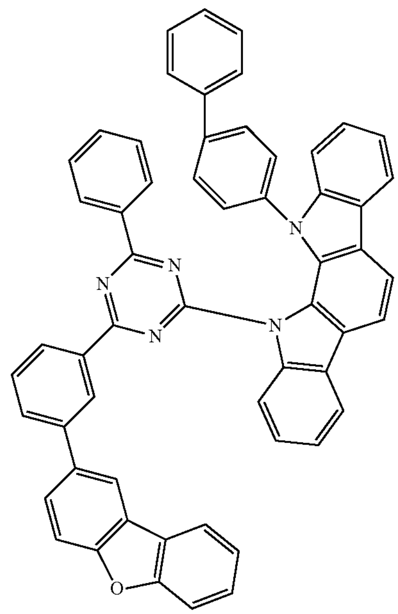

-continued
1-448
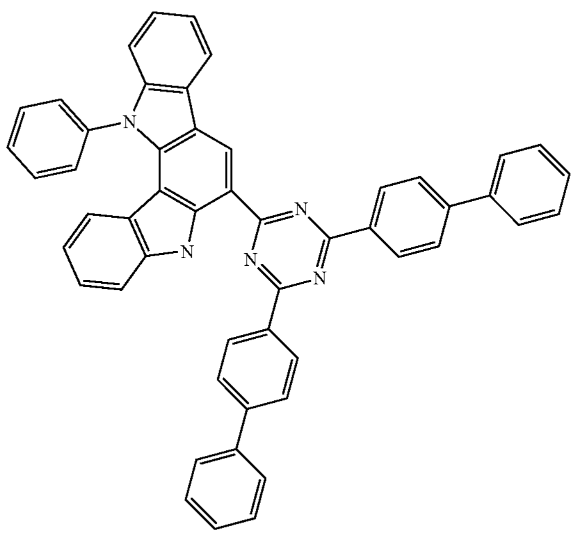
1-449
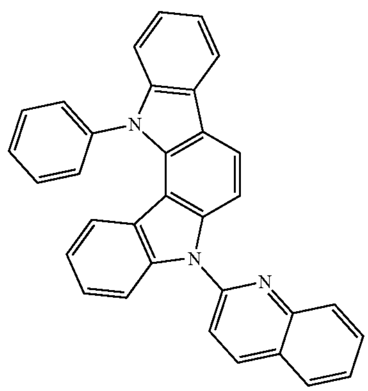
1-450
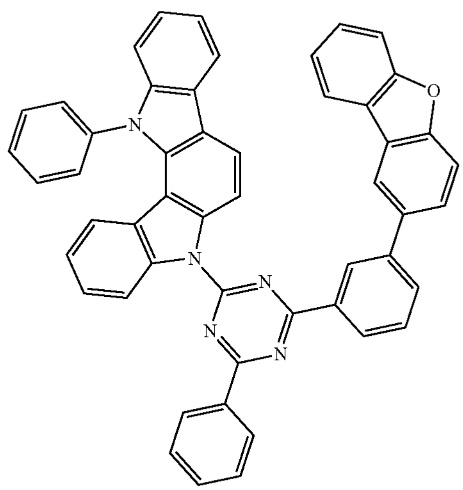
[C 38]
1-451
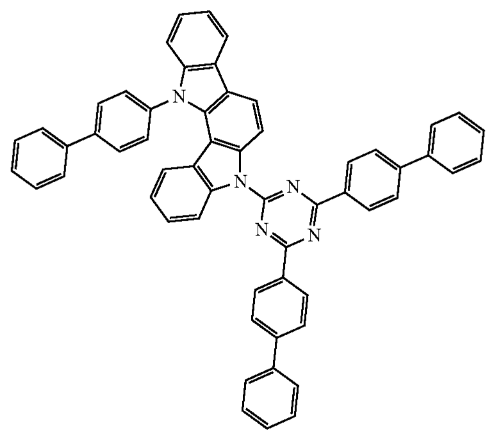
1-452
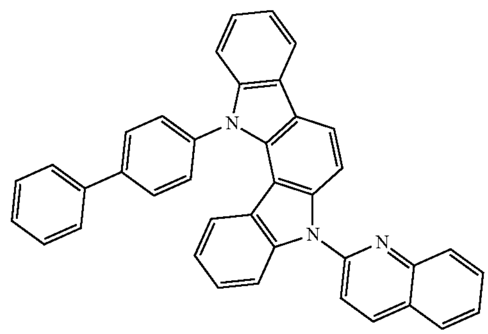
1-453
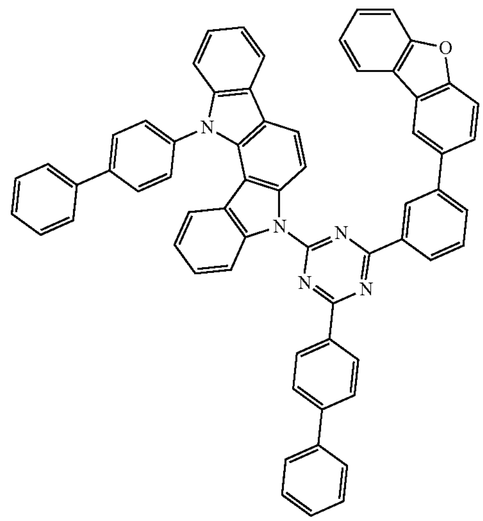

-continued
1-454
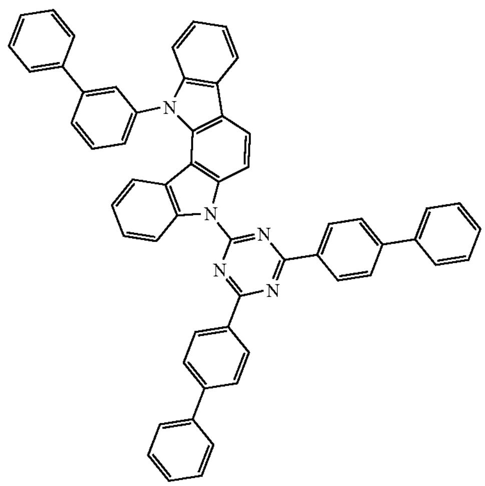
1-455
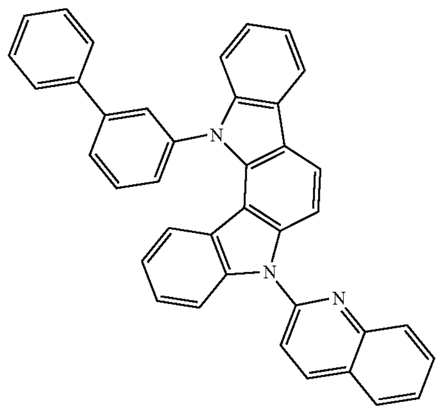
1-456
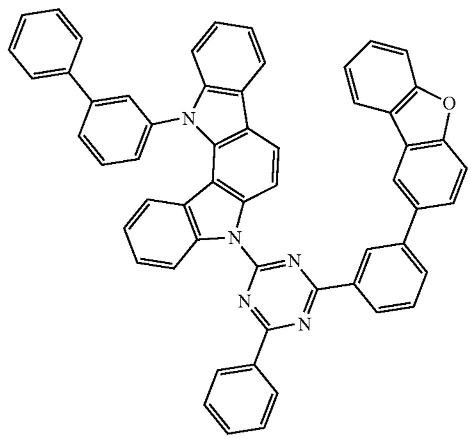
-continued
1-457
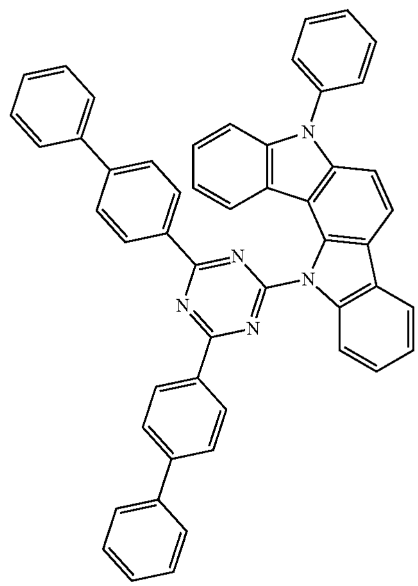
1-458
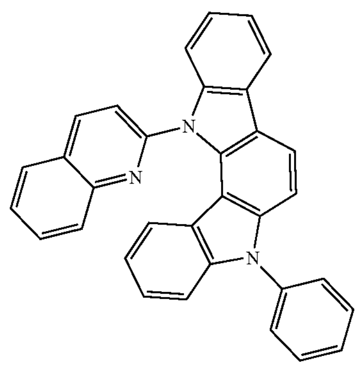
1-459
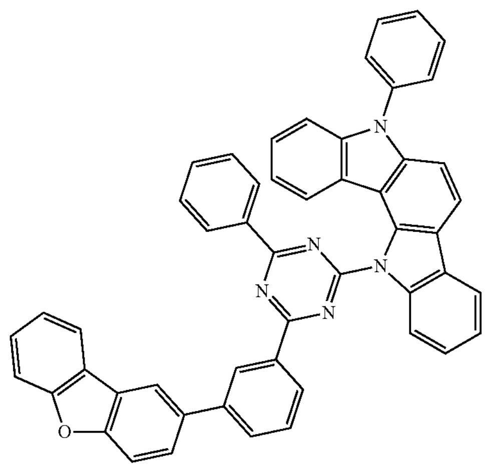

-continued
1-460
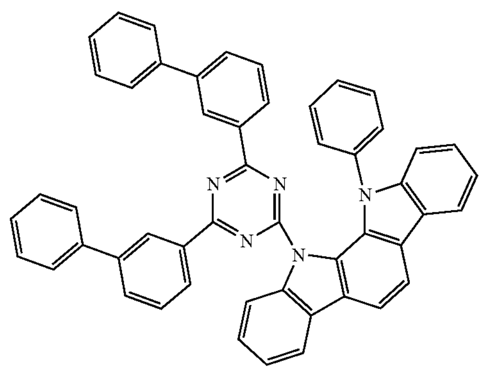
1-461
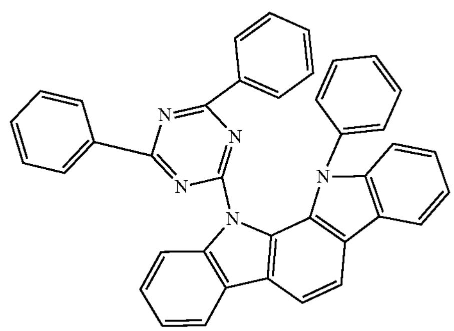
1-462
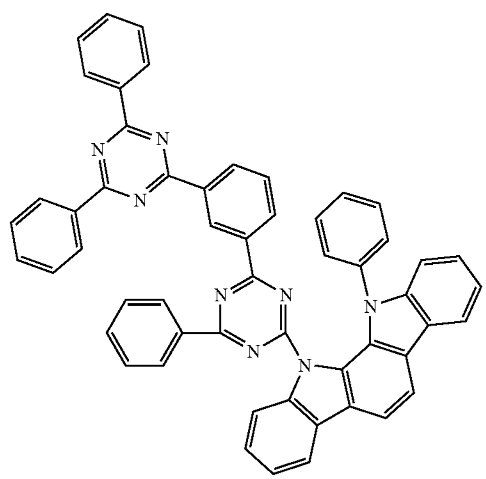
1-463
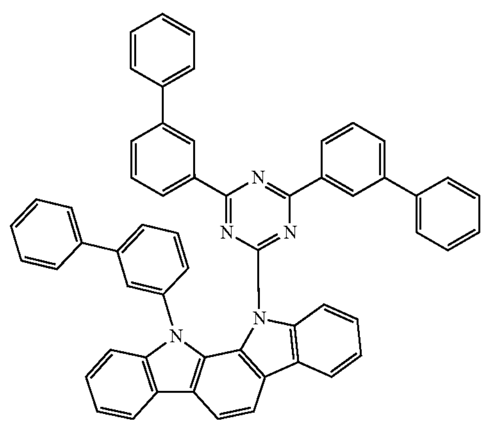
-continued
1-464
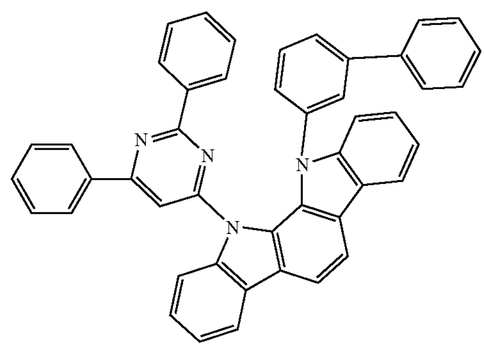
1-465
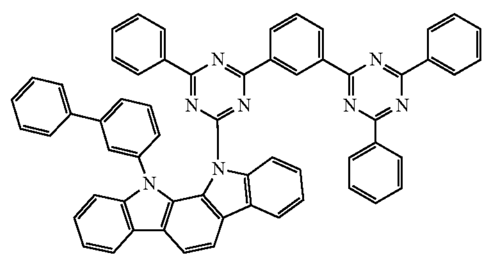
[C 39]
1-466
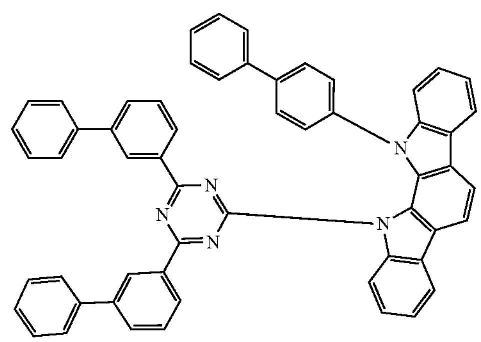
1-467
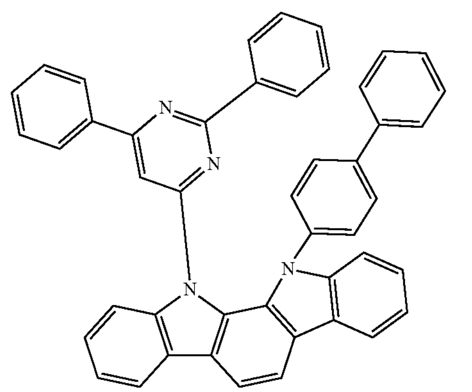

-continued
1-468
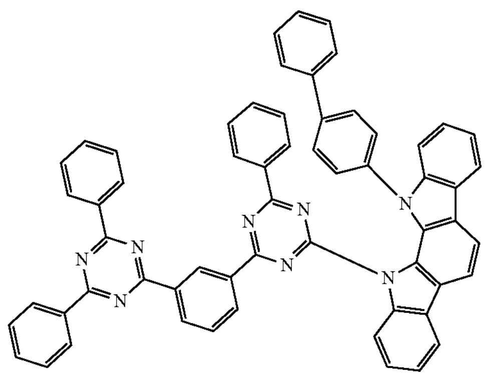
1-469
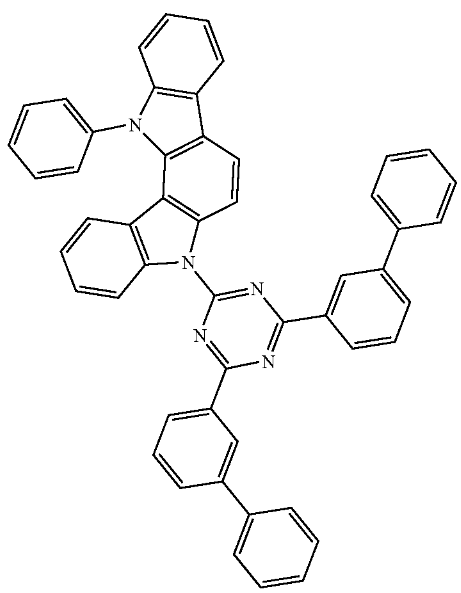
1-470
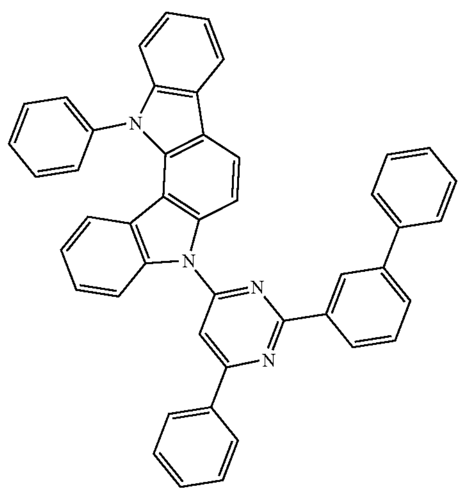
-continued
1-471
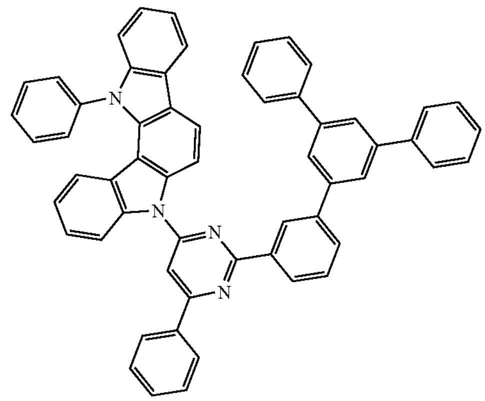
1-472
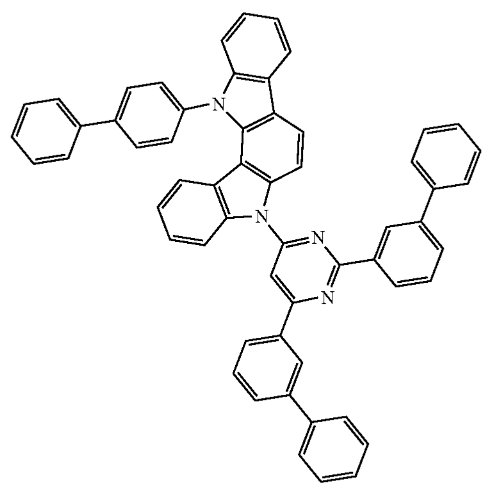
1-473
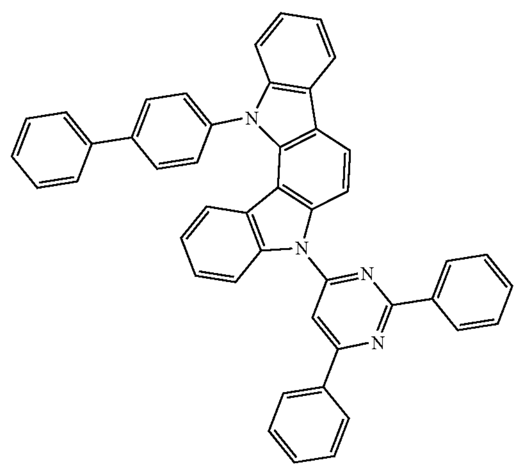

-continued
1-474
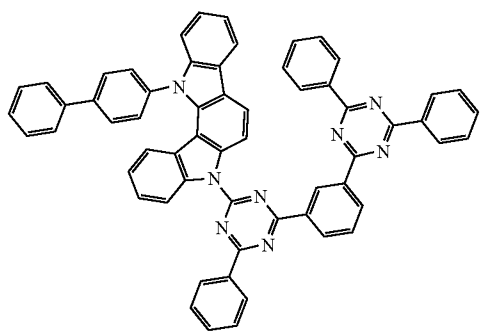
1-475
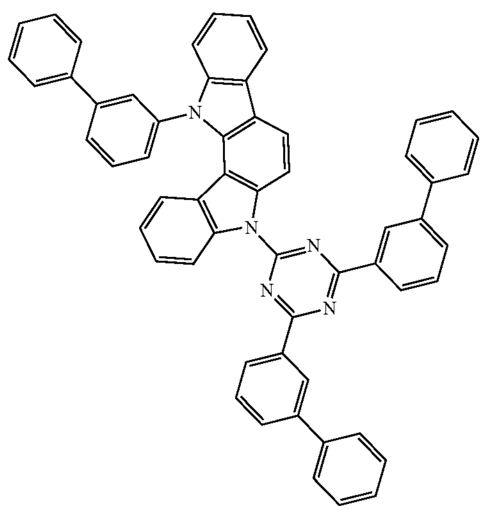
1-476
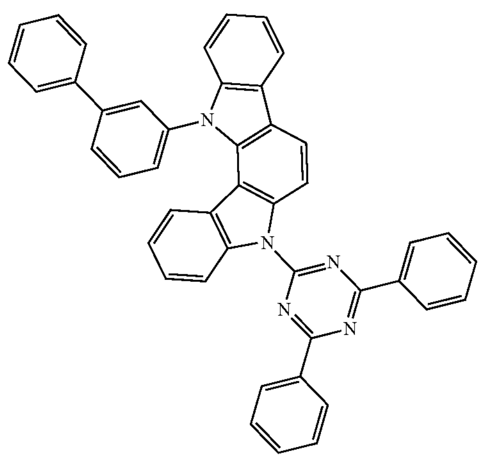
-continued
1-477
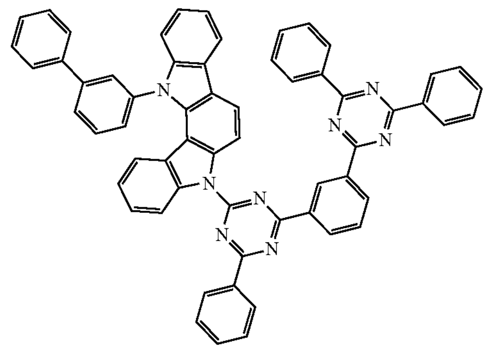
1-478
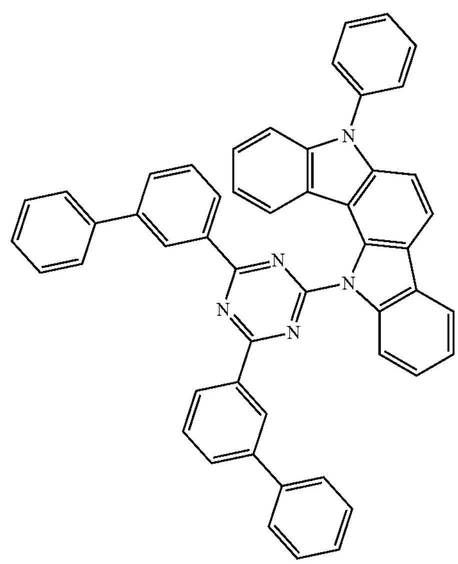
1-479
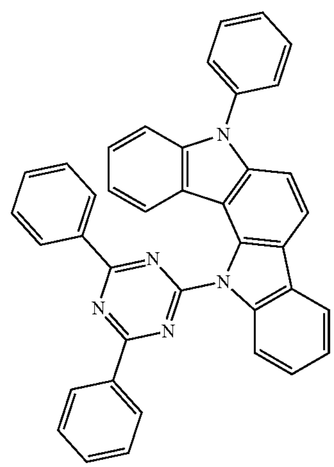

-continued
1-480
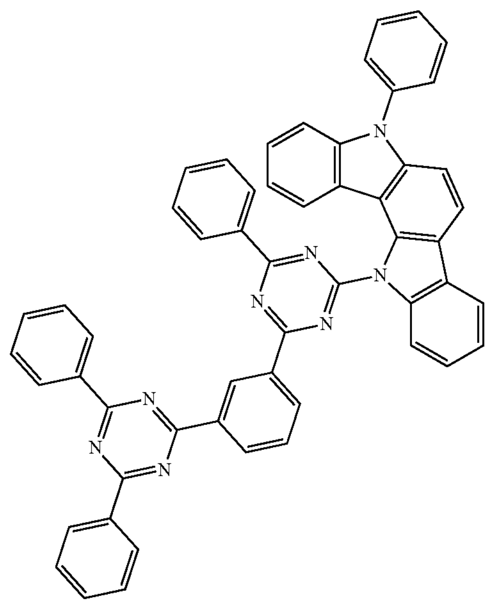
[C 40]
1-481
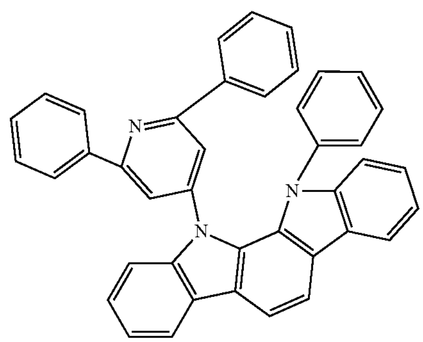
1-482
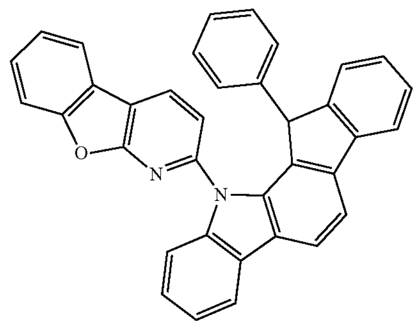
-continued
1-483
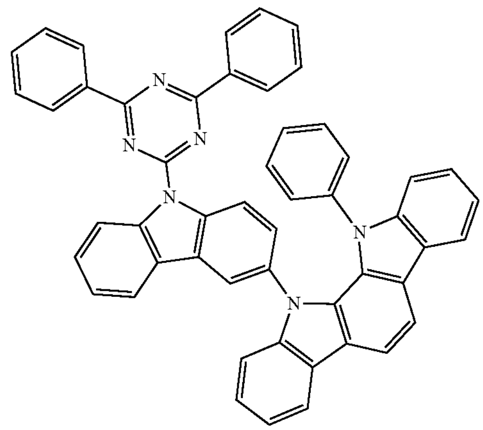
1-484
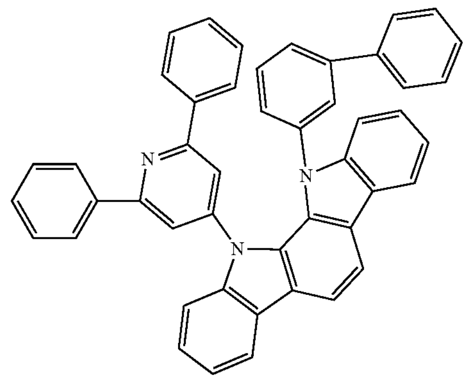
1-485
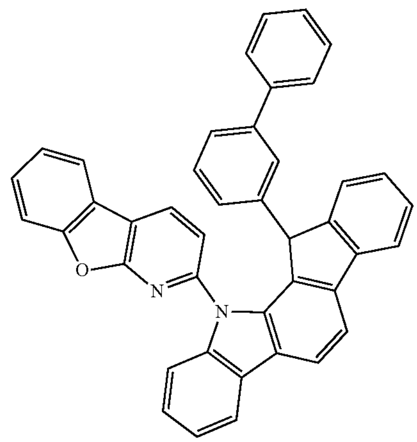

-continued
1-486
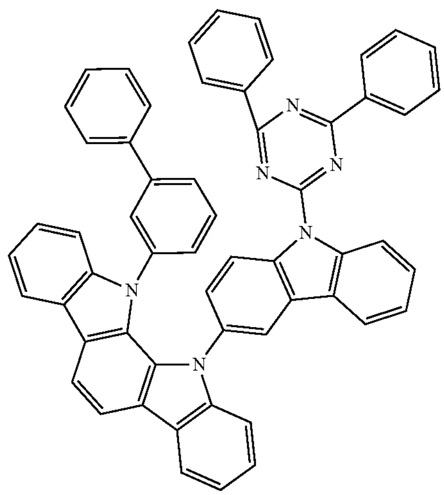
1-487
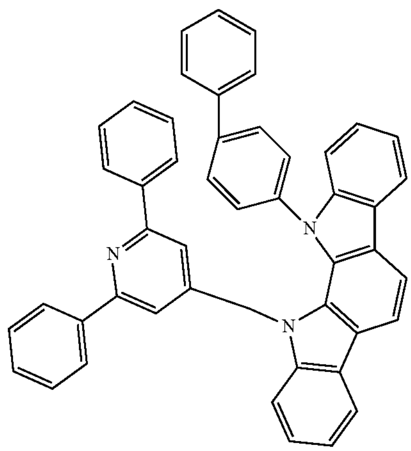
1-488
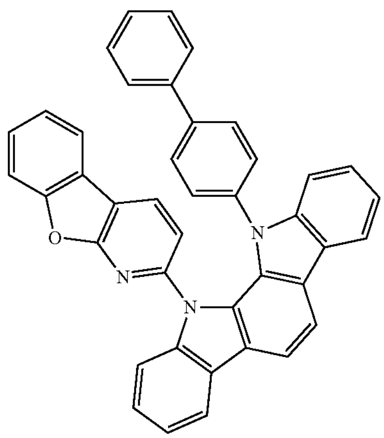
-continued
1-489
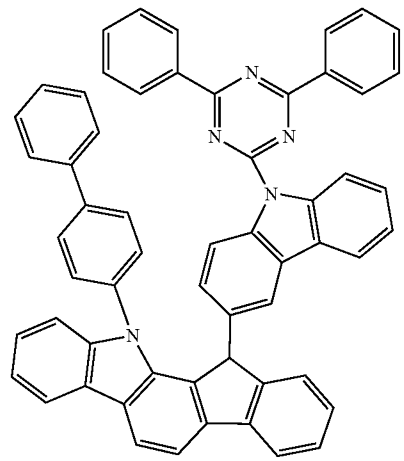
1-490
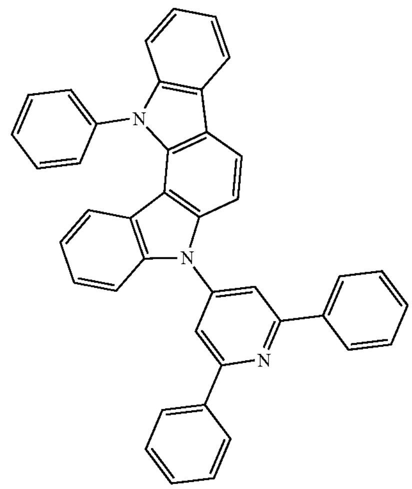
1-491
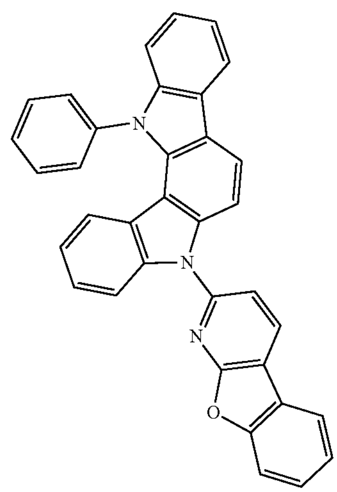

-continued
1-492
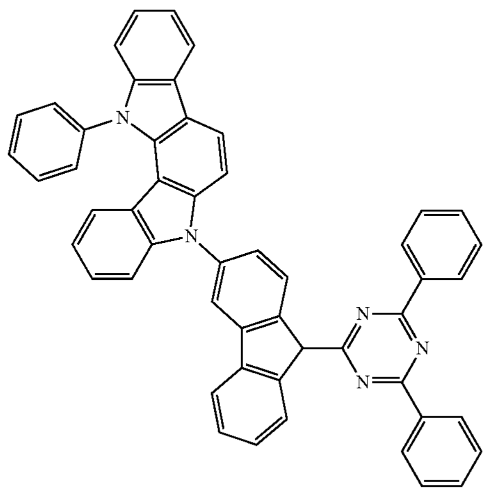
1-493
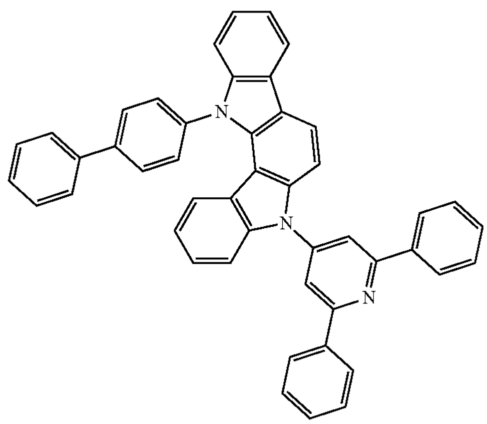
1-494
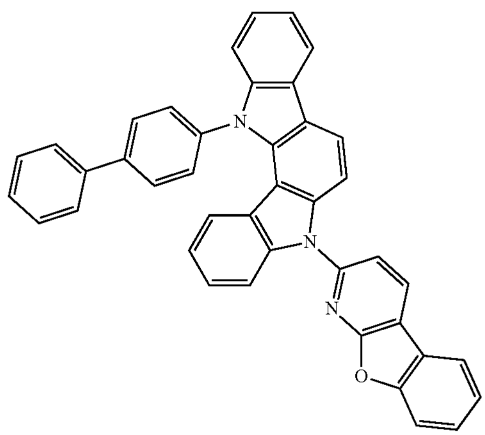
-continued
1-495
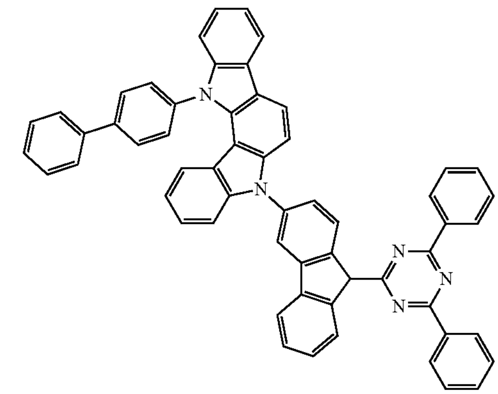
[C 41]
1-496
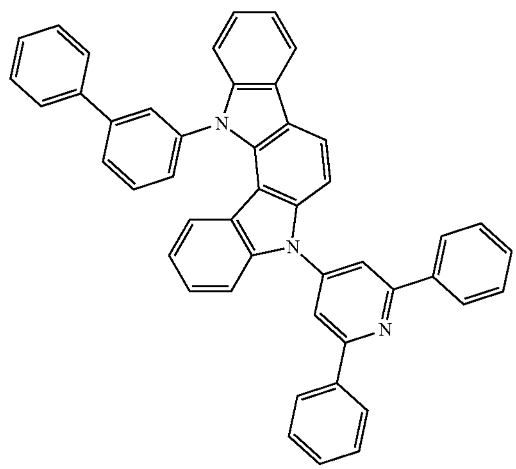
1-497
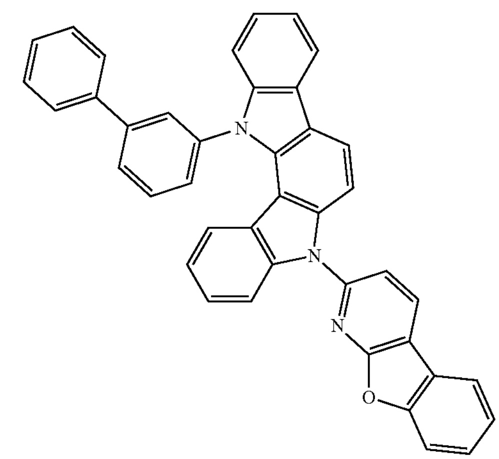

-continued
1-498
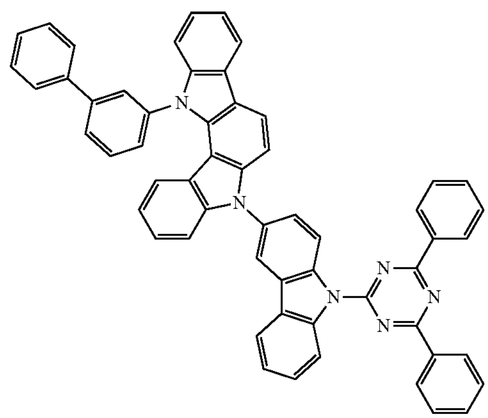
1-499
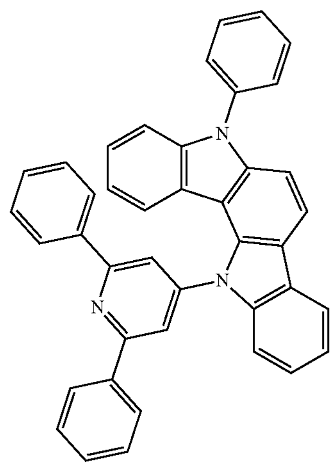
1-500
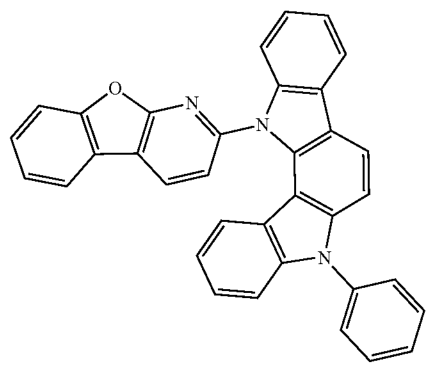
1-501
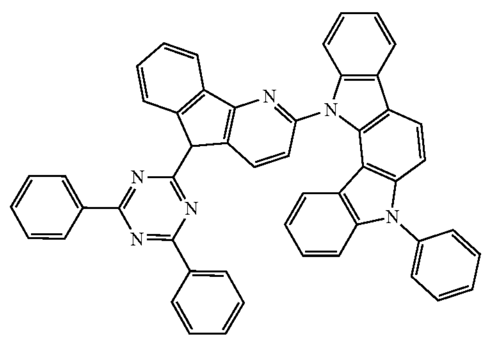
-continued
1-502
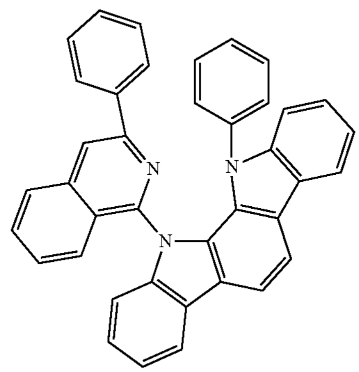
1-503
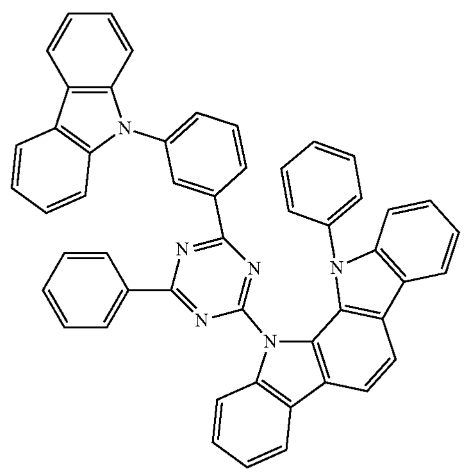
1-504
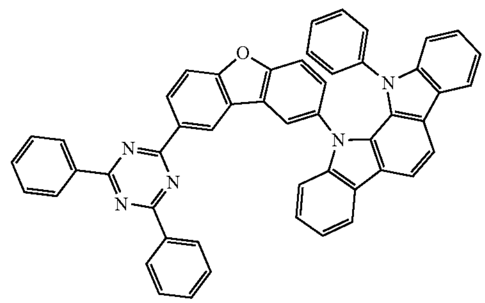
1-505
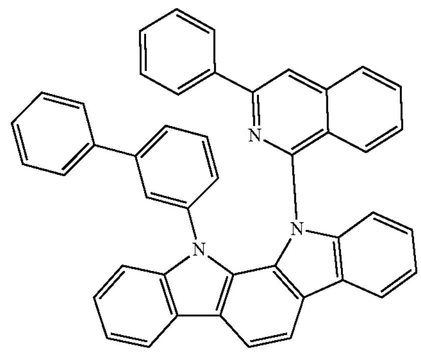

-continued
1-506
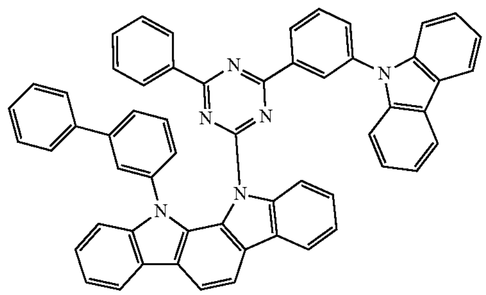
1-507
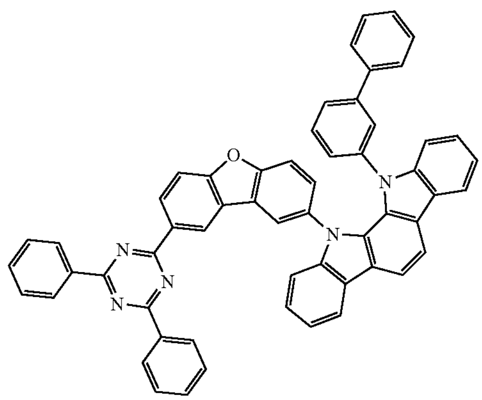
1-508
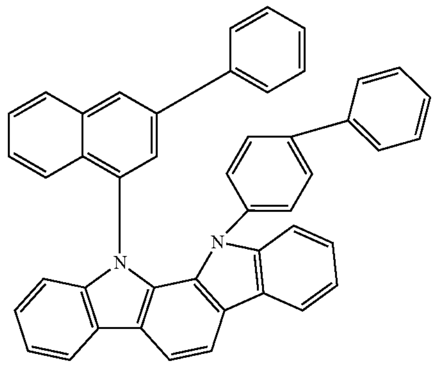
1-509
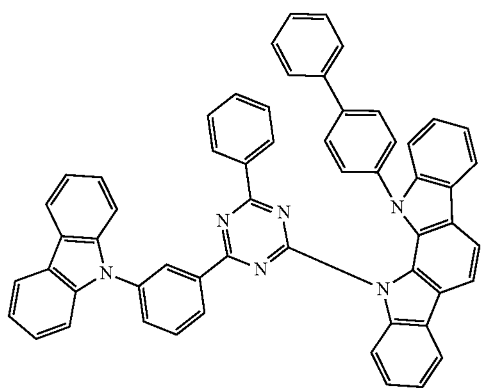
-continued
1-510
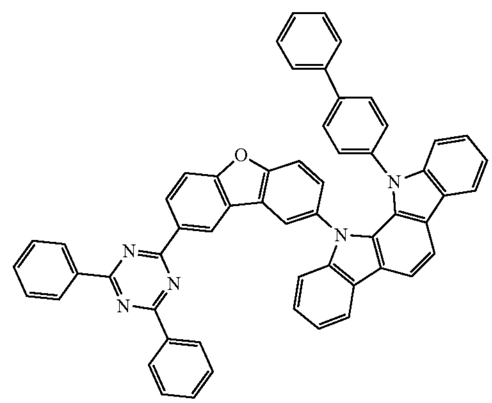
[C 42]
1-511
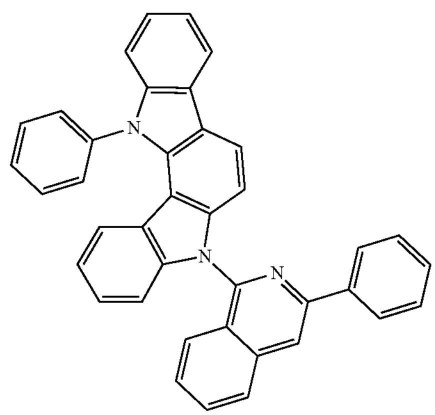
1-512
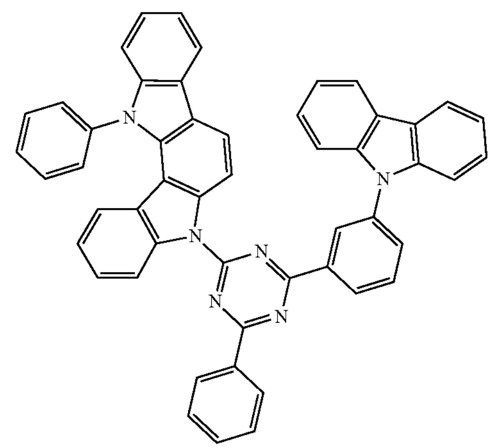

-continued
1-513
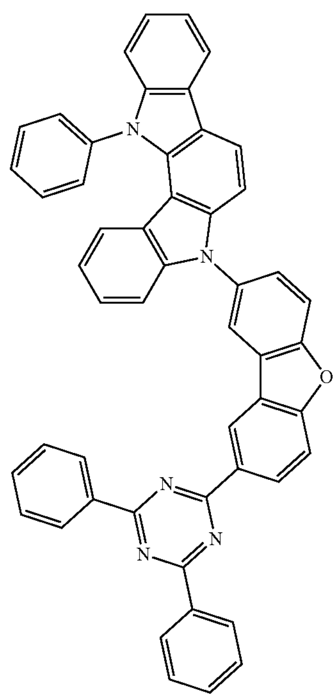
1-514
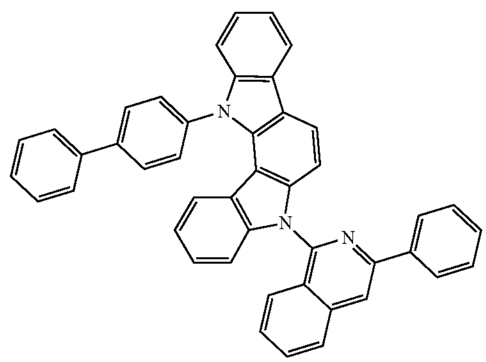
1-515
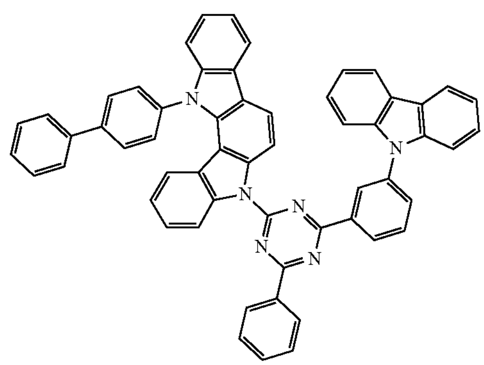
-continued
1-516
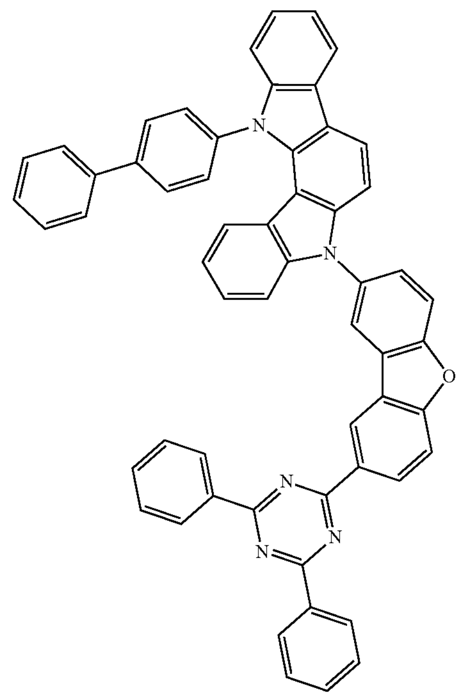
1-517
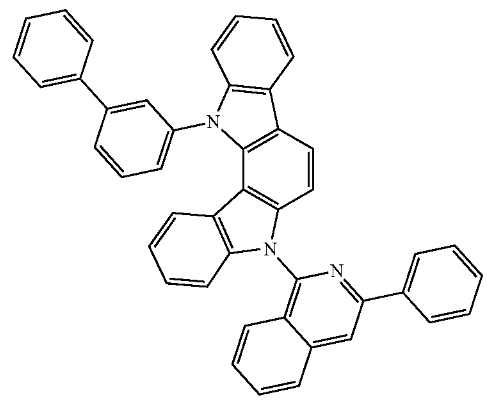
1-518
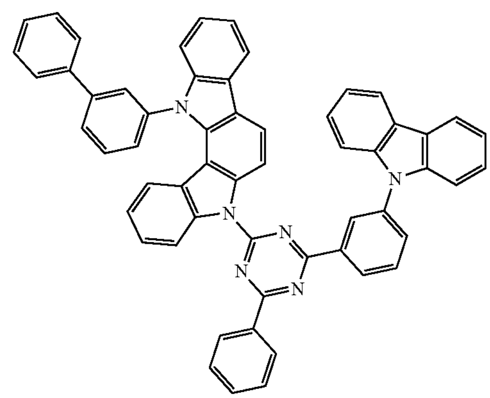

-continued
1-519
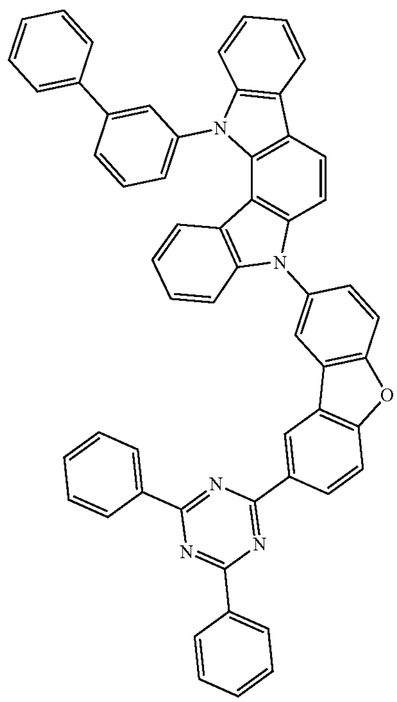
1-520
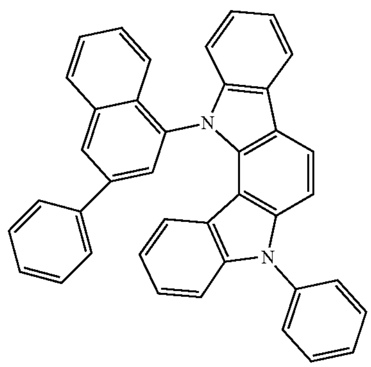
1-521
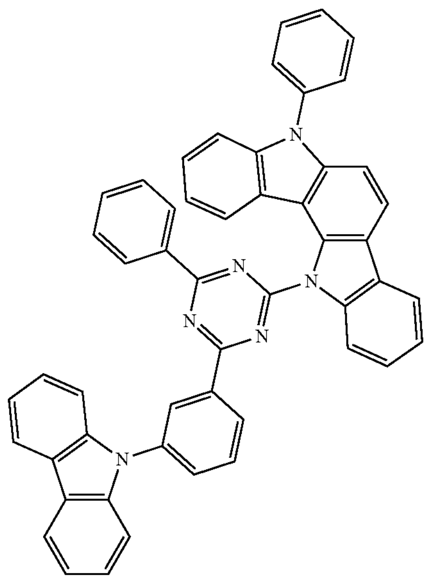
-continued
1-522
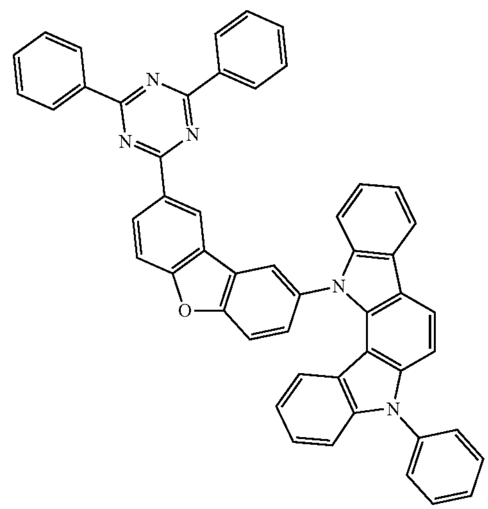
1-523
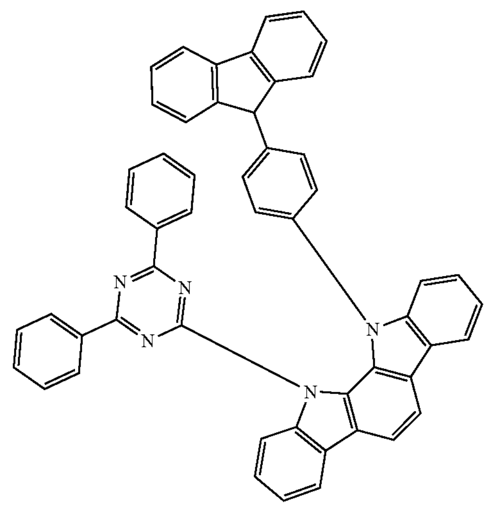
1-524
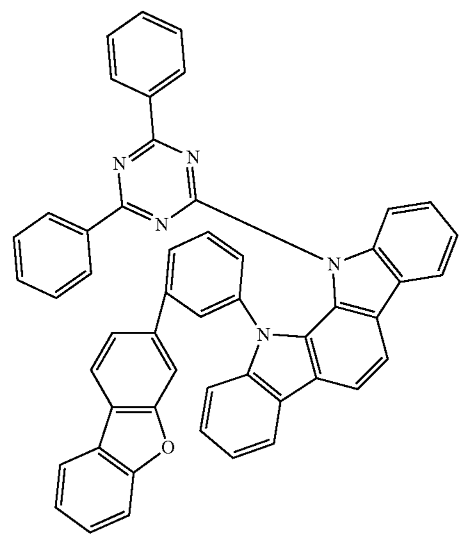

-continued
1-525
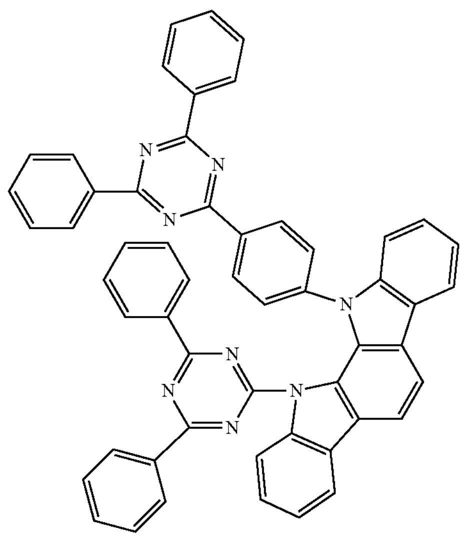
[C 43]
1-526
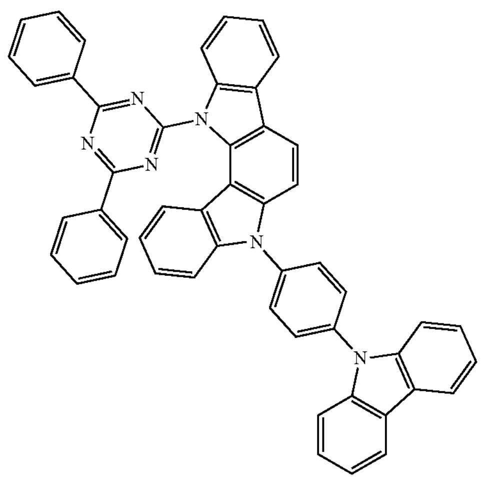
-continued
1-527
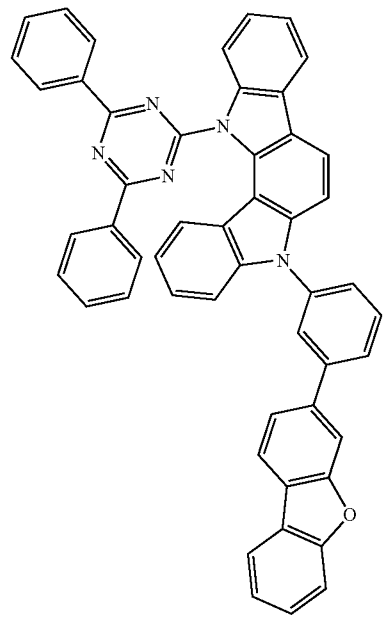
1-528
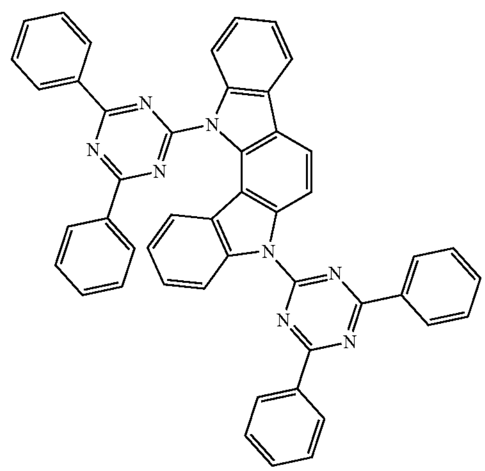
1-529
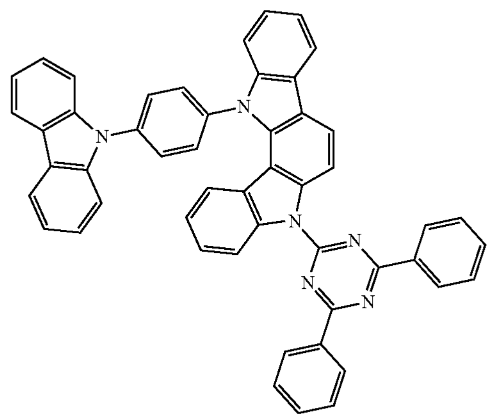

-continued
1-530
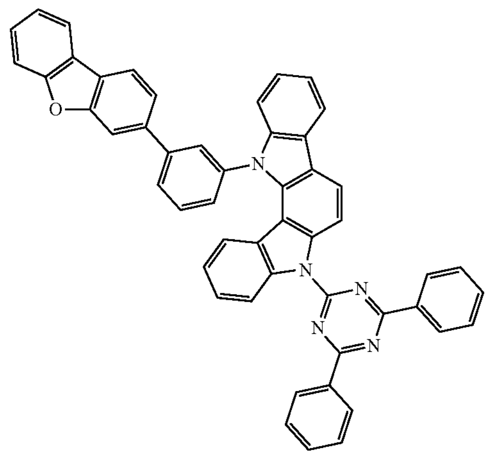
1-531
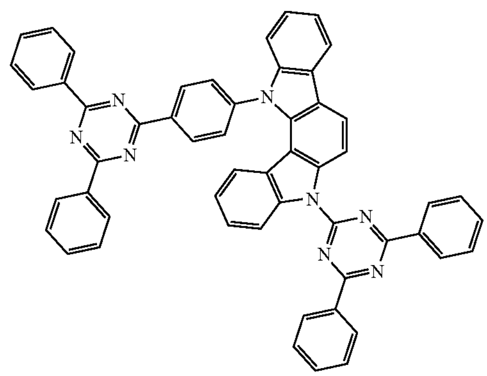
1-532
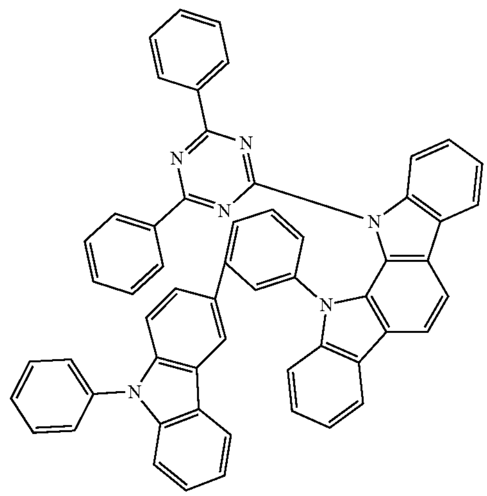
-continued
1-533
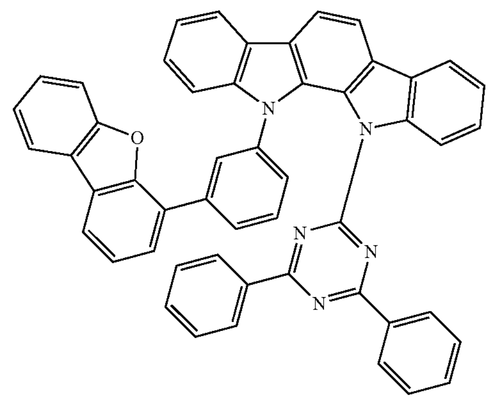
1-534
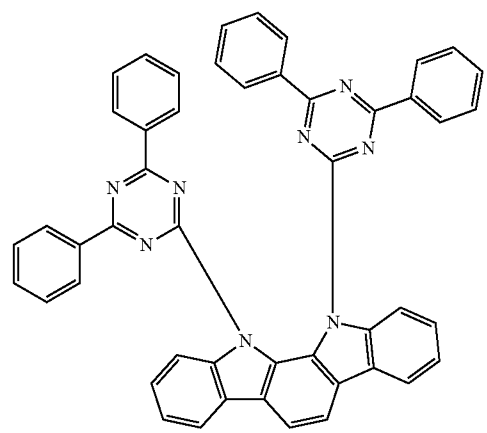
1-535
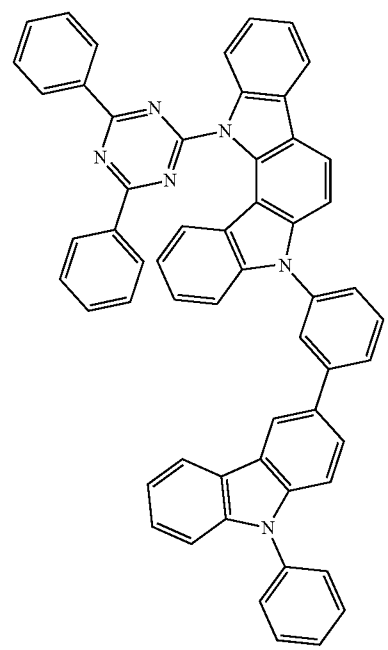

-continued
1-536
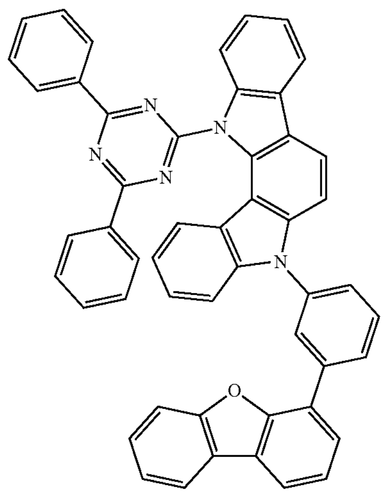
1-537
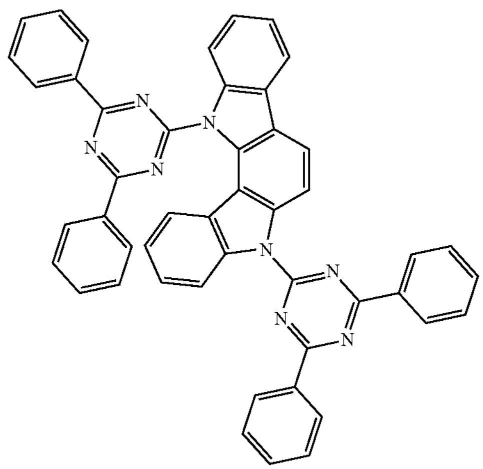
1-538
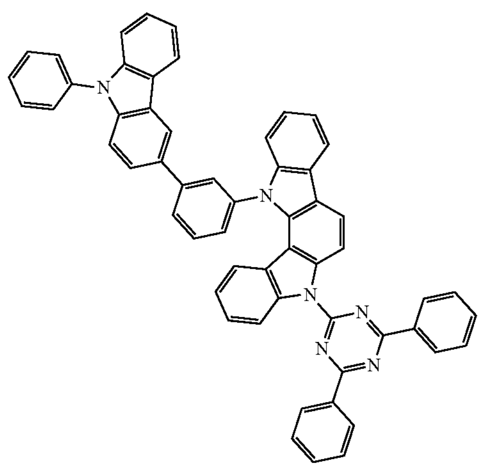
-continued
1-539
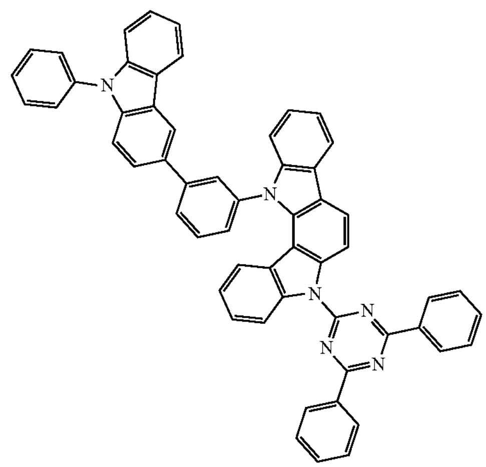
1-540
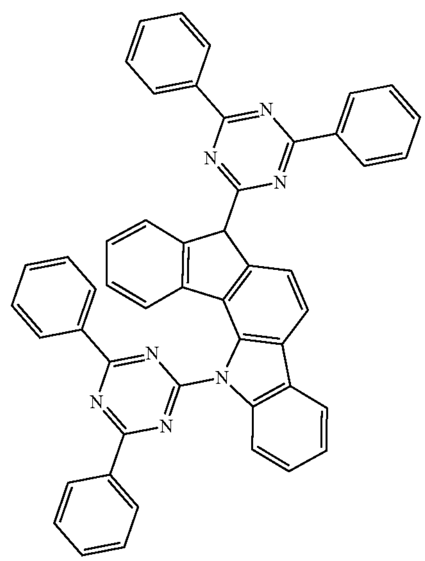
[C 44]
1-541
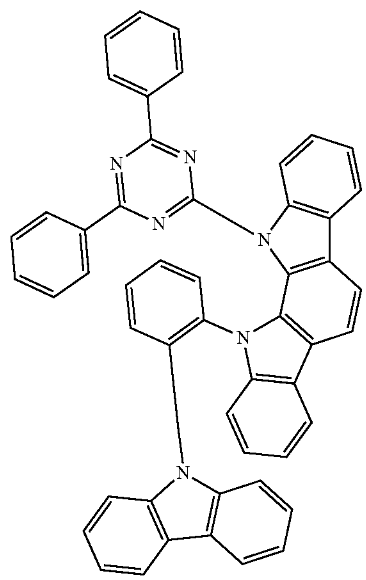

-continued
1-542
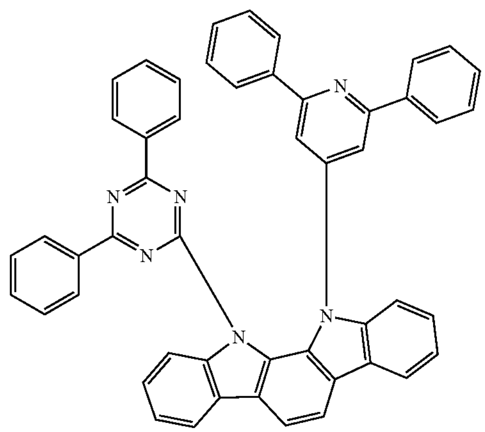
1-543
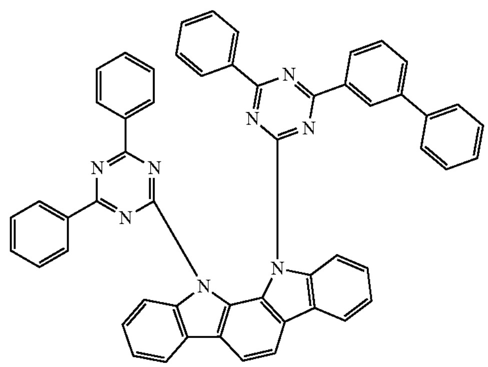
1-544
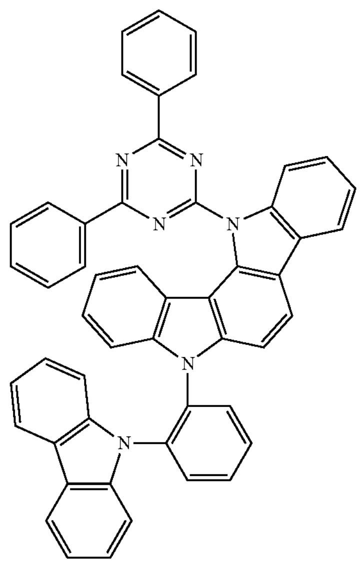
-continued
1-545
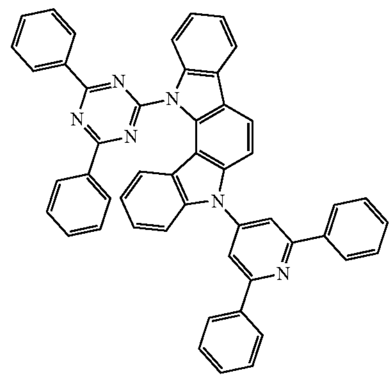
1-546
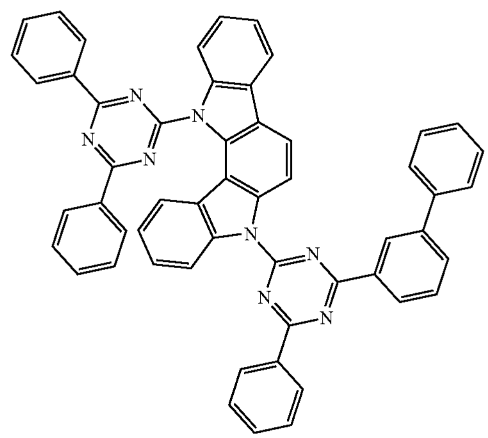
1-547
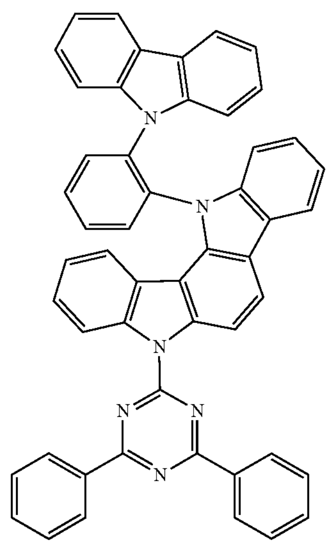

-continued
1-548
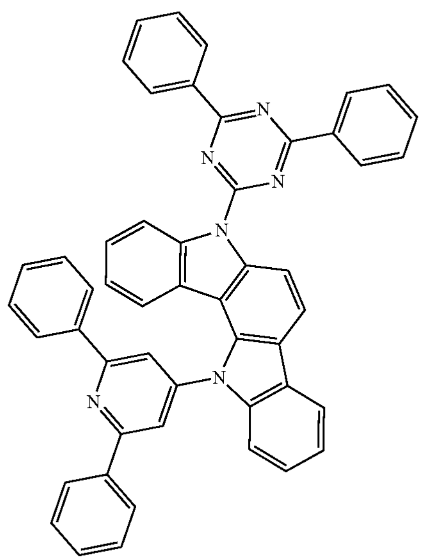
1-549
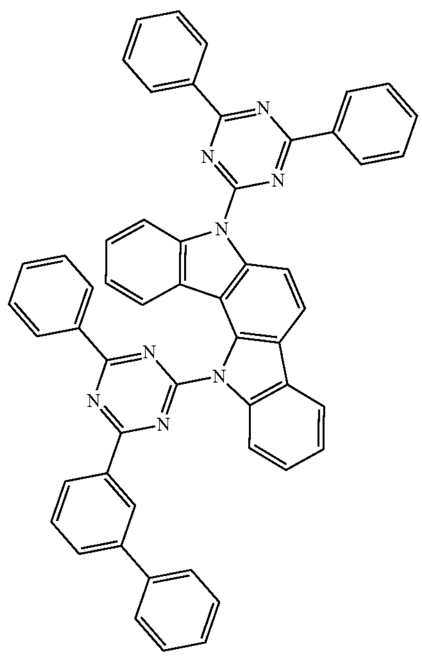
1-550
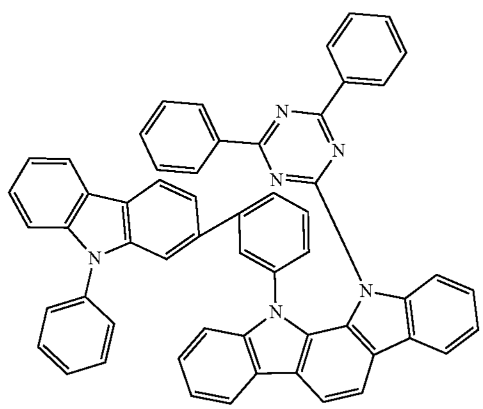
-continued
1-551
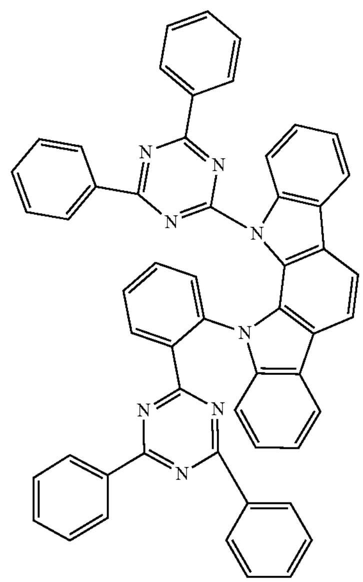
1-552
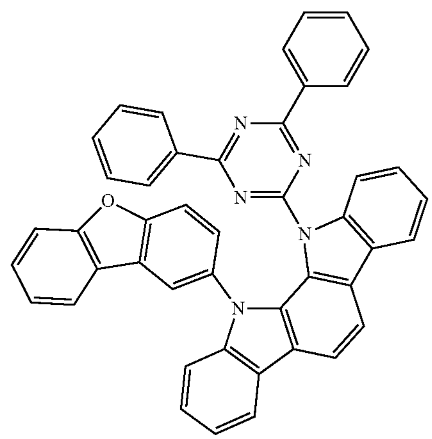
1-553
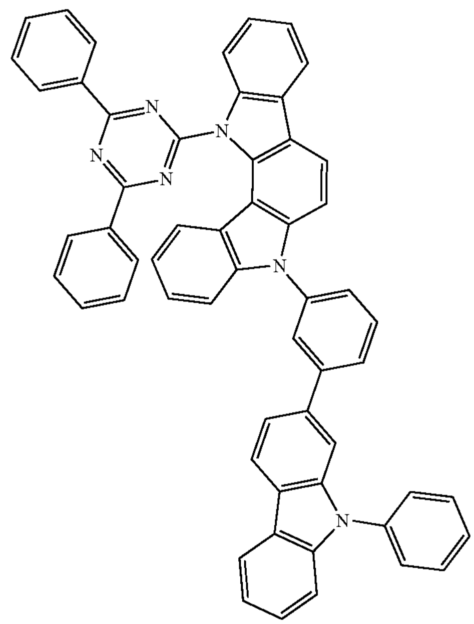

-continued
1-554
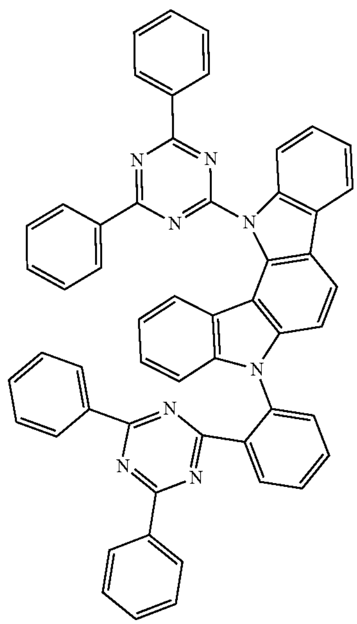
1-555
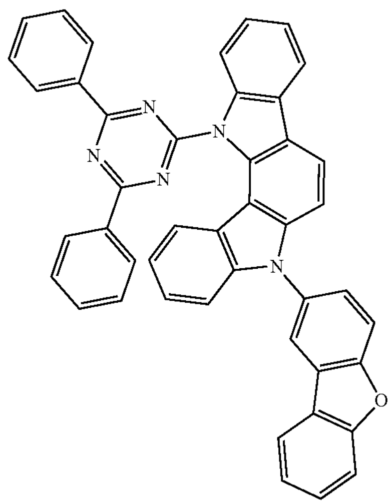
[C 45]
1-556
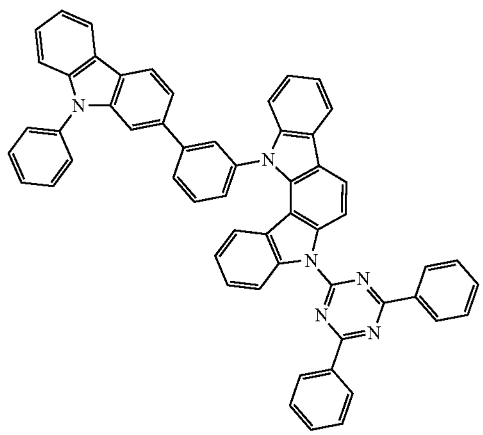
-continued
1-557
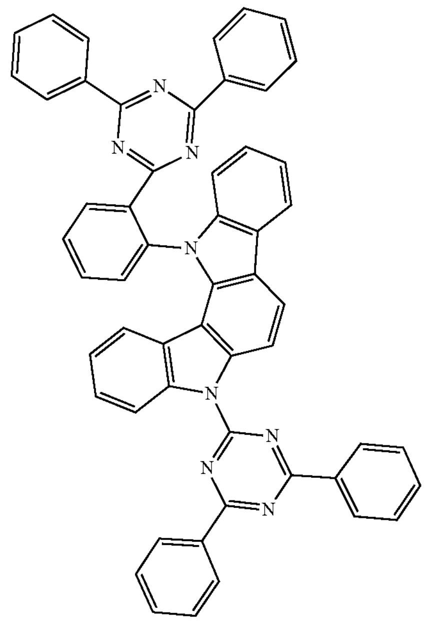
1-558
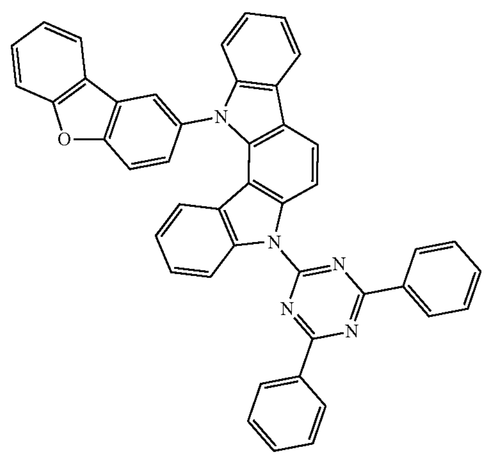
1-559
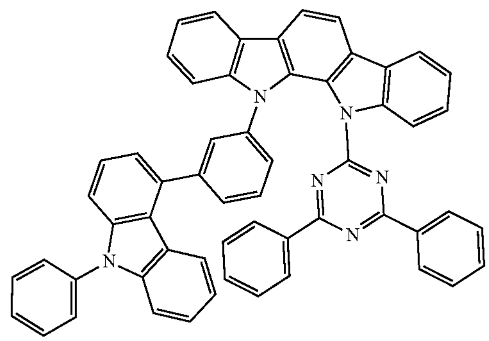

-continued
1-560
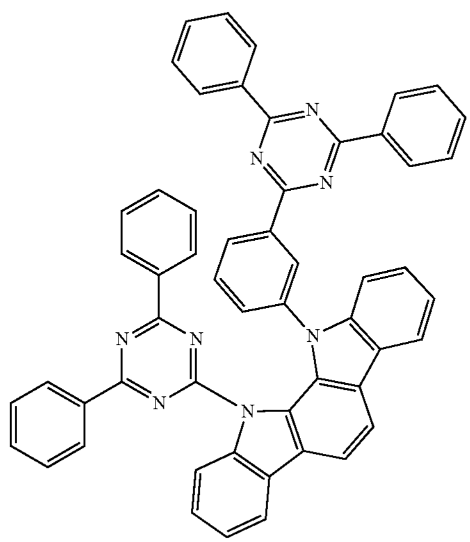
1-561
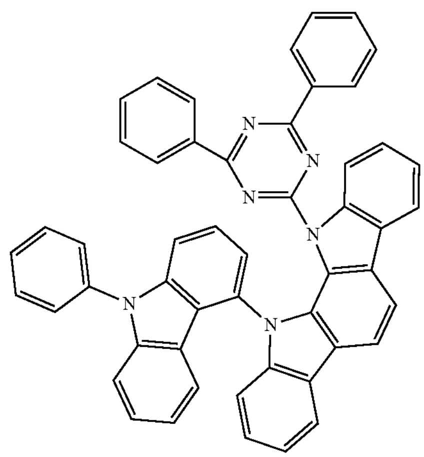
1-562
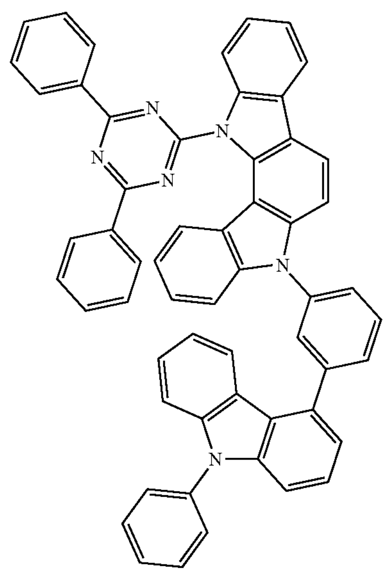
-continued
1-563
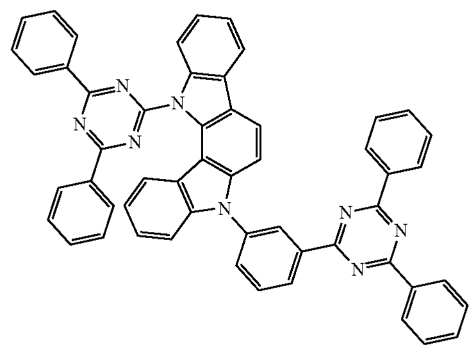
1-564
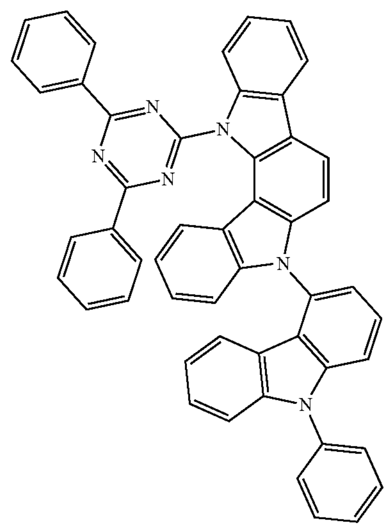
1-565
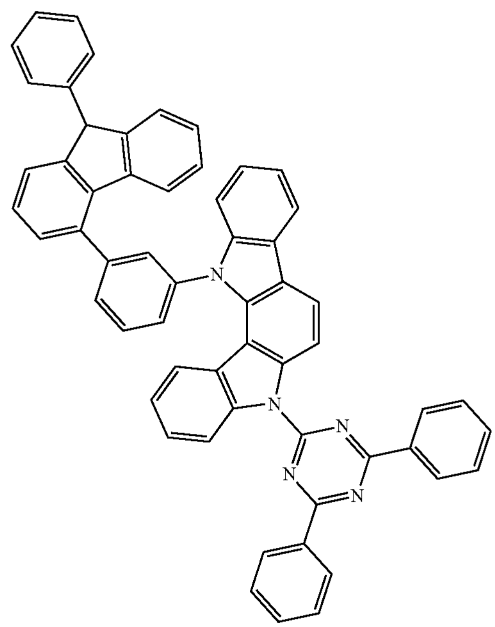

-continued
1-566
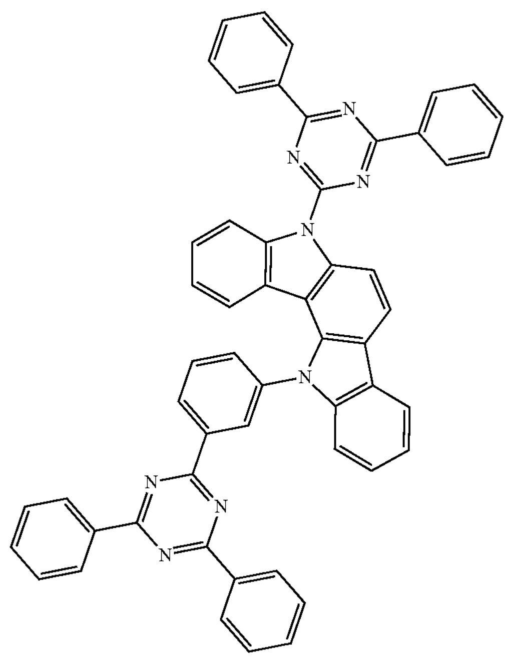
1-567
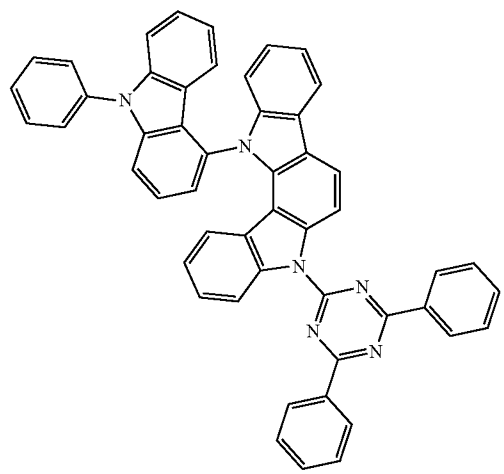
1-568
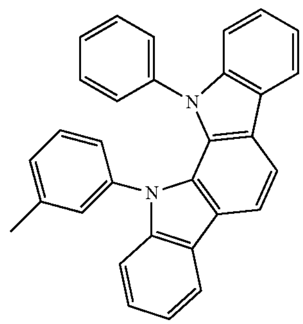
-continued
1-569
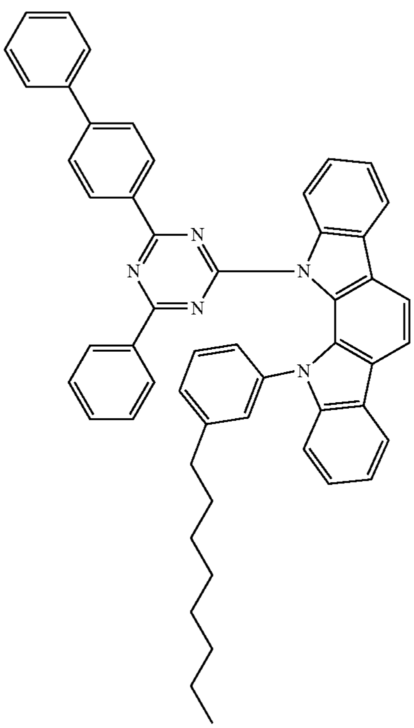
1-570
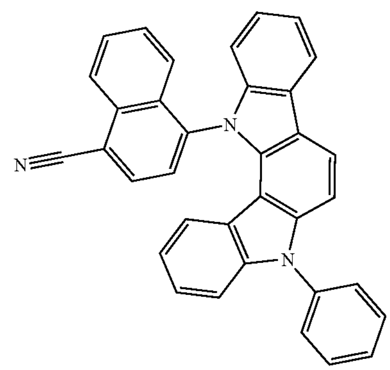
[C 46]
1-571
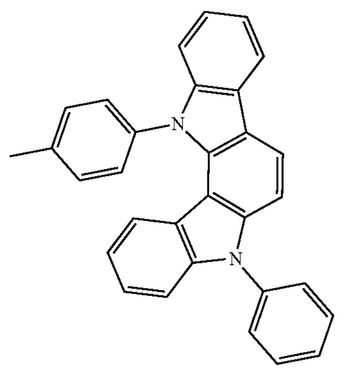

-continued
1-572
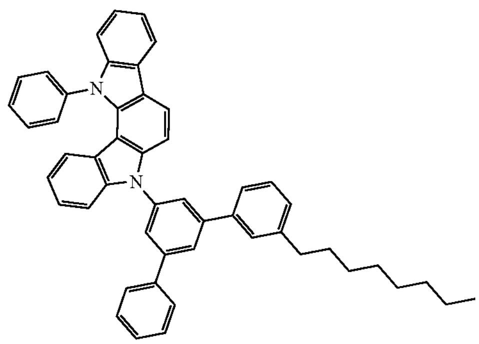
1-573
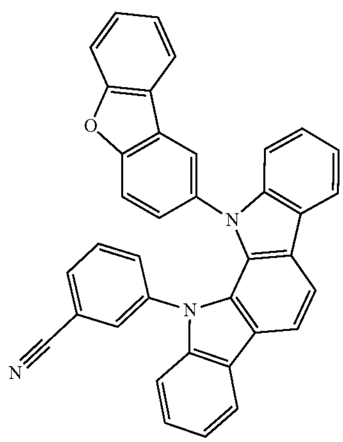
1-574
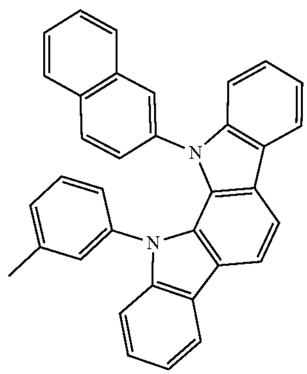
1-575
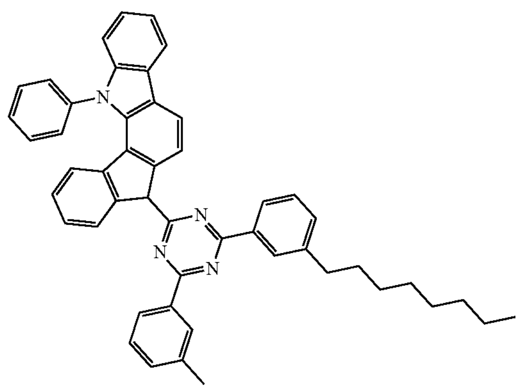
-continued
1-576
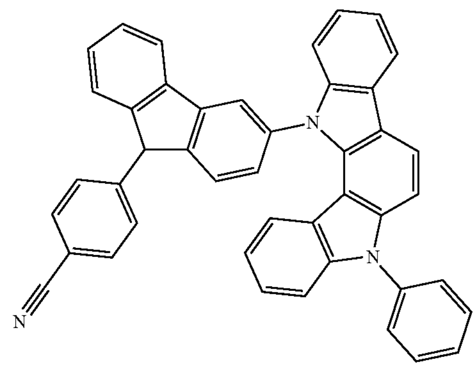
1-577
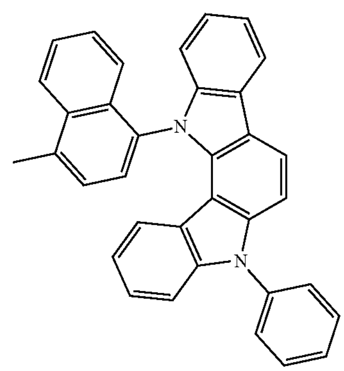
1-578
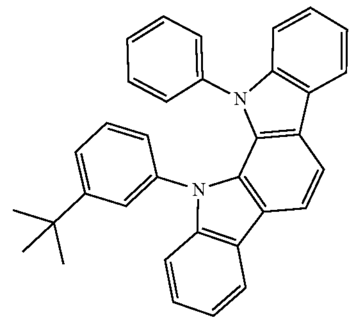
1-579
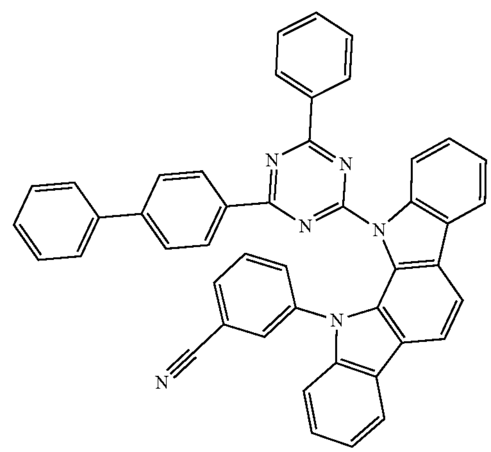

-continued
1-580
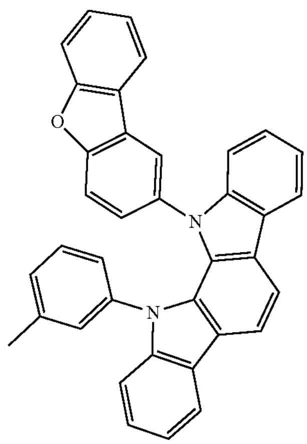
1-581
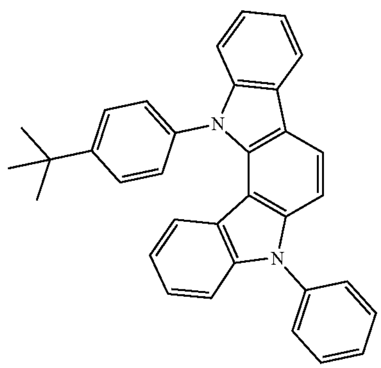
1-582
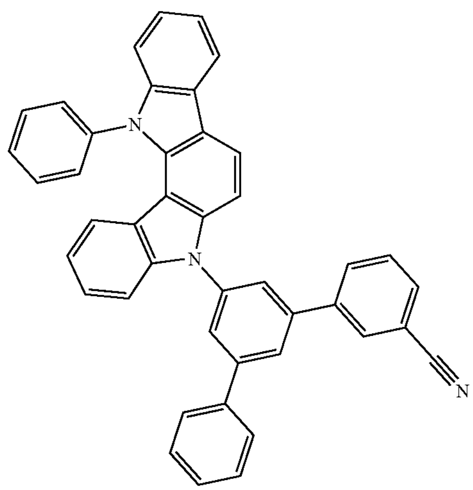
1-583
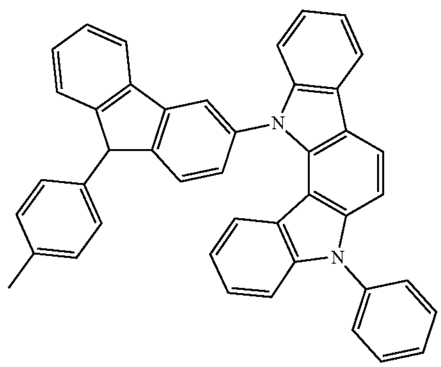
-continued
1-584
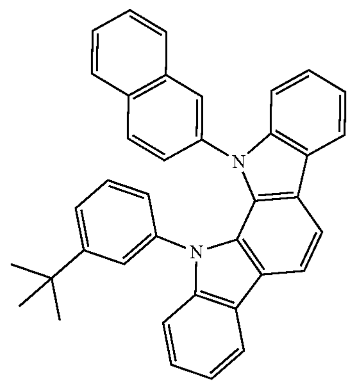
1-585
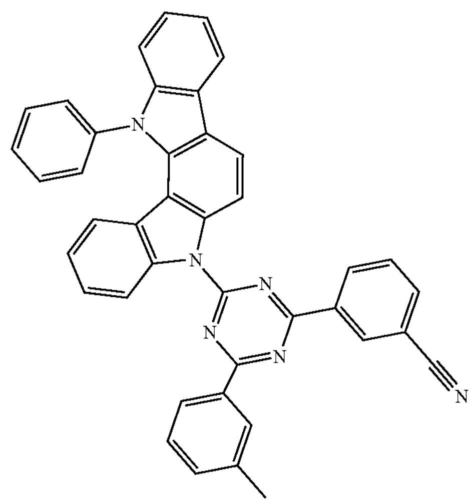
[C 47]
1-586
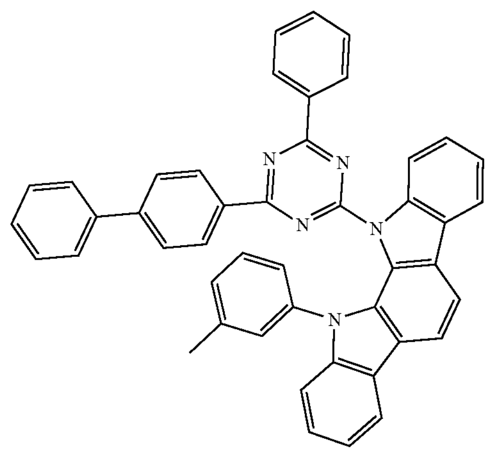

-continued
1-587
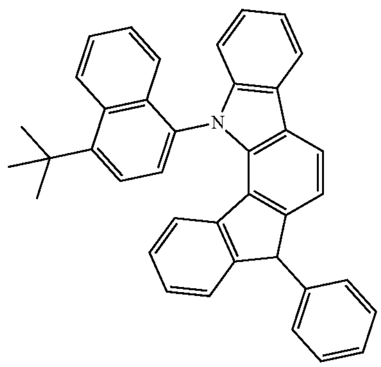
1-588
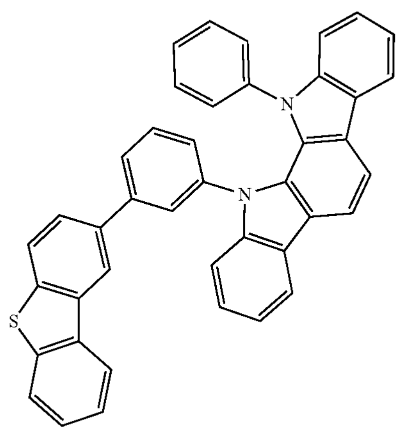
1-589
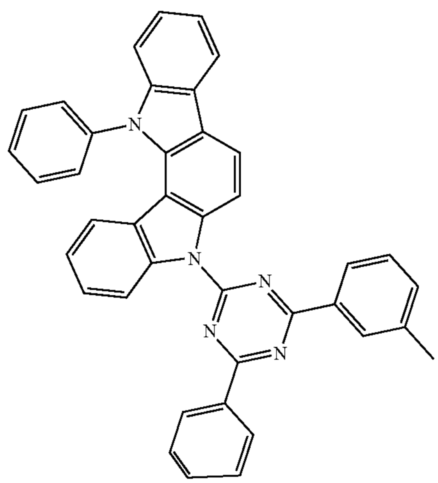
-continued
1-590
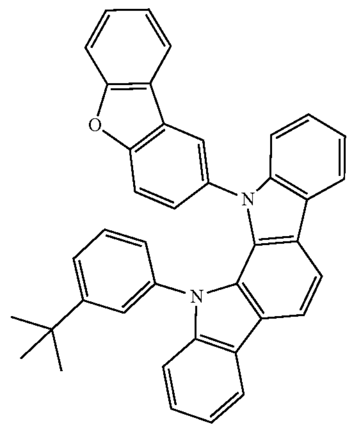
1-591
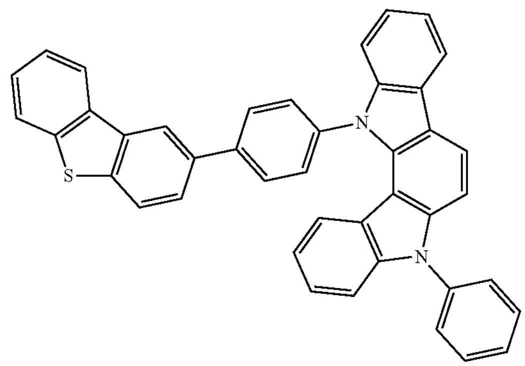
1-592
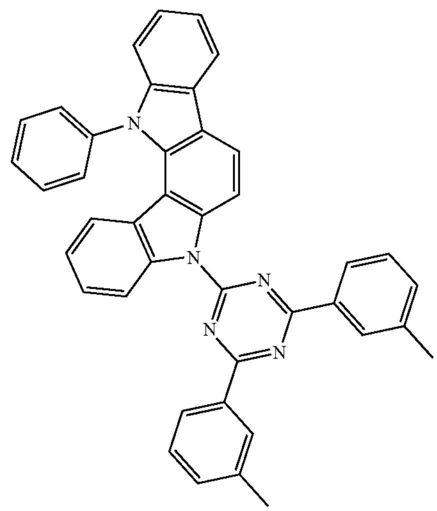

-continued
1-593
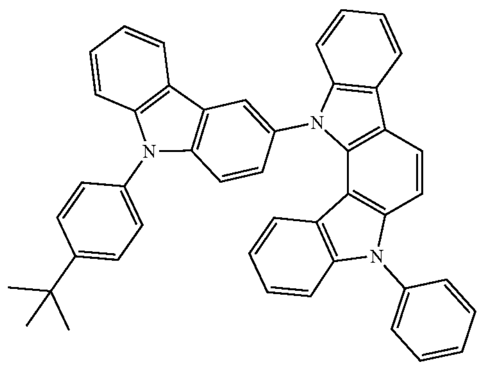
1-594
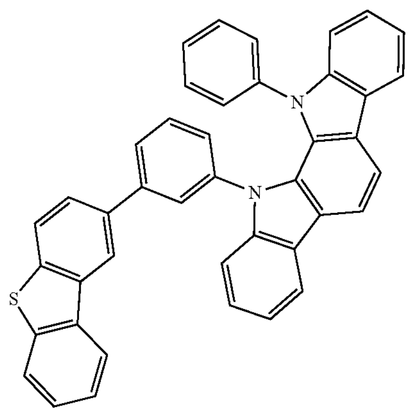
1-595
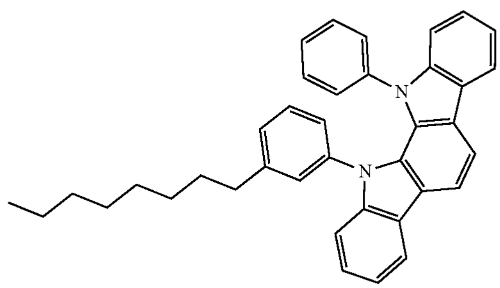
1-596
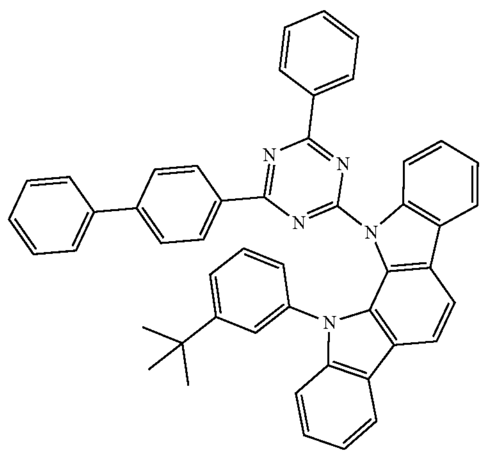
-continued
1-597
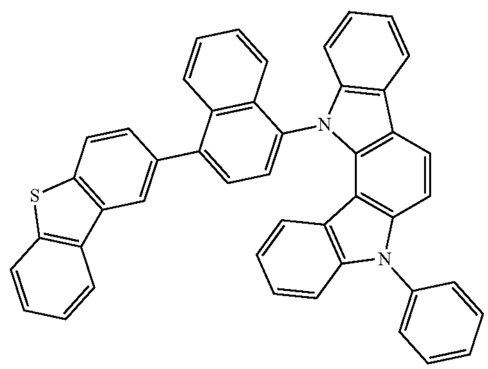
1-598
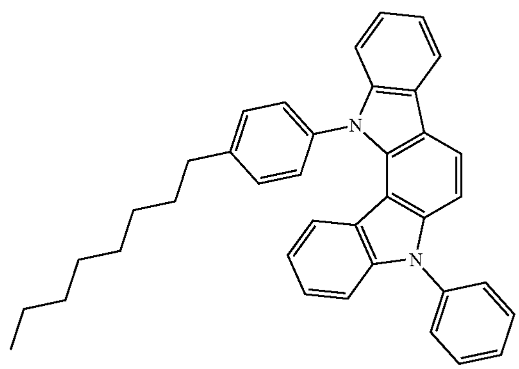
1-599
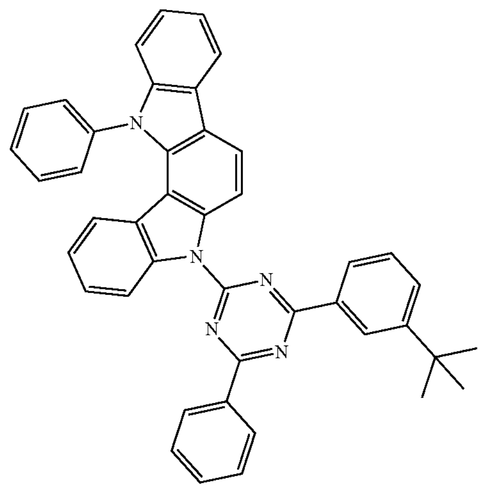

-continued
1-600
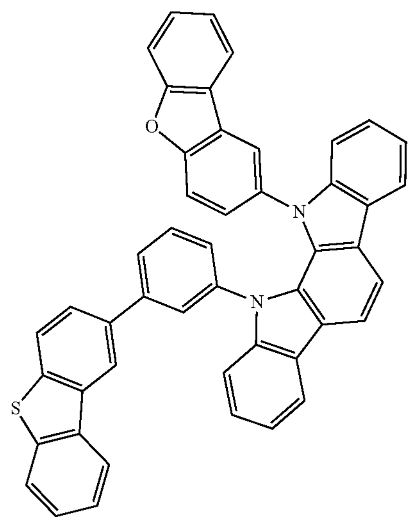
[C 48]
1-601
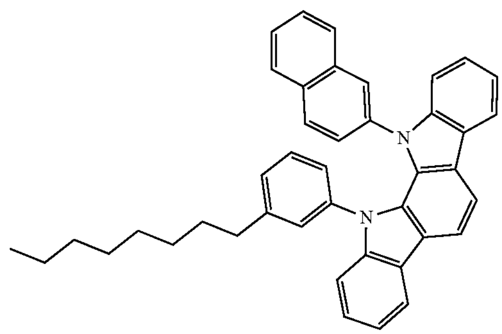
1-602
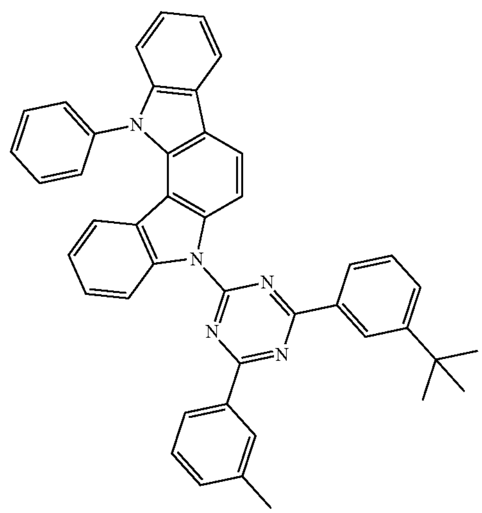
-continued
1-603
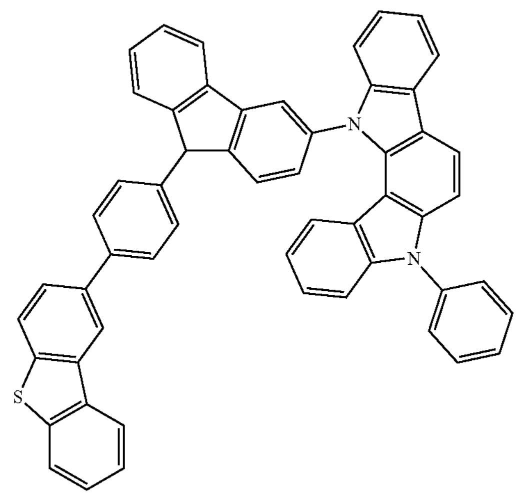
1-604
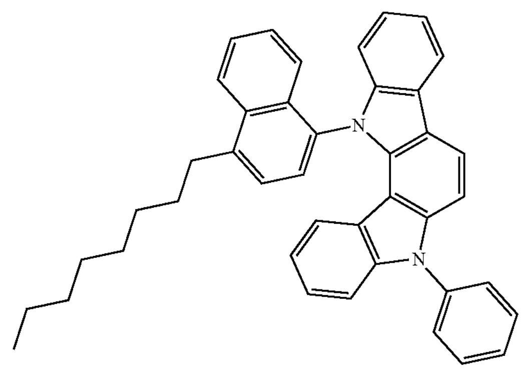
1-605
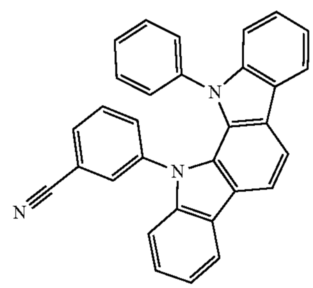

-continued
1-606
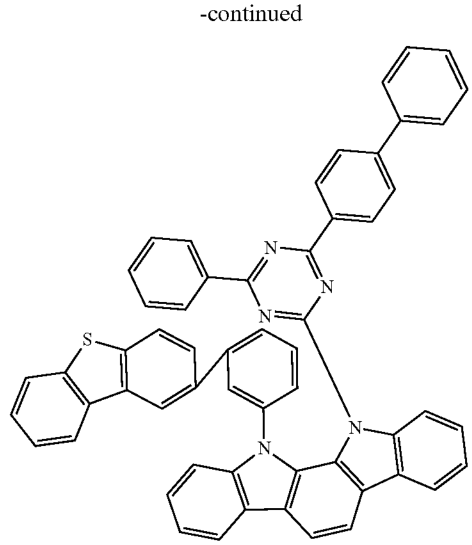
1-607
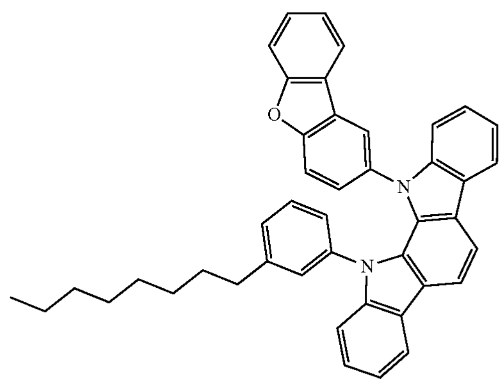
1-608
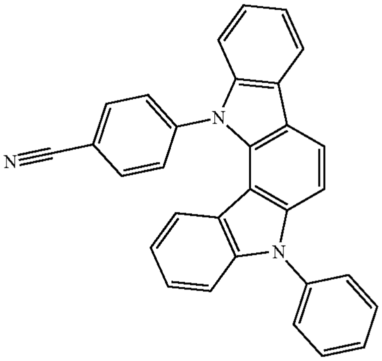
-continued
1-609
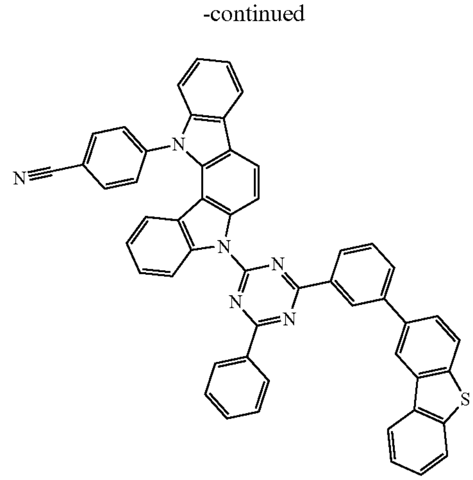
1-610
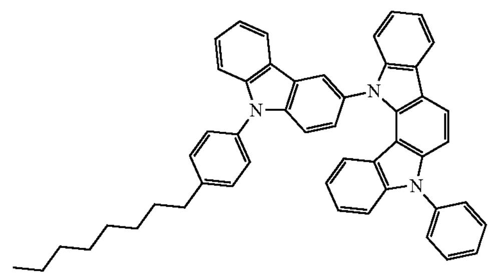
1-611
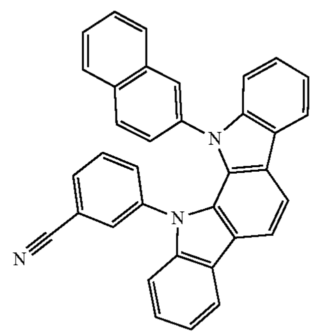
1-612
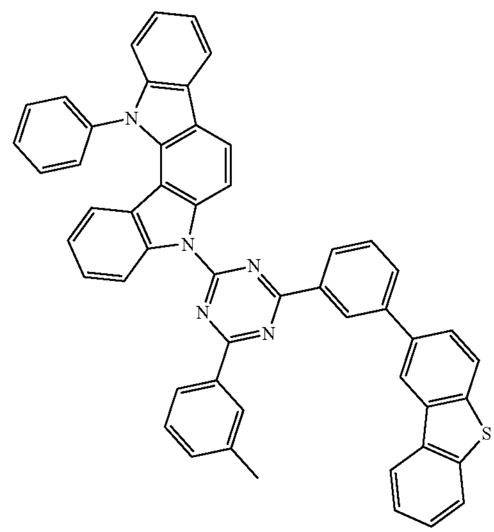

-continued 1-613

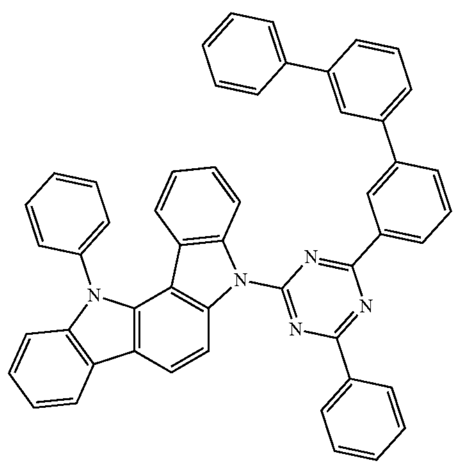

1-614

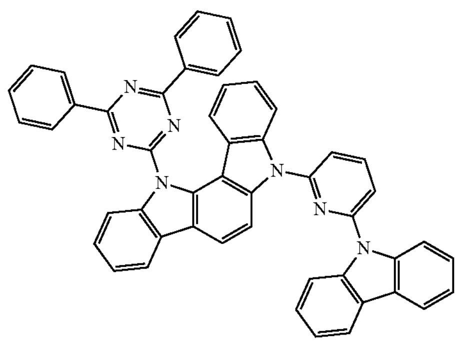

1-615

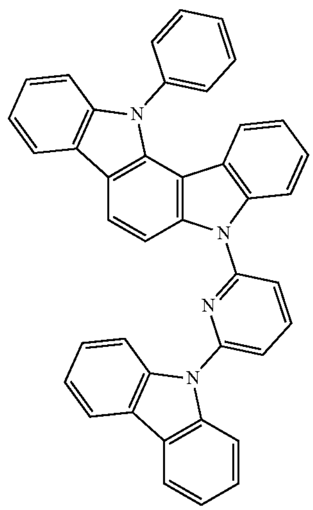

The light emitting dopant used in the organic EL of the present invention is a polycyclic aromatic compound represented by the general formula (2) or a polycyclic aromatic compound having the structure represented by the general formula (2) as a substructure.

The polycyclic aromatic compound having the structure represented by the general formula (2) as a substructure is preferably a polycyclic aromatic compound having the structure represented by the general formula (3) and more preferably a boron-containing polycyclic aromatic compound represented by the aforementioned formula (4).

In the general formula (2) and the general formula (3), the C ring, the D ring, the E ring, the F ring, the G ring, the H ring, the I ring, and the J ring are each independently an aromatic hydrocarbon ring having 6 to 24 carbon atoms, or an aromatic heterocyclic ring having 3 to 17 carbon atoms, and they each preferably represent an aromatic hydrocarbon ring having 6 to 20 carbon atoms or an aromatic heterocyclic ring having 3 to 15 carbon atoms. Since the C ring to J ring are aromatic hydrocarbon rings or aromatic heterocyclic rings, as described above, they are therefore also referred to as aromatic rings.

Specific examples of the aforementioned aromatic rings include rings composed of benzene, naphthalene, acenaphthene, acenaphthylene, azulene, anthracene, chrysene, pyrene, phenanthrene, triphenylene, fluorene, benzo[a]anthracene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, or carbazole. It is more preferably a benzene ring, a naphthalene ring, an anthracene ring, a triphenylene ring, a phenanthrene ring, a pyrene ring, a pyridine ring, a dibenzofuran ring, a dibenzothiophene ring, or a carbazole ring.

$R^6$ represents a substituent of the C ring, the D ring, and the E ring, and each independently represents a cyano group, deuterium, a diarylamino group having 12 to 44 carbon atoms, an arylheteroarylamino group having 12 to 44 carbon atoms, a diheteroarylamino group having 12 to 44 carbon atoms, an aliphatic hydrocarbon group having 1 to 10 carbon atoms, a substituted or unsubstituted aromatic hydrocarbon group having 6 to 18 carbon atom, or a substituted or unsubstituted aromatic heterocyclic group having 3 to 17 carbon atoms. It is preferably a diarylamino group having 12 to 36 carbon atoms, an arylheteroarylamino group having 12 to 36 carbon atoms, a diheteroarylamino group having 12 to 36 carbon atoms, a substituted or unsubstituted aromatic hydrocarbon group having 6 to 12 carbon atoms, or a substituted or unsubstituted aromatic heterocyclic ring having 3 to 15 carbon atoms. It is more preferably a diarylamino group having 12 to 24 carbon atoms, an arylheteroaryl group having 12 to 24 carbon atoms, a diheteroarylamino group having 12 to 24 carbon atoms, a substituted or unsubstituted aromatic hydrocarbon group having 6 to 10 carbon atoms, or a substituted or unsubstituted aromatic heterocyclic group having 3 to 12 carbon atoms.

Specific examples of $R^6$ representing an aliphatic hydrocarbon group having 1 to 10 carbon atoms is the same as in the case of $R^1$.

When $R^6$ represents an unsubstituted aromatic hydrocarbon group having 6 to 18 carbon atoms or an unsubstituted aromatic heterocyclic group having 3 to 17 carbon atoms, specific examples of $R^2$ include a group produced by removing one hydrogen atom from benzene, naphthalene, acenaphthene, acenaphthylene, azulene, anthracene, chrysene, pyrene, phenanthrene, triphenylene, fluorene, benzo[a]anthracene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, and carbazole. It preferably includes a group produced from benzene, naphthalene, acenaphthene, acenaphthylene, azulene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzoisothiazole, benzothiadiazole, purine, pyranone, coumarin, isocoumarin, chromone, dibenzofuran, dibenzothiophene, dibenzoselenophene, or carbazole. It more preferably includes a group produced from benzene or naphthalene.

Specific examples of $R^6$ representing the diarylamino group having 12 to 44 carbon atoms, the arylheteroarylamino group having 12 to 44 carbon atoms, the diheteroarylamino group having 12 to 44 carbon atoms, or the aliphatic hydrocarbon group having 1 to 10 carbon atoms, include diphenylamino, dibiphenylamino, phenylbiphenylamino, naphthylphenylamino, dinaphthylamino, dianthranylamino, diphenanthrenylamino, dipyrenylamino, dibenzofuranylphenylamino, dibenzofuranylbiphenylamino, dibenzofuranylnaphthylamino, dibenzofuranylanthranylamino, dibenzofuranylphenanthrenylamino, dibenzofuranylpyrenylamino, bis-dibenzofuranylamino, carbazolylphenylamino, carbazolylnaphthylamino, carbazolylanthranylamino, carbazolylphenanthrenylamino, carbazolylpyrenylamino, dicarbazolylamino, methyl, ethyl, propyl, butyl, pentyl, hexyl, heptyl, octyl, or nonyl groups. It preferably includes diphenylamino, dibiphenylamino, phenylbiphenylamino, naphthylphenylamino, dinaphthylamino, dianthranylamino, diphenanthrenylamino, or dipyrenylamino groups. It more preferably includes diphenylamino, dibiphenylamino, phenylbiphenylamino, naphthylphenylamino, dinaphthylamino, dibenzofuranyphenylamino, or carbazolylphenylamino.

v each independently represents an integer of 0 to 4, preferably an integer of 0 to 2, and more preferably of 0 to 1.

x represents an integer of 0 to 3, preferably an integer of 0 to 2, and more preferably of 0 to 1.

$Y^1$ is B, P, P═O, P═S, Al, Ga, As, Si—$R^2$ or Ge—$R^3$, preferably B, P, P═O, or P═S, and more preferably B.

$R^2$ and $R^3$ are each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms; preferably an aliphatic hydrocarbon group having 1 to 8 carbon atoms, a substituted or unsubstituted aromatic hydrocarbon group having 6 to 12 carbon atoms, or a substituted or unsubstituted aromatic heterocyclic group having 3 to 15 carbon atoms; more preferably a substituted or unsubstituted aromatic hydrocarbon group having 6 to 10 carbon atoms, or a substituted or unsubstituted aromatic heterocyclic group having 3 to 12 carbon atoms.

Specific examples of $R^2$ and $R^3$ that are the aliphatic hydrocarbon groups having 1 to 10 carbon atoms, the substituted or unsubstituted aromatic hydrocarbon groups having 6 to 18 carbon atoms, or the substituted or unsubstituted aromatic heterocyclic groups having 3 to 17 carbon atoms are the same as in the case where $R^1$ is these groups.

$X^1$ each independently represents N—$Ar^3$, S or Se, preferably, O, N—$Ar^3$, or S, and more preferably O or N—$Ar^3$.

$Ar^3$ is each independently a substituted or unsubstituted aromatic hydrocarbon group having 6 to 18 carbon atoms, a substituted or unsubstituted aromatic heterocyclic ring group having 3 to 17 carbon atoms, or a linked aromatic group formed by linking 2 to 8 groups thereof. It is preferably a substituted or unsubstituted aromatic hydrocarbon group having 6 to 12 carbon atoms, a substituted or unsubstituted aromatic heterocyclic ring group having 3 to 12 carbon atoms, or a substituted or unsubstituted linked aromatic group composed of 2 to 6 aromatic rings linked together. It is more preferably a substituted or unsubstituted aromatic hydrocarbon group having 6 to 10 carbon atoms, a substituted or unsubstituted aromatic heterocyclic ring group having 3 to 10 carbon atoms, or a substituted or unsubstituted linked aromatic group composed of 2 to 4 aromatic rings linked together.

It is more preferably a phenyl group, a biphenyl group, or a terphenyl group.

Specific examples of the unsubstituted aromatic hydrocarbon group, the unsubstituted aromatic heterocyclic group, or the unsubstituted linked aromatic group include a group produced by removing one hydrogen from benzene, naphthalene, acenaphthene, acenaphthylene, azulene, anthracene, chrysene, pyrene, phenanthrene, triphenylene, fluorene, benzo[a]anthracene, pyridine, pyrimidine, triazine, thiophene, isothiazole, thiazole, pyridazine, pyrrole, pyrazole, imidazole, triazole, thiadiazole, pyrazine, furan, isoxazole, quinoline, isoquinoline, quinoxaline, quinazoline, thiadiazole, phthalazine, tetrazole, indole, benzofuran, benzothiophene, benzoxazole, benzothiazole, indazole, benzimidazole, benzotriazole, benzisothiazole, benzothiadiazole, purine, pyranone, coumarin, isocoumarin, chromone, dibenzofuran, dibenzothiophene, dibenzoselenophene, carbazole, or a compound formed by linking 2 to 8 of these compounds; preferably groups produced from benzene, naphthalene, acenaphthene, acenaphthylene, azulene, or a compound formed by linking 2 to 4 of these compounds; more preferably groups produced from benzene or a compound formed by linking 2 to 3 of these compounds.

These unsubstituted aromatic hydrocarbon group, aromatic heterocyclic group or linked aromatic group may have substituents. The substituent in the case of having the substituent, the substituent is a cyano group, an aliphatic hydrocarbon group having 1 to 10 carbon atoms, or a diarylamino group having 12 to 4 carbon atoms, as described above.

N—$Ar^3$ is optionally bonded to any of the C ring, the D ring, or the E ring to form a heterocyclic ring containing N. Moreover, at least one hydrogen in the C ring, the D ring, the E ring, $R^2$, $R^3$, $R^6$ and $Ar^3$ is optionally replaced with a halogen or deuterium.

The polycyclic aromatic compound having the structure represented by the general formula (2) as a substructure (hereinafter also referred to as a substructured polycyclic aromatic compound) will be described.

There is the compound represented by the general formula (3) or formula (4) as the substructured polycyclic aromatic compound.

In the general formula (2), the general formula (3), or formula (4), the common symbols have the same meaning.

In the general formula (3), $X^2$ has the same meaning as $X^1$ of the general formula (2), $Y^2$ has the same meaning as $Y^1$ of the general formula (2). w represents an integer of 0 to 4, y represents an integer of 0 to 3, and Z represents an integer of 0 to 2. Preferably, w is 0 or 2, y is 0 or 1, and z is 0 or 1.

The F ring, the G ring, the H ring, the I ring, and the J ring are aromatic rings as described above and are each independently a substituted or unsubstituted aromatic hydrocarbon ring having 6 to 24 carbon atoms, or a substituted or unsubstituted aromatic heterocyclic ring having 3 to 17 carbon atoms; preferably a substituted or unsubstituted aromatic hydrocarbon ring having 6 to 20 carbon atoms, or a substituted or unsubstituted aromatic heterocyclic ring having 3 to 15 carbon atoms; and specifically, the same as in the description for the C ring to E rings of the general formula (2).

The F ring and the G ring have the same meaning as the C ring and the D ring in the general formula (2), and the H ring and J ring have the same meaning as the E ring, and the I ring is a tetravalent group (when z=0) because it is a shared structure.

In formula (4), $X^3$ each independently represents N—$Ar^5$, O, or S, however, at least one $X^3$ represents N—$Ar^5$. It preferably represents O or N—$Ar^5$ and more preferably N—$Ar^5$.

N—$Ar^5$ or $Ar^5$ has the same meaning as N—$Ar^3$ or $Ar^3$ in the general formula (2).

$R^{61}$ each independently represents a cyano group, deuterium, a diarylamino group having 12 to 44 carbon atoms, an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms. It is preferably a diarylamino group having 12 to 36 carbon atoms, a substituted or unsubstituted aromatic hydrocarbon group having 6 to 12 carbon atoms, or a substituted or unsubstituted aromatic heterocyclic group having 3 to 15 carbon atoms. It is more preferably a diarylamino group having 12 to 24 carbon atoms, a substituted or unsubstituted aromatic hydrocarbon group having 6 to 10 carbon atoms, or a substituted or unsubstituted aromatic heterocyclic group having 3 to 12 carbon atoms.

g and h each independently represent an integer of 0 to 4, i and j each independently represent an integer of 0 to 3, and k represents an integer of 0 to 2. Preferably, g and h each independently represent an integer of 0 to 2, i and j each independently represent 0 or 1, and k is 0.

Specific examples of $Ar^5$ and $R^{61}$ are understood from the description about $Ar^3$ and $R^6$ in the general formula (2).

N—$Ar^5$ is optionally bonded to the aforementioned aromatic ring to form a heterocyclic ring containing N. In this case, $Ar^3$ is optionally bonded directly to the aromatic ring above or via a linking group.

The substructured polycyclic aromatic compound will be described below with reference to formula (3) and formula (4).

Formula (3) is composed of the structure represented by the general formula (2) and the portion of the structure thereof. From another point of view, there are two structures represented by the general formula (2), however they share the I ring. Namely, the structure represented by the general formula (2) is a substructure.

Formula (4) is also similar as described above, and the structure of the central benzene ring is shared, enabling to interpret it to be composed of the structure represented by the general formula (2) and the portion of the structure thereof.

The substructured polycyclic aromatic compound as used in the present invention has the structure represented by the general formula (2) as a substructure. The compound suitably has a structure lacking in any of the rings from the C ring to the E ring in the general formula (2) as another substructure. Then, the compound preferably has the structure represented by the general formula (2) as one substructure and one to three another substructures as described above.

As such an aforementioned substructured polycyclic aromatic compound, for example, the compound represented by formulae (2-a) to (2-h) below are included.

The compound represented by formula (2-a) below corresponds to, for example, such a compound represented by formula (2-64).

Formula (2-a) has a structure in which two compounds of general formula (2) are shared at the central benzene ring, however, it is understood to be a compound including a structural unit of the general formula (2) and one substructure thereof.

Formula (2-b) is a structure in which two compounds of general formula (2) are shared at the central benzene ring, however, it is recognized to be a compound including a structural unit of the general formula (2) and one substructure thereof. Moreover, it has a structure with one of $X^1$ being N—$Ar^3$ which is bonded to another aromatic ring to form a ring (condensed ring structure).

[C 49]

(2-a)

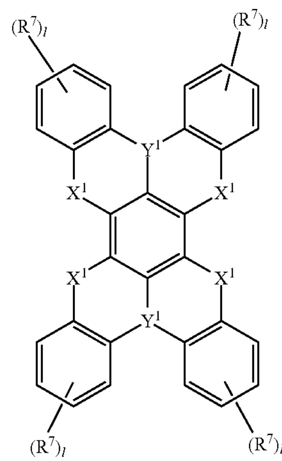

(2-b)

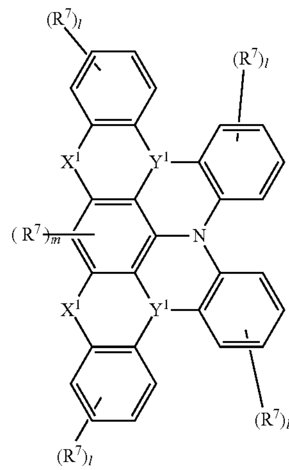

-continued (2-c)

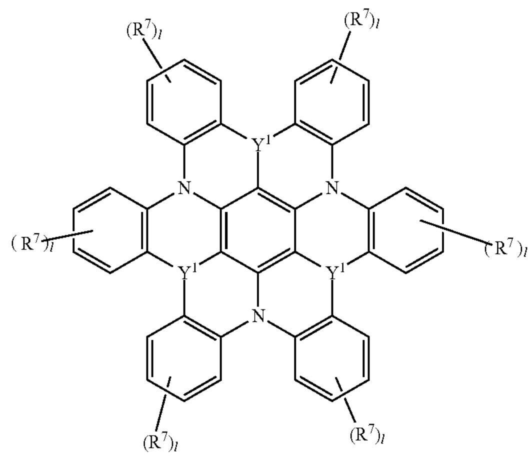

(2-d)

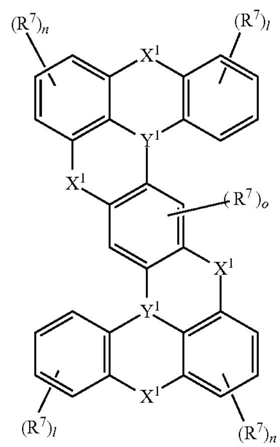

Further, the substructured polycyclic aromatic compound represented by formula (2-c) corresponds to, for example, such a compound presented by formula (2-66) described below. Namely, if explained in the general formula (2), it has a structure having the structural unit represented by three general formulae (2) so as to share the benzene ring that is the E ring. Namely, it is understood to be a compound having a structural unit represented by the general formula (2) and including two substructures, each of which is a structure by removing one benzene ring from the compound of the general formula (2). In addition, it is a structure in which $X^1$ is N—$Ar^3$ and bonded to another adjacent ring to form a ring.

Further, the substructured polycyclic aromatic compounds represented by formula (2-d), formula (2-e), formula (2-f), and formula (2-g) correspond to, for example, such compounds represented by formula (2-67), formula (2-68), formula (2-69), and formula (2-70) described below.

If explained according to the general formula (2), they are each a compound having two or three unit structures represented by the general formula (2) in one compound so as to share the benzene ring that is the C ring (or D ring). Namely, they are each understood to be a compound having the unit structure represented by the general formula (3) as a substructure and includes one substructure that is a structure by removing one benzene ring from the general formula (2).

[C 50]

(2-e)

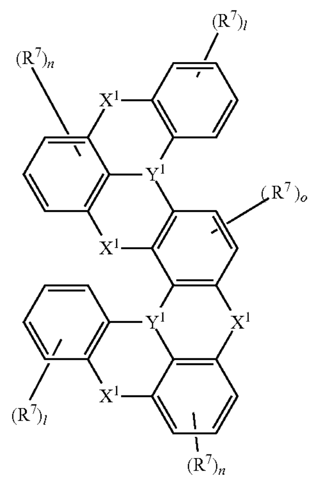

(2-f)

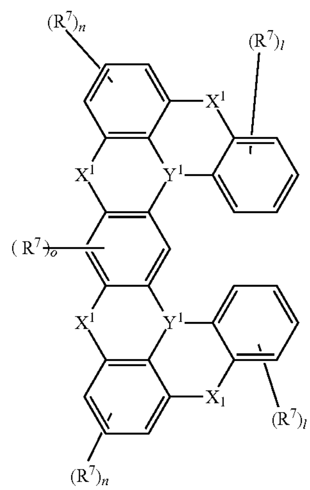

(2-g)

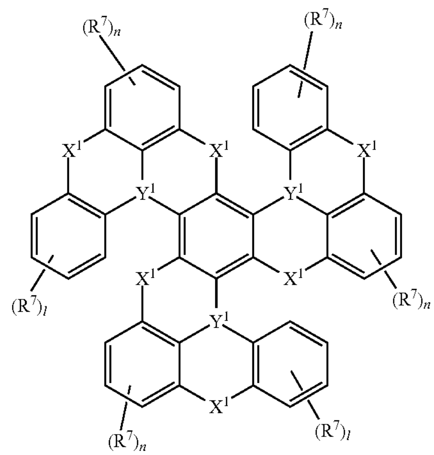

-continued (2-h)

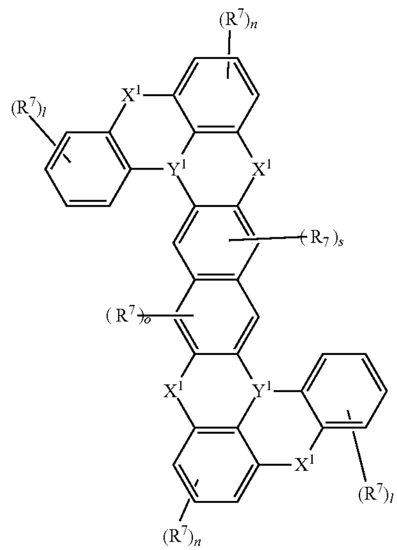

Moreover, the substructured polycyclic aromatic compound represented by formula (2-h) corresponds to, for example, such compounds represented by formula (2-71), formula (2-72), formula (2-73), formula (2-74), and formula (2-75) described below.

If explained from the general formula (2), it is a substructured polycyclic aromatic compound having the C ring being a naphthalene ring and two unit structures represented by the general formula (2) in a single compound so as to share the naphthalene ring. Namely, it is understood to be a compound having the unit structure represented by the general formula (2) as a substructure and includes one or two substructures, each of which is a structure by removing one C ring (naphthalene ring) from the compound of the general formula (2).

The substructured polycyclic aromatic compound of the present invention can be said to be a compound having a structure of a plurality of compounds of the general formula (2) linked by sharing one or two of the rings (the C ring to the E ring) in the structural unit of the general formula (2) and including at least one structural unit of the general formula (2).

The number of compounds of the general formula (2) forming the above structure is 2 to 5 and preferably 2 to 3. The above rings (the C ring to the E ring) may be shared by one, two, or even three rings.

In the aforementioned formulae, $X^1$ and $Y^1$ are as defined in the general formula (2). $R^7$ has the same meaning as $R^{61}$ in formula (4), however is preferably a cyano group, an aliphatic hydrocarbon group having 1 to 10 carbon atoms, or a diarylamino group having 12 to 44 carbon atoms.

l is each independently an integer of 0 to 4, m is each independently an integer of 0 to 1, n is each independently an integer of 0 to 3, and o is each independently an integer of 0 to 2. Preferably l and n are 0 to 2, and o is preferably 0 to 1.

Specific examples of the polycyclic aromatic compound and other substructured polycyclic aromatic compound represented by the general formula (2), the general formula (3) or formula (4) will be described below, however are not limited to these exemplified compounds.

[C 51]

2-1

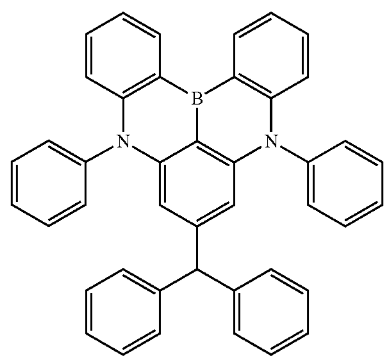

2-2

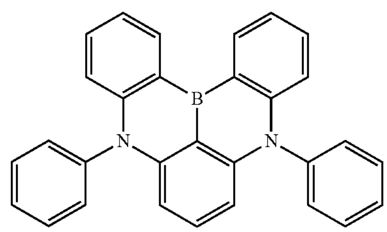

2-3

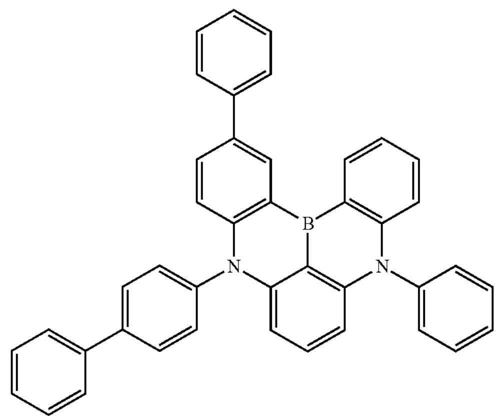

2-4

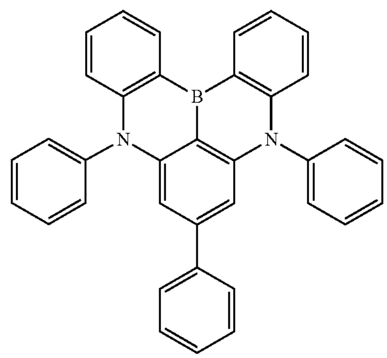

-continued
2-5
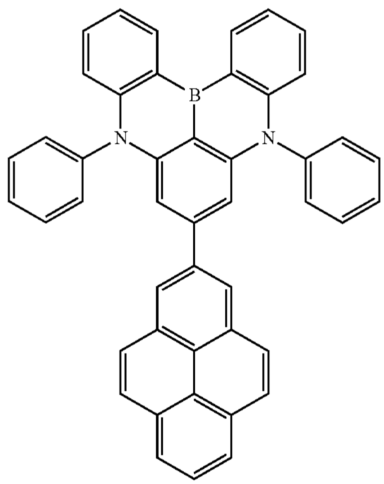
2-6
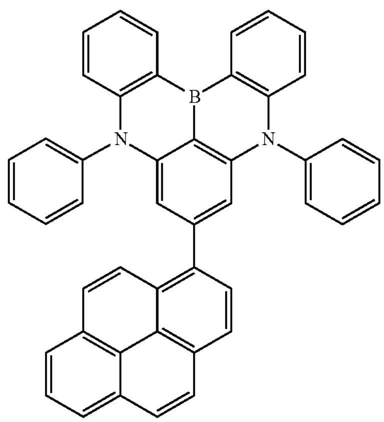
2-7
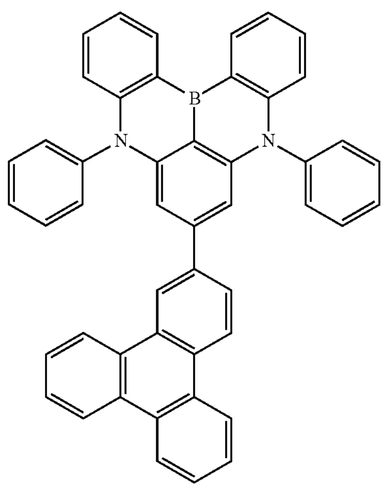
-continued
2-8
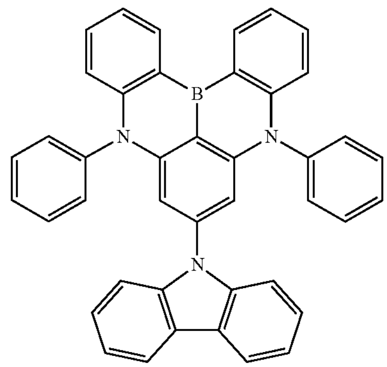
2-9
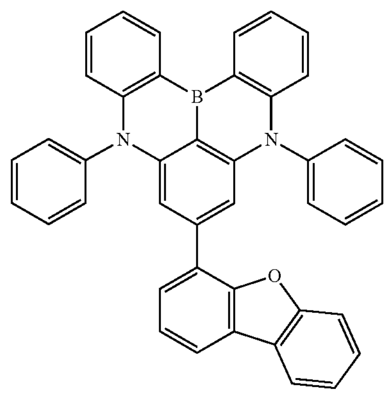
2-10
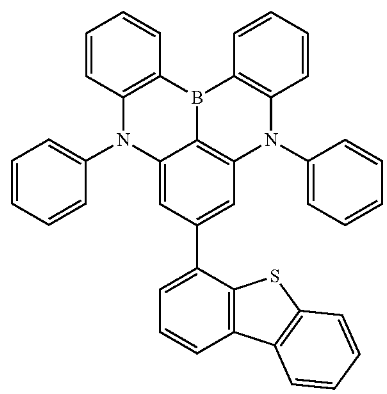
[C 52]
2-11
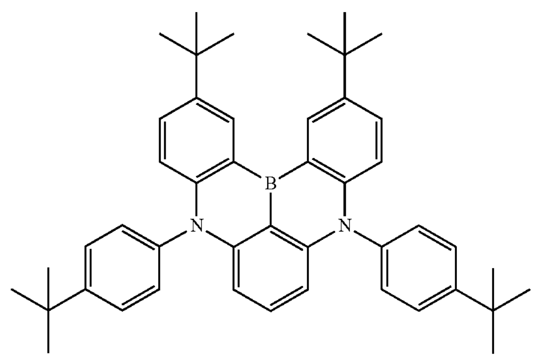

-continued
2-12
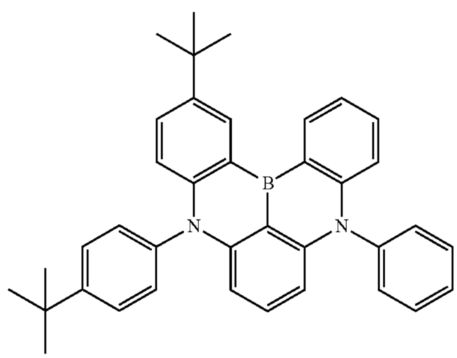
2-13
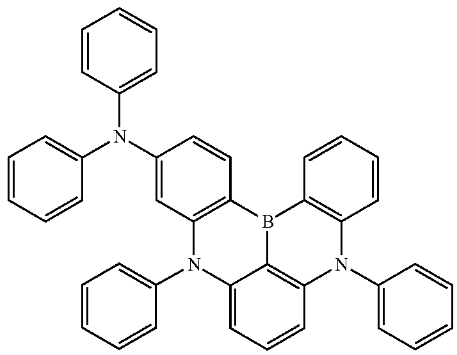
2-14
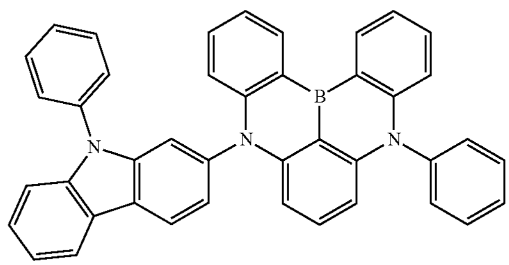
2-15
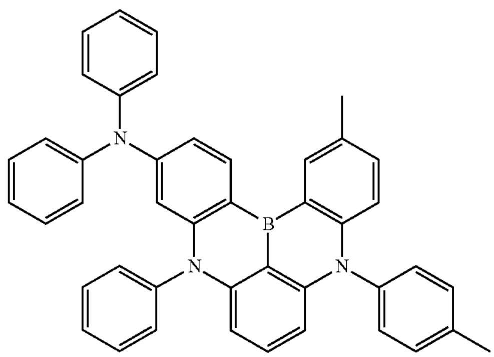
-continued
2-16
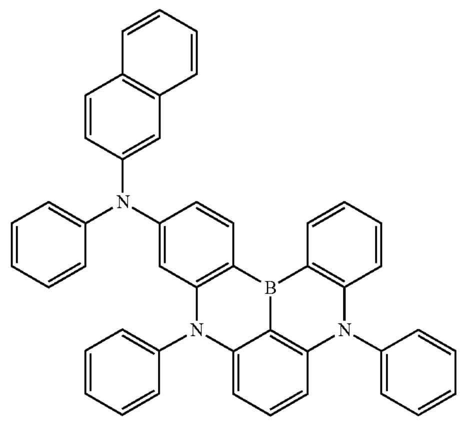
2-17
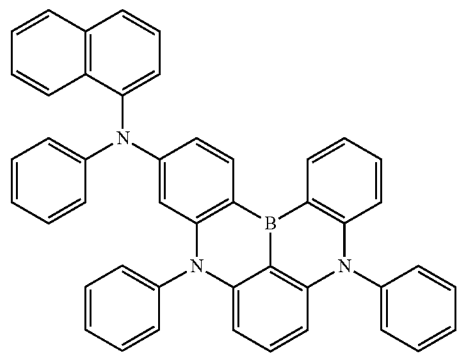
2-18
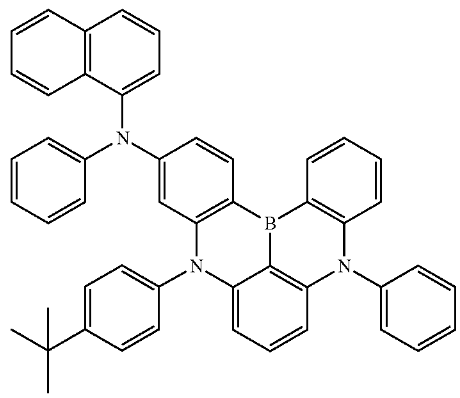
[C 53]
2-19
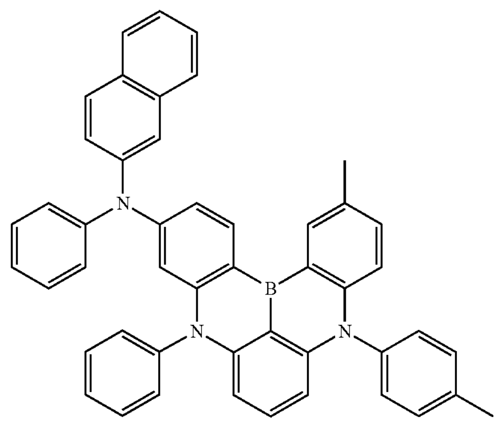

-continued
2-20
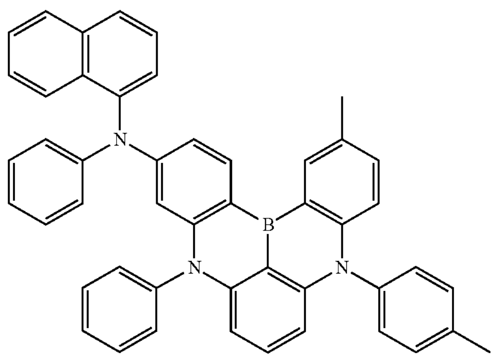
2-21
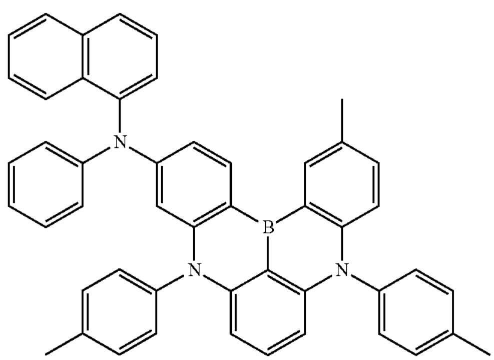
2-22
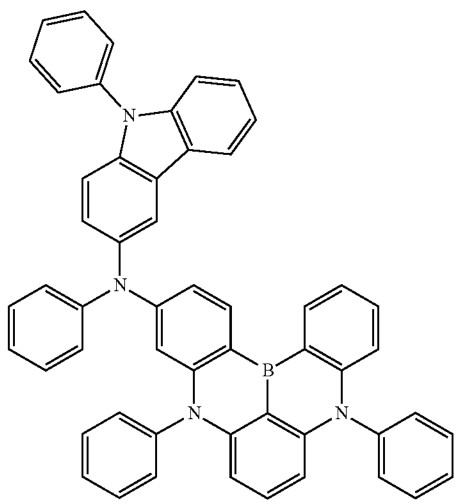
2-23
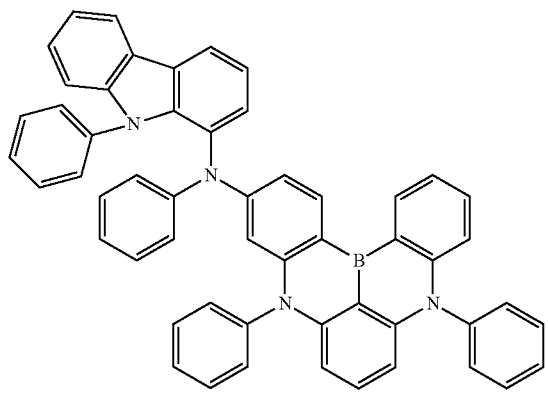
-continued
2-24
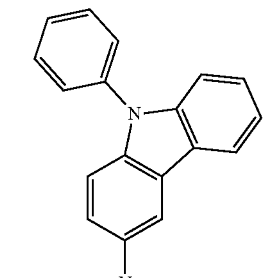
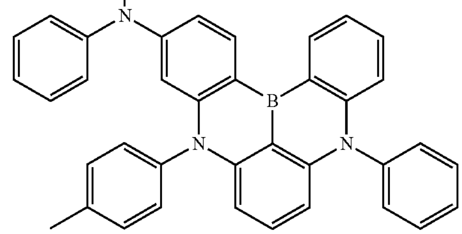
2-25
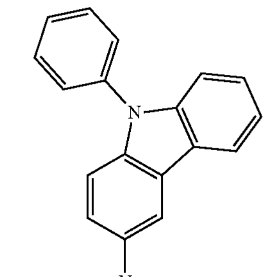
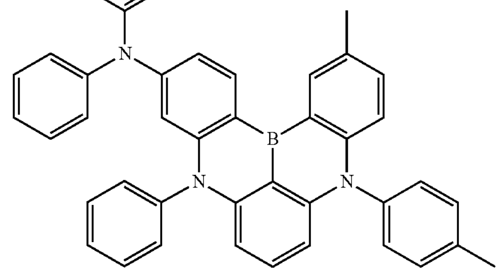
2-26
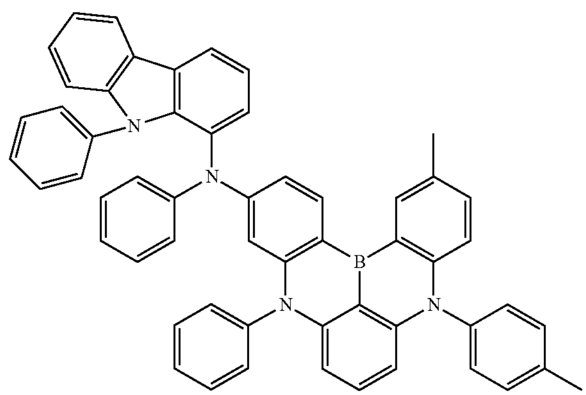

-continued
[C 54]
2-27
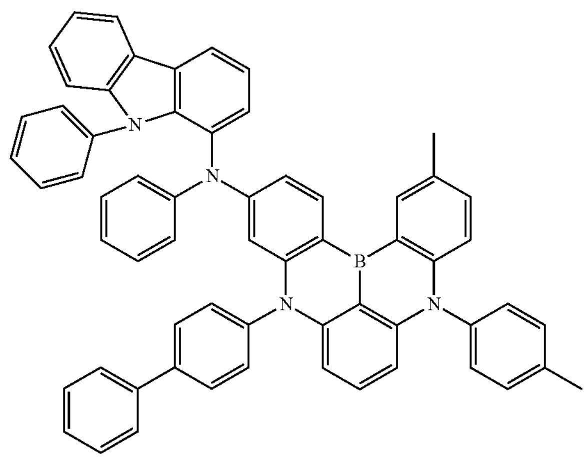
2-28
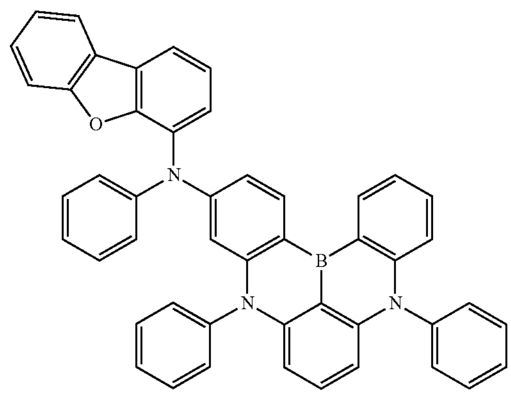
2-29
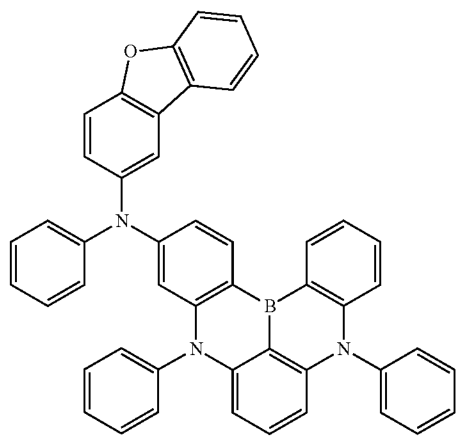
-continued
2-30
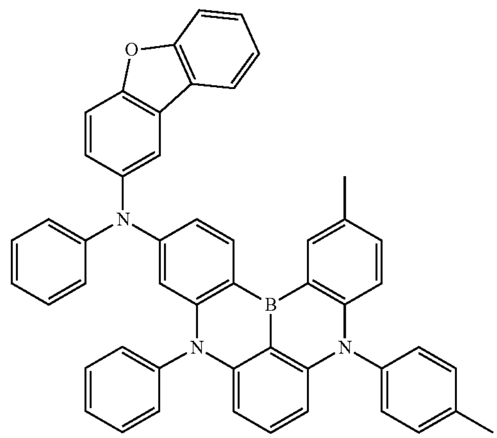
2-31
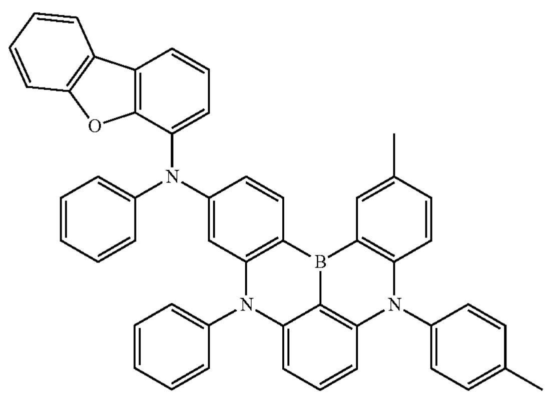
2-32
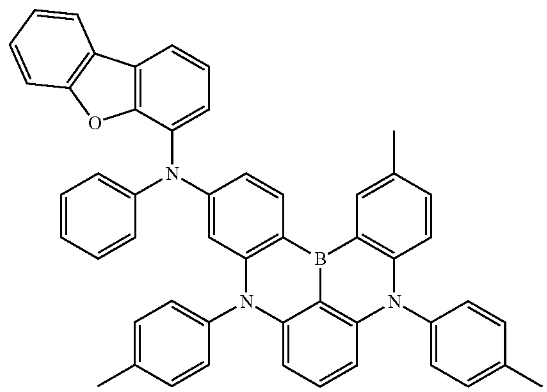

-continued
[C 55]
2-33
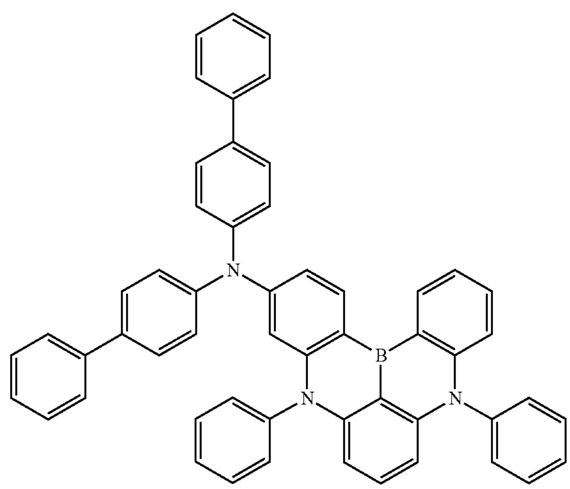
2-34
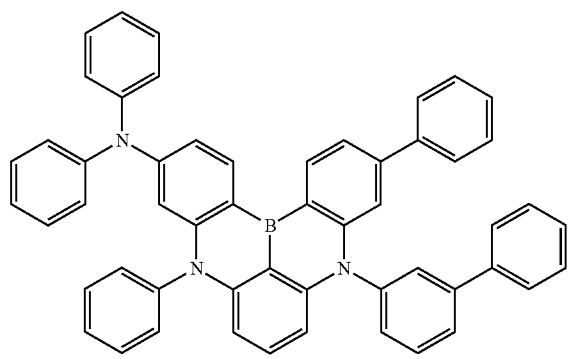
2-35
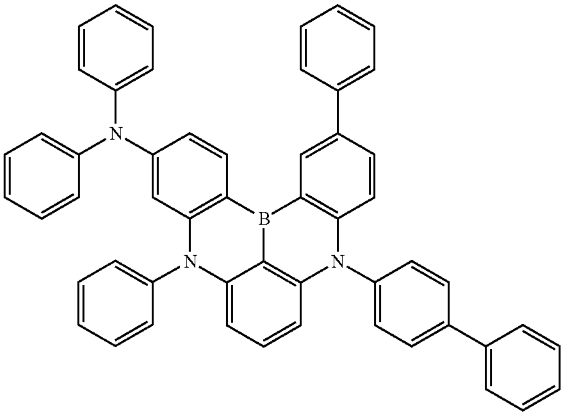
-continued
2-36
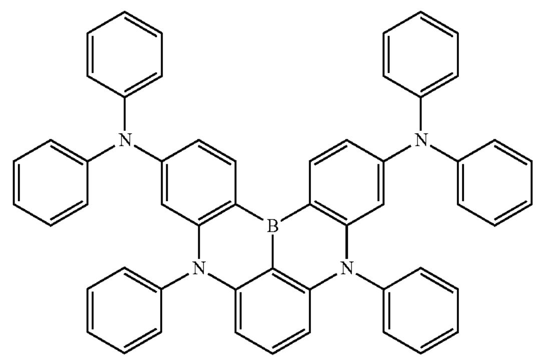
2-37
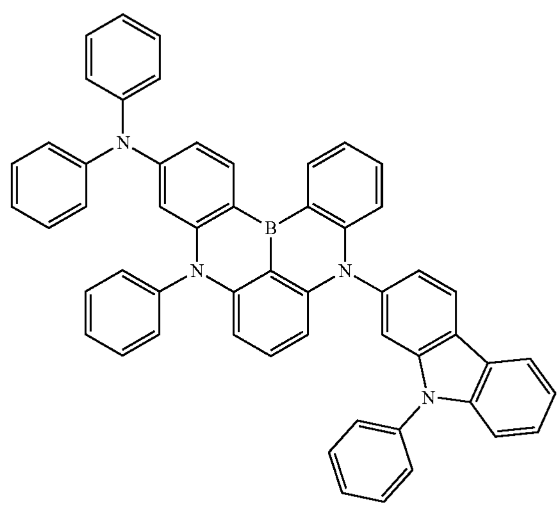
2-38
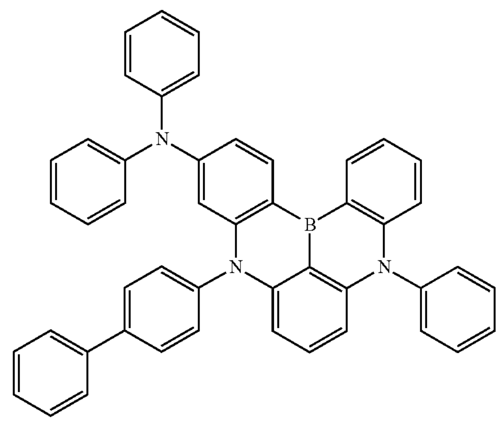

-continued
2-39
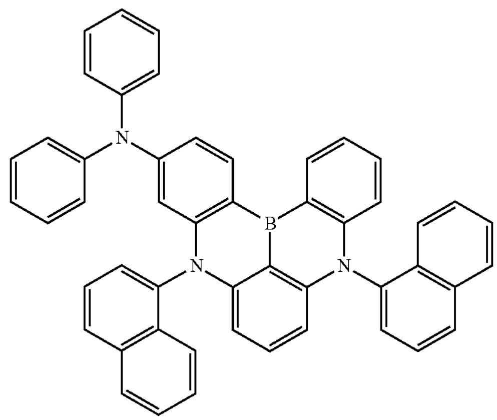
[C 56]
2-40
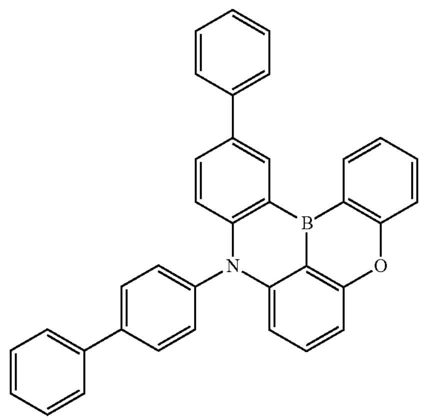
2-41
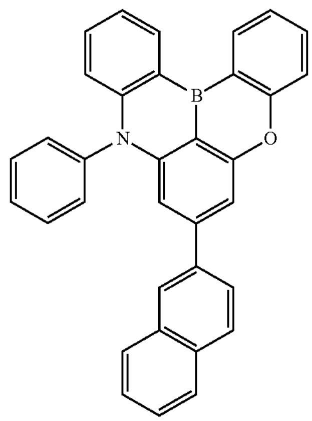
-continued
2-42
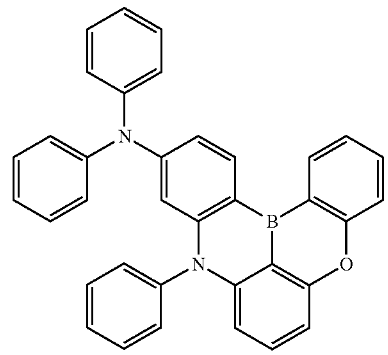
2-43
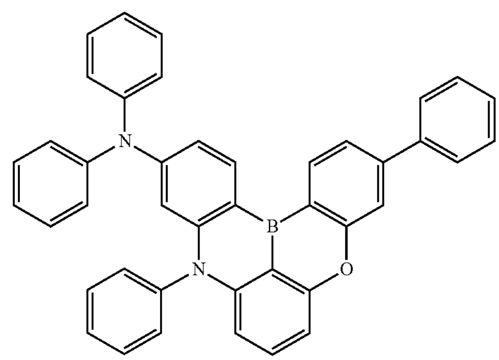
2-44
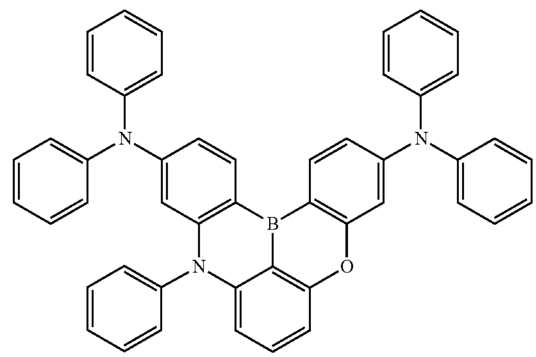
2-45
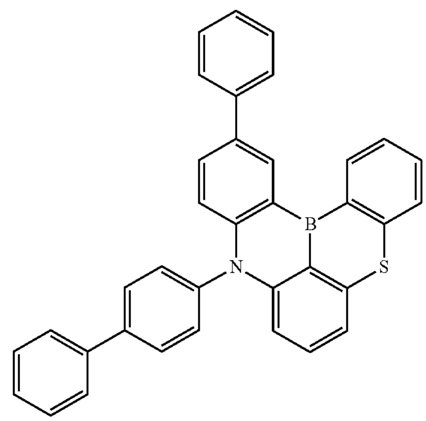

-continued
2-46
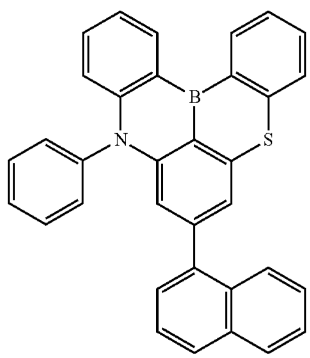
2-47
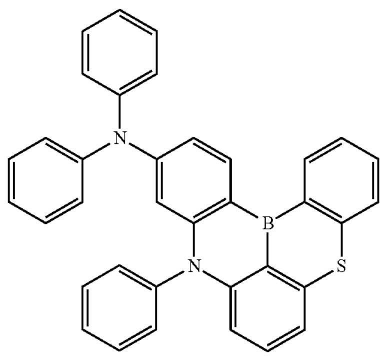
2-48
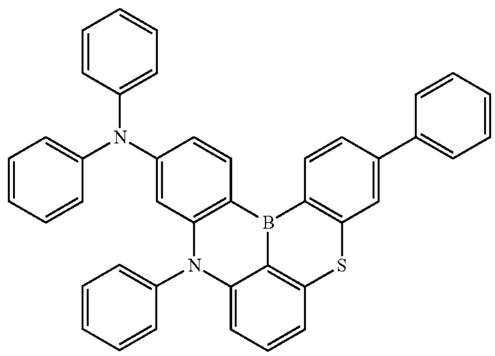
2-49
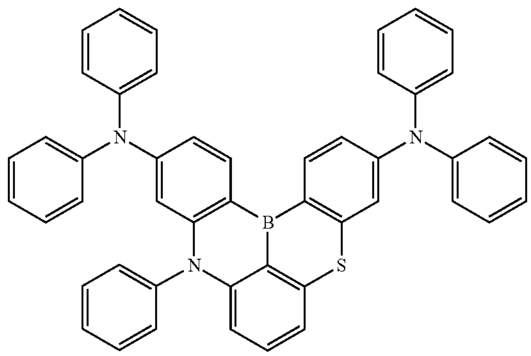
-continued
[C 57]
2-50
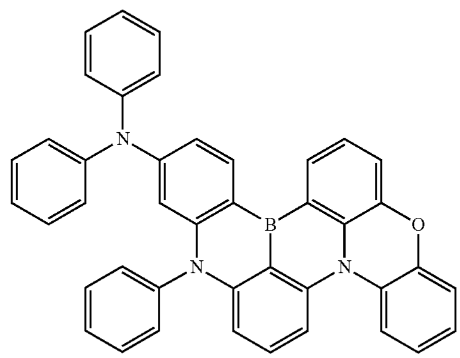
2-51
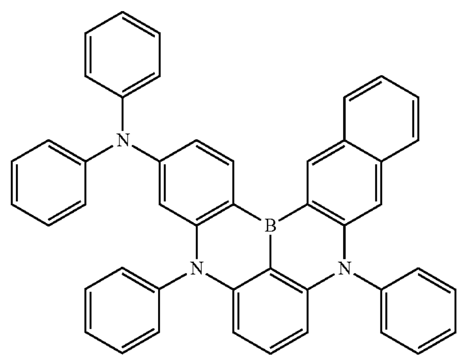
2-52
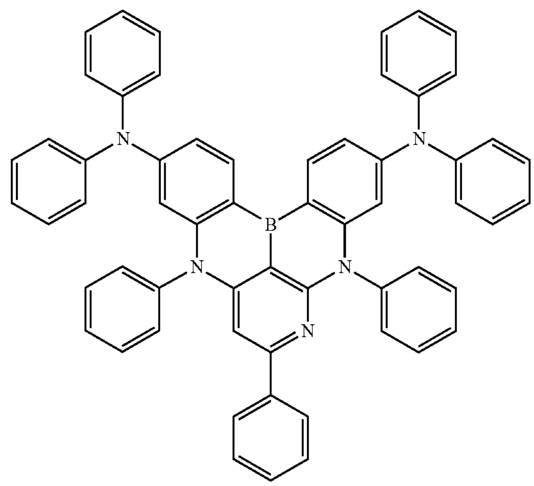

-continued
2-53
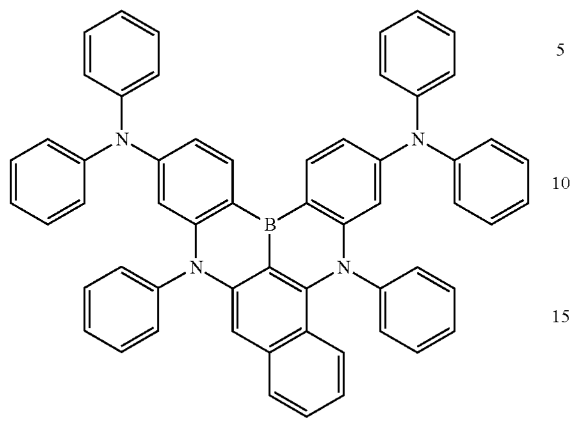
2-54
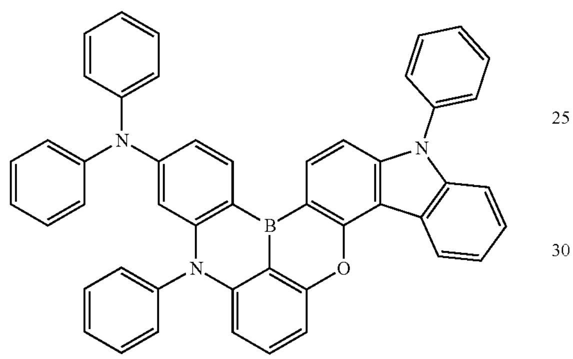
2-55
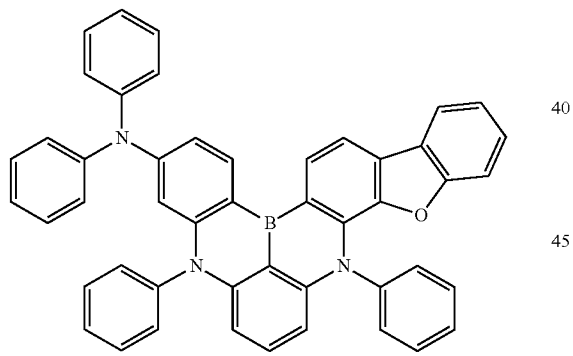
2-56
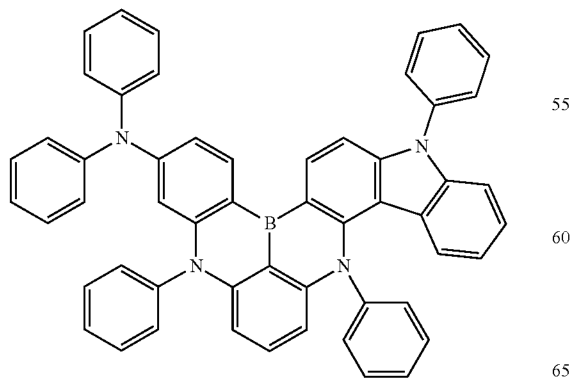
-continued
2-57
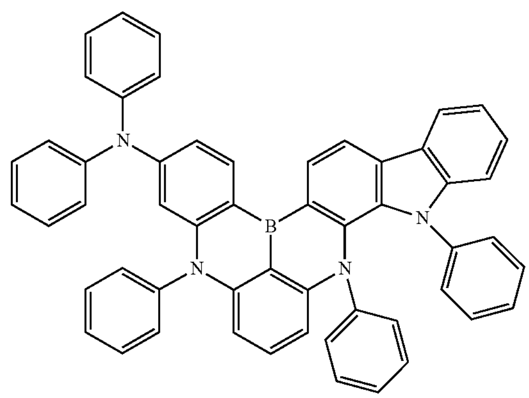
[C 58]
2-58
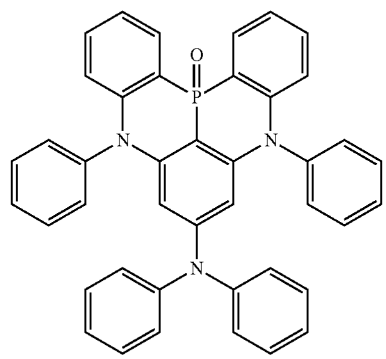
2-59
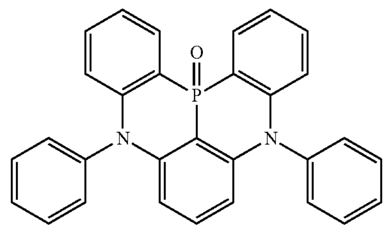
2-60
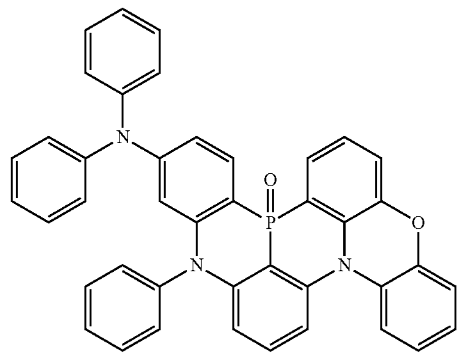

-continued
2-61
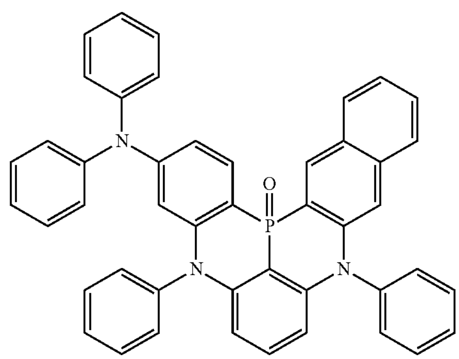
2-62
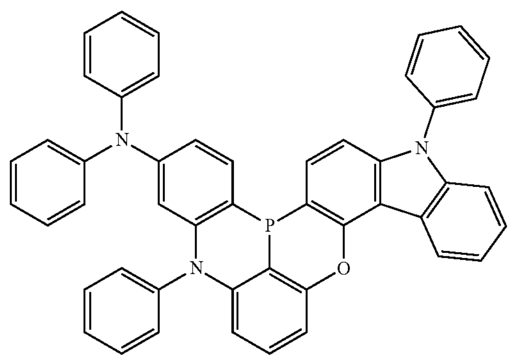
2-63
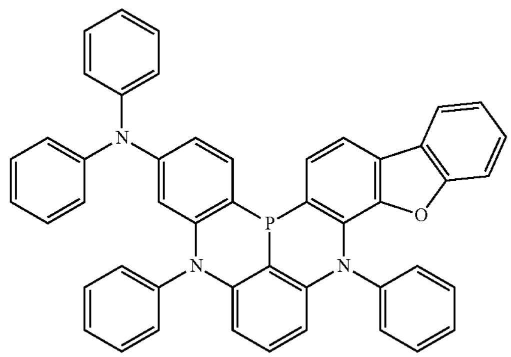
2-64
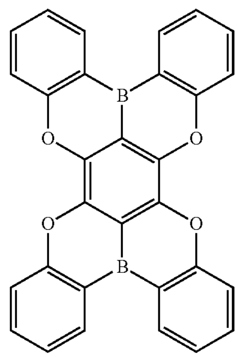
-continued
2-65
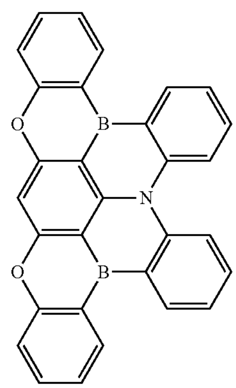
2-66
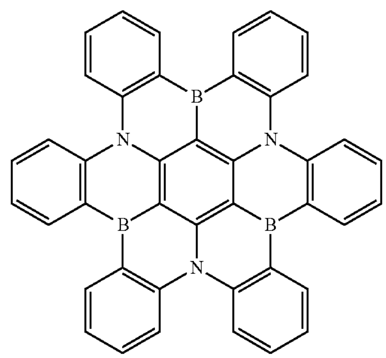
2-67
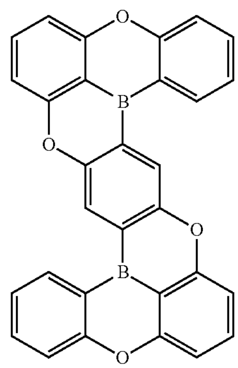
[C 60]
2-68
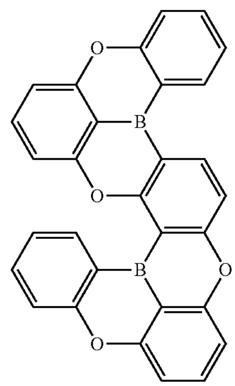

2-69
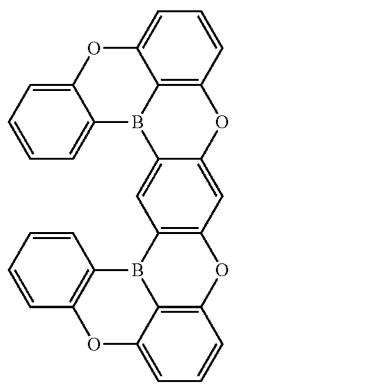
2-70
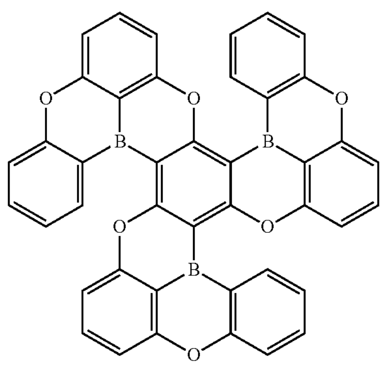
2-71
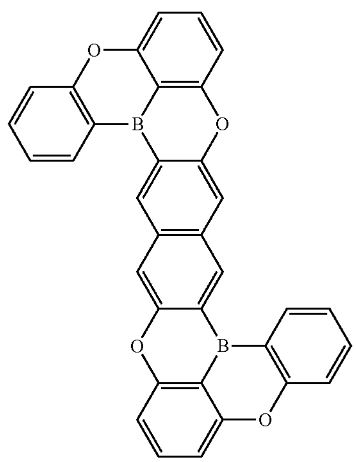
2-72
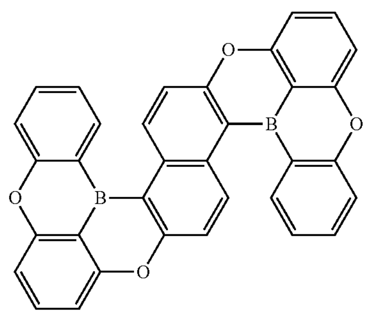
2-73
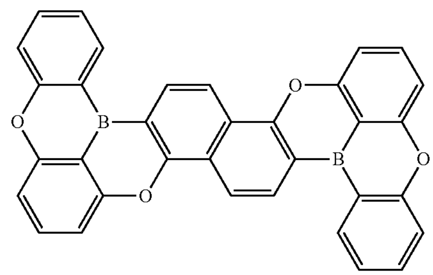
2-74
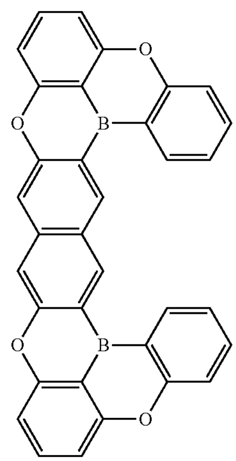
2-75
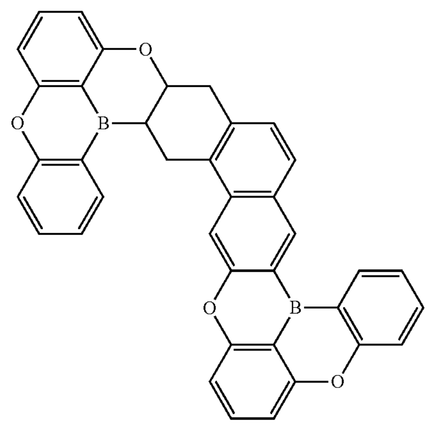
2-76
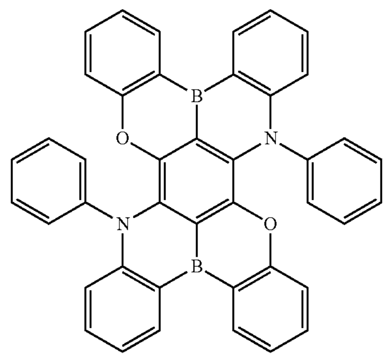

-continued
2-77
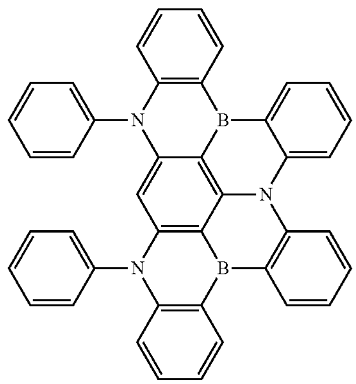
2-78
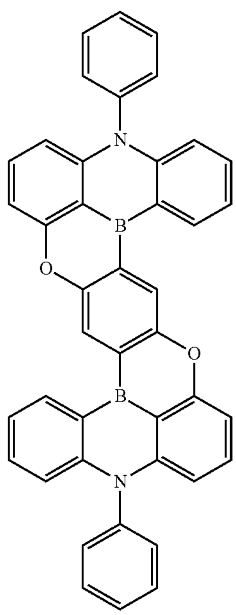
2-79
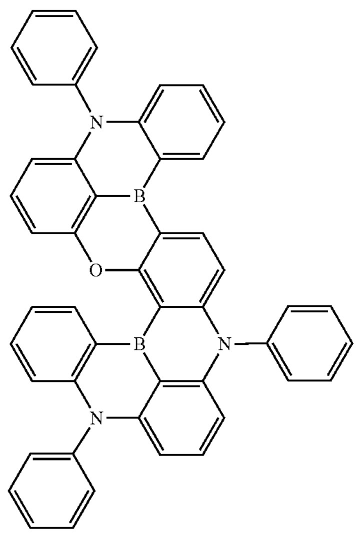
-continued
[C 61]
2-80
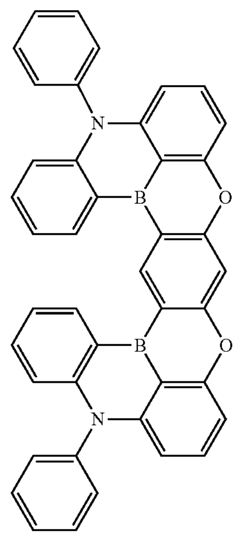
2-81
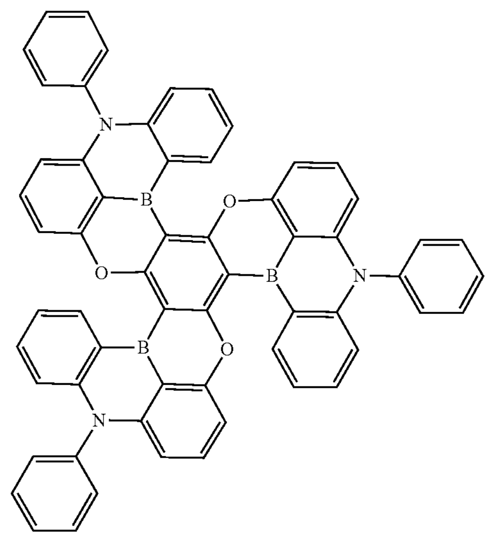

2-82
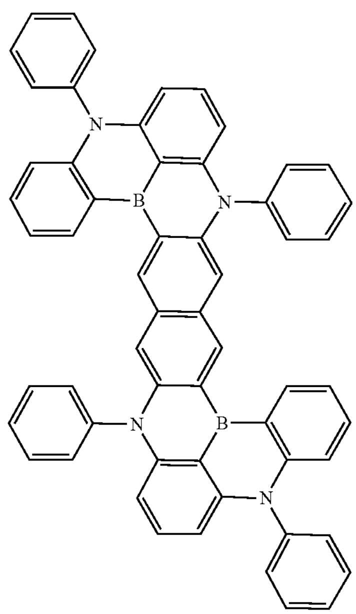
2-83
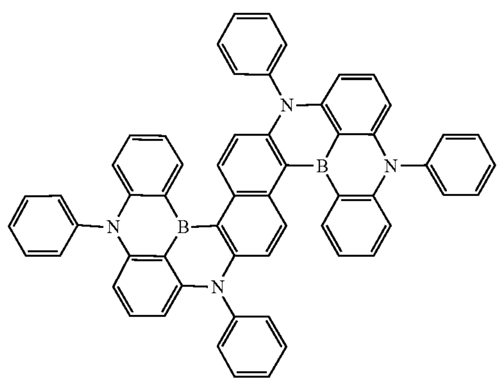
2-84
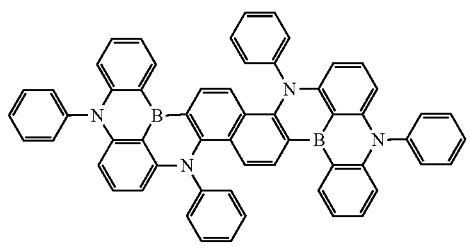
2-85
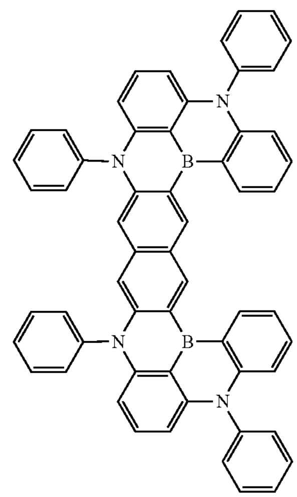
2-86
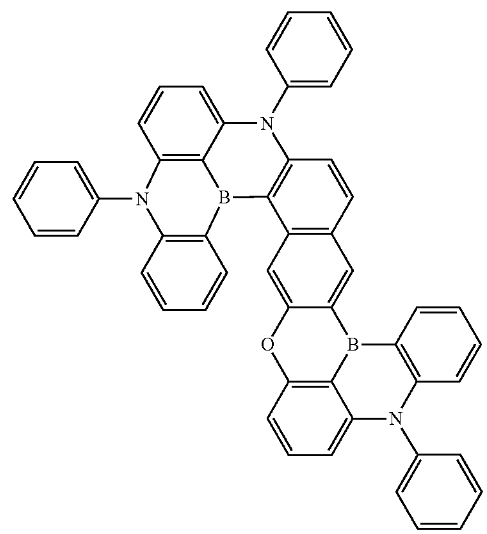
[ 62]
3-1
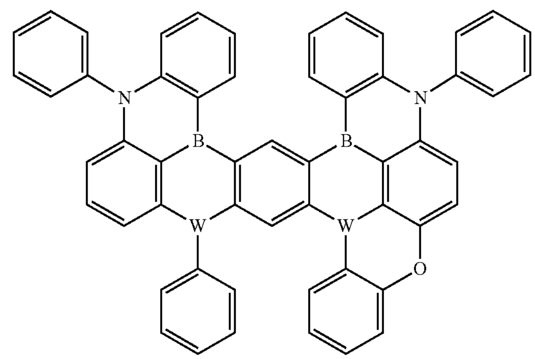

-continued
3-2
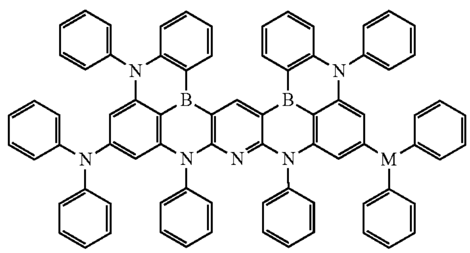
3-3
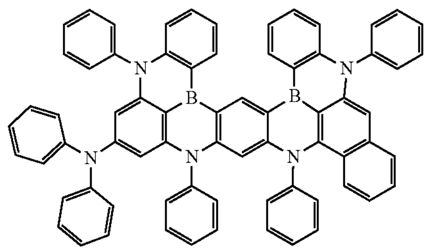
3-4
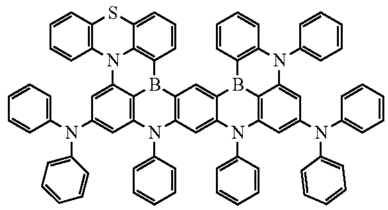
3-5
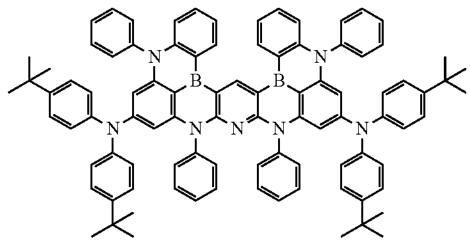
3-6
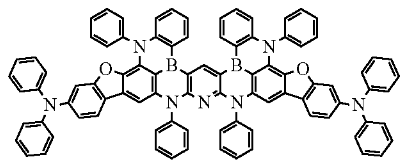
3-7
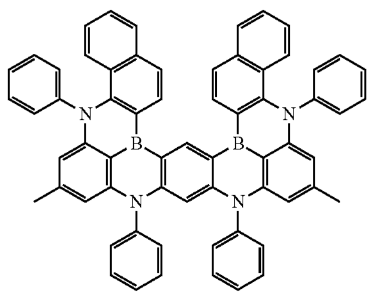
-continued
3-8
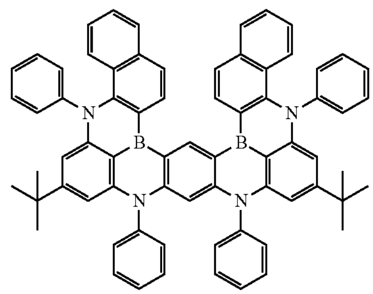
[C 63]
3-9
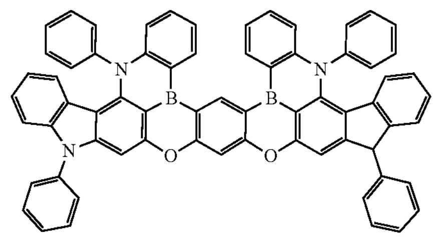
3-10
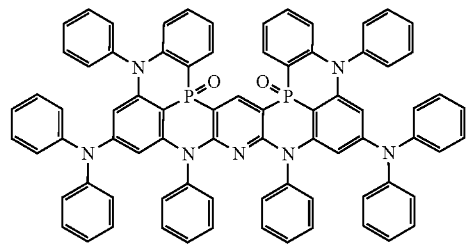
3-11
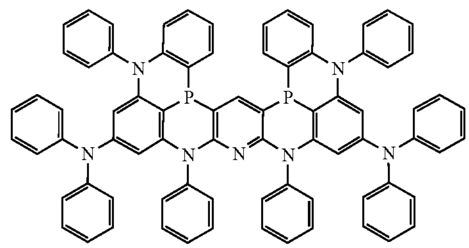
3-12
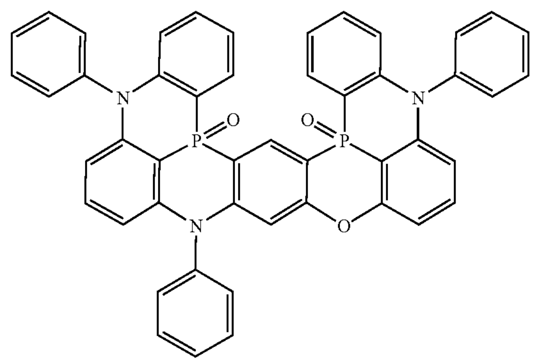

-continued
3-13
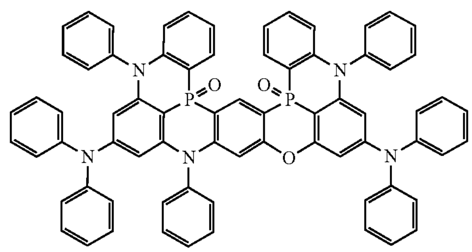
3-14
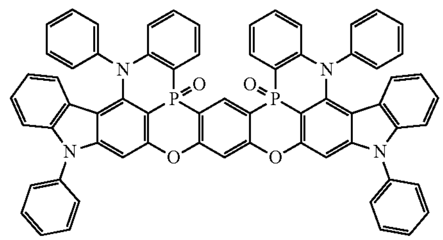
3-15
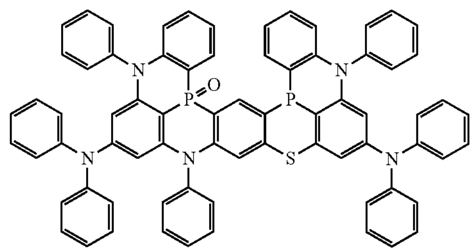
3-16
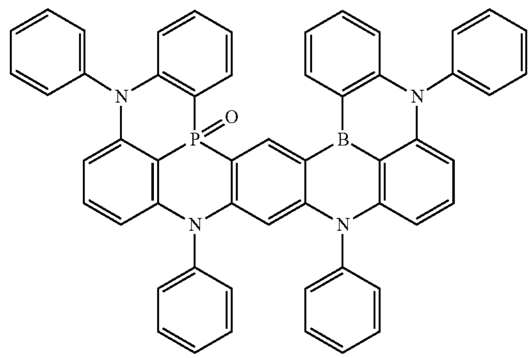
3-17
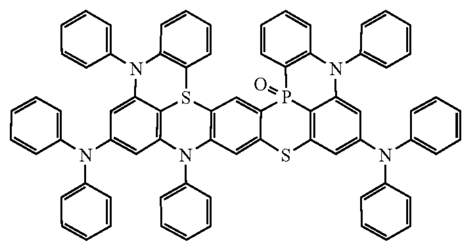
3-18
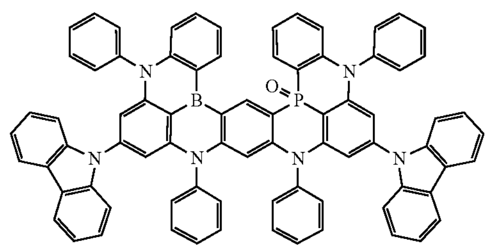
-continued
[C 64]
3-19
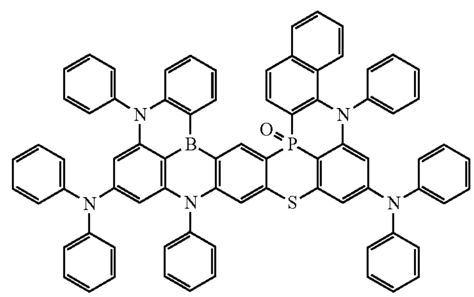
3-20
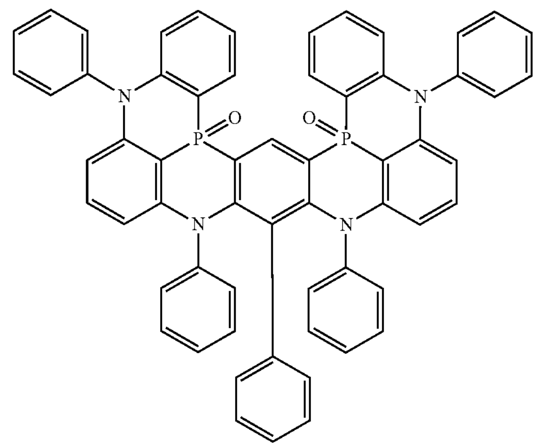
3-21
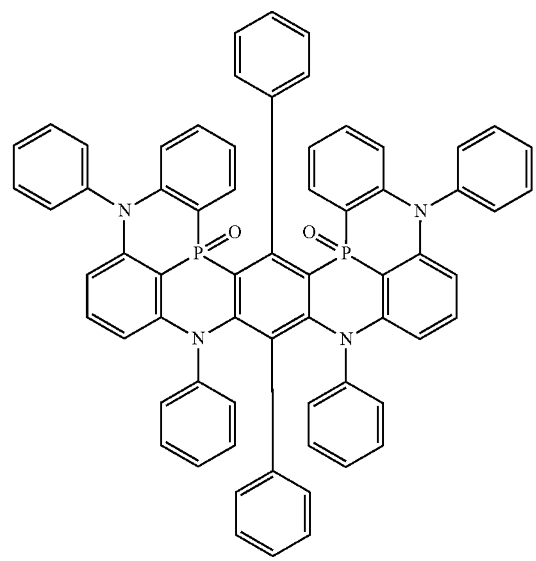
3-22
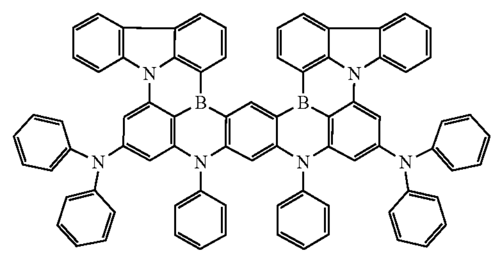

-continued
4-1
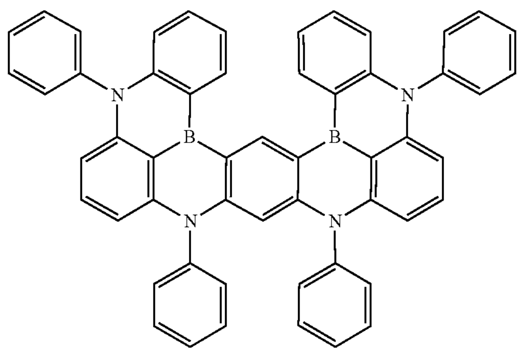
4-2
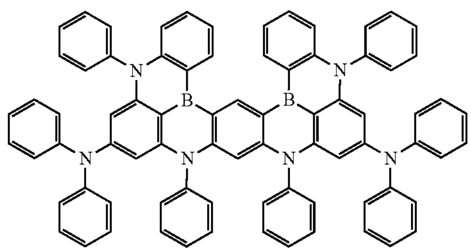
[C 65]
4-3
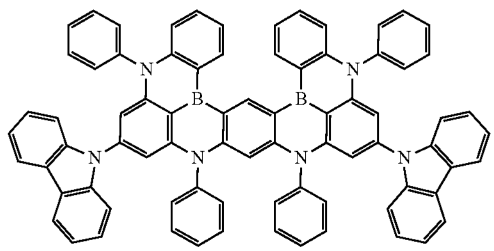
4-4
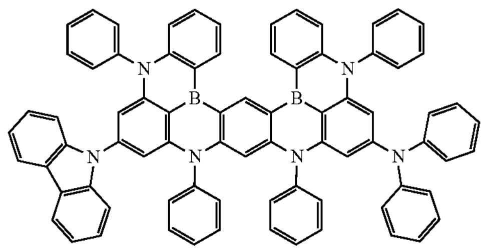
4-5
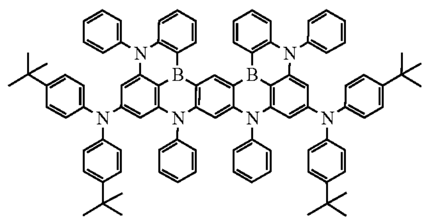
4-6
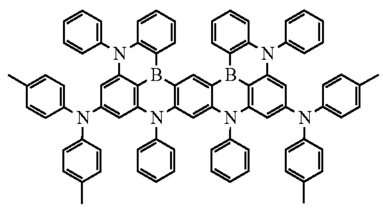
-continued
[C 66]
4-7
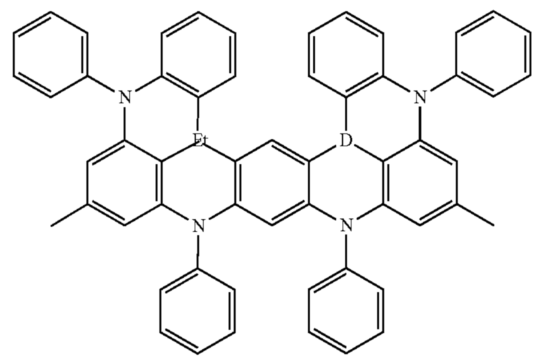
4-8
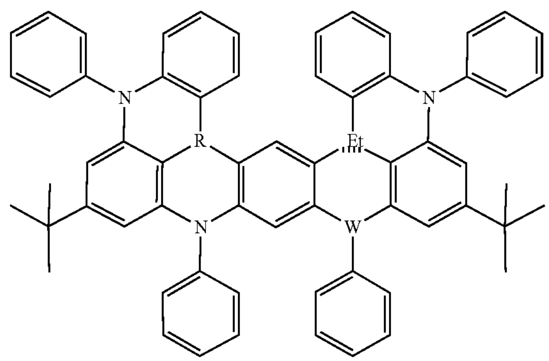
4-9
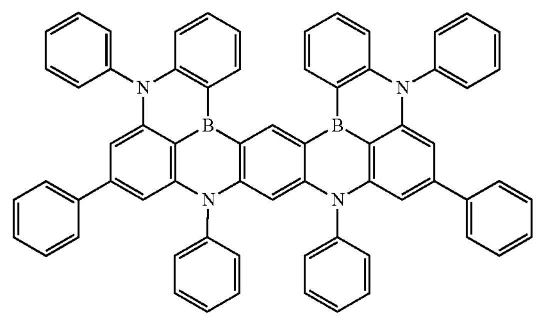
4-10
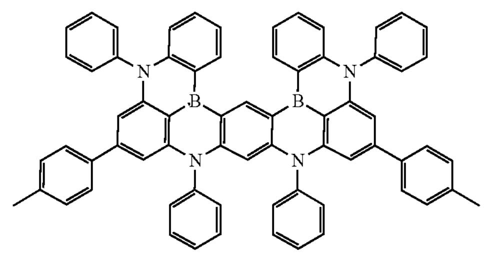

4-11
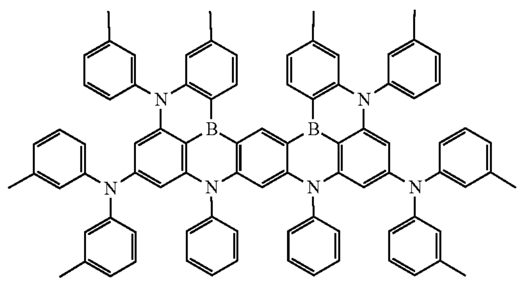
4-12
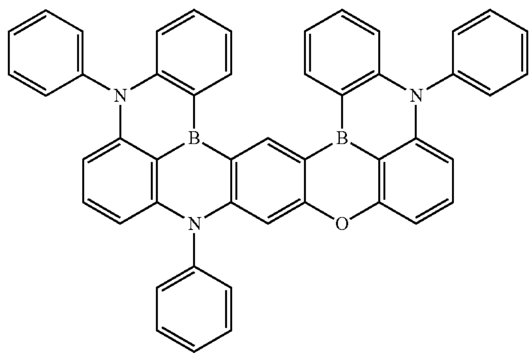
4-13
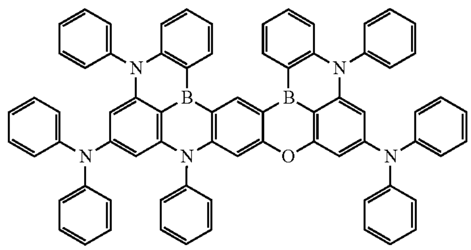
4-14
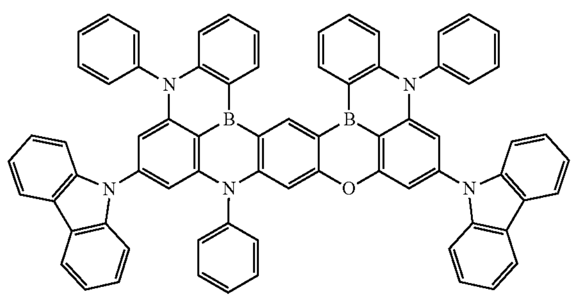
[C 67]
4-15
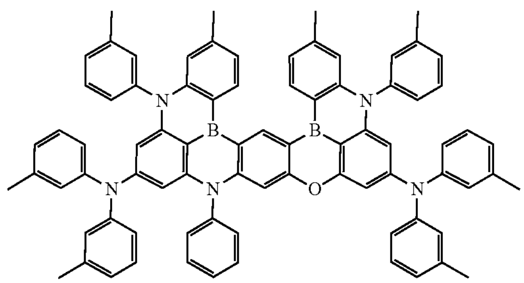
4-16
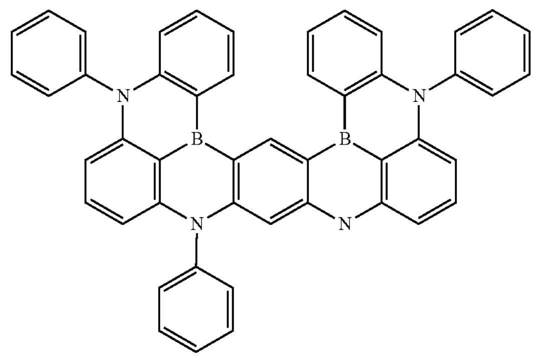
4-17
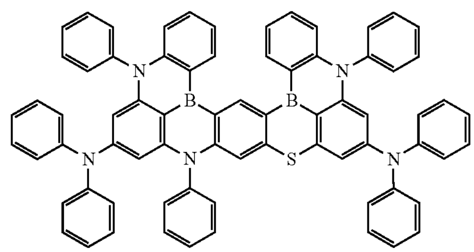
4-18
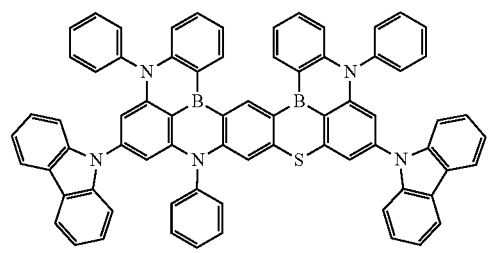
4-19
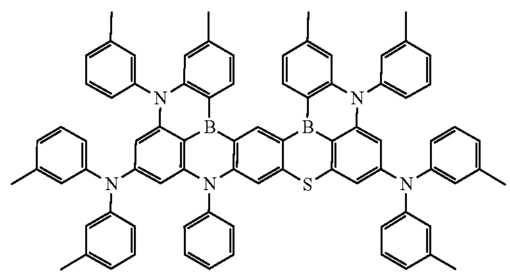

-continued

[C 68]

4-20

4-21

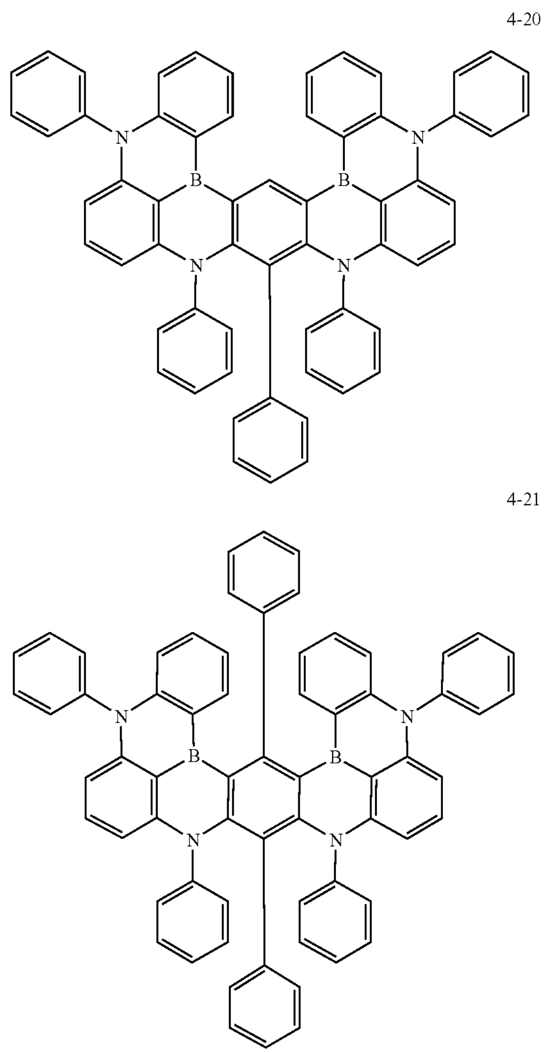

The organic light emitting material used as a light emitting dopant in the organic EL device of the present invention preferably has a ΔEST of 0.20 eV or less, more preferably 0.15 eV or less, and particularly preferably 0.10 eV or less.

The ΔEST represents a difference between excited singlet energy (S1) and excited triplet energy (T1). Here, S1 and T1 are measured by the method described in the Examples.

By using a compound represented by the general formula (2), (3), or (4) as the light emitting dopant, or the material as the light emitting dopant selected from the polycyclic aromatic compounds having the structure represented by the general formula (2) as a substructure, and using the material as the host selected from the compounds represented by the general formula (1), (5), (6), (7) or the general formula (8), an excellent organic EL device can be provided.

Next, the structure of the organic EL device of the present invention will be described with reference to the drawings, however, the structure of the organic EL device is not limited thereto.

FIG. 1 is the cross sectional view illustrating the structural example of the general organic EL device used in the present invention, and 1 denotes a substrate, 2 is an anode, 3 is a hole injection layer, 4 is a hole transport layer, 5 is a light emitting layer, 6 is an electron transport layer, and 7 is a cathode, respectively. The organic EL device of the present invention may have an exciton blocking layer adjacent to the light emitting layer, or may have an electron blocking layer between the light emitting layer and the hole injection layer. The exciton blocking layer may be inserted on either the anode side or the cathode side of the light emitting layer or may be inserted on both sides at the same time. The organic EL device of the present invention has the anode, the light emitting layer, and the cathode as essential layers, but preferably has a hole injection/transport layer and an electron injection/transport layer in addition to the essential layers, and further preferably has a hole blocking layer between the light emitting layer and the electron injection/transport layer. The hole injection/transport layer means either or both of the hole injection layer and the hole transport layer, and the electron injection/transport layer means either or both of the electron injection layer and electron transport layer.

It is also possible to have a structure that is the reverse of the structure shown in FIG. 1, that is, the cathode 7, the electron transport layer 6, the light emitting layer 5, the hole transport layer 4, and the anode 2 can be laminated on the substrate 1, in the order presented. Also, in this case, layers can be added or omitted, as necessary.

—Substrate—

The organic EL device of the present invention is preferably supported on a substrate. The substrate is not particularly limited and may be a substrate conventionally used for organic EL devices, and for example, a substrate made of glass, transparent plastic, or quartz can be used.

—Anode—

As the anode material in the organic EL device, a material made of a metal, alloy, or conductive compound having a high work function (4 eV or more), or a mixture thereof is preferably used. Specific examples of such an electrode material include metals such as Au, and conductive transparent materials such as CuI, indium tin oxide (ITO), $SnO_2$, and ZnO. An amorphous material capable of producing a transparent conductive film such as IDIXO ($In_2O_3$—ZnO) may also be used. As the anode, these electrode materials may be formed into a thin film by a method such as vapor deposition or sputtering, and then a pattern of a desired form may be formed by photolithography. Alternatively, when a highly precise pattern is not required (about 100 μm or more), a pattern may be formed through a mask of a desired form at the time of vapor deposition or sputtering of the above electrode materials. Alternatively, when a coatable material such as an organic conductive compound is used, a wet film forming method such as a printing method and a coating method can also be used. When light is extracted from the anode, the transmittance is desirably more than 10%, and the sheet resistance as the anode is preferably several hundred Ω/square or less. The film thickness is selected within a range of usually 10 to 1,000 nm, and preferably 10 to 200 nm, although it depends on the material.

—Cathode—

On the other hand, a material made of a metal (referred to as an electron injection metal), alloy, or conductive compound having a low work function (4 eV or less) or a mixture thereof is used as the cathode material. Specific examples of such an electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal. Among them, in terms of electron injection properties and durability against oxidation and the like, a mixture of an electron injection metal with a second metal that has a higher work function value than the electron injection metal and is stable, for example, a magnesium/silver mixture, a magnesium/aluminum mixture, a magnesium/indium mixture, an aluminum/aluminum oxide ($Al_2O_3$) mixture, a lithium/aluminum mixture, or aluminum is suitable. The cathode can be produced by forming a thin film from these cathode materials by a method such as vapor deposition and sputtering. The sheet resistance as the cathode is preferably several hundred Ω/square or less, and the film thickness is selected within a range of usually 10 nm to 5 μm, and preferably 50 to 200 nm. To transmit the light emitted, either one of the anode and the cathode of the organic EL device is favorably transparent or translucent because light emission brightness is improved.

The above metal is formed to have a film thickness of 1 to 20 nm on the cathode, and then a conductive transparent material mentioned in the description of the anode is formed on the metal, so that a transparent or translucent cathode can be produced. By applying this process, a device in which both anode and cathode have transmittance can be produced.

—Light Emitting Layer—

The light emitting layer is a layer that emits light after holes and electrons respectively injected from the anode and the cathode are recombined to form excitons, and the light emitting layer includes the light emitting dopant and the hosts.

For the light emitting dopant and the hosts, 99.9 to 90% of the hosts and 0.10 to 10% (% by mass) of the light emitting dopant can be used, for example. Preferably, the amount of the light emitting dopant is 1.0 to 5.0% and the amount of the hosts is 99 to 95%. More preferably, the amount of the light emitting dopant is 1.0 to 3.0% and the amount of the hosts is 99 to 97%.

In the present description, % denotes % by mass unless otherwise noted.

As the host in the light emitting layer, two or more hosts represented by the general formula (1) can be used. For the first host and the second host, for example, the first host can be used in an amount of 10 to 90% and the second host can be used in an amount of 90 to 10%. Preferably, the amount of the first host is 30 to 70% and the amount of the second host is 70 to 30%. More preferably, the amount of the first host is 40 to 60% and the amount of the second host is 60 to 40%.

Furthermore, one known host or a plurality of known hosts may be combined for use as other host other than those described above, and, the amount used may be 50% or less and preferably 25% or less relative to the total amount of the host materials.

The host is preferably a compound that has the hole transport capability and the electron transport capacity and a high glass transition temperature and has a T1 that is greater than the T1 of the light emitting dopant. Specifically, the host has a T1 greater than the T1 of the light emitting dopant preferably by 0.010 eV or higher, more preferably by 0.030 eV or higher, and still more preferably by 0.10 eV or higher. Moreover, a TADF-active compound may also be used as the host material, and a compound with the ΔEST above 0.20 eV or less is preferred.

Other hosts described above have been well known by numerous patent literatures and the like and may be selected therefrom. Specific examples of the host include, but are not particularly limited to, various metal complexes typified by metal complexes of indole derivatives, carbazole derivatives, triazole derivatives, oxazole derivatives, oxadiazole derivatives, imidazole derivatives, phenylenediamine derivatives, arylamine derivatives, styrylanthracene derivatives, fluorenone derivatives, stilbene derivatives, triphenylene derivatives, carborane derivatives, porphyrin derivatives, phthalocyanine derivatives, and 8-quinolinol derivatives, and metal phthalocyanine, and metal complexes of benzoxazole and benzothiazole derivatives; and polymer compounds such as poly(N-vinyl carbazole)derivatives, aniline-based copolymers, thiophene oligomers, polythiophene derivatives, polyphenylene derivatives, polyphenylene vinylene derivatives, and polyfluorene derivatives.

When a plurality of hosts is used, each host is deposited from different deposition sources, or a plurality of hosts is premixed before vapor deposition to form a premix, whereby a plurality of hosts can be simultaneously deposited from one deposition source.

As the method of premixing, a method by which hosts can be mixed as uniformly as possible is desirable, and examples thereof include, but are not limited to, milling, a method of heating and melting hosts under reduced pressure or under an inert gas atmosphere such as nitrogen, and sublimation.

As the light emitting dopant in the light emission layer, the polycyclic aromatic compound represented by the general formula (2) above or the polycyclic aromatic compound having the structure represented by the general formula (2) as a substructure (substructured polycyclic aromatic compound) are used. The polycyclic aromatic compound having the structure represented by general formula (2) as a substructure is preferably a substructured polycyclic aromatic compound represented by the general formula (3) above, and more preferably the boron-containing substructured polycyclic aromatic compound represented by formula (4) above. The light emitting dopant preferably has a difference between the excited singlet energy (S1) and the excited triplet energy (T1) (ΔEST) of 0.20 eV or less.

The light emitting dopant may include one type thereof alone in the light emission layer, or two or more types thereof. The content of the light emitting dopant is preferably 0.050 to 50% and more preferably 0.10 to 40%, relative to the host materials.

When including two or more light emitting dopants in the light emitting layer, the first dopant is the compound represented by the general formula (2), (3) or (4), or the aforementioned substructured polycyclic aromatic compound, and the second dopant may be combined for use with a known compound as the light emitting dopant. The content of the first dopant is preferably 0.050 to 50% relative to the host materials, the content of the second dopant is preferably 0.050 to 50% relative to the host materials, and the total content of the first dopant and the second dopant does not exceed 50% of the host materials.

Such other light emitting dopants have been known by numerous patent literatures and may be selected therefrom. Specific examples of the dopants are not particularly limited, and include fused ring derivatives such as phenanthrene, anthracene, pyrene, tetracene, pentacene, perylene, naphthopyrene, dibenzopyrene, rubrene, and chrysene, benzoxazole derivatives, benzothiazole derivatives, benzoimidazole derivatives, benzotriazole derivatives, oxazole derivatives, oxadiazole derivatives, thiazole derivatives, imidazole derivatives, thiadiazole derivatives, triazole derivatives, pyrazoline derivatives, stilbene derivatives, thiophene derivatives, tetraphenylbutadiene derivatives, cyclopentadiene derivatives, bisstyryl derivatives such as a bisstyrylanthracene derivative and a distyrylbenzene derivative, bisstyrylarylene derivatives, diazaindacene derivatives, furan derivatives, benzofuran derivatives, isobenzofuran derivatives, dibenzofuran derivatives, coumarin derivatives, dicyanomethylenopyran derivatives, dicyanomethylenethiopyran derivatives, polymethine derivatives, cyanine derivatives, oxobenzoanthracene derivatives, xanthene derivatives, rhodamine derivatives, fluorescein derivatives, pyrylium derivatives, carbostyryl derivatives, acridine derivatives, oxazine derivatives, phenylene oxide derivatives, quinacridone derivatives, quinazoline derivatives, pyrrolopyridine derivatives, fluoropyridine derivatives, 1,2,5-thiadiazolopyrene derivatives, pyromethene derivatives, perinone derivatives, pyrrolopyrrole derivatives, squarylium derivatives, violanthrone derivatives, phenazine derivatives, acridone derivatives, deazaflavin derivatives, fluorene derivatives, benzofulorene derivatives, etc.

The light emitting dopant and the first host or the light emitting dopant and the second host may be deposited from different deposition sources, or may be premixed before vapor deposition to form a premix, whereby the light emitting dopant and the first host or the light emitting dopant and the second host can be simultaneously deposited from one deposition source.

—Injection Layer—

The injection layer refers to a layer provided between the electrode and the organic layer to reduce the driving voltage and improve the light emission brightness, and includes the hole injection layer and the electron injection layer. The injection layer may be present between the anode and the light emitting layer or the hole transport layer, as well as between the cathode and the light emitting layer or the electron transport layer. The injection layer may be provided as necessary.

—Hole Blocking Layer—

The hole blocking layer has the function of the electron transport layer in a broad sense, is made of a hole blocking material having a very small ability to transport holes while having the function of transporting electrons, and can improve the recombination probability between the electrons and the holes in the light emitting layer by blocking the holes while transporting the electrons. For the hole blocking layer, a known hole blocking material can be used. To exhibit the characteristics of the light emitting dopant, the material used as the host can also be used as the material for the hole blocking layer. Moreover, a plurality of hole blocking materials may be combined for use.

—Electron Blocking Layer—

The electron blocking layer has the function of the hole transport layer in a broad sense, and can improve the recombination probability between the electrons and the holes in the light emitting layer by blocking the electrons while transporting the holes. As the material for the electron blocking layer, a known material for the electron blocking layer can be used. To exhibit the characteristics of the light emitting dopant, the material used as the host can also be used as the material for the electron blocking layer.

The film thickness of the electron blocking layer is preferably 3 to 100 nm, and more preferably 5 to 30 nm.

—Exciton Blocking Layer—

The exciton blocking layer is a layer to block the diffusion of the excitons generated by recombination of the holes and the electrons in the light emitting layer into a charge transport layer, and insertion of this layer makes it possible to efficiently keep the excitons in the light emitting layer, so that the emission efficiency of the device can be improved. The exciton blocking layer can be inserted between two light emitting layers adjacent to each other in the device in which two or more light emitting layers are adjacent to each other.

As the material for the exciton blocking layer, a known material for the exciton blocking layer can be used.

The layer adjacent to the light emitting layer includes the hole blocking layer, the electron blocking layer, and the exciton blocking layer, and when these layers are not provided, the adjacent layer is the hole transport layer, the electron transport layer, and the like.

—Hole Transport Layer—

The hole transport layer is made of a hole transport material having the function of transporting holes, and the hole transport layer may be provided as a single layer or a plurality of layers.

The hole transport material has any of hole injection properties, hole transport properties, or electron barrier properties, and may be either an organic material or an inorganic material. As the hole transport layer, any of conventionally known compounds may be selected and used. Examples of such a hole transport material include porphyrin derivatives, arylamine derivatives, triazole derivatives, oxadiazole derivatives, imidazole derivatives, polyarylalkane derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers, and conductive polymer oligomers, particularly, thiophene oligomers. Porphyrin derivatives, arylamine derivatives, and styrylamine derivatives are preferably used, and arylamine compounds are more preferably used.

—Electron Transport Layer—

The electron transport layer is made of a material having the function of transporting electrons, and the electron transport layer may be provided as a single layer or a plurality of layers.

The electron transport material (may also serve as the hole blocking material) has the function of transmitting electrons injected from the cathode to the light emitting layer. As the electron transport layer, any of conventionally known compounds may be selected and used, and examples thereof include polycyclic aromatic derivatives such as naphthalene, anthracene, and phenanthroline, tris(8-quinolinolato)aluminum (III) derivatives, phosphine oxide derivatives, nitro-substituted fluorene derivatives, diphenylquinone derivatives, thiopyran dioxide derivatives, carbodiimides, fluorenylidene methane derivatives, anthraquinodimethane and anthrone derivatives, bipyridine derivatives, quinoline derivatives, oxadiazole derivatives, benzimidazole derivatives, benzothiazole derivatives, and indolocarbazole derivatives. Further, polymer materials in which these materials are introduced in the polymer chain or these materials constitute the main chain of the polymer can also be used.

When the organic EL device of the present invention is produced, the film formation method of each layer is not particularly limited, and the layers may be produced by either a dry process or a wet process.

EXAMPLES

Hereinafter, the present invention will be described in further detail with reference to Examples, but the present invention is not limited to these Examples.

The compounds used in Examples and Comparative Examples are shown below.

[C 69]

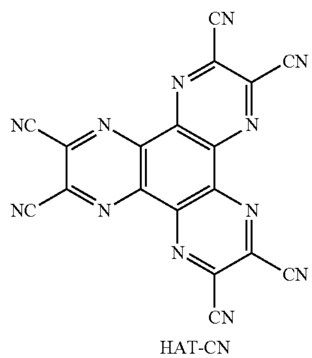

HAT-CN

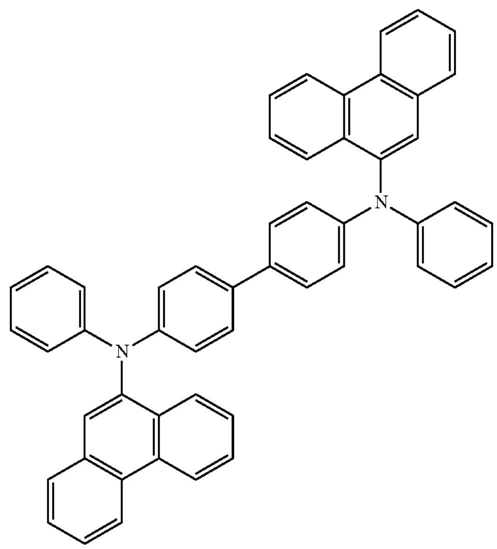

HT-1

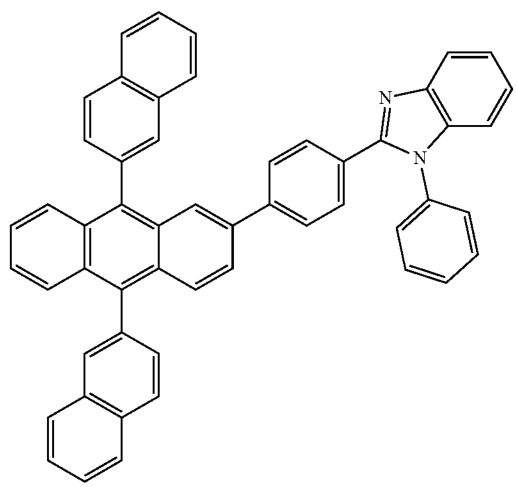

ET-1

-continued

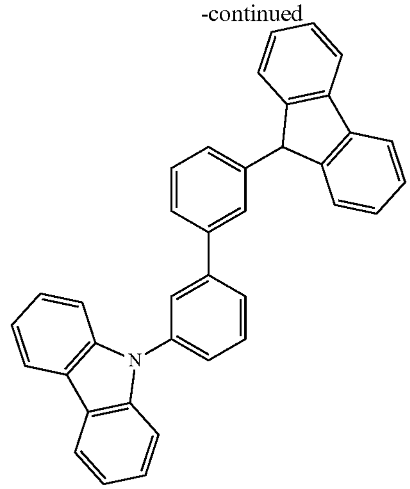

mCBP

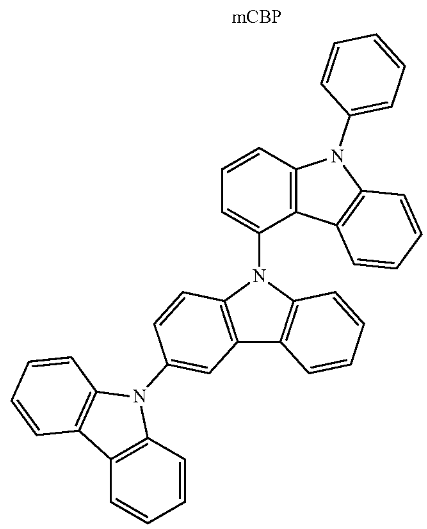

BH1

S1 and T1 of the compounds (2-2) and (4-2) were measured.

S1 and T1 were measured as follows.

Using a vacuum deposition method, a vapor deposited film with 100 nm thickness was vapor co-deposited on a quartz substrate by using BH1 as a host and compound (2-2) or (4-2) as the light emitting dopant from different vapor deposition sources under the condition of a degree of vacuum of $10^{-4}$ Pa or less. At this time, they were co-deposited under deposition conditions such that the concentration of the compound (2-2) or (4-2) was 3%.

For S1, the emission spectrum of this deposition film was measured, a tangent was drawn to the rise of the emission spectrum on the short-wavelength side, and the wavelength value λedge [nm] of the point of intersection of the tangent and the horizontal axis was substituted into the following equation (i) to calculate S1.

$$S1[eV]=1239.85/\lambda edge \quad (i)$$

For T1, the phosphorescence spectrum of the above deposition film was measured, a tangent was drawn to the rise of the phosphorescence spectrum on the short-wavelength side, and the wavelength value λedge [nm] of the point of intersection of the tangent and the horizontal axis was substituted into the following equation (ii) to calculate T1.

$$T1[eV]=1239.85/\lambda edge \quad (ii)$$

The measurement results are shown in Table 1.

TABLE 1

| Compound | S1(eV) | T1(eV) | S1 − T1(eV) |
|---|---|---|---|
| 2-2 | 2.79 | 2.61 | 0.18 |
| 4-2 | 2.71 | 2.67 | 0.04 |

Example 1

Each thin film was laminated on the glass substrate on which an anode made of ITO having a film thickness of 70 nm was formed by a vacuum deposition method at a degree of vacuum of $4.0\times10^{-3}$ Pa. First, HAT-CN was formed on ITO to a thickness of 10 nm as a hole injection layer, and then HT-1 was formed to a thickness of 25 nm as a hole transport layer. Then, a compound (1-148) was formed to a thickness of 5 nm as an electron blocking layer. Then, the compound (1-148) as the first host, a compound (1-331) as the second host, and the compound (4-2) as the light emitting dopant were co-deposited from different deposition sources to form a light emitting layer having a thickness of 30 nm. At this time, they were co-deposited under deposition conditions such that the concentration of the compound (4-2) was 2% and the weight ratio of the first host to the second host was 50:50. Then, compound (1-331) was formed to a thickness of 5 nm as a hole blocking layer. Then, ET-1 was formed to a thickness of 40 nm as an electron transport layer. Further, lithium fluoride (LiF) was formed on the electron transport layer to a thickness of 1 nm as an electron injection layer. Finally, aluminum (Al) was formed on the electron injection layer to a thickness of 70 nm as a cathode, whereby an organic EL device was produced.

Examples 2 to 19

Organic EL devices were each fabricated in the same manner as in Example 1 except that the weight ratio of the light emitting dopant, the first host, and the second host, and the first host and the second host were as shown in Table 2.

Examples 20 to 25

Organic EL devices were each fabricated in the same manner as in Example 1 except that the light emitting dopant, and the first host or the second host were changed as shown in Table 2.

Comparative Example 1

Each thin film was laminated on the glass substrate on which an anode made of ITO having a film thickness of 70 nm was formed, by a vacuum deposition method at a degree of vacuum of $4.0\times10^{-3}$ Pa. First, HAT-CN was formed on ITO to a thickness of 10 nm as a hole injection layer, and then HT-1 was formed to a thickness of 25 nm as a hole transport layer. Then, the compound mCBP was formed to a thickness of 5 nm as an electron blocking layer. Then, the compound mCBP as the first host and the compound (4-2) as the light emitting dopant were co-deposited from different deposition sources to form a light emitting layer having a thickness of 30 nm. At this time, they were co-deposited under deposition conditions such that the concentration of the compound (4-2) was 2%. Then, the compound (1-31) was formed to a thickness of 5 nm as a hole blocking layer. Then, ET-1 was formed to a thickness of 40 nm as an electron transport layer. Further, lithium fluoride (LiF) was formed on the electron transport layer to a thickness of 1 nm as an electron injection layer. Finally, aluminum (Al) was formed on the electron injection layer to a thickness of 70 nm as a cathode, whereby an organic EL device was produced.

Comparative Example 2

An organic EL devices was fabricated in the same manner as in Comparative Example 1 except that the light emitting dopant and the first host (without the second host) were changed as shown in Table 2.

TABLE 2

| | Dopant | First host | Second host |
|---|---|---|---|
| Example 1 | 4-2 | 1-148(50%) | 1-331(50%) |
| Example 2 | 4-2 | 1-148(30%) | 1-331(70%) |
| Example 3 | 4-2 | 1-148(70%) | 1-331(30%) |
| Example 4 | 4-2 | 1-115(50%) | 1-331(50%) |
| Example 5 | 4-2 | 1-184(50%) | 1-331(50%) |
| Example 6 | 4-2 | 1-151(50%) | 1-331(50%) |
| Example 7 | 4-2 | 1-148(50%) | 1-289(50%) |
| Example 8 | 4-2 | 1-148(50%) | 1-356(50%) |
| Example 9 | 4-2 | 1-184(50%) | 1-373(50%) |
| Example 10 | 2-2 | 1-10(50%) | 1-331(50%) |
| Example 11 | 4-2 | 1-148(50%) | 1-383(50%) |
| Example 12 | 4-2 | 1-148(70%) | 1-364(30%) |
| Example 13 | 4-2 | 1-148(70%) | 1-310(30%) |
| Example 14 | 4-2 | 1-148(70%) | 1-613(30%) |
| Example 15 | 4-2 | 1-148(70%) | 1-299(30%) |
| Example 16 | 4-2 | 1-148(70%) | 1-478(30%) |
| Example 17 | 4-2 | 1-148(70%) | 1-469(30%) |
| Example 18 | 4-2 | 1-148(70%) | 1-614(30%) |
| Example 19 | 4-2 | 1-615(70%) | 1-364(30%) |
| Example 20 | 4-2 | 1-148 | — |
| Example 21 | 4-2 | 1-115 | — |
| Example 22 | 4-2 | 1-331 | — |
| Example 23 | 4-2 | 1-356 | — |
| Example 24 | 2-2 | 1-115 | — |
| Example 25 | 4-2 | — | 1-364 |
| Comparative Example 1 | 4-2 | mCBP | — |
| Comparative Example 2 | 2-2 | mCBP | — |

The voltage, maximum emission wavelength of the emission spectrum, external quantum efficiency, and lifetime of each organic EL device produced in Examples and Comparative Examples are shown in Table 3. The voltage, the maximum emission wavelength, and the external quantum efficiency are values at a luminance of 500 cd/$m^2$ and are initial properties. The lifetime denotes a time measured until the luminance decayed to 50% of the initial luminance upon the initial luminance of 500 cd/$m^2$.

TABLE 3

| | Voltage (V) | Maximum emission wavelength (nm) | External quantum efficiency (%) | Lifetime (h) |
|---|---|---|---|---|
| Example 1 | 3.6 | 471 | 23.1 | 205 |
| Example 2 | 3.8 | 472 | 22.6 | 193 |
| Example 3 | 3.5 | 471 | 24.4 | 237 |
| Example 4 | 3.8 | 473 | 24.5 | 132 |

TABLE 3-continued

| | Voltage (V) | Maximum emission wavelength (nm) | External quantum efficiency (%) | Lifetime (h) |
|---|---|---|---|---|
| Example 5 | 3.5 | 472 | 23.4 | 212 |
| Example 6 | 3.8 | 470 | 20.3 | 155 |
| Example 7 | 3.7 | 470 | 23.6 | 216 |
| Example 8 | 3.9 | 474 | 23.2 | 148 |
| Example 9 | 3.5 | 473 | 19.9 | 256 |
| Example 10 | 3.9 | 462 | 13.3 | 57 |
| Example 11 | 4.0 | 472 | 22.5 | 131 |
| Example 12 | 3.4 | 472 | 22.3 | 413 |
| Example 13 | 3.4 | 472 | 24.7 | 391 |
| Example 14 | 3.2 | 473 | 23.5 | 721 |
| Example 15 | 3.2 | 472 | 21.4 | 654 |
| Example 16 | 3.3 | 472 | 22.1 | 830 |
| Example 17 | 3.3 | 473 | 24.1 | 984 |
| Example 18 | 3.8 | 473 | 25.3 | 350 |
| Example 19 | 3.8 | 474 | 20.7 | 634 |
| Example 20 | 4.1 | 470 | 21.2 | 145 |
| Example 21 | 4.2 | 469 | 20.9 | 119 |
| Example 22 | 4.0 | 472 | 19.8 | 111 |
| Example 23 | 4.2 | 473 | 19.3 | 105 |
| Example 24 | 4.1 | 461 | 10.5 | 30 |
| Example 25 | 4.3 | 473 | 19.8 | 251 |
| Comparative Example 1 | 4.7 | 471 | 22.7 | 24 |
| Comparative Example 2 | 4.8 | 458 | 6.7 | 11 |

Table 3 shows that the organic EL devices which are the Examples of the present invention have the properties of the low voltage, high efficiency, and the long lifetime and are found to be blue luminescence from the maximum emission wavelength.

REFERENCE SIGNS LIST

1 substrate, 2 the anode, 3 hole injection layer, 4 hole transport layer, 5 light emitting layer, 6 electron transport layer, 7 cathode

What is claimed is:

1. An organic electroluminescent device comprising one or more light emitting layers between an anode and a cathode opposite to each other, wherein at least one of the light emitting layers comprises one or more hosts selected from the compounds represented by the following general formula (1) and, as a light emitting dopant, a polycyclic aromatic compound represented by the following general formula (2) or a polycyclic aromatic compound having a structure represented by the general formula (2) as a substructure:

(1)

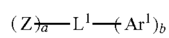

(1a)

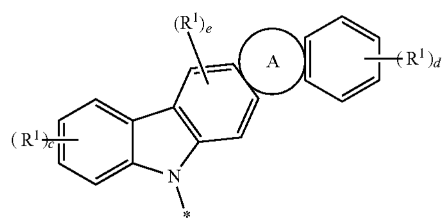

(1b)

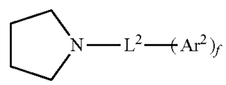

wherein Z is an indolocarbazole ring-containing group represented by the general formula (1a),

* is a bonding site to $L^1$, and the ring A is a heterocyclic ring represented by formula (1b), and the ring A is condensed with an adjacent ring at an arbitrary position, $L^1$ and $L^2$ are each independently a substituted or unsubstituted aromatic hydrocarbon group having 6 to 30 carbon atoms, or a substituted or unsubstituted aromatic heterocyclic group having 3 to 17 carbon atoms, $Ar^1$ and $Ar^2$ are each independently a substituted or unsubstituted aromatic hydrocarbon group having 6 to 30 carbon atoms, a substituted or unsubstituted aromatic heterocyclic group having 3 to 17 carbon atoms, or a linked aromatic group formed by linking 2 to 8 groups thereof, $R^1$ is each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, and a represents an integer of 1 to 3, b represents an integer of 0 to 3, and c and d each independently represent an integer of 0 to 4, e represents an integer of 0 to 2, and f represents an integer of 0 to 3;

(2)

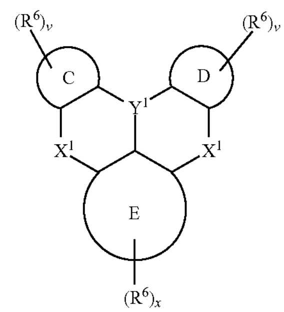

wherein the C ring, the D ring, and the E ring are each independently an aromatic hydrocarbon ring having 6 to 24 carbon atoms or an aromatic heterocyclic ring having 3 to 17 carbon atoms, and $Y^1$ is B, P, P═O, P═S, Al, Ga, As, Si—$R^2$ or Ge—$R^3$, $R^2$ and $R^3$ are each independently an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, $X^1$ is each independently O, N—$Ar^3$, S or Se, and $Ar^3$ is each independently a substituted or unsubstituted aromatic hydrocarbon group having 6 to 18 carbon atoms, a substituted or unsubstituted aromatic heterocyclic group having 3 to 17 carbon atoms, or a linked aromatic group formed by linking 2 to 8 groups thereof, N—$Ar^3$ is optionally bonded to any of the C ring, the D ring, or the E ring to form a heterocyclic ring containing N, and at least one hydrogen in the C ring, the D ring, the E ring, $R^2$, $R^3$, $R^6$ and $Ar^3$ is optionally replaced with a halogen or deuterium, $R^6$ each independently represents a cyano group, deuterium, a diarylamino group having 12 to 44 carbon atoms, an arylheteroarylamino group having 12 to 44 carbon atoms, a diheteroarylamino group having 12 to 44 carbon atoms, an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, and v each independently represents an integer of 0 to 4, and x represents an integer of 0 to 3, wherein the polycyclic aromatic compound having the structure represented by the general formula (2) as a substructure is a polycyclic aromatic compound represented by the general formula (3) below:

(3)

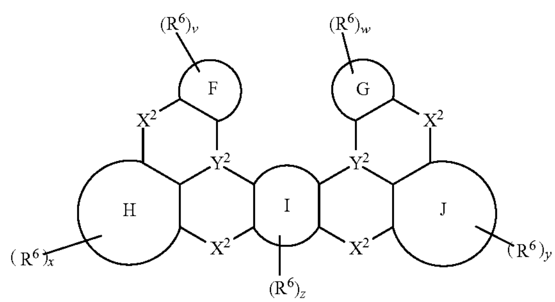

wherein the F ring, the G ring, the H ring, the I ring, and the J ring are each independently a substituted or unsubstituted aromatic hydrocarbon ring having 6 to 24 carbon atoms or a substituted or unsubstituted aromatic heterocyclic ring having 3 to 17 carbon atoms, $Y^2$ has the same meaning as $Y^1$ in the general formula (2), $X^2$ has the same meaning as $X^1$ in the general formula (2), and at least one hydrogen in the F ring, the G ring, the H ring, the I ring, and the J ring is optionally replaced with a halogen or deuterium, $R^6$, x, and v are as defined in the general formula (2), w represents an integer of 0 to 4, y represents an integer of 0 to 3, and z represents an integer of 0 to 2.

2. The organic electroluminescent device according to claim 1, wherein the polycyclic aromatic compound having the structure represented by the general formula (2) as a substructure is a polycyclic aromatic compound represented by the general formula (4) below:

(4)

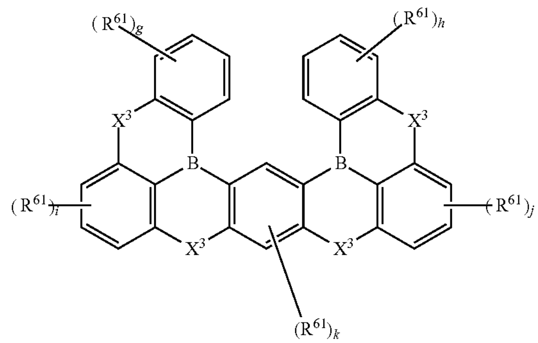

wherein $X^3$ each independently represents N—$Ar^5$, O, or S, however at least one $X^3$ represents N—$Ar^5$, $Ar^5$ each independently represents a substituted or unsubstituted aromatic hydrocarbon group having 6 to 18 carbon atoms, a substituted or unsubstituted aromatic heterocyclic ring group having 3 to 17 carbon atoms, or a linked aromatic ring composed of 2 to 8 aromatic rings thereof linked together, N—$Ar^5$ is optionally bonded with any of the aromatic ring bonded with $X^3$ to form a heterocyclic ring containing N, $R^{61}$ each independently represents a cyano group, deuterium, a diarylamino group having 12 to 44 carbon atoms, an aliphatic hydrocarbon group having 1 to 10 carbon atoms, a substituted or unsubstituted aromatic hydrocarbon group having 6 to 18 carbon atoms, or a substituted or unsubstituted aromatic heterocyclic group having 3 to 17 carbon atoms, and g and h each independently represent an integer of 0 to 4, i and j each independently represent an integer of 0 to 3, and k represents an integer of 0 to 2.

3. The organic electroluminescent device according to claim 1, wherein the light emitting layer contains two or more hosts selected from the compounds represented by the general formula (1).

4. The organic electroluminescent device according to claim 3, wherein at least one host selected from the compounds represented by the general formula (1) has $L^1$ and $L^2$, either of which alone is a substituted or unsubstituted nitrogen-containing aromatic heterocyclic ring group having 3 to 17 carbon atoms.

5. The organic electroluminescent device according to claim 4, comprising a first host represented by the following formula (5a) or (5b) and a second host represented by the following formula (6), as the hosts selected from the compounds represented by the general formula (1):

[C 5]

(5a)

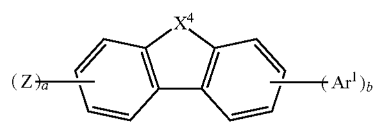

(5b)

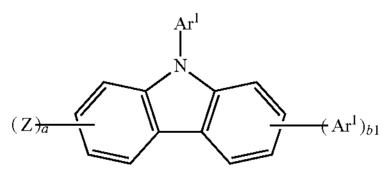

(6)

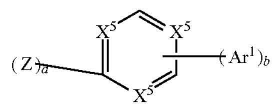

wherein Z, $Ar^1$, a and b are as defined in the general formula (1), $X^4$ represents O or S, b1 represents an integer of 0 to 2, $X^5$ each independently represents N, C—H, C—, or C—$R^7$, and at least one $X^5$ represents N, and $R^7$ independently represents a cyano group, an aliphatic hydrocarbon group having 1 to 10 carbon atoms, or a diarylamino group having 12 to 44 carbon atoms.

6. The organic electroluminescent device according to claim 4, wherein at least one host selected from the compounds represented by the general formula (1) is a compound represented by the following formula (7) or formula (8):

(7)

(8)

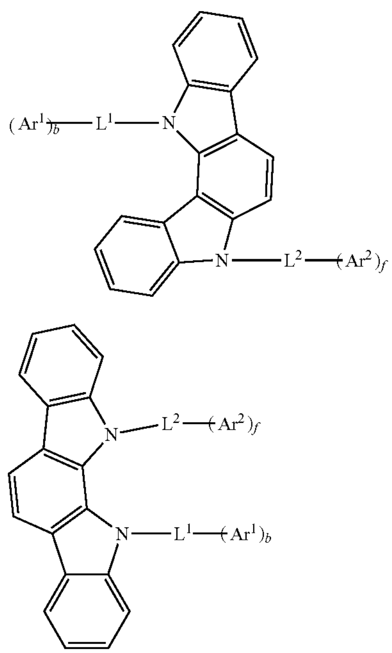

wherein $L^1$, $L^2$, $Ar^1$, $Ar^2$, b and f are as defined in the general formula (1).

7. The organic electroluminescent device according to claim 6, wherein at least two hosts selected from the compounds represented by the general formula (1) are represented by the formula (7).

8. The organic electroluminescent device according to claim 1, wherein the light emitting dopant has a difference between excited singlet energy (S1) and excited triplet energy (T1) (ΔEST) of 0.20 eV or less.

9. The organic electroluminescent device according to claim 8, wherein the ΔEST is 0.10 eV or less.

10. The organic electroluminescent device according to claim 3, wherein 99.9 to 90% by mass of the hosts and 0.10 to 10% by mass of the light emitting dopant are contained, and the first host represented by formula (5) is contained in an amount of 10 to 90% by mass and the second host represented by formula (6) is contained in an amount of 90 to 10% by mass, based on the hosts.

11. The organic electroluminescent device according to claim 5, wherein 99.9 to 90% by mass of the hosts and 0.10 to 10% by mass of the light emitting dopant are contained, and the first host represented by formula (5) is contained in an amount of 10 to 90% by mass and the second host represented by formula (6) is contained in an amount of 90 to 10% by mass, based on the hosts.

12. The organic electroluminescent device according to claim 8, wherein 99.9 to 90% by mass of the hosts and 0.10 to 10% by mass of the light emitting dopant are contained, and the first host represented by formula (5) is contained in an amount of 10 to 90% by mass and the second host represented by formula (6) is contained in an amount of 90 to 10% by mass, based on the hosts.

13. The organic electroluminescent device according to claim 9, wherein 99.9 to 90% by mass of the hosts and 0.10 to 10% by mass of the light emitting dopant are contained, and the first host represented by formula (5) is contained in an amount of 10 to 90% by mass and the second host represented by formula (6) is contained in an amount of 90 to 10% by mass, based on the hosts.

* * * * *